US00RE50257E

(19) United States
(12) Reissued Patent
Ikegaya et al.

(10) Patent Number: US RE50,257 E
(45) **Date of Reissued Patent: *Dec. 31, 2024**

(54) DATA PROCESSING DEVICE AND DATA PROCESSING METHOD

(71) Applicant: Saturn Licensing LLC, New York, NY (US)

(72) Inventors: Ryoji Ikegaya, Kanagawa (JP); Makiko Yamamoto, Tokyo (JP); Yuji Shinohara, Kanagawa (JP)

(73) Assignee: Saturn Licensing LLC, New York, NY (US)

( * ) Notice: This patent is subject to a terminal disclaimer.

(21) Appl. No.: 17/874,082

(22) Filed: Jul. 26, 2022

Related U.S. Patent Documents

Reissue of:
(64) Patent No.: 9,621,191
Issued: Apr. 11, 2017
Appl. No.: 14/782,740
PCT Filed: Feb. 5, 2015
PCT No.: PCT/JP2015/053181
§ 371 (c)(1),
(2) Date: Oct. 6, 2015
PCT Pub. No.: WO2015/125612
PCT Pub. Date: Aug. 27, 2015

U.S. Applications:
(63) Continuation of application No. 16/381,936, filed on Apr. 11, 2019, now Pat. No. Re. 49,243, which is an application for the reissue of Pat. No. 9,621,191.

(30) Foreign Application Priority Data

Feb. 19, 2014 (JP) ..... 2014-030012

(51) Int. Cl.
*H03M 13/03* (2006.01)
*H03M 13/00* (2006.01)
(Continued)

(52) U.S. Cl.
CPC ..... *H03M 13/036* (2013.01); *H03M 13/1102* (2013.01); *H03M 13/1137* (2013.01);
(Continued)

(58) Field of Classification Search
CPC ..... H03M 13/036; H03M 13/1102; H03M 13/1137; H03M 13/1165; H03M 13/152;
(Continued)

(56) References Cited

U.S. PATENT DOCUMENTS

2007/0011570 A1 1/2007 Jeong et al.
2008/0178065 A1 7/2008 Khandekar et al.
(Continued)

FOREIGN PATENT DOCUMENTS

CN 1547806 A 11/2004
CN 101013931 A 8/2007
(Continued)

OTHER PUBLICATIONS

"Digital Video Broadcasting (DVB); Second generation framing structure, channel coding and modulation systems for Broadcasting, Interactive Services, News Gathering and other broadband satellite applications (DVB-S2)" ETSI EN 302 307, V1. 2. 1, Aug. 2009, 78 Pages.
(Continued)

*Primary Examiner* — Woo H Choi
(74) *Attorney, Agent, or Firm* — Oblon, McClelland, Maier & Neustadt, L.L.P.

(57) ABSTRACT

In group-wise interleaving, interleaving of an LDPC code having a code length N of 64800 bits and an encoding rate r of 5/15 is performed in a unit of a bit group of 360 bits. In group-wise deinterleaving, an arrangement of the LDPC code that has undergone group-wise interleaving is returned to an original arrangement. The technology can be applied to a case of transmitting data using the LDPC code. The data
(Continued)

| Rate | N | K | N-K | M1 | M2 | Q1 | Q2 |
|---|---|---|---|---|---|---|---|
| 5/15 | 64800 | 21600 | 43200 | 1440 | 41760 | 4 | 116 |
| 6/15 | 64800 | 25920 | 38880 | 1080 | 37800 | 3 | 105 |
| 7/15 | 64800 | 30240 | 34560 | 1080 | 33480 | 3 | 93 |

processing device and data processing method can ensure excellent communication quality in data transmission using an LDPC code.

21 Claims, 132 Drawing Sheets

(51) Int. Cl.

| | |
|---|---|
| ***H03M 13/11*** | (2006.01) |
| ***H03M 13/25*** | (2006.01) |
| ***H03M 13/27*** | (2006.01) |
| ***H03M 13/29*** | (2006.01) |
| *H03M 13/15* | (2006.01) |
| *H04L 27/26* | (2006.01) |

(52) U.S. Cl.
CPC ..... *H03M 13/1165* (2013.01); *H03M 13/255* (2013.01); *H03M 13/271* (2013.01); *H03M 13/2778* (2013.01); *H03M 13/2792* (2013.01); *H03M 13/2906* (2013.01); *H03M 13/616* (2013.01); *H03M 13/152* (2013.01); *H04L 27/2626* (2013.01)

(58) Field of Classification Search
CPC ..... H03M 13/255; H03M 13/271; H03M 13/2778; H03M 13/279; H03M 13/2906; H03M 13/616; H04L 27/2626
See application file for complete search history.

(56) References Cited

U.S. PATENT DOCUMENTS

| | | | | |
|---|---|---|---|---|
| 2009/0187811 | A1 | 7/2009 | Eroz et al. | |
| 2009/0210767 | A1 | 8/2009 | Myung et al. | |
| 2010/0269019 | A1 | 10/2010 | Yokokawa et al. | |
| 2010/0325512 | A1 | 12/2010 | Yokokawa et al. | |
| 2011/0090948 | A1 | 4/2011 | Zhou et al. | |
| 2012/0166914 | A1 | 6/2012 | Khandekar et al. | |
| 2013/0216001 | A1 | 8/2013 | Petrov | |
| 2013/0227378 | A1 | 8/2013 | Yamamoto et al. | |
| 2014/0082452 | A1 | 3/2014 | Shinohara et al. | |
| 2014/0126672 | A1* | 5/2014 | Petrov | H03M 13/1165 375/298 |
| 2014/0153625 | A1* | 6/2014 | Vojcic | H04L 1/005 375/224 |
| 2015/0222471 | A1* | 8/2015 | Myung | H04L 1/0043 375/296 |
| 2015/0236721 | A1* | 8/2015 | Kim | H04L 1/0041 714/776 |
| 2015/0256202 | A1* | 9/2015 | Park | H03M 13/1165 714/762 |
| 2016/0156371 | A1 | 6/2016 | Ikegaya et al. | |

FOREIGN PATENT DOCUMENTS

| | | | |
|---|---|---|---|
| CN | 101277144 | A | 10/2008 |
| CN | 101420409 | A | 4/2009 |
| CN | 101874350 | A | 10/2010 |
| CN | 101874351 | A | 10/2010 |
| CN | 103138768 | A | 6/2013 |
| CN | 103404037 | A | 11/2013 |
| EM | 2 214 319 | B1 | 8/2010 |
| EM | 2 560 310 | A1 | 2/2013 |
| EM | 3 148 088 | A1 | 3/2017 |
| JP | 2007-6494 | A | 1/2007 |
| JP | 2009-224820 | | 10/2009 |
| JP | 2011-523318 | A | 8/2011 |
| JP | 2013-5124 | A | 1/2013 |
| KR | 10 2010 0096098 | | 9/2010 |
| KR | 10 2010 0096102 | | 9/2010 |
| KR | 10 2014 0018922 | | 2/2014 |

OTHER PUBLICATIONS

DVB Organization: "CfT_Sony_LDPC_64APSK_annex.pdf", DVB, Digital Video Broadcasting, Feb. 12, 2013, XP017840337, pp. 1-127.

ETSI EN 302 755 : DVB "Frame structure channel coding and modulation for a second generation digital terrestrial television broadcasting system (DVB-T2)", V1,3,1 pp. 40-46, 129-138, Apr. 2012, 18 pgs.

Draft ETSI EN 303 105 V1.1.1: "Digital Video Broadcasting (DVB); Next Generation broadcasting system to Handheld, physical layer specification (DVB-NGH)", DVB Document A160, Nov. 2012, pp. 1-295.

International Search Report issued Apr. 21, 2015 in PCT/JP2015/053181 (with English language translation).

"Digital Video Broadcasting (DVB); Second generation framing structure, channel coding and modulation systems for Broadcasting, Interactive Services, News Gathering and other broadband satellite applications (DVB-SZ)" ETSI EN 302 307, V1. 2. 1, Aug. 2009, 78 Pages.

* cited by examiner

FIG. 3

$$H = \begin{bmatrix} 1 & 1 & 1 & 0 & 0 & 0 & 1 & 0 & 1 & 1 & 0 & 0 \\ 1 & 1 & 0 & 1 & 1 & 0 & 0 & 0 & 0 & 0 & 1 & 1 \\ 0 & 0 & 1 & 1 & 1 & 1 & 1 & 0 & 0 & 1 & 0 & 0 \\ 0 & 0 & 0 & 1 & 1 & 1 & 0 & 1 & 1 & 0 & 0 & 1 \\ 1 & 1 & 0 & 0 & 0 & 1 & 0 & 1 & 0 & 1 & 1 & 0 \\ 0 & 0 & 1 & 0 & 0 & 0 & 1 & 1 & 1 & 0 & 1 & 1 \end{bmatrix}$$

FIG. 13

NUMBER OF COLUMNS OF EACH COLUMN WEIGHT

| | N=64800 | | | | N=16200 | | | |
|---|---|---|---|---|---|---|---|---|
| Nominal ENCODING RATES | X | KX | K3 | M | X | KX | K3 | M |
| 1/4 | 12 | 5400 | 10800 | 48600 | 12 | 1440 | 1800 | 12960 |
| 1/3 | 12 | 7200 | 14400 | 43200 | 12 | 1800 | 3600 | 10800 |
| 2/5 | 12 | 8640 | 17280 | 38880 | 12 | 2160 | 4320 | 9720 |
| 1/2 | 8 | 12960 | 19440 | 32400 | 8 | 1800 | 5400 | 9000 |
| 3/5 | 12 | 12960 | 25920 | 25920 | 12 | 3240 | 6480 | 6480 |
| 2/3 | 13 | 4320 | 38880 | 21600 | 13 | 1080 | 9720 | 5400 |
| 3/4 | 12 | 5400 | 43200 | 16200 | 12 | 360 | 11520 | 4320 |
| 4/5 | 11 | 6480 | 45360 | 12960 | - | 0 | 12600 | 3600 |
| 5/6 | 13 | 5400 | 48600 | 10800 | 13 | 360 | 12960 | 2880 |
| 8/9 | 4 | 7200 | 50400 | 7200 | 4 | 1800 | 12600 | 1800 |
| 9/10 | 4 | 6480 | 51840 | 6480 | --- | --- | --- | --- |

FIG. 15
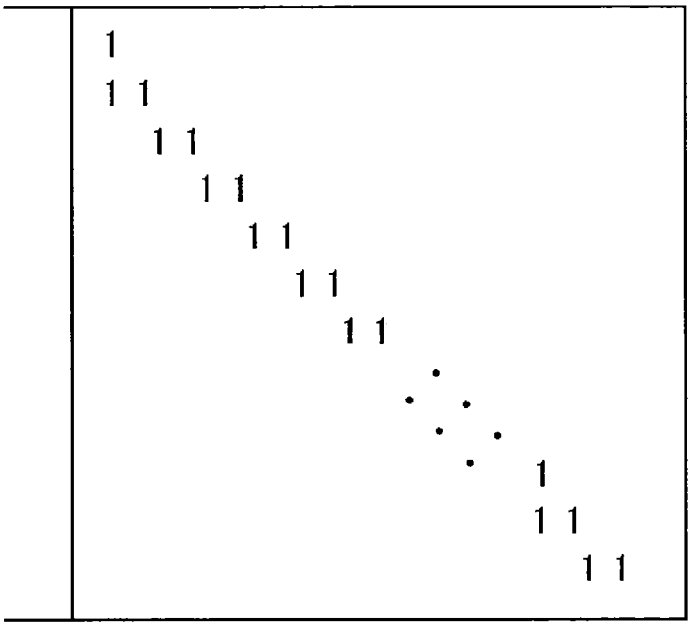
STAIRCASE STRUCTURE OF PARITY MATRIX
A
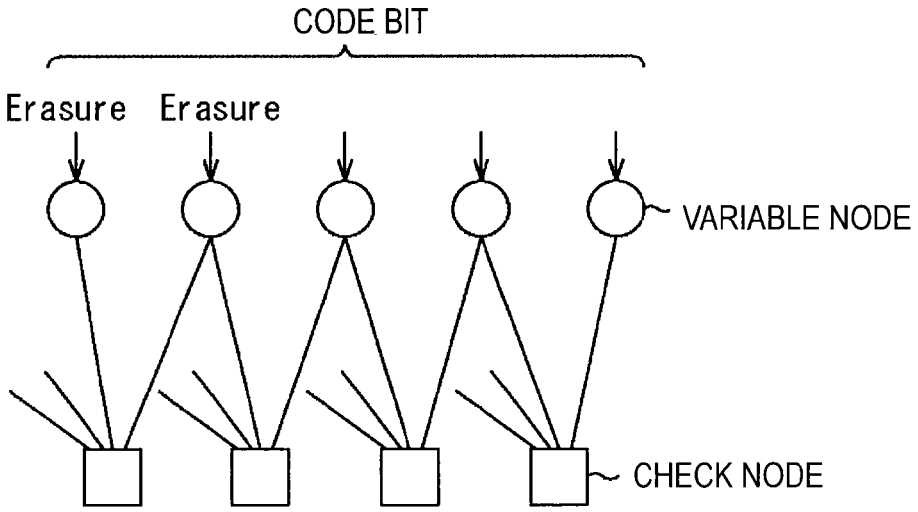
STAIRCASE STRUCTURE PORTION OF Tanner Graph
B r1/4 16K 6295 9626 304 7695 4839 4936 1660 144 11203 5567 6347 12557
10691 4988 3859 3734 3071 3494 7687 10313 5964 8069 8296 11090
10774 3613 5208 11177 7676 3549 8746 6583 7239 12265 2674 4292
11869 3708 5981 8718 4908 10650 6805 3334 2627 10461 9285 11120
7844 3079 10773
3385 10854 5747
1360 12010 12202
6189 4241 2343
9840 12726 4977

FIG. 21

DISPLAY ROW NUMBERS OF PARITY CHECK MATRIX (INFORMATION MATRIX $H_A$) FOR EVERY 360 COLUMNS STARTING FROM FIRST COLUMN

ROW NUMBER OF PARITY CHECK MATRIX

| | | | | | | | | | | | | | | | | | | | | | | | | |
|---|---|---|---|---|---|---|---|---|---|---|---|---|---|---|---|---|---|---|---|---|---|---|---|---|
| FIRST ROW OF $H_A$ | 0 | 2084 | 1613 | 1548 | 1286 | 1460 | 3196 | 4297 | 2481 | 3369 | 3451 | 4620 | 2622 | | | | | | | | | | | |
| 361-ST ROW OF $H_A$ | 1 | 122 | 1516 | 3448 | 2880 | 1407 | 1847 | 3799 | 3529 | 373 | 971 | 4358 | 3108 | | | | | | | | | | | |
| 721-ST ROW OF $H_A$ | 2 | 259 | 3399 | 929 | 2650 | 864 | 3996 | 3833 | 107 | 5287 | 164 | 3125 | 2350 | | | | | | | | | | | |
| 1081-ST ROW OF $H_A$ | 3 | 342 | 3529 | | | | | | | | | | | | | | | | | | | | | |
| | 4 | 4198 | 2147 | | | | | | | | | | | | | | | | | | | | | |
| | 5 | 1880 | 4836 | | | | | | | | | | | | | | | | | | | | | |
| | 6 | 3864 | 4910 | | | | | | | | | | | | | | | | | | | | | |
| | 7 | 243 | 1542 | | | | | | | | | | | | | | | | | | | | | |
| | 8 | 3011 | 1436 | | | | | | | | | | | | | | | | | | | | | |
| | 9 | 2167 | 2512 | | | | | | | | | | | | | | | | | | | | | |
| | 10 | 4606 | 1003 | | | | | | | | | | | | | | | | | | | | | |
| | 11 | 2835 | 705 | | | | | | | | | | | | | | | | | | | | | |
| | 12 | 3426 | 2365 | | | | | | | | | | | | | | | | | | | | | |
| | 13 | 3848 | 2474 | | | | | | | | | | | | | | | | | | | | | |
| | 14 | 1360 | 1743 | | | | | | | | | | | | | | | | | | | | | |
| | 0 | 163 | 2536 | | | | | | | | | | | | | | | | | | | | | |
| | 1 | 2583 | 1180 | | | | | | | | | | | | | | | | | | | | | |
| | 2 | 1542 | 509 | | | | | | | | | | | | | | | | | | | | | |
| | 3 | 4418 | 1005 | | | | | | | | | | | | | | | | | | | | | |
| | 4 | 5212 | 5117 | | | | | | | | | | | | | | | | | | | | | |
| | 5 | 2155 | 2922 | | | | | | | | | | | | | | | | | | | | | |
| | 6 | 347 | 2696 | | | | | | | | | | | | | | | | | | | | | |
| | 7 | 226 | 4296 | | | | | | | | | | | | | | | | | | | | | |
| | 8 | 1560 | 487 | | | | | | | | | | | | | | | | | | | | | |
| | 9 | 3926 | 1640 | | | | | | | | | | | | | | | | | | | | | |
| | 10 | 149 | 2928 | | | | | | | | | | | | | | | | | | | | | |
| | 11 | 2364 | 563 | | | | | | | | | | | | | | | | | | | | | |
| | 12 | 635 | 688 | | | | | | | | | | | | | | | | | | | | | |
| | 13 | 231 | 1684 | | | | | | | | | | | | | | | | | | | | | |
| | 14 | 1129 | 3894 | | | | | | | | | | | | | | | | | | | | | |

$h_{3,5}$

PARITY CHECK MATRIX INITIAL VALUE TABLE

| |
|---|
| 2 6 18 |
| 2 10 19 |
| 22 |
| 19 |
| 15 |

PROVIDED BY CRC/ETRI

FIG. 30

```
N=16200, rate=8/15
  5 519 825 1871 2098 2478 2659 2820 3200 3294 3650 3804 3949 4426 4460 4503 456
8 4590 4949 5219 5662 5738 5905 5911 6160 6404 6637 6708 6737 6814 7263 7412
  81 391 1272 1633 2062 2882 3443 3503 3535 3908 4033 4163 4490 4929 5262 5399 5
576 5768 5910 6331 6430 6844 6867 7201 7274 7290 7343 7350 7378 7387 7440 7554
  105 975 3421 3480 4120 4444 5957 5971 6119 6617 6761 6810 7067 7353
  6 138 485 1444 1512 2615 2990 3109 5604 6435 6513 6632 6704 7507
  20 858 1051 2539 3049 5162 5308 6158 6391 6604 6744 7071 7195 7238
  1140 5838 6203 6748
  6282 6466 6481 6638
  2346 2592 5436 7487
  2219 3897 5896 7528
  2897 6028 7018
  1285 1863 5324
  3075 6005 6466
  5 6020 7551
  2121 3751 7507
  4027 5488 7542
  2 6012 7011
  3823 5531 5687
  1379 2262 5297
  1882 7498 7551
  3749 4806 7227
  2 2074 6898
  17 616 7482
  9 6823 7480
  5195 5880 7559
```

FIG. 31

N=16200, rate=10/15

352 747 894 1437 1688 1807 1883 2119 2159 3321 3400 3543 3588 3770 3821 4384 4470 4884 5012 5036 5084 5101 5271 5281 5353

505 915 1156 1269 1518 1650 2153 2256 2344 2465 2509 2867 2875 3007 3254 3519 3687 4331 4439 4532 4940 5011 5076 5113 5367

268 346 650 919 1260 4389 4653 4721 4838 5054 5157 5162 5275 5362

220 236 828 1590 1792 3259 3647 4276 4281 4325 4963 4974 5003 5037

381 737 1099 1409 2364 2955 3228 3341 3473 3985 4257 4730 5173 5242

88 771 1640 1737 1803 2408 2575 2974 3167 3464 3780 4501 4901 5047

749 1502 2201 3189

2873 3245 3427

2158 2605 3165

1 3438 3606

10 3019 5221

371 2901 2923

9 3935 4683

1937 3502 3735

507 3128 4994

25 3854 4550

1178 4737 5366

2 223 5304

1146 5175 5197

1816 2313 3649

740 1951 3844

1320 3703 4791

1754 2905 4058

7 917 5277

3048 3954 5396

4804 4824 5105

2812 3895 5226

0 5318 5358

1483 2324 4826

2266 4752 5387

FIG. 32

N=16200, rate=12/15

3 394 1014 1214 1361 1477 1534 1660 1856 2745 2987 2991 3124 3155
59 136 528 781 803 928 1293 1489 1944 2041 2200 2613 2690 2847
155 245 311 621 1114 1269 1281 1783 1995 2047 2672 2803 2885 3014
79 870 974 1326 1449 1531 2077 2317 2467 2627 2811 3083 3101 3132
4 582 660 902 1048 1482 1697 1744 1928 2628 2699 2728 3045 3104
175 395 429 1027 1061 1068 1154 1168 1175 2147 2359 2376 2613 2682
1388 2241 3118 3148
143 506 2067 3148
1594 2217 2705
398 988 2551
1149 2588 2654
678 2844 3115
1508 1547 1954
1199 1267 1710
2589 3163 3207
1 2583 2974
2766 2897 3166
929 1823 2742
1113 3007 3239
1753 2478 3127
0 509 1811
1672 2646 2984
965 1462 3230
3 1077 2917
1183 1316 1662
968 1593 3239
64 1996 2226
1442 2058 3181
513 973 1058
1263 3185 3229
681 1394 3017
419 2853 3217
3 2404 3175
2417 2792 2854
1879 2940 3235
647 1704 3060

FIG. 33

N=64800, rate=7/15

7 15 26 69 1439 3712 5756 5792 5911 8456 10579 19462 19782 21709 23214 25142 26040 30206 30475 31211 31427 32105 32989 33082 33502 34116 34241 34288 34292 34318 34373 34390 34465

83 1159 2271 6500 6807 7823 10344 10700 13367 14162 14242 14352 15015 17301 18952 20811 24974 25795 27868 28081 33077 33204 33262 33350 33516 33677 33680 33930 34090 34250 34290 34377 34398

25 2281 2995 3321 6006 7482 8428 11489 11601 14011 17409 26210 29945 30675 31101 31355 31421 31543 31697 32056 32216 33282 33453 33487 33696 34044 34107 34213 34247 34261 34276 34467 34495

0 43 87 2530 4485 4595 9951 11212 12270 12344 15566 21335 24699 26580 28518 28564 28812 29821 30418 31467 31871 32513 32597 33187 33402 33706 33838 33932 33977 34084 34283 34440 34473

81 3344 5540 7711 13308 15400 15885 18265 18632 22209 23657 27736 29158 29701 29845 30409 30654 30855 31420 31604 32519 32901 33267 33444 33525 33712 33878 34031 34172 34432 34496 34502 34541

42 50 66 2501 4706 6715 6970 8637 9999 14555 22776 26479 27442 27984 28534 29587 31309 31783 31907 31927 31934 32313 32369 32830 33364 33434 33553 33654 33725 33889 33962 34467 34482

6534 7122 8723 13137 13183 15818 18307 19324 20017 26389 29326 31464 32678 33668 34217

50 113 2119 5038 5581 6397 6550 10987 22308 25141 25943 29299 30186 33240 33399

7262 8787 9246 10032 10505 13090 14587 14790 16374 19946 21129 25726 31033 33660 33675

5004 5087 5291 7949 9477 11845 12698 14585 15239 17486 18100 18259 21409 21789 24280

28 82 3939 5007 6682 10312 12485 14384 21570 25512 26612 26854 30371 31114 32689

437 3055 9100 9517 12369 19030 19950 21328 24196 24236 25928 28458 30013 32181 33560

18 3590 4832 7053 8919 21149 24256 26543 27266 30747 31839 32671 33089 33571 34296

2678 4569 4667 6551 7639 10057 24276 24563 25818 26592 27879 28028 29444 29873 34017

72 77 2874 9092 10041 13669 20676 20778 25566 28470 28888 30338 31772 32143 33939

296 2196 7309 11901 14025 15733 16768 23587 25489 30936 31533 33749 34331 34431 34507

6 8144 12490 13275 14140 18706 20251 20644 21441 21938 23703 34190 34444 34463 34495

5108 14499 15734 19222 24695 25667 28359 28432 30411 30720 34161 34386 34465 34511 34522

61 89 3042 5524 12128 22505 22700 22919 24454 30526 33437 34114 34188 34490 34502

11 83 4668 4856 6361 11633 15342 16393 16958 26613 29136 30917 32559 34346 34504

3185 9728 25062

1643 5531 21573

2285 6088 24083

FIG. 34

78 14678 19119
49 13705 33535
21192 32280 32781
10753 21469 22084
10082 11950 13889
7861 25107 29167
14051 34171 34430
706 894 8316
29693 30445 32281
10202 30964 34448
15815 32453 34463
4102 21608 24740
4472 29399 31435
1162 7118 23226
4791 33548 34096
1084 34099 34418
1765 20745 33714
1302 21300 33655
33 8736 16646
53 18671 19089
21 572 2028
3339 11506 16745
285 6111 12643
27 10336 11586
21046 32728 34538
22215 24195 34026
19975 26938 29374
16473 26777 34212
20 29260 32784
35 31645 32837
26132 34410 34495
12446 20649 26851
6796 10992 31061
0 46 8420
10 636 22885
7183 16342 18305
1 5604 28258
6071 18675 34489
16786 25023 33323
3573 5081 10925
5067 31761 34415
3735 33534 34522
85 32829 34518
6555 23368 34559
22083 29335 29390
6738 21110 34316
120 4192 11123
3313 4144 20824
27783 28550 31034
6597 8164 34427

FIG. 35

18009 23474 32460
94 6342 12656
17 31962 34535
15091 24955 28545
15 3213 28298
26562 30236 34537
16832 20334 24628
4841 20669 26509
18055 23700 34534
23576 31496 34492
10699 13826 34440

FIG. 36

N=64800, rate=9/15

113 1557 3316 5680 6241 10407 13404 13947 14040 14353 15522 15698 16079 17363 19374 19543 20530 22833 24339

271 1361 6236 7006 7307 7333 12768 15441 15568 17923 18341 20321 21502 22023 23938 25351 25590 25876 25910

73 605 872 4008 6279 7653 10346 10799 12482 12935 13604 15909 16526 19782 20506 22804 23629 24859 25600

1445 1690 4304 4851 8919 9176 9252 13783 16076 16675 17274 18806 18882 20819 21958 22451 23869 23999 24177

1290 2337 5661 6371 8996 10102 10941 11360 12242 14918 16808 20571 23374 24046 25045 25060 25662 25783 25913

28 42 1926 3421 3503 8558 9453 10168 15820 17473 19571 19685 22790 23336 23367 23890 24061 25657 25680

0 1709 4041 4932 5968 7123 8430 9564 10596 11026 14761 19484 20762 20858 23803 24016 24795 25853 25863

29 1625 6500 6609 16831 18517 18568 18738 19387 20159 20544 21603 21941 24137 24269 24416 24803 25154 25395

55 66 871 3700 11426 13221 15001 16367 17601 18380 22796 23488 23938 25476 25635 25678 25807 25857 25872

1 19 5958 8548 8860 11489 16845 18450 18469 19496 20190 23173 25262 25566 25668 25679 25858 25888 25915

7520 7690 8855 9183 14654 16695 17121 17854 18083 18428 19633 20470 20736 21720 22335 23273 25083 25293 25403

48 58 410 1299 3786 10668 18523 18963 20864 22106 22308 23033 23107 23128 23990 24286 24409 24595 25802

12 51 3894 6539 8276 10885 11644 12777 13427 14039 15954 17078 19053 20537 22863 24521 25087 25463 25838

3509 8748 9581 11509 15884 16230 17583 19264 20900 21001 21310 22547 22756 22959 24768 24814 25594 25626 25880

21 29 69 1448 2386 4601 6626 6667 10242 13141 13852 14137 18640 19951 22449 23454 24431 25512 25814

18 53 7890 9934 10063 16728 19040 19809 20825 21522 21800 23582 24556 25031 25547 25562 25733 25789 25906

4096 4582 5766 5894 6517 10027 12182 13247 15207 17041 18958 20133 20503 22228 24332 24613 25689 25855 25883

0 25 819 5539 7076 7536 7695 9532 13668 15051 17683 19665 20253 21996 24136 24890 25758 25784 25807

34 40 44 4215 6076 7427 7965 8777 11017 15593 19542 22202 22973 23397 23423 24418 24873 25107 25644

1595 6216 22850 25439

1562 15172 19517 22362

7508 12879 24324 24496

6298 15819 16757 18721

11173 15175 19966 21195

59 13505 16941 23793

2267 4830 12023 20587

8827 9278 13072 16664

14419 17463 23398 25348

6112 16534 20423 22698

493 8914 21103 24799

FIG. 37

6896 12761 13206 25873
2 1380 12322 21701
11600 21306 25753 25790
8421 13076 14271 15401
9630 14112 19017 20955
212 13932 21781 25824
5961 9110 16654 19636
58 5434 9936 12770
6575 11433 19798
2731 7338 20926
14253 18463 25404
21791 24805 25869
2 11646 15850
6075 8586 23819
18435 22093 24852
2103 2368 11704
10925 17402 18232
9062 25061 25674
18497 20853 23404
18606 19364 19551
7 1022 25543
6744 15481 25868
9081 17305 25164
8 23701 25883
9680 19955 22848
56 4564 19121
5595 15086 25892
3174 17127 23183
19397 19817 20275
12561 24571 25825
7111 9889 25865
19104 20189 21851
549 9686 25548
6586 20325 25906
3224 20710 21637
641 15215 25754
13484 23729 25818
2043 7493 24246
16860 25230 25768
22047 24200 24902
9391 18040 19499
7855 24336 25069
23834 25570 25852
1977 8800 25756
6671 21772 25859
3279 6710 24444
24099 25117 25820
5553 12306 25915
48 11107 23907
10832 11974 25773

FIG. 38

2223 17905 25484
16782 17135 20446
475 2861 3457
16218 22449 24362
11716 22200 25897
8315 15009 22633
13 20480 25852
12352 18658 25687
3681 14794 23703
30 24531 25846
4103 22077 24107
23837 25622 25812
3627 13387 25839
908 5367 19388
0 6894 25795
20322 23546 25181
8178 25260 25437
2449 13244 22565
31 18928 22741
1312 5134 14838
6085 13937 24220
66 14633 25670
47 22512 25472
8867 24704 25279
6742 21623 22745
147 9948 24178
8522 24261 24307
19202 22406 24609

FIG. 39

N=64800, rate=11/15

696 989 1238 3091 3116 3738 4269 6406 7033 8048 9157 10254 12033 16456 16912
444 1488 6541 8626 10735 12447 13111 13706 14135 15195 15947 16453 16916 17137
17268
401 460 992 1145 1576 1678 2238 2320 4280 6770 10027 12486 15363 16714 17157
1161 3108 3727 4508 5092 5348 5582 7727 11793 12515 12917 13362 14247 16717 17
205
542 1190 6883 7911 8349 8835 10489 11631 14195 15009 15454 15482 16632 17040 1
7063
17 487 776 880 5077 6172 9771 11446 12798 16016 16109 16171 17087 17132 17226
1337 3275 3462 4229 9246 10180 10845 10866 12250 13633 14482 16024 16812 17186
17241
15 980 2305 3674 5971 8224 11499 11752 11770 12897 14082 14836 15311 16391 172
09
0 3926 5869 8696 9351 9391 11371 14052 14172 14636 14974 16619 16961 17033 172
37
3033 5317 6501 8579 10698 12168 12966 14019 15392 15806 15991 16493 16690 1706
2 17090
981 1205 4400 6410 11003 13319 13405 14695 15846 16297 16492 16563 16616 16862
16953
1725 4276 8869 9588 14062 14486 15474 15548 16300 16432 17042 17050 17060 1717
5 17273
1807 5921 9960 10011 14305 14490 14872 15852 16054 16061 16306 16799 16833 171
36 17262
2826 4752 6017 6540 7016 8201 14245 14419 14716 15983 16569 16652 17171 17179
17247
1662 2516 3345 5229 8086 9686 11456 12210 14595 15808 16011 16421 16825 17112
17195
2890 4821 5987 7226 8823 9869 12468 14694 15352 15805 16075 16462 17102 17251
17263
3751 3890 4382 5720 10281 10411 11350 12721 13121 14127 14980 15202 15335 1673
5 17123
26 30 2805 5457 6630 7188 7477 7556 11065 16608 16859 16909 16943 17030 17103
40 4524 5043 5566 9645 10204 10282 11696 13080 14837 15607 16274 17034 17225 1
7266
904 3157 6284 7151 7984 11712 12887 13767 15547 16099 16753 16829 17044 17250
17259
7 311 4876 8334 9249 11267 14072 14559 15003 15235 15686 16331 17177 17238 172
53
4410 8066 8596 9631 10369 11249 12610 15769 16791 16960 17018 17037 17062 1716
5 17204
24 8261 9691 10138 11607 12782 12786 13424 13933 15262 15795 16476 17084 17193
17220
88 11622 14705 15890
304 2026 2638 6018
1163 4268 11620 17232
9701 11785 14463 17260
4118 10952 12224 17006
3647 10823 11521 12060
1717 3753 9199 11642

FIG. 40

2187 14280 17220
14787 16903 17061
381 3534 4294
3149 6947 8323
12562 16724 16881
7289 9997 15306
5615 13152 17260
5666 16926 17027
4190 7798 16831
4778 10629 17180
10001 13884 15453
6 2237 8203
7831 15144 15160
9186 17204 17243
9435 17168 17237
42 5701 17159
7812 14259 15715
39 4513 6658
38 9368 11273
1119 4785 17182
5620 16521 16729
16 6685 17242
210 3452 12383
466 14462 16250
10548 12633 13962
1452 6005 16453
22 4120 13684
5195 11563 16522
5518 16705 17201
12233 14552 15471
6067 13440 17248
8660 8967 17061
8673 12176 15051
5959 15767 16541
3244 12109 12414
31 15913 16323
3270 15686 16653
24 7346 14675
12 1531 8740
6228 7565 16667
16936 17122 17162
4868 8451 13183
3714 4451 16919
11313 13801 17132
17070 17191 17242
1911 11201 17186
14 17190 17254
11760 16008 16832
14543 17033 17278
16129 16765 17155

FIG. 41

6891 15561 17007
12741 14744 17116
8992 16661 17277
1861 11130 16742
4822 13331 16192
13281 14027 14989
38 14887 17141
10698 13452 15674
4 2539 16877
857 17170 17249
11449 11906 12867
285 14118 16831
15191 17214 17242
39 728 16915
2469 12969 15579
16644 17151 17164
2592 8280 10448
9236 12431 17173
9064 16892 17233
4526 16146 17038
31 2116 16083
15837 16951 17031
5362 8382 16618
6137 13199 17221
2841 15068 17068
24 3620 17003
9880 15718 16764
1784 10240 17209
2731 10293 10846
3121 8723 16598
8563 15662 17088
13 1167 14676
29 13850 15963
3654 7553 8114
23 4362 14865
4434 14741 16688
8362 13901 17244
13687 16736 17232
46 4229 13394
13169 16383 16972
16031 16681 16952
3384 9894 12580
9841 14414 16165
5013 17099 17115
2130 8941 17266
6907 15428 17241
16 1860 17235
2151 16014 16643
14954 15958 17222
3969 8419 15116

FIG. 43

N=64800, rate=13/15

142 2307 2598 2650 4028 4434 5781 5881 6016 6323 6681 6698 8125
2932 4928 5248 5256 5983 6773 6828 7789 8426 8494 8534 8539 8583
899 3295 3833 5399 6820 7400 7753 7890 8109 8451 8529 8564 8602
21 3060 4720 5429 5636 5927 6966 8110 8170 8247 8355 8365 8616
20 1745 2838 3799 4380 4418 4646 5059 7343 8161 8302 8456 8631
9 6274 6725 6792 7195 7333 8027 8186 8209 8273 8442 8548 8632
494 1365 2405 3799 5188 5291 7644 7926 8139 8458 8504 8594 8625
192 574 1179 4387 4695 5089 5831 7673 7789 8298 8301 8612 8632
11 20 1406 6111 6176 6256 6708 6834 7828 8232 8457 8495 8602
6 2654 3554 4483 4966 5866 6795 8069 8249 8301 8497 8509 8623
21 1144 2355 3124 6773 6805 6887 7742 7994 8358 8374 8580 8611
335 4473 4883 5528 6096 7543 7586 7921 8197 8319 8394 8489 8636
2919 4331 4419 4735 6366 6393 6844 7193 8165 8205 8544 8586 8617
12 19 742 930 3009 4330 6213 6224 7292 7430 7792 7922 8137
710 1439 1588 2434 3516 5239 6248 6827 8230 8448 8515 8581 8619
200 1075 1868 5581 7349 7642 7698 8037 8201 8210 8320 8391 8526
3 2501 4252 5256 5292 5567 6136 6321 6430 6486 7571 8521 8636
3062 4599 5885 6529 6616 7314 7319 7567 8024 8153 8302 8372 8598
105 381 1574 4351 5452 5603 5943 7467 7788 7933 8362 8513 8587
787 1857 3386 3659 6550 7131 7965 8015 8040 8312 8484 8525 8537
15 1118 4226 5197 5575 5761 6762 7038 8260 8338 8444 8512 8568
36 5216 5368 5616 6029 6591 8038 8067 8299 8351 8565 8578 8585
1 23 4300 4530 5426 5532 5817 6967 7124 7979 8022 8270 8437
629 2133 4828 5475 5875 5890 7194 8042 8345 8385 8518 8598 8612
11 1065 3782 4237 4993 7104 7863 7904 8104 8228 8321 8383 8565
2131 2274 3168 3215 3220 5597 6347 7812 8238 8354 8527 8557 8614
5600 6591 7491 7696
1766 8281 8626
1725 2280 5120
1650 3445 7652
4312 6911 8626
15 1013 5892
2263 2546 2979
1545 5873 7406
67 726 3697
2860 6443 8542
17 911 2820
1561 4580 6052
79 5269 7134
22 2410 2424
3501 5642 8627
808 6950 8571
4099 6389 7482
4023 5000 7833
5476 5765 7917
1008 3194 7207
20 495 5411
1703 8388 8635
6 4395 4921

FIG. 44

200 2053 8206
1089 5126 5562
10 4193 7720
1967 2151 4608
22 738 3513
3385 5066 8152
440 1118 8537
3429 6058 7716
5213 7519 8382
5564 8365 8620
43 3219 8603
4 5409 5815
5 6376 7654
4091 5724 5953
5348 6754 8613
1634 6398 6632
72 2058 8605
3497 5811 7579
3846 6743 8559
15 5933 8629
2133 5859 7068
4151 4617 8566
2960 8270 8410
2059 3617 8210
544 1441 6895
4043 7482 8592
294 2180 8524
3058 8227 8373
364 5756 8617
5383 8555 8619
1704 2480 4181
7338 7929 7990
2615 3905 7981
4298 4548 8296
8262 8319 8630
892 1893 8028
5694 7237 8595
1487 5012 5810
4335 8593 8624
3509 4531 5273
10 22 830
4161 5208 6280
275 7063 8634
4 2725 3113
2279 7403 8174
1637 3328 3930
2810 4939 5624
3 1234 7687
2799 7740 8616
22 7701 8636

FIG. 45

4302 7857 7993
7477 7794 8592
9 6111 8591
5 8606 8628
347 3497 4033
1747 2613 8636
1827 5600 7042
580 1822 6842
232 7134 7783
4629 5000 7231
951 2806 4947
571 3474 8577
2437 2496 7945
23 5873 8162
12 1168 7686
8315 8540 8596
1766 2506 4733
929 1516 3338
21 1216 6555
782 1452 8617
8 6083 6087
667 3240 4583
4030 4661 5790
559 7122 8553
3202 4388 4909
2533 3673 8594
1991 3954 6206
6835 7900 7980
189 5722 8573
2680 4928 4998
243 2579 7735
4281 8132 8566
7656 7671 8609
1116 2291 4166
21 388 8021
6 1123 8369
311 4918 8511
0 3248 6290
13 6762 7172
4209 5632 7563
49 127 8074
581 1735 4075
0 2235 5470
2178 5820 6179
16 3575 6054
1095 4564 6458
9 1581 5953
2537 6469 8552
14 3874 4844
0 3269 3551

FIG. 46

2114 7372 7926
1875 2388 4057
3232 4042 6663
9 401 583
13 4100 6584
2299 4190 4410
21 3670 4979

FIG. 47

N=64800, rate=6/15

1606 3402 4961 6751 7132 11516 12300 12482 12592 13342 13764 14123 21576 23946
24533 25376 25667 26836 31799 34173 35462 36153 36740 37085 37152 37468 37658
4621 5007 6910 8732 9757 11508 13099 15513 16335 18052 19512 21319 23663 25628
27208 31333 32219 33003 33239 33447 36200 36473 36938 37201 37283 37495 38642
16 1094 2020 3080 4194 5098 5631 6877 7889 8237 9804 10067 11017 11366 13136 1
3354 15379 18934 20199 24522 26172 28666 30386 32714 36390 37015 37162
700 897 1708 6017 6490 7372 7825 9546 10398 16605 18561 18745 21625 22137 2369
3 24340 24966 25015 26995 28586 28895 29687 33938 34520 34858 37056 38297
159 2010 2573 3617 4452 4958 5556 5832 6481 8227 9924 10836 14954 15594 16623
18065 19249 22394 22677 23408 23731 24076 24776 27007 28222 30343 38371
3118 3545 4768 4992 5227 6732 8170 9397 10522 11508 15536 20218 21921 28599 29
445 29758 29968 31014 32027 33685 34378 35867 36323 36728 36870 38335 38623
1264 4254 6936 9165 9486 9950 10861 11653 13697 13961 15164 15665 18444 19470
20313 21189 24371 26431 26999 28086 28251 29261 31981 34015 35850 36129 37186
111 1307 1628 2041 2524 5358 7988 8191 10322 11905 12919 14127 15515 15711 170
61 19024 21195 22902 23727 24401 24608 25111 25228 27338 35398 37794 38196
961 3035 7174 7948 13355 13607 14971 18189 18339 18665 18875 19142 20615 21136
21309 21758 23366 24745 25849 25982 27583 30006 31118 32106 36469 36583 37920
2990 3549 4273 4808 5707 6021 6509 7456 8240 10044 12262 12660 13085 14750 156
80 16049 21587 23997 25803 28343 28693 34393 34860 35490 36021 37737 38296
955 4323 5145 6885 8123 9730 11840 12216 19194 20313 23056 24248 24830 25268 2
6617 26801 28557 29753 30745 31450 31973 32839 33025 33296 35710 37366 37509
264 605 4181 4483 5156 7238 8863 10939 11251 12964 16254 17511 20017 22395 228
18 23261 23422 24064 26329 27723 28186 30434 31956 33971 34372 36764 38123
520 2562 2794 3528 3860 4402 5676 6963 8655 9018 9783 11933 16336 17193 17320
19035 20606 23579 23769 24123 24966 27866 32457 34011 34499 36620 37526
10106 10637 10906 34242
1856 15100 19378 21848
943 11191 27806 29411
4575 6359 13629 19383
4476 4953 18782 24313
5441 6381 21840 35943
9638 9763 12546 30120
9587 10626 11047 25700
4088 15298 28768 35047
2332 6363 8782 28863
4625 4933 28298 30289
3541 4918 18257 31746
1221 25233 26757 34892
8150 16677 27934 30021
8500 25016 33043 38070
7374 10207 16189 35811
611 18480 20064 38261
25416 27352 36089 38469
1667 17614 25839 32776
4118 12481 21912 37945
5573 13222 23619 31271
18271 26251 27182 30587
14690 26430 26799 34355

PROVIDED BY Samsung

FIG. 48

13688 16040 20716 34558
2740 14957 23436 32540
3491 14365 14681 36858
4796 6238 25203 27854
1731 12816 17344 26025
19182 21662 23742 27872
6502 13641 17509 34713
12246 12372 16746 27452
1589 21528 30621 34003
12328 20515 30651 31432
3415 22656 23427 36395
632 5209 25958 31085
619 3690 19648 37778
9528 13581 26965 36447
2147 26249 26968 28776
15698 18209 30683
1132 19888 34111
4608 25513 38874
475 1729 34100
7348 32277 38587
182 16473 33082
3865 9678 21265
4447 20151 27618
6335 14371 38711
704 9695 28858
4856 9757 30546
1993 19361 30732
756 28000 29138
3821 24076 31813
4611 12326 32291
7628 21515 34995
1246 13294 30068
6466 33233 35865
14484 23274 38150
21269 36411 37450
23129 26195 37653

PROVIDED BY Samsung

FIG. 49

N=64800, rate=8/15

2768 3039 4059 5856 6245 7013 8157 9341 9802 10470 11521 12083 16610 18361 20321 24601 27420 28206 29788

2739 8244 8891 9157 12624 12973 15534 16622 16919 18402 18780 19854 20220 20543 22306 25540 27478 27678 28053

1727 2268 6246 7815 9010 9556 10134 10472 11389 14599 15719 16204 17342 17666 18850 22058 25579 25860 29207

28 1346 3721 5565 7019 9240 12355 13109 14800 16040 16839 17369 17631 19357 19473 19891 20381 23911 29683

869 2450 4386 5316 6160 7107 10362 11132 11271 13149 16397 16532 17113 19894 22043 22784 27383 28615 28804

508 4292 5831 8559 10044 10412 11283 14810 15888 17243 17538 19903 20528 22090 22652 27235 27384 28208 28485

389 2248 5840 6043 7000 9054 11075 11760 12217 12565 13587 15403 19422 19528 21493 25142 27777 28566 28702

1015 2002 5764 6777 9346 9629 11039 11153 12690 13068 13990 16841 17702 20021 24106 26300 29332 30081 30196

1480 3084 3467 4401 4798 5187 7851 11368 12323 14325 14546 16360 17158 18010 21333 25612 26556 26906 27005

6925 8876 12392 14529 15253 15437 19226 19950 20321 23021 23651 24393 24653 26668 27205 28269 28529 29041 29292

2547 3404 3538 4666 5126 5468 7695 8799 14732 15072 15881 17410 18971 19609 19717 22150 24941 27908 29018

888 1581 2311 5511 7218 9107 10454 12252 13662 15714 15894 17025 18671 24304 25316 25556 28489 28977 29212

1047 1494 1718 4645 5030 6811 7868 8146 10611 15767 17682 18391 22614 23021 23763 25478 26491 29088 29757

59 1781 1900 3814 4121 8044 8906 9175 11156 14841 15789 16033 16755 17292 18550 19310 22505 29567 29850

1952 3057 4399 9476 10171 10769 11335 11569 15002 19501 20621 22642 23452 24360 25109 25290 25828 28505 29122

2895 3070 3437 4764 4905 6670 9244 11845 13352 13573 13975 14600 15871 17996 19672 20079 20579 25327 27958

612 1528 2004 4244 4599 4926 5843 7684 10122 10443 12267 14368 18413 19058 22985 24257 26202 26596 27899

1361 2195 4146 6708 7158 7538 9138 9998 14862 15359 16076 18925 21401 21573 22503 24146 24247 27778 29312

5229 6235 7134 7655 9139 13527 15408 16058 16705 18320 19909 20901 22238 22437 23654 25131 27550 28247 29903

697 2035 4887 5275 6909 9166 11805 15338 16381 18403 20425 20688 21547 24590 25171 26726 28848 29224 29412

5379 17329 22659 23062

11814 14759 22329 22936

2423 2811 10296 12727

8460 15260 16769 17290

14191 14608 29536 30187

7103 10069 20111 22850

4285 15413 26448 29069

548 2137 9189 10928

4581 7077 23382 23949

PROVIDED BY Samsung

FIG. 50

3942 17248 19486 27922
8668 10230 16922 26678
6158 9980 13788 28198
12422 16076 24206 29887
8778 10649 18747 22111
21029 22677 27150 28980
7918 15423 27672 27803
5927 18086 23525
3397 15058 30224
24016 25880 26268
1096 4775 7912
3259 17301 20802
129 8396 15132
17825 28119 28676
2343 8382 28840
3907 18374 20939
1132 1290 8786
1481 4710 28846
2185 3705 26834
5496 15681 21854
12697 13407 22178
12788 21227 22894
629 2854 6232
2289 18227 27458
7593 21935 23001
3836 7081 12282
7925 18440 23135
497 6342 9717
11199 22046 30067
12572 28045 28990
1240 2023 10933
19566 20629 25186
6442 13303 28813
4765 10572 16180
552 19301 24286
6782 18480 21383
11267 12288 15758
771 5652 15531
16131 20047 25649
13227 23035 24450
4839 13467 27488
2852 4677 22993
2504 28116 29524
12518 17374 24267
1222 11859 27922
9660 17286 18261
232 11296 29978
9750 11165 16295
4894 9505 23622
10861 11980 14110

PROVIDED BY Samsung

FIG. 51

2128 15883 22836
6274 17243 21989
10866 13202 22517
11159 16111 21608
3719 18787 22100
1756 2020 23901
20913 29473 30103
2729 15091 26976
4410 8217 12963
5395 24564 28235
3859 17909 23051
5733 26005 29797
1935 3492 29773
11903 21380 29914
6091 10469 29997
2895 8930 15594
1827 10028 20070

PROVIDED BY Samsung

FIG. 52

N=64800, rate=12/15

584 1472 1621 1867 3338 3568 3723 4185 5126 5889 7737 8632 8940 9725
221 445 590 3779 3835 6939 7743 8280 8448 8491 9367 10042 11242 12917
4662 4837 4900 5029 6449 6687 6751 8684 9936 11681 11811 11886 12089 12909
2418 3018 3647 4210 4473 7447 7502 9490 10067 11092 11139 11256 12201 12383
2591 2947 3349 3406 4417 4519 5176 6672 8498 8863 9201 11294 11376 12184
27 101 197 290 871 1727 3911 5411 6676 8701 9350 10310 10798 12439
1765 1897 2923 3584 3901 4048 6963 7054 7132 9165 10184 10824 11278 12669
2183 3740 4808 5217 5660 6375 6787 8219 8466 9037 10353 10583 11118 12762
73 1594 2146 2715 3501 3572 3639 3725 6959 7187 8406 10120 10507 10691
240 732 1215 2185 2788 2830 3499 3881 4197 4991 6425 7061 9756 10491
831 1568 1828 3424 4319 4516 4639 6018 9702 10203 10417 11240 11518 12458
2024 2970 3048 3638 3676 4152 5284 5779 5926 9426 9945 10873 11787 11837
1049 1218 1651 2328 3493 4363 5750 6483 7613 8782 9738 9803 11744 11937
1193 2060 2289 2964 3478 4592 4756 6709 7162 8231 8326 11140 11908 12243
978 2120 2439 3338 3850 4589 6567 8745 9656 9708 10161 10542 10711 12639
2403 2938 3117 3247 3711 5593 5844 5932 7801 10152 10226 11498 12162 12941
1781 2229 2276 2533 3582 3951 5279 5774 7930 9824 10920 11038 12340 12440
289 384 1980 2230 3464 3873 5958 8656 8942 9006 10175 11425 11745 12530
155 354 1090 1330 2002 2236 3559 3705 4922 5958 6576 8564 9972 12760
303 876 2059 2142 5244 5330 6644 7576 8614 9598 10410 10718 11033 12957
3449 3617 4408 4602 4727 6182 8835 8928 9372 9644 10237 10747 11655 12747
811 2565 2820 8677 8974 9632 11069 11548 11839 12107 12411 12695 12812 12890
972 4123 4943 6385 6449 7339 7477 8379 9177 9359 10074 11709 12552 12831
842 973 1541 2262 2905 5276 6758 7099 7894 8128 8325 8663 8875 10050
474 791 968 3902 4924 4965 5085 5908 6109 6329 7931 9038 9401 10568
1397 4461 4658 5911 6037 7127 7318 8678 8924 9000 9473 9602 10446 12692
1334 7571 12881
1393 1447 7972
633 1257 10597
4843 5102 11056
3294 8015 10513
1108 10374 10546
5353 7824 10111
3398 7674 8569
7719 9478 10503
2997 9418 9581
5777 6519 11229
1966 5214 9899
6 4088 5827
836 9248 9612
483 7229 7548
7865 8289 9804
2915 11098 11900
6180 7096 9481
1431 6786 8924
748 6757 8625
3312 4475 7204
1852 8958 11020
1915 2903 4006

PROVIDED BY Samsung

FIG. 53

6776 10886 12531
2594 9998 12742
159 2002 12079
853 3281 3762
5201 5798 6413
3882 6062 12047
4133 6775 9657
228 6874 11183
7433 10728 10864
7735 8073 12734
2844 4621 11779
3909 7103 12804
6002 9704 11060
5864 6856 7681
3652 5869 7605
2546 2657 4461
2423 4203 9111
244 1855 4691
1106 2178 6371
391 1617 10126
250 9259 10603
3435 4614 6924
1742 8045 9529
7667 8875 11451
4023 6108 6911
8621 10184 11650
6726 10861 12348
3228 6302 7388
1 1137 5358
381 2424 8537
3256 7508 10044
1980 2219 4569
2468 5699 10319
2803 3314 12808
8578 9642 11533
829 4585 7923
59 329 5575
1067 5709 6867
1175 4744 12219
109 2518 6756
2105 10626 11153
5192 10696 10749
6260 7641 8233
2998 3094 11214
3398 6466 11494
6574 10448 12160
2734 10755 12780
1028 7958 10825
8545 8602 10793
392 3398 11417

PROVIDED BY Samsung

FIG. 54

6639 9291 12571
1067 7919 8934
1064 2848 12753
6076 8656 12690
5504 6193 10171
1951 7156 7356
4389 4780 7889
526 4804 9141
1238 3648 10464
2587 5624 12557
5560 5903 11963
1134 2570 3297
10041 11583 12157
1263 9585 12912
3744 7898 10646
45 9074 10315
1051 6188 10038
2242 8394 12712
3598 9025 12651
2295 3540 5610
1914 4378 12423
1766 3635 12759
5177 9586 11143
943 3590 11649
4864 6905 10454
5852 6042 10421
6095 8285 12349
2070 7171 8563
718 12234 12716
512 10667 11353
3629 6485 7040
2880 8865 11466
4490 10220 11796
5440 8819 9103
5262 7543 12411
516 7779 10940
2515 5843 9202
4684 5994 10586
573 2270 3324
7870 8317 10322
6856 7638 12909
1583 7669 10781
8141 9085 12555
3903 5485 9992
4467 11998 12904

PROVIDED BY Samsung

FIG. 55

N=16200, rate=6/15

27 430 519 828 1897 1943 2513 2600 2640 3310 3415 4266 5044 5100 5328 5483 592
8 6204 6392 6416 6602 7019 7415 7623 8112 8485 8724 8994 9445 9667
27 174 188 631 1172 1427 1779 2217 2270 2601 2813 3196 3582 3895 3908 3948 446
3 4955 5120 5809 5988 6478 6604 7096 7673 7735 7795 8925 9613 9670
27 370 617 852 910 1030 1326 1521 1606 2118 2248 2909 3214 3413 3623 3742 3752
4317 4694 5300 5687 6039 6100 6232 6491 6621 6860 7304 8542 8634
990 1753 7635 8540
933 1415 5666 8745
27 6567 8707 9216
2341 8692 9580 9615
260 1092 5839 6080
352 3750 4847 7726
4610 6580 9506 9597
2512 2974 4814 9348
1461 4021 5060 7009
1796 2883 5553 8306
1249 5422 7057
3965 6968 9422
1498 2931 5092
27 1090 6215
26 4232 6354

PROVIDED BY LGE

FIG. 56

N=16200, rate=7/15

553 742 901 1327 1544 2179 2519 3131 3280 3603 3789 3792 4253 5340 5934 5962 6
004 6698 7793 8001 8058 8126 8276 8559
503 590 598 1185 1266 1336 1806 2473 3021 3356 3490 3680 3936 4501 4659 5891 6
132 6340 6602 7447 8007 8045 8059 8249
795 831 947 1330 1502 2041 2328 2513 2814 2829 4048 4802 6044 6109 6461 6777 6
800 7099 7126 8095 8428 8519 8556 8610
601 787 899 1757 2259 2518 2783 2816 2823 2949 3396 4330 4494 4684 4700 4837 4
881 4975 5130 5464 6554 6912 7094 8297
4229 5628 7917 7992
1506 3374 4174 5547
4275 5650 8208 8533
1504 1747 3433 6345
3659 6955 7575 7852
607 3002 4913 6453
3533 6860 7895 8048
4094 6366 8314
2206 4513 5411
32 3882 5149
389 3121 4626
1308 4419 6520
2092 2373 6849
1815 3679 7152
3582 3979 6948
1049 2135 3754
2276 4442 6591

PROVIDED BY LGE

FIG. 57

N=16200, rate=9/15

212 255 540 967 1033 1517 1538 3124 3408 3800 4373 4864 4905 5163 5177 6186
275 660 1351 2211 2876 3063 3433 4088 4273 4544 4618 4632 5548 6101 6111 6136
279 335 494 865 1662 1681 3414 3775 4252 4595 5272 5471 5796 5907 5986 6008
345 352 3094 3188 4297 4338 4490 4865 5303 6477
222 681 1218 3169 3850 4878 4954 5666 6001 6237
172 512 1536 1559 2179 2227 3334 4049 6464
716 934 1694 2890 3276 3608 4332 4468 5945
1133 1593 1825 2571 3017 4251 5221 5639 5845
1076 1222 6465
159 5064 6078
374 4073 5357
2833 5526 5845
1594 3639 5419
1028 1392 4239
115 622 2175
300 1748 6245
2724 3276 5349
1433 6117 6448
485 663 4955
711 1132 4315
177 3266 4339
1171 4841 4982
33 1584 3692
2820 3485 4249
1716 2428 3125
250 2275 6338
108 1719 4961

PROVIDED BY LGE

FIG. 58

N=16200, rate=11/15

49 719 784 794 968 2382 2685 2873 2974 2995 3540 4179
272 281 374 1279 2034 2067 2112 3429 3613 3815 3838 4216
206 714 820 1800 1925 2147 2168 2769 2806 3253 3415 4311
62 159 166 605 1496 1711 2652 3016 3347 3517 3654 4113
363 733 1118 2062 2613 2736 3143 3427 3664 4100 4157 4314
57 142 436 983 1364 2105 2113 3074 3639 3835 4164 4242
870 921 950 1212 1861 2128 2707 2993 3730 3968 3983 4227
185 2684 3263
2035 2123 2913
883 2221 3521
1344 1773 4132
438 3178 3650
543 756 1639
1057 2337 2898
171 3298 3929
1626 2960 3503
484 3050 3323
2283 2336 4189
2732 4132 4318
225 2335 3497
600 2246 2658
1240 2790 3020
301 1097 3539
1222 1267 2594
1364 2004 3603
1142 1185 2147
564 1505 2086
697 991 2908
1467 2073 3462
2574 2818 3637
748 2577 2772
1151 1419 4129
164 1238 3401

PROVIDED BY LGE

FIG. 59

N=16200, rate=13/15

71 334 645 779 786 1124 1131 1267 1379 1554 1766 1798 1939
6 183 364 506 512 922 972 981 1039 1121 1537 1840 2111
6 71 153 204 253 268 781 799 873 1118 1194 1661 2036
6 247 353 581 921 940 1108 1146 1208 1268 1511 1527 1671
6 37 466 548 747 1142 1203 1271 1512 1516 1837 1904 2125
6 171 863 953 1025 1244 1378 1396 1723 1783 1816 1914 2121
1268 1360 1647 1769
6 458 1231 1414
183 535 1244 1277
107 360 498 1456
6 2007 2059 2120
1480 1523 1670 1927
139 573 711 1790
6 1541 1889 2023
6 374 957 1174
287 423 872 1285
6 1809 1918
65 818 1396
590 766 2107
192 814 1843
775 1163 1256
42 735 1415
334 1008 2055
109 596 1785
406 534 1852
684 719 1543
401 465 1040
112 392 621
82 897 1950
887 1962 2125
793 1088 2159
723 919 1139
610 839 1302
218 1080 1816
627 1646 1749
496 1165 1741
916 1055 1662
182 722 945
5 595 1674

PROVIDED BY LGE

FIG. 60

N=64800, rate=10/15

316 1271 3692 9495 12147 12849 14928 16671 16938 17864 19108 20502 21097 21115
2341 2559 2643 2816 2865 5137 5331 7000 7523 8023 10439 10797 13208 15041
5556 6858 7677 10162 10207 11349 12321 12398 14787 15743 15859 15952 19313 208
79
349 573 910 2702 3654 6214 9246 9353 10638 11772 14447 14953 16620 19888
204 1390 2887 3835 6230 6533 7443 7876 9299 10291 10896 13960 18287 20086
541 2429 2838 7144 8523 8637 10490 10585 11074 12074 15762 16812 17900 18548
733 1659 3838 5323 5805 7882 9429 10682 13697 16909 18846 19587 19592 20904
1134 2136 4631 4653 4718 5197 10410 11666 14996 15305 16048 17417 18960 20303
734 1001 1283 4959 10016 10176 10973 11578 12051 15550 15915 19022 19430 20121
745 4057 5855 9885 10594 10989 13156 13219 13351 13631 13685 14577 17713 20386
968 1446 2130 2502 3092 3787 5323 8104 8418 9998 11681 13972 17747 17929
3020 3857 5275 5786 6319 8608 11943 14062 17144 17752 18001 18453 19311 21414
709 747 1038 2181 5320 8292 10584 10859 13964 15009 15277 16953 20675 21509
1663 3247 5003 5760 7186 7360 10346 14211 14717 14792 15155 16128 17355 17970
516 578 1914 6147 9419 11148 11434 13289 13325 13332 19106 19257 20962 21556
5009 5632 6531 9430 9886 10621 11765 13969 16178 16413 18110 18249 20616 20759
457 2686 3318 4608 5620 5858 6480 7430 9602 12691 14664 18777 20152 20848
33 2877 5334 6851 7907 8654 10688 15401 16123 17942 17969 18747 18931 20224
87 897 7636 8663 11425 12288 12672 14199 16435 17615 17950 18953 19667 20281
1042 1832 2545 2719 2947 3672 3700 6249 6398 6833 11114 14283 17694 20477
326 488 2662 2880 3009 5357 6587 8882 11604 14374 18781 19051 19057 20508
854 1294 2436 2852 4903 6466 7761 9072 9564 10321 13638 15658 16946 19119
194 899 1711 2408 2786 5391 7108 8079 8716 11453 17303 19484 20989 21389
1631 3121 3994 5005 7810 8850 10315 10589 13407 17162 18624 18758 19311 20301
736 2424 4792 5600 6370 10061 16053 16775 18600
1254 8163 8876 9157 12141 14587 16545 17175 18191
388 6641 8974 10607 10716 14477 16825 17191 18400
5578 6082 6824 7360 7745 8655 11402 11665 12428
3603 8729 13463 14698 15210 19112 19550 20727 21052
48 1732 3805 5158 15442 16909 19854 21071 21579
11707 14014 21531
1542 4133 4925
10083 13505 21198
14300 15765 16752
778 1237 11215
1325 3199 14534
2007 14510 20599
1996 5881 16429
5111 15018 15980
4989 10681 12810
3763 10715 16515
2259 10080 15642
9032 11319 21305
3915 15213 20884
11150 15022 20201
1147 6749 19625
12139 12939 18870
3840 4634 10244

PROVIDED BY LGE

FIG. 61

1018 10231 17720
2708 13056 13393
5781 11588 18888
1345 2036 5252
5908 8143 15141
1804 13693 18640
10433 13965 16950
9568 10122 15945
547 6722 14015
321 12844 14095
2632 10513 14936
6369 11995 20321
9920 19136 21529
1990 2726 10183
5763 12118 15467
503 10006 19564
9839 11942 19472
11205 13552 15389
8841 13797 19697
124 6053 18224
6477 14406 21146
1224 8027 16011
3046 4422 17717
739 12308 17760
4014 4130 7835
2266 5652 11981
2711 7970 18317
2196 15229 17217
8636 13302 16764
5612 15010 16657
615 1249 4639
3821 12073 18506
1066 16522 21536
11307 18363 19740
3240 8560 10391
3124 11424 20779
1604 8861 17394
2083 7400 8093
3218 7454 9155
9855 15998 20533
316 2850 20652
5583 9768 10333
7147 7713 18339
12607 17428 21418
14216 16954 18164
8477 15970 18488
1632 8032 9751
4573 9080 13507
11747 12441 13876
1183 15605 16675

PROVIDED BY LGE

FIG. 62

4408 10264 17109
5495 7882 12150
1010 3763 5065
9828 18054 21599
6342 7353 15358
6362 9462 19999
7184 13693 17622
4343 4654 10995
7099 8466 18520
11505 14395 15138
6779 16691 18726
7146 12644 20196
5865 16728 19634
4657 8714 21246
4580 5279 18750
3767 6620 18905
9209 13093 17575
12486 15875 19791
8046 14636 17491
2120 4643 13206
6186 9675 12601
784 5770 21585

PROVIDED BY LGE

FIG. 63

N=64800, rate=9/15

218 592 1116 2229 2989 3217 3922 4338 5063 7196 8516 9168 10774 12013 12355 12485 13238 13315 13365 15102 16325 16379 17222 17866 19091 21096 21677 22183 22884 23023 23059 23295 23694 24888 25755

142 556 754 1359 1813 2861 3733 4015 4103 4137 4590 5431 7423 8429 9924 10043 11764 12672 13476 14250 15182 15575 15835 16093 16893 17014 17993 18328 19778 20782 22151 22347 23841 25434 25647

8 1287 1813 2927 4094 4691 5599 7087 7503 8777 9100 11299 11310 12283 12638 12774 12983 13161 13750 13899 14093 14581 15066 18310 19537 21141 21530 21920 22726 23080 23250 23588 23749 25129 25493

170 2231 2273 4646 5468 5912 7624 7804 8019 8715 9157 10173 10978 13144 14209 14508 15118 15510 16699 17285 18189 18842 19164 19242 19568 20657 20745 22599 22754 24105 24136 24644 25091 25259 25476

611 3593 5689 5980 6779 7830 8200 8420 8701 10161 10601 10863 11251 11540 12306 12364 12396 13247 13256 13454 13683 13810 13912 14254 14665 15530 16749 18022 21173 21359 21564 21860 23562 23936 25873

225 490 1197 1357 2322 3436 3759 5720 5886 10068 10994 12476 13186 13403 13774 14376 14505 14946 15555 16515 17068 17581 18317 19533 19993 20376 20597 21656 23103 23230 23860 24883 25100 25576 25835

910 1479 3144 3600 4255 5851 6277 6587 7337 8562 9592 11428 11534 12127 12452 13565 14336 15311 15470 16915 17520 18194 18324 18385 18575 19627 20126 20219 21108 21294 22218 22466 22541 23614 24218

120 6693 11582 11756 14656 16088 24473 24811

990 3571 8517 10259 14187 15732 17864 23697

2366 5536 8236 14281 16178 19247 25431 25641

9056 10221 16011 17287 22095 22694 23634 24541

1138 3241 4444 11816 14651 17585 20317 24036

3166 5421 7828 11855 13148 16492 22830 25181

3644 5858 7555 12551 14018 15716 20181 20877

3405 7546 10508 12355 12455 16386 22014 22846

5305 12878 13734 15949 16747 17458 18068 23552

2717 4365 5192 9626 11487 17811 24163 25201

4705 5787 12649 14298 15570 19876 23193 24688

3394 4960 9629 11445 19031 23128 23563 25774

1648 4768 8372 11388 11448 13373 14773 15814

4043 10049 13225 14765 18206 19663 20316 25534

8820 15709 17949 18383 18624 19746 23307 25346

221 10075 12281 13163 16430 18834 20637 21646

264 296 2837 4856 9223 10324 16336 18557

4532 7935 12782 16508 17549 21310 23929 24846

5143 5666 6753 8248 12394 13840 14926 15611

4289 9811 10826 11025 11425 15567 20767 25246

1826 4386 6372 6698 7467 20479 23360 24751

740 1873 3727 8628 11803 21326 24482 25134

315 664 2026 10700 12624 21194 24678 24802

8431 9604 11559 12120 19557 21047 21161 21584

6275 8787 9830 10580 12795 15287 20794 21063

3780 7735 9717 10410 14334 19217 24239 24857

4214 9796 10451 17817 18072 18697 19265 24591

2497 5485 6337 10065 13070 14240 20115 23668

PROVIDED BY NERC

FIG. 64

750 14148 17061 18247 22764 23024 24172 25347
8665 9325 11559 13331 20047 20633 22239 24771
2380 6028 6722 7577 10971 12640 25689 25899
726 2719 3466 4360 4490 4570 14908 21224
9935 11724 17848 20984
3206 5876 21624 22202
2016 6467 18748 21565
8700 14455 25199
3226 4420 10829
14098 15408 17937
974 3658 7162
112 3354 12949
2534 5898 8903
1419 8178 8313
11829 19776 25767
15438 17714 19803
220 2577 9487
158 5317 9608
3503 11020 23289
11919 14584 19928
1594 3696 16179
10671 16931 17471
1753 4357 7056
3522 12686 17448
6249 7005 16719
1635 2568 13330
6630 9681 24490
5839 9707 15176
5793 21197 22913
8105 19194 24006
2614 11400 20796
11519 13935 20122
4911 17744 20743
5136 6333 25790
7467 12085 25881
2460 10009 24753
7494 7741 11636
8801 12817 24194
14311 15139 16691
826 3907 19556
5009 10578 17371
953 6240 6283
7644 13421 18814
11989 12118 24827
10905 19182 21977
9089 20001 23153
2195 8597 23530
11195 15654 25877
5761 12774 20592
14546 19182 22537

PROVIDED BY NERC

FIG. 65

6708 16466 21216
5969 14367 21850
4267 10268 16960
7643 15766 25598
7842 17639 23802
10516 11135 13663
483 5940 7305
9003 11614 22948
21555 24593 25102
3680 7927 19104
10255 13278 20938
16574 18589 19391
7647 16916 18999
740 6115 18541
4233 10673 17021
3520 10970 11696
5172 19013 24821
4867 19496 23534
16451 19269 20178
9275 12726 13369
6508 10234 10389
4614 6489 11229
1861 12769 15928

PROVIDED BY NERC

FIG. 66

N=16200, rate=5/15
69 244 706 5145 5994 6066 6763 6815 8509
257 541 618 3933 6188 7048 7484 8424 9104
69 500 536 1494 1669 7075 7553 8202 10305
11 189 340 2103 3199 6775 7471 7918 10530
333 400 434 1806 3264 5693 8534 9274 10344
111 129 260 3562 3676 3680 3809 5169 7308 8280
100 303 342 3133 3952 4226 4713 5053 5717 9931
83 87 374 828 2460 4943 6311 8657 9272 9571
114 166 325 2680 4698 7703 7886 8791 9978 10684
281 542 549 1671 3178 3955 7153 7432 9052 10219
202 271 608 3860 4173 4203 5169 6871 8113 9757
16 359 419 3333 4198 4737 6170 7987 9573 10095
235 244 584 4640 5007 5563 6029 6816 7678 9968
123 449 646 2460 3845 4161 6610 7245 7686 8651
136 231 468 835 2622 3292 5158 5294 6584 9926
3085 4683 8191 9027 9922 9928 10550
2462 3185 3976 4091 8089 8772 9342

PROVIDED BY CRC/ETRI

FIG. 67

N=64800, rate=5/15

221 1011 1218 4299 7143 8728 11072 15533 17356 33909 36833
360 1210 1375 2313 3493 16822 21373 23588 23656 26267 34098
544 1347 1433 2457 9186 10945 13583 14858 19195 34606 37441
37 596 715 4134 8091 12106 24307 24658 34108 40591 42883
235 398 1204 2075 6742 11670 13512 23231 24784 27915 34752
204 873 890 13550 16570 19774 34012 35249 37655 39885 42890
221 371 514 11984 14972 15690 28827 29069 30531 31018 43121
280 549 1435 1889 3310 10234 11575 15243 20748 30469 36005
223 666 1248 13304 14433 14732 18943 21248 23127 38529 39272
370 819 1065 9461 10319 25294 31958 33542 37458 39681 40039
585 870 1028 5087 5216 12228 16216 16381 16937 27132 27893
164 167 1210 7386 11151 20413 22713 23134 24188 36771 38992
298 511 809 4620 7347 8873 19602 24162 29198 34304 41145
105 830 1212 2415 14759 15440 16361 16748 22123 32684 42575
659 665 668 6458 22130 25972 30697 31074 32048 36078 37129
91 808 953 8015 8988 13492 13987 15979 28355 34509 39698
594 983 1265 3028 4029 9366 11069 11512 27066 40939 41639
506 740 1321 1484 10747 16376 17384 20285 31502 38925 42606
338 356 975 2022 3578 18689 18772 19826 22914 24733 27431
709 1264 1366 4617 8893 25226 27800 29080 30277 37781 39644
840 1179 1338 2973 3541 7043 12712 15005 17149 19910 36795
1009 1267 1380 4919 12679 22889 29638 30987 34637 36232 37284
466 913 1247 1646 3049 5924 9014 20539 34546 35029 36540
374 697 984 1654 5870 10883 11684 20294 28888 31612 34031
117 240 635 5093 8673 11323 12456 14145 21397 39619 42559
122 1265 1427 13528 14282 15241 16852 17227 34723 36836 39791
595 1180 1310 6952 17916 24725 24971 27243 29555 32138 35987
140 470 1017 13222 13253 18462 20806 21117 28673 31598 37235
7 710 1072 8014 10804 13303 14292 16690 26676 36443 41966
48 189 759 12438 14523 16388 23178 27315 28656 29111 29694
285 387 410 4294 4467 5949 25386 27898 34880 41169 42614
474 545 1320 10506 13186 18126 27110 31498 35353 36193 37322
1075 1130 1424 11390 13312 14161 16927 25071 25844 34287 38151
161 396 427 5944 17281 22201 25218 30143 35566 38261 42513
233 247 694 1446 3180 3507 9069 20764 21940 33422 39358
271 508 1013 6271 21760 21858 24887 29808 31099 35475 39924
8 674 1329 3135 5110 14460 28108 28388 31043 31137 31863
1035 1222 1409 8287 16083 24450 24888 29356 30329 37834 39684
391 1090 1128 1866 4095 10643 13121 14499 20056 22195 30593
55 161 1402 6289 6837 8791 17937 21425 26602 30461 37241
110 377 1228 6875 13253 17032 19008 23274 32285 33452 41630
360 638 1355 5933 12593 13533 23377 23881 24586 26040 41663
535 1240 1333 3354 10860 16032 32573 34908 34957 39255 40759
526 936 1321 7992 10260 18527 28248 29356 32636 34666 35552
336 785 875 7530 13062 13075 18925 27963 28703 33688 36502
36 591 1062 1518 3821 7048 11197 17781 19408 22731 24783
214 1145 1223 1546 9475 11170 16061 21273 38688 40051 42479
1136 1226 1423 20227 22573 24951 26462 29586 34915 42441 43048
26 276 1425 6048 7224 7917 8747 27559 28515 35002 37649

PROVIDED BY CRC/ETRI

FIG. 68

127 294 437 4029 8585 9647 11904 24115 28514 36893 39722
748 1093 1403 9536 19305 20468 31049 38667 40502 40720 41949
96 638 743 9806 12101 17751 22732 24937 32007 32594 38504
649 904 1079 2770 3337 9158 20125 24619 32921 33698 35173
401 518 984 7372 12438 12582 18704 35874 39420 39503 39790
10 451 1077 8078 16320 17409 25807 28814 30613 41261 42955
405 592 1178 15936 18418 19585 21966 24219 30637 34536 37838
50 584 851 9720 11919 22544 22545 25851 35567 41587 41876
911 1113 1176 1806 10058 10809 14220 19044 20748 29424 36671
441 550 1135 1956 11254 18699 30249 33099 34587 35243 39952
510 1016 1281 8621 13467 13780 15170 16289 20925 26426 34479
4969 5223 17117 21950 22144 24043 27151 39809
11452 13622 18918 19670 23995 32647 37200 37399
6351 6426 13185 13973 16699 22524 31070 31916
4098 10617 14854 18004 28580 36158 37500 38552

PROVIDED BY CRC/ETRI

FIG. 69

N=64800, rate=6/15

71 276 856 6867 12964 17373 18159 26420 28460 28477
257 322 672 2533 5316 6578 9037 10231 13845 36497
233 765 904 1366 3875 13145 15409 18620 23910 30825
100 224 405 12776 13868 14787 16781 23886 29099 31419
23 496 891 2512 12589 14074 19392 20339 27658 28684
473 712 759 1283 4374 9898 12551 13814 24242 32728
511 567 815 11823 17106 17900 19338 22315 24396 26448
45 733 836 1923 3727 17468 25746 33806 35995 36657
17 487 675 2670 3922 5145 18009 23993 31073 36624
72 751 773 1937 17324 28512 30666 30934 31016 31849
257 343 594 14041 19141 24914 26864 28809 32055 34753
99 241 491 2650 9670 17433 17785 18988 22235 30742
198 299 655 6737 8304 10917 16092 19387 20755 37690
351 916 926 18151 21708 23216 30321 33578 34052 37949
54 332 373 2010 3332 5623 16301 34337 36451 37861
139 257 1068 11090 20289 29694 29732 32640 35133 36404
457 885 968 2115 4956 5422 5949 17570 26673 32387
137 570 619 5006 6099 7979 14429 16650 25443 32789
46 282 287 10258 18383 20258 27186 27494 28429 38266
445 486 1058 1868 9976 11294 20364 23695 30826 35330
134 900 931 12518 14544 17715 19623 21111 33868 34570
62 66 586 8020 20270 23831 31041 31965 32224 35189
174 290 784 6740 14673 17642 26286 27382 33447 34879
332 675 1033 1838 12004 15439 20765 31721 34225 38863
527 558 832 3867 6318 8317 10883 13466 18427 25377
431 780 1021 1112 2873 7675 13059 17793 20570 20771
339 536 1015 5725 6916 10846 14487 21156 28123 32614
456 830 1078 7511 11801 12362 12705 17401 28867 34032
222 538 989 5593 6022 8302 14008 23445 25127 29022
37 393 788 3025 7768 11367 22276 22761 28232 30394
234 257 1045 1307 2908 6337 26530 28142 34129 35997
35 46 978 9912 9978 12567 17843 24194 34887 35206
39 959 967 5027 10847 14657 18859 28075 28214 36325
275 477 823 11376 18073 28997 30521 31661 31941 32116
185 580 966 11733 12013 12760 13358 19372 32534 35504
760 891 1046 11150 20358 21638 29930 31014 33050 34840
360 389 1057 5316 5938 14186 16404 32445 34021 35722
306 344 679 5224 6674 10305 18753 25583 30585 36943
103 171 1016 8780 11741 12144 19470 20955 22495 27377
818 832 894 3883 14279 14497 22505 28129 28719 31246
215 411 760 5886 25612 28556 32213 32704 35901 36130
229 489 1067 2385 8587 20565 23431 28102 30147 32859
288 664 980 8138 8531 21676 23787 26708 28798 34490
89 552 847 6656 9889 23949 26226 27080 31236 35823
66 142 443 3339 3813 7977 14944 15464 19186 25983
605 876 931 16682 17669 25800 28220 33432 35738 37382
346 423 806 5669 7668 8789 9928 19724 24039 27893
48 460 1055 3512 7389 7549 20216 22180 28221 35437
187 636 824 1678 4508 13588 19683 21750 30311 33480

PROVIDED BY CRC/ETRI

FIG. 70

25 768 935 2856 8187 9052 21850 29941 33217 34293
349 624 716 2698 6395 6435 8974 10649 15932 17378
336 410 871 3582 9830 10885 13892 18027 19203 36659
176 849 1078 17302 19379 27964 28164 28720 32557 35495
234 890 1075 9431 9605 9700 10113 11332 12679 24268
516 638 733 8851 19871 22740 25791 30152 32659 35568
253 830 879 2086 16885 22952 23765 25389 34656 37293
94 954 998 2003 3369 6870 7321 29856 31373 34888
79 350 933 4853 6252 11932 12058 21631 24552 24876
246 647 778 4036 10391 10656 13194 32335 32360 34179
149 339 436 6971 8356 8715 11577 22376 28684 31249
36 149 220 6936 18408 19192 19288 23063 28411 35312
273 683 1042 6327 10011 18041 21704 29097 30791 31425
46 138 722 2701 10984 13002 19930 26625 28458 28965
12 1009 1040 1990 2930 5302 21215 22625 23011 29288
125 241 819 2245 3199 8415 21133 26786 27226 38838
45 476 1075 7393 15141 20414 31244 33336 35004 38391
432 578 667 1343 10466 11314 11507 23314 27720 34465
248 291 556 1971 3989 8992 18000 19998 23932 34652
68 694 837 2246 7472 7873 11078 12868 20937 35591
272 924 949 2030 4360 6203 9737 19705 19902 38039
21 314 979 2311 2632 4109 19527 21920 31413 34277
197 253 804 1249 4315 10021 14358 20559 27099 30525
9802 16164 17499 22378 22403 22704 26742 29908
9064 10904 12305 14057 16156 26000 32613 34536
5178 6319 10239 19343 25628 30577 31110 32291

PROVIDED BY CRC/ETRI

FIG. 71

N=64800, rate=7/15

460 792 1007 4580 11452 13130 26882 27020 32439
35 472 1056 7154 12700 13326 13414 16828 19102
45 440 772 4854 7863 26945 27684 28651 31875
744 812 892 1509 9018 12925 14140 21357 25106
271 474 761 4268 6706 9609 19701 19707 24870
223 477 662 1987 9247 18376 22148 24948 27694
44 379 786 8823 12322 14666 16377 28688 29924
104 219 562 5832 19665 20615 21043 22759 32180
41 43 870 7963 13718 14136 17216 30470 33428
592 744 887 4513 6192 18116 19482 25032 34095
456 821 1078 7162 7443 8774 15567 17243 33085
151 666 977 6946 10358 11172 18129 19777 32234
236 793 870 2001 6805 9047 13877 30131 34252
297 698 772 3449 4204 11608 22950 26071 27512
202 428 474 3205 3726 6223 7708 20214 25283
139 719 915 1447 2938 11864 15932 21748 28598
135 853 902 3239 18590 20579 30578 33374 34045
9 13 971 11834 13642 17628 21669 24741 30965
344 531 730 1880 16895 17587 21901 28620 31957
7 192 380 3168 3729 5518 6827 20372 34168
28 521 681 4313 7465 14209 21501 23364 25980
269 393 898 3561 11066 11985 17311 26127 30309
42 82 707 4880 4890 9818 23340 25959 31695
189 262 707 6573 14082 22259 24230 24390 24664
383 568 573 5498 13449 13990 16904 22629 34203
585 596 820 2440 2488 21956 28261 28703 29591
755 763 795 5636 16433 21714 23452 31150 34545
23 343 669 1159 3507 13096 17978 24241 34321
316 384 944 4872 8491 18913 21085 23198 24798
64 314 765 3706 7136 8634 14227 17127 23437
220 693 899 8791 12417 13487 18335 22126 27428
285 794 1045 8624 8801 9547 19167 21894 32657
386 621 1045 1634 1882 3172 13686 16027 22448
95 622 693 2827 7098 11452 14112 18831 31308
446 813 928 7976 8935 13146 27117 27766 33111
89 138 241 3218 9283 20458 31484 31538 34216
277 420 704 9281 12576 12788 14496 15357 20585
141 643 758 4894 10264 15144 16357 22478 26461
17 108 160 13183 15424 17939 19276 23714 26655
109 285 608 1682 20223 21791 24615 29622 31983
123 515 622 7037 13946 15292 15606 16262 23742
264 565 923 6460 13622 13934 23181 25475 26134
202 548 789 8003 10993 12478 16051 25114 27579
121 450 575 5972 10062 18693 21852 23874 28031
507 560 889 12064 13316 19629 21547 25461 28732
664 786 1043 9137 9294 10163 23389 31436 34297
45 830 907 10730 16541 21232 30354 30605 31847
203 507 1060 6971 12216 13321 17861 22671 29825
369 881 952 3035 12279 12775 17682 17805 34281

PROVIDED BY CRC/ETRI

FIG. 72

683 709 1032 3787 17623 24138 26775 31432 33626
524 792 1042 12249 14765 18601 25811 32422 33163
137 639 688 7182 8169 10443 22530 24597 29039
159 643 749 16386 17401 24135 28429 33468 33469
107 481 555 7322 13234 19344 23498 26581 31378
249 389 523 3421 10150 17616 19085 20545 32069
395 738 1045 2415 3005 3820 19541 23543 31068
27 293 703 1717 3460 8326 8501 10290 32625
126 247 515 6031 9549 10643 22067 29490 34450
331 471 1007 3020 3922 7580 23358 28620 30946
222 542 1021 3291 3652 13130 16349 33009 34348
532 719 1038 5891 7528 23252 25472 31395 31774
145 398 774 7816 13887 14936 23708 31712 33160
88 536 600 1239 1887 12195 13782 16726 27998
151 269 585 1445 3178 3970 15568 20358 21051
650 819 865 15567 18546 25571 32038 33350 33620
93 469 800 6059 10405 12296 17515 21354 22231
97 206 951 6161 16376 27022 29192 30190 30665
412 549 986 5833 10583 10766 24946 28878 31937
72 604 659 5267 12227 21714 32120 33472 33974
25 902 912 1137 2975 9642 11598 25919 28278
420 976 1055 8473 11512 20198 21662 25443 30119
1 24 932 6426 11899 13217 13935 16548 29737
53 618 988 6280 7267 11676 13575 15532 25787
111 739 809 8133 12717 12741 20253 20608 27850
120 683 943 14496 15162 15440 18660 27543 32404
600 754 1055 7873 9679 17351 27268 33508
344 756 1054 7102 7193 22903 24720 27883
582 1003 1046 11344 23756 27497 27977 32853
28 429 509 11106 11767 12729 13100 31792
131 555 907 5113 10259 10300 20580 23029
406 915 977 12244 20259 26616 27899 32228
46 195 224 1229 4116 10263 13608 17830
19 819 953 7965 9998 13959 30580 30754
164 1003 1032 12920 15975 16582 22624 27357
8433 11894 13531 17675 25889 31384
3166 3813 8596 10368 25104 29584
2466 8241 12424 13376 24837 32711

PROVIDED BY CRC/ETRI

CODE LENGTH: N=16200
ENCODING RATE: { 8, 10, 12 } / 15

| Rate | PERFORMANCE THRESHOLD (Es/NO) | MINIMUM CYCLE LENGTH |
|---|---|---|
| 8/15 | 0. 805765 | 6 |
| 10/15 | 2. 471011 | 6 |
| 12/15 | 4. 269922 | 6 |

| Rate | X1 | KX1 | X2 | KX2 | Y1 | KY1 | Y2 | KY2 | M |
|---|---|---|---|---|---|---|---|---|---|
| 8/15 | 32 | 720 | 14 | 1080 | 4 | 1440 | 3 | 5400 | 7560 |
| 10/15 | 25 | 720 | 14 | 1440 | 4 | 360 | 3 | 8280 | 5400 |
| 12/15 | 14 | 2160 | — | 0 | 4 | 720 | 3 | 10080 | 3240 |

CODE LENGTH: N=64800
ENCODING RATE: { 7, 9, 11, 13 } / 15

| Rate | PERFORMANCE THRESHOLD (Es/NO) | MINIMUM CYCLE LENGTH |
|---|---|---|
| 7/15 | -0.093751 | 6 |
| 9/15 | 1.658523 | 8 |
| 11/15 | 3.351930 | 6 |
| 13/15 | 5.301749 | 6 |

| Rate | X1 | KX1 | X2 | KX2 | Y1 | KY1 | Y2 | KY2 | M |
|---|---|---|---|---|---|---|---|---|---|
| 7/15 | 33 | 2160 | 15 | 5040 | 4 | 0 | 3 | 23040 | 34560 |
| 9/15 | 19 | 6840 | — | 0 | 4 | 6840 | 3 | 25200 | 25920 |
| 11/15 | 15 | 8280 | — | 0 | 4 | 2520 | 3 | 36720 | 17280 |
| 13/15 | 13 | 9360 | — | 0 | 4 | 360 | 3 | 46440 | 8640 |

CODE LENGTH: N=64800
ENCODING RATE: { 6, 8, 12 } / 15

| Rate | X1 | KX1 | X2 | KX2 | Y1 | KY1 | Y2 | KY2 | M |
|---|---|---|---|---|---|---|---|---|---|
| 6/15 | 27 | 4680 | — | 0 | 4 | 13680 | 3 | 7560 | 38880 |
| 8/15 | 19 | 7200 | — | 0 | 4 | 5760 | 3 | 21600 | 30240 |
| 12/15 | 14 | 9360 | — | 0 | 4 | 0 | 3 | 42480 | 12960 |

PROVIDED BY Samsung

CODE LENGTH: N=16200

ENCODING RATE: { 6, 7, 9, 11, 13 } / 15

| Rate | X1 | KX1 | X2 | KX2 | Y1 | KY1 | Y2 | KY2 | M |
|---|---|---|---|---|---|---|---|---|---|
| 6/15 | 30 | 1080 | – | – | 4 | 3600 | 3 | 1800 | 9720 |
| 7/15 | 24 | 1440 | – | – | 4 | 2520 | 3 | 3600 | 8640 |
| 9/15 | 16 | 1080 | 10 | 720 | 9 | 1080 | 3 | 6840 | 6480 |
| 11/15 | 12 | 2520 | – | – | – | – | 3 | 9360 | 4320 |
| 13/15 | 13 | 2160 | – | – | 4 | 3600 | 3 | 8280 | 2160 |

PROVIDED BY LGE

CODE LENGTH: N=64800
ENCODING RATE: 10 / 15

| Rate | X1 | KX1 | X2 | KX2 | Y1 | KY1 | Y2 | KY2 | M |
|---|---|---|---|---|---|---|---|---|---|
| 10/15 | 14 | 8640 | 9 | 2160 | 4 | 0 | 3 | 32400 | 21600 |

PROVIDED BY LGE

CODE LENGTH: N=64800
ENCODING RATE: 9 / 15

| Rate | X1 | KX1 | X2 | KX2 | Y1 | KY1 | Y2 | KY2 | M |
|---|---|---|---|---|---|---|---|---|---|
| 9/15 | 35 | 2520 | 8 | 11520 | 4 | 1080 | 3 | 23760 | 25920 |

PROVIDED BY NERC

CODE LENGTH: N=16200
ENCODING RATE: 5 / 15

| Rate | N | K | N-K | g | Q1 | Q2 |
|---|---|---|---|---|---|---|
| 5/15 | 16200 | 5400 | 10800 | 720 | 2 | 28 |

※Q1=g/360, Q2=(N-K-g)/360

PROVIDED BY CRC/ETRI

CODE LENGTH: N=64800
ENCODING RATE: { 5, 6, 7 } / 15

| Rate | N | K | N-K | M1 | M2 | Q1 | Q2 |
|---|---|---|---|---|---|---|---|
| 5/15 | 64800 | 21600 | 43200 | 1440 | 41760 | 4 | 116 |
| 6/15 | 64800 | 25920 | 38880 | 1080 | 37800 | 3 | 105 |
| 7/15 | 64800 | 30240 | 34560 | 1080 | 33480 | 3 | 93 |

※M1=g, M2=N-K-g, Q1=M1/360, Q2=M2/360

PROVIDED BY CRC/ETRI

FIG. 87

| Input cell word y | Constellation point zq |
|---|---|
| (00) | $(1+1i)/\sqrt{2}$ |
| (01) | $(1-1i)/\sqrt{2}$ |
| (10) | $(-1+1i)/\sqrt{2}$ |
| (11) | $(-1-1i)/\sqrt{2}$ |

FIG. 88

| w/Shape | NUC_16_5/15 | NUC_16_6/15 | NUC_16_7/15 | NUC_16_8/15 |
|---|---|---|---|---|
| w0 | 0.5309 + 1.1928i | 0.5115 + 1.2092i | 0.5029 + 1.1949i | 0.4951 + 1.2068i |
| w1 | 1.1928 + 0.5309i | 1.2092 + 0.5115i | 1.1962 + 0.5050i | 1.2068 + 0.4951i |
| w2 | 0.2842 + 0.4633i | 0.2663 + 0.4530i | 0.2632 + 0.4959i | 0.2575 + 0.4819i |
| w3 | 0.4633 + 0.2842i | 0.4530 + 0.2663i | 0.4993 + 0.2625i | 0.4819 + 0.2575i |

| w/Shape | NUC_16_9/15 | NUC_16_10/15 | NUC_16_11/15 | NUC_16_12/15 | NUC_16_13/15 |
|---|---|---|---|---|---|
| w0 | 0.4967 + 1.1932i | 0.4487 + 1.1657i | 0.9342 + 0.9847i | 0.9555 + 0.9555i | 0.9517 + 0.9511i |
| w1 | 1.1896 + 0.4896i | 1.2080 + 0.5377i | 0.9866 + 0.2903i | 0.9555 + 0.2949i | 0.9524 + 0.3061i |
| w2 | 0.2452 + 0.5326i | 0.2213 + 0.4416i | 0.2716 + 0.9325i | 0.2949 + 0.9555i | 0.3067 + 0.9524i |
| w3 | 0.5210 + 0.2440i | 0.6186 + 0.2544i | 0.2901 + 0.2695i | 0.2949 + 0.2949i | 0.3061 + 0.3067i |

FIG. 89

| w/Shape | NUC_64_5/15 | NUC_64_6/15 | NUC_64_7/15 | NUC_64_8/15 |
|---|---|---|---|---|
| w0 | 1.4327+0.3305i | 1.4521+0.3005i | 1.4865+0.2932i | 1.4827+0.2920i |
| w1 | 1.0909+0.2971i | 1.2657+0.8178i | 1.2618+0.8446i | 1.2563+0.8411i |
| w2 | 1.2484+0.7803i | 1.0666+0.2744i | 1.0271+0.2345i | 1.0211+0.2174i |
| w3 | 0.9762+0.5715i | 0.9500+0.5641i | 0.8976+0.5624i | 0.8798+0.5702i |
| w4 | 0.3309+1.4326i | 0.3011+1.4529i | 0.2943+1.4811i | 0.2920+1.4827i |
| w5 | 0.2979+1.0923i | 0.8202+1.2651i | 0.8402+1.2602i | 0.8410+1.2563i |
| w6 | 0.7829+1.2477i | 0.2750+1.0676i | 0.2356+1.0261i | 0.2174+1.0211i |
| w7 | 0.5739+0.9763i | 0.5656+0.9499i | 0.5632+0.8957i | 0.5702+0.8798i |
| w8 | 0.3901+0.2112i | 0.3553+0.1948i | 0.3147+0.1567i | 0.3040+0.1475i |
| w9 | 0.5317+0.2475i | 0.3569+0.2094i | 0.3116+0.1730i | 0.3028+0.1691i |
| w10 | 0.3945+0.2289i | 0.5596+0.2431i | 0.6512+0.2053i | 0.6855+0.1871i |
| w11 | 0.5236+0.2894i | 0.5410+0.3002i | 0.5965+0.3353i | 0.6126+0.3563i |
| w12 | 0.2108+0.3911i | 0.1946+0.3566i | 0.1567+0.3125i | 0.1475+0.3040i |
| w13 | 0.2475+0.5327i | 0.2094+0.3579i | 0.1733+0.3091i | 0.1691+0.3028i |
| w14 | 0.2287+0.3955i | 0.2430+0.5607i | 0.2056+0.6506i | 0.1871+0.6855i |
| w15 | 0.2898+0.5246i | 0.3004+0.5417i | 0.3364+0.5943i | 0.3563+0.6126i |

| w/Shape | NUC_64_9/15 | NUC_64_10/15 | NUC_64_11/15 | NUC_64_12/15 | NUC_64_13/15 |
|---|---|---|---|---|---|
| w0 | 1.4678+0.3029i | 1.4388+0.2878i | 1.4443+0.2683i | 1.4480+0.2403i | 1.4303+0.2329i |
| w1 | 1.2296+0.8500i | 1.2150+0.8133i | 0.7471+1.2243i | 0.6406+1.1995i | 0.6297+1.1818i |
| w2 | 1.0496+0.2245i | 1.0386+0.2219i | 1.1749+0.7734i | 1.0952+0.9115i | 1.0803+0.9154i |
| w3 | 0.8739+0.6079i | 0.8494+0.6145i | 0.7138+0.8201i | 0.6868+0.8108i | 0.6870+0.8095i |
| w4 | 0.2834+1.4645i | 0.2931+1.4656i | 0.1638+1.0769i | 1.0500+0.1642i | 1.0444+0.1681i |
| w5 | 0.8084+1.2532i | 0.8230+1.2278i | 0.2927+1.4217i | 0.7170+0.1473i | 0.7240+0.1548i |
| w6 | 0.2038+1.0260i | 0.2069+1.0649i | 0.1462+0.7457i | 1.0519+0.5188i | 1.0553+0.5250i |
| w7 | 0.5574+0.8905i | 0.5677+0.8971i | 0.4134+0.7408i | 0.7146+0.4532i | 0.7142+0.4710i |
| w8 | 0.3884+0.1313i | 0.4119+0.1177i | 1.0203+0.1517i | 0.1677+1.0405i | 0.2114+1.4305i |
| w9 | 0.3771+0.1914i | 0.3998+0.2516i | 0.6653+0.1357i | 0.2402+1.4087i | 0.2020+1.0575i |
| w10 | 0.7243+0.1752i | 0.7442+0.1559i | 0.9639+0.4465i | 0.1369+0.7073i | 0.1221+0.6613i |
| w11 | 0.6116+0.4008i | 0.5954+0.4328i | 0.6746+0.4339i | 0.4044+0.7057i | 0.3735+0.7557i |
| w12 | 0.1358+0.2445i | 0.1166+0.1678i | 0.1271+0.1428i | 0.1374+0.1295i | 0.1455+0.1275i |
| w13 | 0.1677+0.2860i | 0.1582+0.3325i | 0.3782+0.1406i | 0.4185+0.1357i | 0.4322+0.1389i |
| w14 | 0.1555+0.6756i | 0.1355+0.7408i | 0.1311+0.4288i | 0.1325+0.3998i | 0.1432+0.3852i |
| w15 | 0.3472+0.6007i | 0.3227+0.6200i | 0.3919+0.4276i | 0.4122+0.4120i | 0.4220+0.4278i |

FIG. 90

| w/Shape | NUC_256_6/15 | NUC_256_7/15 | NUC_256_8/15 | NUC_256_9/15 | NUC_256_10/15 | NUC_256_11/15 | NUC_256_12/15 | NUC_256_13/15 |
|---|---|---|---|---|---|---|---|---|
| w0 | 0.8800+1.6826i | 1.2905+1.3099i | 1.0804+1.3788i | 1.3231+1.1506i | 1.6097+0.1548i | 0.3105+0.3382i | 1.1014+1.1670i | 0.3556+0.3497i |
| w1 | 0.3911+1.3645i | 1.0504+0.9577i | 1.0487+0.9862i | 0.9851+1.2311i | 1.5549+0.4605i | 0.4342+0.3360i | 0.8557+1.2421i | 0.3579+0.4945i |
| w2 | 0.2191+1.7524i | 1.5329+0.8935i | 1.6464+0.7428i | 1.1439+0.8974i | 1.3226+0.1290i | 0.3149+0.4829i | 1.2957+0.8039i | 0.5049+0.3571i |
| w3 | 0.2274+1.4208i | 1.1577+0.8116i | 1.3245+0.8414i | 0.9343+0.9271i | 1.2772+0.3829i | 0.4400+0.4807i | 1.0881+0.8956i | 0.5056+0.5063i |
| w4 | 0.8678+1.2487i | 1.7881+0.2509i | 0.7198+1.2427i | 1.5398+0.7962i | 1.2753+1.0242i | 0.1811+0.3375i | 0.5795+1.2110i | 0.2123+0.3497i |
| w5 | 0.7275+1.1667i | 1.4275+0.1400i | 0.8106+1.0040i | 0.9092+0.5599i | 1.4434+0.7540i | 0.0633+0.3404i | 0.6637+1.4215i | 0.2116+0.4900i |
| w6 | 0.8747+1.0470i | 1.4784+0.5201i | 0.5595+1.0317i | 1.2222+0.6574i | 1.0491+0.3476i | 0.1818+0.4851i | 0.6930+1.0082i | 0.0713+0.3489i |
| w7 | 0.7930+1.0408i | 1.3408+0.4346i | 0.6118+0.9722i | 0.9579+0.6373i | 1.1861+0.6253i | 0.0633+0.4815i | 0.8849+0.9647i | 0.0690+0.4960i |
| w8 | 0.2098+0.9768i | 0.7837+0.5867i | 1.6768+0.2002i | 0.7748+1.5867i | 0.8326+0.0970i | 0.3084+0.1971i | 1.2063+0.5115i | 0.3527+0.2086i |
| w9 | 0.2241+1.0454i | 0.8250+0.6455i | 0.9997+0.6844i | 0.8876+1.2489i | 0.8962+0.2804i | 0.4356+0.1993i | 1.0059+0.4952i | 0.3497+0.0713i |
| w10 | 0.1858+0.9878i | 0.8256+0.5601i | 1.4212+0.4769i | 0.5992+0.9208i | 1.1044+0.1102i | 0.3098+0.0676i | 1.4171+0.5901i | 0.4960+0.2123i |
| w11 | 0.1901+1.0659i | 0.8777+0.6110i | 1.1479+0.6312i | 0.6796+0.9743i | 1.0648+0.3267i | 0.4342+0.0691i | 1.0466+0.6935i | 0.4974+0.0698i |
| w12 | 0.5547+0.8312i | 1.0080+0.1843i | 0.6079+0.6566i | 0.5836+0.5879i | 0.7325+0.6071i | 0.1775+0.1985i | 0.6639+0.6286i | 0.2086+0.2079i |
| w13 | 0.5479+0.8651i | 1.0759+0.1721i | 0.7284+0.6957i | 0.6915+0.5769i | 0.8280+0.4559i | 0.0640+0.1978i | 0.8353+0.5851i | 0.2094+0.0690i |
| w14 | 0.6073-0.8182i | 1.0056+0.2758i | 0.5724+0.7031i | 0.5858+0.7058i | 0.8744+0.7153i | 0.1775+0.0676i | 0.6879+0.8022i | 0.0676+0.2079i |
| w15 | 0.5955+0.8420i | 1.0862+0.2964i | 0.6302+0.7259i | 0.6868+0.6793i | 0.9882+0.5300i | 0.0647+0.0669i | 0.8634+0.7622i | 0.0698+0.0683i |
| w16 | 1.4070+0.1790i | 0.8334+1.5554i | 0.1457+1.4010i | 1.6118+0.1497i | 0.1646+1.6407i | 0.7455+0.3411i | 0.1213+1.4368i | 0.3586+0.7959i |
| w17 | 1.7227+0.2900i | 0.8165+1.1092i | 0.1866+1.7346i | 0.9511+0.1140i | 0.4867+1.5743i | 0.5811+0.3396i | 0.1077+1.2098i | 0.3571+0.6392i |
| w18 | 1.3246+0.2562i | 0.6092+1.2729i | 0.1174+1.1035i | 1.2970+0.1234i | 0.1363+1.3579i | 0.7556+0.4669i | 0.0651+0.9801i | 0.5034+0.8271i |
| w19 | 1.3636+0.3654i | 0.6728+1.1456i | 0.1095+1.0132i | 1.0266+0.1191i | 0.4023+1.3026i | 0.5862+0.4756i | 0.2009+1.0115i | 0.5063+0.6600i |
| w20 | 1.3708+1.2834i | 0.3061+1.7469i | 0.4357+1.3636i | 1.5831+0.4498i | 1.0542+1.2584i | 0.9556+0.3280i | 0.3764+1.4264i | 0.2146+0.7862i |
| w21 | 1.6701+0.8403i | 0.1327+1.4056i | 0.5853+1.6920i | 0.9328+0.3586i | 0.7975+1.4450i | 1.1767+0.3091i | 0.3237+1.2130i | 0.2109+0.6340i |
| w22 | 1.1614+0.7909i | 0.3522+1.3414i | 0.3439+1.0689i | 1.2796+0.3894i | 0.8687+1.0407i | 0.9673+0.4720i | 0.5205+0.9814i | 0.0713+0.8093i |
| w23 | 1.2241+0.7367i | 0.2273+1.3081i | 0.3234+0.9962i | 1.0188+0.3447i | 0.6502+1.1951i | 1.2051+0.5135i | 0.3615+1.0163i | 0.0698+0.6467i |
| w24 | 0.9769+0.1863i | 0.5007+0.8098i | 0.1092+0.6174i | 0.5940+0.1059i | 0.0982+0.9745i | 0.7367+0.2015i | 0.0715+0.6596i | 0.2799+1.0862i |
| w25 | 0.9452+0.2057i | 0.5528+0.8347i | 0.1074+0.6307i | 0.7215+0.1100i | 0.2842+0.9344i | 0.5811+0.2015i | 0.2116+0.6597i | 0.2806+1.2755i |
| w26 | 1.0100+0.2182i | 0.4843+0.8486i | 0.1109+0.6996i | 0.5863+0.1138i | 0.1142+1.1448i | 0.7316+0.0669i | 0.0729+0.8131i | 0.4328+0.9904i |
| w27 | 0.9795+0.2417i | 0.5304+0.8759i | 0.1076+0.7345i | 0.6909+0.1166i | 0.3385+1.0973i | 0.5782+0.0669i | 0.2158+0.8246i | 0.4551+1.1812i |
| w28 | 0.8241+0.4856i | 0.1715+0.9147i | 0.3291+0.6264i | 0.5843+0.3604i | 0.6062+0.7465i | 0.9062+0.1971i | 0.5038+0.6467i | 0.2309+0.9414i |
| w29 | 0.8232+0.4837i | 0.1540+0.9510i | 0.3126+0.6373i | 0.6970+0.3592i | 0.4607+0.8538i | 1.2829+0.1185i | 0.3526+0.6572i | 0.1077+1.3891i |
| w30 | 0.8789+0.5391i | 0.1964+0.9438i | 0.3392+0.6999i | 0.5808+0.3250i | 0.7263+0.8764i | 0.9156+0.0735i | 0.5185+0.8086i | 0.0772+0.9852i |
| w31 | 0.8796+0.5356i | 0.1788+0.9832i | 0.3202+0.7282i | 0.6678+0.3290i | 0.5450+1.0067i | 1.1011+0.0735i | 0.3593+0.8245i | 0.0802+1.1753i |
| w32 | 0.1376+0.3342i | 0.3752+0.1667i | 0.9652+0.1069i | 0.1406+1.6192i | 0.2655+0.0746i | 0.3244+0.8044i | 1.2545+0.1010i | 0.9301+0.3727i |
| w33 | 0.1383+0.3292i | 0.3734+0.1667i | 0.9075+0.1666i | 0.1272+1.2984i | 0.2664+0.0759i | 0.4589+0.8218i | 1.0676+0.0956i | 0.8256+0.5256i |
| w34 | 0.1363+0.3322i | 0.3758+0.1661i | 0.9724+0.1171i | 0.1211+0.9644i | 0.4571+0.0852i | 0.3207+0.6415i | 1.4782+0.1167i | 0.6593+0.3668i |
| w35 | 0.1370+0.3273i | 0.3746+0.1649i | 0.9188+0.1752i | 0.1220+1.0093i | 0.4516+0.1062i | 0.4509+0.6371i | 0.8981+0.0882i | 0.8623+0.5182i |
| w36 | 0.1655+0.3265i | 0.4013+0.1230i | 0.6342+0.1372i | 0.1124+0.6101i | 0.2559+0.1780i | 0.1920+0.8196i | 0.5518+0.0690i | 1.0186+0.3645i |
| w37 | 0.1656+0.3227i | 0.4001+0.1230i | 0.6550+0.1495i | 0.1177+0.6041i | 0.2588+0.1772i | 0.0633+0.8167i | 0.6903+0.0552i | 1.0001+0.5242i |
| w38 | 0.1634+0.3246i | 0.4037+0.1230i | 0.6290+0.1393i | 0.1136+0.7455i | 0.3592+0.2811i | 0.1811+0.6371i | 0.5742+0.1987i | 1.1857+0.2725i |
| w39 | 0.1636+0.3208i | 0.4019+0.1218i | 0.6494+0.1504i | 0.1185+0.7160i | 0.3728+0.2654i | 0.0640+0.6415i | 0.7374+0.1564i | 1.3928+0.3408i |
| w40 | 0.1779+0.8841i | 0.6325+0.3934i | 1.3127+0.1240i | 0.4324+1.5679i | 0.7706+0.0922i | 0.3331+1.0669i | 1.2378+0.3049i | 0.8011+0.2227i |
| w41 | 0.1828+0.8845i | 0.5946+0.3928i | 0.9572+0.4344i | 0.3984+1.2825i | 0.7407+0.2260i | 0.4655+1.0087i | 1.0518+0.3032i | 0.7981+0.0735i |
| w42 | 0.1745+0.8828i | 0.6116+0.3879i | 1.2403+0.2631i | 0.3766+0.9534i | 0.6180+0.0927i | 0.3433+1.2865i | 1.4584+0.3511i | 0.6459+0.2198i |
| w43 | 0.1793+0.8829i | 0.6019+0.3837i | 1.0254+0.4130i | 0.3868+1.0301i | 0.6019+0.1858i | 0.5004+1.5062i | 0.9107+0.2603i | 0.6430+0.0713i |
| w44 | 0.3547+0.8009i | 0.7377+0.1618i | 0.6096+0.4214i | 0.3667+0.5995i | 0.6007+0.4980i | 0.1971+1.0051i | 0.6321+0.4729i | 0.9681+0.2205i |
| w45 | 0.3593+0.8011i | 0.7298+0.1582i | 0.6773+0.4284i | 0.3328+0.5960i | 0.6673+0.3928i | 0.0735+1.0298i | 0.7880+0.4392i | 0.9615+0.0735i |
| w46 | 0.3576+0.5990i | 0.7274+0.1782i | 0.5995+0.4102i | 0.3687+0.7194i | 0.4786+0.3935i | 0.1498+1.5018i | 0.6045+0.3274i | 1.3327+0.1039i |
| w47 | 0.3624+0.5994i | 0.7165+0.1746i | 0.6531+0.4101i | 0.3379+0.6964i | 0.5176+0.3391i | 0.0865+1.2553i | 0.7629+0.2965i | 1.1359+0.0809i |
| w48 | 0.2697+0.1443i | 0.1509+0.2425i | 0.1250+0.1153i | 0.1065+0.1146i | 0.0757+0.1003i | 0.7811+0.8080i | 0.0596+0.0739i | 0.8382+0.8709i |
| w49 | 0.2704+0.1433i | 0.1503+0.2400i | 0.1252+0.1158i | 0.1145+0.1108i | 0.0753+0.1004i | 0.6167+0.8153i | 0.1767+0.0731i | 0.8145+0.6934i |
| w50 | 0.2644+0.1442i | 0.1515+0.2437i | 0.1245+0.1152i | 0.1053+0.1274i | 0.0777+0.4788i | 0.7636+0.6255i | 0.0612+0.2198i | 0.6845+0.8486i |
| w51 | 0.2650+0.1432i | 0.1503+0.2425i | 0.1247+0.1156i | 0.1134+0.1236i | 0.0967+0.4754i | 0.6000+0.6327i | 0.1815+0.2192i | 0.6600+0.6796i |
| w52 | 0.2763+0.1638i | 0.1285+0.2388i | 0.3768+0.1244i | 0.1111+0.3821i | 0.1023+0.2243i | 0.9898+0.7680i | 0.4218+0.0715i | 1.1612+0.6949i |
| w53 | 0.2768+0.1626i | 0.1279+0.2419i | 0.3707+0.1237i | 0.1186+0.3867i | 0.1010+0.2242i | 1.5855+0.1498i | 0.2978+0.0725i | 0.9785+0.6942i |
| w54 | 0.2715+0.1630i | 0.1279+0.2431i | 0.3779+0.1280i | 0.1080+0.3431i | 0.1950+0.3918i | 0.9476+0.6175i | 0.4337+0.2115i | 1.3698+0.6259i |
| w55 | 0.2719+0.1618i | 0.1279+0.2406i | 0.3717+0.1252i | 0.1177+0.3459i | 0.1881+0.3969i | 1.4625+0.4015i | 0.3057+0.2167i | 1.2183+0.4841i |
| w56 | 0.6488+0.1696i | 0.3394+0.5764i | 0.1161+0.3693i | 0.3644+0.1080i | 0.0930+0.8122i | 0.8276+1.0225i | 0.0667+0.5124i | 0.7989+1.0498i |
| w57 | 0.6462+0.1706i | 0.3364+0.5722i | 0.1157+0.3645i | 0.3262+0.1104i | 0.2215+0.7840i | 0.6313+1.0364i | 0.2008+0.5095i | 0.4395+1.4203i |
| w58 | 0.6456+0.1745i | 0.3328+0.5758i | 0.1173+0.3469i | 0.3881+0.1173i | 0.0037+0.8514i | 0.8815+1.2865i | 0.0625+0.3858i | 0.6118+1.0246i |
| w59 | 0.6431+0.1753i | 0.3303+0.5698i | 0.1171+0.3424i | 0.3289+0.1196i | 0.1540+0.6366i | 0.6342+1.2705i | 0.1899+0.3842i | 0.6303+1.2421i |
| w60 | 0.5854+0.3186i | 0.1491+0.6316i | 0.3593+0.3899i | 0.3865+0.3758i | 0.4810+0.6306i | 1.0422+0.9593i | 0.4818+0.4946i | 1.0550+0.8924i |
| w61 | 0.5862+0.3167i | 0.1461+0.6280i | 0.3422+0.3808i | 0.3310+0.3795i | 0.3858+0.7037i | 1.2749+0.8538i | 0.3380+0.5050i | 0.8612+1.2800i |
| w62 | 0.5864+0.3275i | 0.1509+0.6280i | 0.3614+0.3755i | 0.3872+0.3453i | 0.3527+0.5230i | 1.1556+1.1847i | 0.4571+0.3499i | 1.2696+0.8969i |
| w63 | 0.5878+0.3254i | 0.1473+0.6225i | 0.3503+0.3656i | 0.3336+0.3402i | 0.3100+0.5559i | 1.4771+0.6742i | 0.3216+0.3599i | 1.0342+1.1181i |

FIG. 91

| u/Shape | NUC_1k_6/15 | NUC_1k_7/15 | NUC_1k_8/15 | NUC_1k_9/15 | NUC_1k_10/15 | NUC_1k_11/15 | NUC_1k_12/15 | NUC_1k_13/15 |
|---|---|---|---|---|---|---|---|---|
| u1 | 1.0003 | 1 | 1.0005 | 1 | 1.0772 | 1.16666667 | 2.5983 | 2.85714286 |
| u2 | 1.0149 | 1.04 | 2.0897 | 2.78571429 | 2.8011 | 3.08333333 | 4.5193 | 4.85714286 |
| u3 | 1.0158 | 1.04 | 2.0888 | 2.78571429 | 2.9634 | 3.33333333 | 6.1649 | 6.85714286 |
| u4 | 2.6848 | 3 | 3.9945 | 4.85714286 | 4.8127 | 5.16666667 | 8.2107 | 8.85714286 |
| u5 | 2.6903 | 3.04 | 3.9931 | 4.85714286 | 5.1864 | 5.75 | 9.9594 | 11 |
| u6 | 2.882 | 3.28 | 5.3843 | 6.85714286 | 6.7838 | 7.41666667 | 12.0321 | 13.2857143 |
| u7 | 2.8747 | 3.32 | 5.3894 | 6.85714286 | 7.5029 | 8.5 | 13.9574 | 15.7142857 |
| u8 | 4.7815 | 5.24 | 7.5206 | 9.14285714 | 9.238 | 10.0833333 | 16.2598 | 18.1428571 |
| u9 | 4.7619 | 5.32 | 7.6013 | 9.28571429 | 10.32 | 11.5833333 | 18.4269 | 20.7142857 |
| u10 | 5.5779 | 6.04 | 9.3371 | 11.5714286 | 12.0115 | 13.3333333 | 20.9273 | 23.4285714 |
| u11 | 5.6434 | 6.28 | 9.8429 | 12.2142857 | 13.5356 | 15.25 | 23.4863 | 26.2857143 |
| u12 | 7.3854 | 8.24 | 11.9255 | 14.6428571 | 15.6099 | 17.3333333 | 26.4823 | 29.2857143 |
| u13 | 7.8797 | 8.84 | 13.3962 | 16.4285714 | 17.7524 | 19.75 | 29.7085 | 32.4285714 |
| u14 | 9.635 | 11.04 | 15.8981 | 19.4285714 | 20.5256 | 22.4166667 | 33.6247 | 35.7142857 |
| u15 | 11.7874 | 13.68 | 19.1591 | 23.2857143 | 24.1254 | 25.5833333 | 38.5854 | 39.4285714 |

FIG. 92

A

| | | | | | | | | | | | | | | | | |
|---|---|---|---|---|---|---|---|---|---|---|---|---|---|---|---|---|
| $y_{0,q}$ | 1 | 1 | 1 | 1 | 1 | 1 | 1 | 1 | 1 | 1 | 1 | 1 | 1 | 1 | 1 | 1 |
| $y_{2,q}$ | 0 | 0 | 0 | 0 | 0 | 0 | 0 | 0 | 1 | 1 | 1 | 1 | 1 | 1 | 1 | 1 |
| $y_{4,q}$ | 0 | 0 | 0 | 0 | 1 | 1 | 1 | 1 | 1 | 1 | 1 | 1 | 0 | 0 | 0 | 0 |
| $y_{6,q}$ | 0 | 0 | 1 | 1 | 1 | 1 | 0 | 0 | 0 | 0 | 1 | 1 | 1 | 1 | 0 | 0 |
| $y_{8,q}$ | 0 | 1 | 1 | 0 | 0 | 1 | 1 | 0 | 0 | 1 | 1 | 0 | 0 | 1 | 1 | 0 |
| $Re(z_a)$ | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | $-1$ |
| $Y_{0,q}$ | 0 | 0 | 0 | 0 | 0 | 0 | 0 | 0 | 0 | 0 | 0 | 0 | 0 | 0 | 0 | 0 |
| $y_{2,q}$ | 1 | 1 | 1 | 1 | 1 | 1 | 1 | 1 | 0 | 0 | 0 | 0 | 0 | 0 | 0 | 0 |
| $y_{4,q}$ | 0 | 0 | 0 | 0 | 1 | 1 | 1 | 1 | 1 | 1 | 1 | 1 | 0 | 0 | 0 | 0 |
| $y_{6,q}$ | 0 | 0 | 1 | 1 | 1 | 1 | 0 | 0 | 0 | 0 | 1 | 1 | 1 | 1 | 0 | 0 |
| $y_{8,q}$ | 0 | 1 | 1 | 0 | 0 | 1 | 1 | 0 | 0 | 1 | 1 | 0 | 0 | 1 | 1 | 0 |
| $Re(z_a)$ | 1 | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ |

B

| | | | | | | | | | | | | | | | | |
|---|---|---|---|---|---|---|---|---|---|---|---|---|---|---|---|---|
| $y_{1,q}$ | 1 | 1 | 1 | 1 | 1 | 1 | 1 | 1 | 1 | 1 | 1 | 1 | 1 | 1 | 1 | 1 |
| $y_{3,q}$ | 0 | 0 | 0 | 0 | 0 | 0 | 0 | 0 | 1 | 1 | 1 | 1 | 1 | 1 | 1 | 1 |
| $y_{5,q}$ | 0 | 0 | 0 | 0 | 1 | 1 | 1 | 1 | 1 | 1 | 1 | 1 | 0 | 0 | 0 | 0 |
| $y_{7,q}$ | 0 | 0 | 1 | 1 | 1 | 1 | 0 | 0 | 0 | 0 | 1 | 1 | 1 | 1 | 0 | 0 |
| $y_{9,q}$ | 0 | 1 | 1 | 0 | 0 | 1 | 1 | 0 | 0 | 1 | 1 | 0 | 0 | 1 | 1 | 0 |
| $Im(z_a)$ | $-u_{15}$ | $-u_{14}$ | $-u_{13}$ | $-u_{12}$ | $-u_{11}$ | $-u_{10}$ | $-u_9$ | $-u_8$ | $-u_7$ | $-u_6$ | $-u_5$ | $-u_4$ | $-u_3$ | $-u_2$ | $-u_1$ | $-1$ |
| $y_{1,q}$ | 0 | 0 | 0 | 0 | 0 | 0 | 0 | 0 | 0 | 0 | 0 | 0 | 0 | 0 | 0 | 0 |
| $y_{3,q}$ | 1 | 1 | 1 | 1 | 1 | 1 | 1 | 1 | 0 | 0 | 0 | 0 | 0 | 0 | 0 | 0 |
| $y_{5,q}$ | 0 | 0 | 0 | 0 | 1 | 1 | 1 | 1 | 1 | 1 | 1 | 1 | 0 | 0 | 0 | 0 |
| $y_{7,q}$ | 0 | 0 | 1 | 1 | 1 | 1 | 0 | 0 | 0 | 0 | 1 | 1 | 1 | 1 | 0 | 0 |
| $y_{9,q}$ | 0 | 1 | 1 | 0 | 0 | 1 | 1 | 0 | 0 | 1 | 1 | 0 | 0 | 1 | 1 | 0 |
| $Im(z_a)$ | 1 | $u_1$ | $u_2$ | $u_3$ | $u_4$ | $u_5$ | $u_6$ | $u_7$ | $u_8$ | $u_9$ | $u_{10}$ | $u_{11}$ | $u_{12}$ | $u_{13}$ | $u_{14}$ | $u_{15}$ |

FIG. 94

| | N=64800 | | | | |
|---|---|---|---|---|---|
| | QPSK | 16QAM | 64QAM | 256QAM | 1024QAM |
| C | 2 | 4 | 6 | 8 | 10 |
| R1 | 32400 | 16200 | 10800 | 7920 | 6480 |
| R2 | 0 | 0 | 0 | 180 | 0 |

| | N=16200 | | | | |
|---|---|---|---|---|---|
| | QPSK | 16QAM | 64QAM | 256QAM | 1024QAM |
| C | 2 | 4 | 6 | 8 | 10 |
| R1 | 7920 | 3960 | 2520 | 1800 | 1440 |
| R2 | 180 | 90 | 180 | 225 | 180 |

C: NUMBER OF COLUMNS (NUMBER OF SYMBOL BITS)
R1: NUMBER OF ROWS OF Part1
R2: NUMBER OF ROWS OF Part2

FIG. 97

BIT GROUP

| | | | | | | | | | | | | | | | | | | | | |
|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

| | | | | | | | | | | | | | | | | | | | | |
|---|---|---|---|---|---|---|---|---|---|---|---|---|---|---|---|---|---|---|---|---|
| 39 | 47 | 96 | 176 | 33 | 75 | 165 | 38 | 27 | 58 | 90 | 76 | 17 | 46 | 10 | 91 | 133 | 69 | 171 | 32 | 117 | 78 |
| 13 | 146 | 101 | 36 | 0 | 138 | 25 | 77 | 122 | 49 | 14 | 125 | 140 | 93 | 130 | 2 | 104 | 102 | 128 | 4 | 111 | 151 |
| 84 | 167 | 35 | 127 | 156 | 55 | 82 | 85 | 66 | 114 | 8 | 147 | 115 | 113 | 5 | 31 | 100 | 106 | 48 | 52 | 67 | 107 |
| 18 | 126 | 112 | 50 | 9 | 143 | 28 | 160 | 71 | 79 | 43 | 98 | 86 | 94 | 64 | 3 | 166 | 105 | 103 | 118 | 63 | 51 |
| 139 | 172 | 141 | 175 | 56 | 74 | 95 | 29 | 45 | 129 | 120 | 168 | 92 | 150 | 7 | 162 | 153 | 137 | 108 | 159 | 157 | 173 |
| 23 | 89 | 132 | 57 | 37 | 70 | 134 | 40 | 21 | 149 | 80 | 1 | 121 | 59 | 110 | 142 | 152 | 15 | 154 | 145 | 12 | 170 |
| 54 | 155 | 99 | 22 | 123 | 72 | 177 | 131 | 116 | 44 | 158 | 73 | 11 | 65 | 164 | 119 | 174 | 34 | 83 | 53 | 24 | 42 |
| 60 | 26 | 161 | 68 | 178 | 41 | 148 | 109 | 87 | 144 | 135 | 20 | 62 | 81 | 169 | 124 | 6 | 19 | 30 | 163 | 61 | 179 |
| 136 | 97 | 16 | 88 | | | | | | | | | | | | | | | | | | |

FIG. 98

BIT GROUP

| | | | | | | | | | | | | | | | | | | | | |
|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

| | | | | | | | | | | | | | | | | | | | | |
|---|---|---|---|---|---|---|---|---|---|---|---|---|---|---|---|---|---|---|---|---|
| 6 | 14 | 1 | 127 | 161 | 177 | 75 | 123 | 62 | 103 | 17 | 18 | 167 | 88 | 27 | 34 | 8 | 110 | 7 | 78 | 94 | 44 |
| 45 | 166 | 149 | 61 | 163 | 145 | 155 | 157 | 82 | 130 | 70 | 92 | 151 | 139 | 160 | 133 | 26 | 2 | 79 | 15 | 95 | 122 |
| 126 | 178 | 101 | 24 | 138 | 146 | 179 | 30 | 86 | 58 | 11 | 121 | 159 | 49 | 84 | 132 | 117 | 119 | 50 | 52 | 4 | 51 |
| 48 | 74 | 114 | 59 | 40 | 131 | 33 | 89 | 66 | 136 | 72 | 16 | 134 | 37 | 164 | 77 | 99 | 173 | 20 | 158 | 156 | 90 |
| 41 | 176 | 81 | 42 | 60 | 109 | 22 | 150 | 105 | 120 | 12 | 64 | 56 | 68 | 111 | 21 | 148 | 53 | 169 | 97 | 108 | 35 |
| 140 | 91 | 115 | 152 | 36 | 106 | 154 | 0 | 25 | 54 | 63 | 172 | 80 | 168 | 142 | 118 | 162 | 135 | 73 | 83 | 153 | 141 |
| 9 | 28 | 55 | 31 | 112 | 107 | 85 | 100 | 175 | 23 | 57 | 47 | 38 | 170 | 137 | 76 | 147 | 93 | 19 | 98 | 124 | 39 |
| 87 | 174 | 144 | 46 | 10 | 129 | 69 | 71 | 125 | 96 | 116 | 171 | 128 | 65 | 102 | 5 | 43 | 143 | 104 | 13 | 67 | 29 |
| 3 | 113 | 32 | 165 | | | | | | | | | | | | | | | | | | |

FIG. 99

BIT GROUP

| | | | | | | | | | | | | | | | | | | | |
|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

| | | | | | | | | | | | | | | | | | | | |
|---|---|---|---|---|---|---|---|---|---|---|---|---|---|---|---|---|---|---|---|
| 103 | 116 | 158 | 0 | 27 | 73 | 140 | 30 | 148 | 36 | 153 | 154 | 10 | 174 | 122 | 178 | 6 | 106 | 162 | 59 | 142 | 112 |
| 7 | 74 | 11 | 51 | 49 | 72 | 31 | 65 | 156 | 95 | 171 | 105 | 173 | 168 | 1 | 155 | 125 | 82 | 86 | 161 | 57 | 165 |
| 54 | 26 | 121 | 25 | 157 | 93 | 22 | 34 | 33 | 39 | 19 | 46 | 150 | 141 | 12 | 9 | 79 | 118 | 24 | 17 | 85 | 117 |
| 67 | 58 | 129 | 160 | 89 | 61 | 146 | 77 | 130 | 102 | 101 | 137 | 94 | 69 | 14 | 133 | 60 | 149 | 136 | 16 | 108 | 41 |
| 90 | 28 | 144 | 13 | 175 | 114 | 2 | 18 | 63 | 68 | 21 | 109 | 53 | 123 | 75 | 81 | 143 | 169 | 42 | 119 | 138 | 104 |
| 4 | 131 | 145 | 8 | 5 | 76 | 15 | 88 | 177 | 124 | 45 | 97 | 64 | 100 | 37 | 132 | 38 | 44 | 107 | 35 | 43 | 80 |
| 50 | 91 | 152 | 78 | 166 | 55 | 115 | 170 | 159 | 147 | 167 | 87 | 83 | 29 | 96 | 172 | 48 | 98 | 62 | 139 | 70 | 164 |
| 84 | 47 | 151 | 134 | 126 | 113 | 179 | 110 | 111 | 128 | 32 | 52 | 66 | 40 | 135 | 176 | 99 | 127 | 163 | 3 | 120 | 71 |
| 56 | 92 | 23 | 20 | | | | | | | | | | | | | | | | | | |

FIG. 100

BIT GROUP

| | | | | | | | | | | | | | | | | | | | | |
|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇔

| | | | | | | | | | | | | | | | | | | | | |
|---|---|---|---|---|---|---|---|---|---|---|---|---|---|---|---|---|---|---|---|---|
| 139 | 106 | 125 | 81 | 88 | 104 | 3 | 66 | 60 | 65 | 2 | 95 | 155 | 24 | 151 | 5 | 51 | 53 | 29 | 75 | 52 | 85 |
| 8 | 22 | 98 | 93 | 168 | 15 | 86 | 126 | 173 | 100 | 130 | 176 | 20 | 10 | 87 | 92 | 175 | 36 | 143 | 110 | 67 | 146 |
| 149 | 127 | 133 | 42 | 84 | 64 | 78 | 1 | 48 | 159 | 79 | 138 | 46 | 112 | 164 | 31 | 152 | 57 | 144 | 69 | 27 | 136 |
| 122 | 170 | 132 | 171 | 129 | 115 | 107 | 134 | 89 | 157 | 113 | 119 | 135 | 45 | 148 | 83 | 114 | 71 | 128 | 161 | 140 | 26 |
| 13 | 59 | 38 | 35 | 96 | 28 | 0 | 80 | 174 | 137 | 49 | 16 | 101 | 74 | 179 | 91 | 44 | 55 | 169 | 131 | 163 | 123 |
| 145 | 162 | 108 | 178 | 12 | 77 | 167 | 21 | 154 | 82 | 54 | 90 | 177 | 17 | 41 | 39 | 7 | 102 | 156 | 62 | 109 | 14 |
| 37 | 23 | 153 | 6 | 147 | 50 | 47 | 63 | 18 | 70 | 68 | 124 | 72 | 33 | 158 | 32 | 118 | 99 | 105 | 94 | 25 | 121 |
| 166 | 120 | 160 | 141 | 165 | 111 | 19 | 150 | 87 | 76 | 73 | 142 | 117 | 4 | 172 | 58 | 11 | 30 | 9 | 103 | 40 | 61 |
| 43 | 34 | 56 | 116 | | | | | | | | | | | | | | | | | | |

FIG. 101

BIT GROUP

| | | | | | | | | | | | | | | | | | | | | |
|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

| | | | | | | | | | | | | | | | | | | | | |
|---|---|---|---|---|---|---|---|---|---|---|---|---|---|---|---|---|---|---|---|---|
| 72 | 59 | 65 | 61 | 80 | 2 | 66 | 23 | 69 | 101 | 19 | 16 | 53 | 109 | 74 | 106 | 113 | 56 | 97 | 30 | 164 | 15 |
| 25 | 20 | 117 | 76 | 50 | 82 | 178 | 13 | 169 | 36 | 107 | 40 | 122 | 138 | 42 | 96 | 27 | 163 | 46 | 64 | 124 | 57 |
| 87 | 120 | 168 | 166 | 39 | 177 | 22 | 67 | 134 | 9 | 102 | 28 | 148 | 91 | 83 | 88 | 167 | 32 | 99 | 140 | 60 | 152 |
| 1 | 123 | 29 | 154 | 26 | 70 | 149 | 171 | 12 | 6 | 55 | 100 | 62 | 86 | 114 | 174 | 132 | 139 | 7 | 45 | 103 | 130 |
| 31 | 49 | 151 | 119 | 79 | 41 | 118 | 126 | 3 | 179 | 110 | 111 | 51 | 93 | 145 | 73 | 133 | 54 | 104 | 161 | 37 | 129 |
| 63 | 38 | 95 | 159 | 89 | 112 | 115 | 136 | 33 | 68 | 17 | 35 | 137 | 173 | 143 | 78 | 77 | 141 | 150 | 58 | 158 | 125 |
| 156 | 24 | 105 | 98 | 43 | 84 | 92 | 128 | 165 | 153 | 108 | 0 | 121 | 170 | 131 | 144 | 47 | 157 | 11 | 155 | 176 | 48 |
| 135 | 4 | 116 | 146 | 127 | 52 | 162 | 142 | 8 | 5 | 34 | 85 | 90 | 44 | 172 | 94 | 160 | 175 | 75 | 71 | 18 | 147 |
| 10 | 21 | 14 | 81 | | | | | | | | | | | | | | | | | | |

FIG. 102

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 8 | 27 | 7 | 70 | 75 | 84 | 50 | 131 | 146 | 99 | 96 | 141 | 155 | 157 | 82 | 57 | 120 | 38 | 137 | 13 | 83 | 23 |
| 40 | 9 | 56 | 171 | 124 | 172 | 39 | 142 | 20 | 128 | 133 | 2 | 89 | 153 | 103 | 112 | 129 | 151 | 162 | 106 | 14 | 62 |
| 107 | 110 | 73 | 71 | 177 | 154 | 80 | 176 | 24 | 91 | 32 | 173 | 25 | 16 | 17 | 159 | 21 | 92 | 6 | 67 | 81 | 37 |
| 15 | 136 | 100 | 64 | 102 | 163 | 168 | 18 | 78 | 76 | 45 | 140 | 123 | 118 | 58 | 122 | 11 | 19 | 86 | 98 | 119 | 111 |
| 26 | 138 | 125 | 74 | 97 | 63 | 10 | 152 | 161 | 175 | 87 | 52 | 60 | 22 | 79 | 104 | 30 | 158 | 54 | 145 | 49 | 34 |
| 166 | 109 | 179 | 174 | 93 | 41 | 116 | 48 | 3 | 29 | 134 | 167 | 105 | 132 | 114 | 169 | 147 | 144 | 77 | 61 | 170 | 90 |
| 178 | 0 | 43 | 149 | 130 | 117 | 47 | 44 | 36 | 115 | 88 | 101 | 148 | 69 | 46 | 94 | 143 | 164 | 139 | 126 | 160 | 156 |
| 33 | 113 | 65 | 121 | 53 | 42 | 66 | 165 | 85 | 127 | 135 | 5 | 55 | 150 | 72 | 35 | 31 | 51 | 4 | 1 | 68 | 12 |
| 28 | 95 | 59 | 108 | | | | | | | | | | | | | | | | | | |

FIG. 103

BIT GROUP

| | | | | | | | | | | | | | | | | | | | | |
|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

| | | | | | | | | | | | | | | | | | | | | |
|---|---|---|---|---|---|---|---|---|---|---|---|---|---|---|---|---|---|---|---|---|
| 0 | 2 | 4 | 6 | 8 | 10 | 12 | 14 | 16 | 18 | 20 | 22 | 24 | 26 | 28 | 30 | 32 | 34 | 36 | 38 | 40 | 42 |
| 44 | 46 | 48 | 50 | 52 | 54 | 56 | 58 | 60 | 62 | 64 | 66 | 68 | 70 | 72 | 74 | 76 | 78 | 80 | 82 | 84 | 86 |
| 88 | 90 | 92 | 94 | 96 | 98 | 100 | 102 | 104 | 106 | 108 | 110 | 112 | 114 | 116 | 118 | 120 | 122 | 124 | 126 | 128 | 130 |
| 132 | 134 | 136 | 138 | 140 | 142 | 144 | 146 | 148 | 150 | 152 | 154 | 156 | 158 | 160 | 162 | 164 | 166 | 168 | 170 | 172 | 174 |
| 176 | 178 | 1 | 3 | 5 | 7 | 9 | 11 | 13 | 15 | 17 | 19 | 21 | 23 | 25 | 27 | 29 | 31 | 33 | 35 | 37 | 39 |
| 41 | 43 | 45 | 47 | 49 | 51 | 53 | 55 | 57 | 59 | 61 | 63 | 65 | 67 | 69 | 71 | 73 | 75 | 77 | 79 | 81 | 83 |
| 85 | 87 | 89 | 91 | 93 | 95 | 97 | 99 | 101 | 103 | 105 | 107 | 109 | 111 | 113 | 115 | 117 | 119 | 121 | 123 | 125 | 127 |
| 129 | 131 | 133 | 135 | 137 | 139 | 141 | 143 | 145 | 147 | 149 | 151 | 153 | 155 | 157 | 159 | 161 | 163 | 165 | 167 | 169 | 171 |
| 173 | 175 | 177 | 179 | | | | | | | | | | | | | | | | | | |

FIG. 104

BIT GROUP

| | | | | | | | | | | | | | | | | | | | | |
|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

| | | | | | | | | | | | | | | | | | | | | |
|---|---|---|---|---|---|---|---|---|---|---|---|---|---|---|---|---|---|---|---|---|
| 11 | 5 | 8 | 18 | 1 | 25 | 32 | 31 | 19 | 21 | 50 | 102 | 65 | 85 | 45 | 86 | 98 | 104 | 64 | 78 | 72 | 53 |
| 103 | 79 | 93 | 41 | 82 | 108 | 112 | 116 | 120 | 124 | 128 | 132 | 136 | 140 | 144 | 148 | 152 | 156 | 160 | 164 | 168 | 172 |
| 176 | 4 | 12 | 15 | 3 | 10 | 20 | 28 | 34 | 23 | 33 | 68 | 63 | 69 | 92 | 44 | 90 | 75 | 56 | 100 | 47 | 106 |
| 42 | 39 | 97 | 99 | 89 | 52 | 109 | 113 | 117 | 121 | 125 | 129 | 133 | 137 | 141 | 145 | 149 | 153 | 157 | 161 | 165 | 169 |
| 173 | 177 | 6 | 16 | 14 | 7 | 13 | 36 | 28 | 29 | 37 | 73 | 70 | 54 | 76 | 91 | 66 | 80 | 88 | 51 | 96 | 81 |
| 95 | 38 | 57 | 105 | 107 | 59 | 61 | 110 | 114 | 118 | 122 | 126 | 130 | 134 | 138 | 142 | 146 | 150 | 154 | 158 | 162 | 166 |
| 170 | 174 | 178 | 0 | 9 | 17 | 2 | 27 | 30 | 24 | 22 | 35 | 77 | 74 | 46 | 94 | 62 | 87 | 83 | 101 | 49 | 43 |
| 84 | 48 | 60 | 67 | 71 | 58 | 40 | 55 | 111 | 115 | 119 | 123 | 127 | 131 | 135 | 139 | 143 | 147 | 151 | 155 | 159 | 163 |
| 167 | 171 | 175 | 179 | | | | | | | | | | | | | | | | | | |

FIG. 105

BIT GROUP

| | | | | | | | | | | | | | | | | | | | | |
|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

| | | | | | | | | | | | | | | | | | | | | |
|---|---|---|---|---|---|---|---|---|---|---|---|---|---|---|---|---|---|---|---|---|
| 9 | 18 | 15 | 13 | 35 | 26 | 28 | 99 | 40 | 68 | 85 | 58 | 63 | 104 | 50 | 52 | 94 | 69 | 108 | 114 | 120 | 126 |
| 132 | 138 | 144 | 150 | 156 | 162 | 168 | 174 | 8 | 16 | 17 | 24 | 37 | 23 | 22 | 103 | 64 | 43 | 47 | 56 | 92 | 59 |
| 70 | 42 | 106 | 60 | 109 | 115 | 121 | 127 | 133 | 139 | 145 | 151 | 157 | 163 | 169 | 175 | 4 | 1 | 10 | 19 | 30 | 31 |
| 89 | 86 | 77 | 81 | 51 | 79 | 83 | 48 | 45 | 62 | 67 | 65 | 110 | 116 | 122 | 128 | 134 | 140 | 146 | 152 | 158 | 164 |
| 170 | 176 | 6 | 2 | 0 | 25 | 20 | 34 | 98 | 105 | 82 | 96 | 90 | 107 | 53 | 74 | 73 | 93 | 55 | 102 | 111 | 117 |
| 123 | 129 | 135 | 141 | 147 | 153 | 159 | 165 | 171 | 177 | 14 | 7 | 3 | 27 | 21 | 33 | 44 | 97 | 38 | 75 | 72 | 41 |
| 84 | 80 | 100 | 87 | 76 | 57 | 112 | 118 | 124 | 130 | 136 | 142 | 148 | 154 | 160 | 166 | 172 | 178 | 5 | 11 | 12 | 32 |
| 29 | 36 | 88 | 71 | 78 | 95 | 49 | 54 | 61 | 66 | 46 | 39 | 101 | 91 | 113 | 119 | 125 | 131 | 137 | 143 | 149 | 155 |
| 161 | 167 | 173 | 179 | | | | | | | | | | | | | | | | | | |

FIG. 106

BIT GROUP

| | | | | | | | | | | | | | | | | | | | | |
|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇔

| | | | | | | | | | | | | | | | | | | | | |
|---|---|---|---|---|---|---|---|---|---|---|---|---|---|---|---|---|---|---|---|---|
| 0 | 14 | 19 | 21 | 2 | 11 | 22 | 9 | 8 | 7 | 16 | 3 | 26 | 24 | 27 | 80 | 100 | 121 | 107 | 31 | 36 | 42 |
| 46 | 49 | 75 | 93 | 127 | 95 | 119 | 73 | 61 | 63 | 117 | 89 | 99 | 129 | 52 | 111 | 124 | 48 | 122 | 82 | 106 | 91 |
| 92 | 71 | 103 | 102 | 81 | 113 | 101 | 97 | 33 | 115 | 59 | 112 | 90 | 51 | 126 | 85 | 123 | 40 | 83 | 53 | 69 | 70 |
| 132 | 134 | 136 | 138 | 140 | 142 | 144 | 146 | 148 | 150 | 152 | 154 | 156 | 158 | 160 | 162 | 164 | 166 | 168 | 170 | 172 | 174 |
| 176 | 178 | 4 | 5 | 10 | 12 | 20 | 6 | 18 | 13 | 17 | 15 | 1 | 29 | 28 | 23 | 25 | 67 | 116 | 66 | 104 | 44 |
| 50 | 47 | 84 | 76 | 65 | 130 | 56 | 128 | 77 | 39 | 94 | 87 | 120 | 62 | 88 | 74 | 35 | 110 | 131 | 98 | 60 | 37 |
| 45 | 78 | 125 | 41 | 34 | 118 | 38 | 72 | 108 | 58 | 43 | 109 | 57 | 105 | 68 | 86 | 79 | 96 | 32 | 114 | 64 | 55 |
| 30 | 54 | 133 | 135 | 137 | 139 | 141 | 143 | 145 | 147 | 149 | 151 | 153 | 155 | 157 | 159 | 161 | 163 | 165 | 167 | 169 | 171 |
| 173 | 175 | 177 | 179 | | | | | | | | | | | | | | | | | | |

FIG. 107

BIT GROUP

| | | | | | | | | | | | | | | | | | | | | |
|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

| | | | | | | | | | | | | | | | | | | | | |
|---|---|---|---|---|---|---|---|---|---|---|---|---|---|---|---|---|---|---|---|---|
| 21 | 11 | 12 | 9 | 0 | 6 | 24 | 25 | 85 | 103 | 118 | 122 | 71 | 101 | 41 | 93 | 55 | 73 | 100 | 40 | 106 | 119 |
| 45 | 80 | 128 | 68 | 129 | 61 | 124 | 36 | 126 | 117 | 114 | 132 | 136 | 140 | 144 | 148 | 152 | 156 | 160 | 164 | 168 | 172 |
| 176 | 20 | 18 | 10 | 13 | 16 | 8 | 26 | 27 | 54 | 111 | 52 | 44 | 87 | 113 | 115 | 58 | 116 | 49 | 77 | 95 | 86 |
| 30 | 78 | 81 | 56 | 125 | 53 | 89 | 94 | 50 | 123 | 65 | 83 | 133 | 137 | 141 | 145 | 149 | 153 | 157 | 161 | 165 | 169 |
| 173 | 177 | 2 | 17 | 1 | 4 | 7 | 15 | 29 | 82 | 32 | 102 | 76 | 121 | 92 | 130 | 127 | 62 | 107 | 38 | 46 | 43 |
| 110 | 75 | 104 | 70 | 91 | 69 | 96 | 120 | 42 | 34 | 79 | 35 | 105 | 134 | 138 | 142 | 146 | 150 | 154 | 158 | 162 | 166 |
| 170 | 174 | 178 | 19 | 5 | 3 | 14 | 22 | 28 | 23 | 109 | 51 | 108 | 131 | 33 | 84 | 88 | 64 | 63 | 59 | 57 | 97 |
| 98 | 48 | 31 | 99 | 37 | 72 | 39 | 74 | 66 | 60 | 67 | 47 | 112 | 90 | 135 | 139 | 143 | 147 | 151 | 155 | 159 | 163 |
| 167 | 171 | 175 | 179 | | | | | | | | | | | | | | | | | | |

FIG. 108

BIT GROUP

| | | | | | | | | | | | | | | | | | | | | |
|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

| | | | | | | | | | | | | | | | | | | | | |
|---|---|---|---|---|---|---|---|---|---|---|---|---|---|---|---|---|---|---|---|---|
| 12 | 15 | 2 | 16 | 27 | 50 | 35 | 74 | 38 | 70 | 108 | 32 | 112 | 54 | 30 | 122 | 72 | 116 | 36 | 90 | 49 | 85 |
| 132 | 138 | 144 | 150 | 156 | 162 | 168 | 174 | 0 | 14 | 9 | 5 | 23 | 66 | 68 | 52 | 96 | 117 | 84 | 128 | 100 | 63 |
| 60 | 127 | 81 | 99 | 53 | 55 | 103 | 95 | 133 | 139 | 145 | 151 | 157 | 163 | 169 | 175 | 10 | 22 | 13 | 11 | 28 | 104 |
| 37 | 57 | 115 | 46 | 65 | 129 | 107 | 75 | 119 | 110 | 31 | 43 | 97 | 78 | 125 | 58 | 134 | 140 | 146 | 152 | 158 | 164 |
| 170 | 176 | 4 | 19 | 6 | 8 | 24 | 44 | 101 | 94 | 118 | 130 | 69 | 71 | 83 | 34 | 86 | 124 | 48 | 106 | 89 | 40 |
| 102 | 91 | 135 | 141 | 147 | 153 | 159 | 165 | 171 | 177 | 3 | 20 | 7 | 17 | 25 | 87 | 41 | 120 | 47 | 80 | 59 | 62 |
| 88 | 45 | 56 | 131 | 61 | 126 | 113 | 92 | 51 | 98 | 136 | 142 | 148 | 154 | 160 | 166 | 172 | 178 | 21 | 18 | 1 | 26 |
| 29 | 39 | 73 | 121 | 105 | 77 | 42 | 114 | 93 | 82 | 111 | 109 | 67 | 79 | 123 | 64 | 76 | 33 | 137 | 143 | 149 | 155 |
| 161 | 167 | 173 | 179 | | | | | | | | | | | | | | | | | | |

FIG. 109

BIT GROUP

| | | | | | | | | | | | | | | | | | | | | |
|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

| | | | | | | | | | | | | | | | | | | | | |
|---|---|---|---|---|---|---|---|---|---|---|---|---|---|---|---|---|---|---|---|---|
| 0 | 2 | 4 | 6 | 8 | 10 | 12 | 14 | 16 | 18 | 20 | 22 | 24 | 26 | 28 | 30 | 32 | 34 | 36 | 38 | 40 | 42 |
| 44 | 46 | 48 | 50 | 52 | 54 | 56 | 58 | 60 | 62 | 64 | 66 | 68 | 70 | 72 | 74 | 76 | 78 | 80 | 82 | 84 | 86 |
| 88 | 90 | 92 | 94 | 96 | 98 | 100 | 102 | 104 | 106 | 108 | 110 | 112 | 114 | 116 | 118 | 120 | 122 | 124 | 126 | 128 | 130 |
| 132 | 134 | 136 | 138 | 140 | 142 | 144 | 146 | 148 | 150 | 152 | 154 | 156 | 158 | 160 | 162 | 164 | 166 | 168 | 170 | 172 | 174 |
| 176 | 178 | 1 | 3 | 5 | 7 | 9 | 11 | 13 | 15 | 17 | 19 | 21 | 23 | 25 | 27 | 29 | 31 | 33 | 35 | 37 | 39 |
| 41 | 43 | 45 | 47 | 49 | 51 | 53 | 55 | 57 | 59 | 61 | 63 | 65 | 67 | 69 | 71 | 73 | 75 | 77 | 79 | 81 | 83 |
| 85 | 87 | 89 | 91 | 93 | 95 | 97 | 99 | 101 | 103 | 105 | 107 | 109 | 111 | 113 | 115 | 117 | 119 | 121 | 123 | 125 | 127 |
| 129 | 131 | 133 | 135 | 137 | 139 | 141 | 143 | 145 | 147 | 149 | 151 | 153 | 155 | 157 | 159 | 161 | 163 | 165 | 167 | 169 | 171 |
| 173 | 175 | 177 | 179 | | | | | | | | | | | | | | | | | | |

FIG. 110

BIT GROUP

| | | | | | | | | | | | | | | | | | | | | | |
|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

⇕

| | | | | | | | | | | | | | | | | | | | | | |
|---|---|---|---|---|---|---|---|---|---|---|---|---|---|---|---|---|---|---|---|---|---|
| 0 | 4 | 8 | 12 | 16 | 20 | 24 | 28 | 32 | 36 | 40 | 44 | 48 | 52 | 56 | 60 | 64 | 68 | 72 | 76 | 80 | 84 |
| 88 | 92 | 96 | 100 | 104 | 108 | 112 | 116 | 120 | 124 | 128 | 132 | 136 | 140 | 144 | 148 | 152 | 156 | 160 | 164 | 168 | 172 |
| 176 | 1 | 5 | 9 | 13 | 17 | 21 | 25 | 29 | 33 | 37 | 41 | 45 | 49 | 53 | 57 | 61 | 65 | 69 | 73 | 77 | 81 |
| 85 | 89 | 93 | 97 | 101 | 105 | 109 | 113 | 117 | 121 | 125 | 129 | 133 | 137 | 141 | 145 | 149 | 153 | 157 | 161 | 165 | 169 |
| 173 | 177 | 2 | 6 | 10 | 14 | 18 | 22 | 26 | 30 | 34 | 38 | 42 | 46 | 50 | 54 | 58 | 62 | 66 | 70 | 74 | 78 |
| 82 | 86 | 90 | 94 | 98 | 102 | 106 | 110 | 114 | 118 | 122 | 126 | 130 | 134 | 138 | 142 | 146 | 150 | 154 | 158 | 162 | 166 |
| 170 | 174 | 178 | 3 | 7 | 11 | 15 | 19 | 23 | 27 | 31 | 35 | 39 | 43 | 47 | 51 | 55 | 59 | 63 | 67 | 71 | 75 |
| 79 | 83 | 87 | 91 | 95 | 99 | 103 | 107 | 111 | 115 | 119 | 123 | 127 | 131 | 135 | 139 | 143 | 147 | 151 | 155 | 159 | 163 |
| 167 | 171 | 175 | 179 | | | | | | | | | | | | | | | | | | |

FIG. 111

BIT GROUP

| | | | | | | | | | | | | | | | | | | | | |
|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| 22 | 23 | 24 | 25 | 26 | 27 | 28 | 29 | 30 | 31 | 32 | 33 | 34 | 35 | 36 | 37 | 38 | 39 | 40 | 41 | 42 | 43 |
| 44 | 45 | 46 | 47 | 48 | 49 | 50 | 51 | 52 | 53 | 54 | 55 | 56 | 57 | 58 | 59 | 60 | 61 | 62 | 63 | 64 | 65 |
| 66 | 67 | 68 | 69 | 70 | 71 | 72 | 73 | 74 | 75 | 76 | 77 | 78 | 79 | 80 | 81 | 82 | 83 | 84 | 85 | 86 | 87 |
| 88 | 89 | 90 | 91 | 92 | 93 | 94 | 95 | 96 | 97 | 98 | 99 | 100 | 101 | 102 | 103 | 104 | 105 | 106 | 107 | 108 | 109 |
| 110 | 111 | 112 | 113 | 114 | 115 | 116 | 117 | 118 | 119 | 120 | 121 | 122 | 123 | 124 | 125 | 126 | 127 | 128 | 129 | 130 | 131 |
| 132 | 133 | 134 | 135 | 136 | 137 | 138 | 139 | 140 | 141 | 142 | 143 | 144 | 145 | 146 | 147 | 148 | 149 | 150 | 151 | 152 | 153 |
| 154 | 155 | 156 | 157 | 158 | 159 | 160 | 161 | 162 | 163 | 164 | 165 | 166 | 167 | 168 | 169 | 170 | 171 | 172 | 173 | 174 | 175 |
| 176 | 177 | 178 | 179 | | | | | | | | | | | | | | | | | | |

| | | | | | | | | | | | | | | | | | | | | |
|---|---|---|---|---|---|---|---|---|---|---|---|---|---|---|---|---|---|---|---|---|
| 8 | 112 | 92 | 165 | 12 | 55 | 5 | 126 | 87 | 70 | 69 | 94 | 103 | 78 | 137 | 148 | 9 | 60 | 13 | 7 | 178 | 79 |
| 43 | 136 | 34 | 68 | 118 | 152 | 49 | 15 | 99 | 61 | 66 | 28 | 109 | 125 | 33 | 167 | 81 | 93 | 97 | 26 | 35 | 30 |
| 153 | 131 | 122 | 71 | 107 | 130 | 76 | 4 | 95 | 42 | 58 | 134 | 0 | 89 | 75 | 40 | 129 | 31 | 80 | 101 | 52 | 16 |
| 142 | 44 | 138 | 46 | 116 | 27 | 82 | 88 | 143 | 128 | 72 | 29 | 83 | 117 | 172 | 14 | 51 | 159 | 48 | 160 | 100 | 1 |
| 102 | 90 | 22 | 3 | 114 | 19 | 108 | 113 | 39 | 73 | 111 | 155 | 106 | 105 | 91 | 150 | 54 | 25 | 135 | 139 | 147 | 36 |
| 56 | 123 | 6 | 67 | 104 | 96 | 157 | 10 | 62 | 164 | 86 | 74 | 133 | 120 | 174 | 53 | 140 | 156 | 171 | 149 | 127 | 85 |
| 59 | 124 | 84 | 11 | 21 | 132 | 41 | 145 | 158 | 32 | 17 | 23 | 50 | 169 | 170 | 38 | 18 | 151 | 24 | 166 | 175 | 2 |
| 47 | 57 | 98 | 20 | 177 | 161 | 154 | 176 | 163 | 37 | 110 | 168 | 141 | 64 | 65 | 173 | 162 | 121 | 45 | 77 | 115 | 179 |
| 63 | 119 | 146 | 144 | | | | | | | | | | | | | | | | | | |

DATA PROCESSING DEVICE AND DATA PROCESSING METHOD

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*This application is a continuation reissue of application Ser. No. 16/381,936, filed Apr. 11, 2019, which is an application for reissue of U.S. Pat. No. 9,621,191, which issued from a U.S. national stage application of PCT Application No. PCT/JP2015/053181, filed on Feb. 5, 2015, and is based upon and claims the benefit of priority from prior Japanese Application No. 2014-030012, filed on Feb. 19, 2014. The entire contents of the above-identified documents are incorporated herein by reference.*

TECHNICAL FIELD

The present technology relates to a data processing device and a data processing method, and particularly to a data processing device and a data processing method which can ensure excellent communication quality in data transmission using, for example, an LDPC code.

BACKGROUND ART

Some information used in the present specification and drawings was provided by Samsung Electronics Co., Ltd. (hereinafter referred to as Samsung), LG Electronics Inc., NERC, and CRC/ETRI (which is clarified in the drawings).

A Low Density Parity Check (LDPC) code has a high error correcting capability and has been widely adopted in transmission systems for digital broadcasting, for example, Digital Video Broadcasting (DVB)-S.2, DVB-T.2, and DVB-C.2 of Europe, Advanced Television Systems Committee (ATSC) 3.0 of the U.S., and the like in recent years (for example, refer to Non-Patent Literature 1).

From a recent study, it is known that performance near a Shannon limit is obtained from the LDPC code when a code length increases, similar to a turbo code. Because the LDPC code has a property that a shortest distance is proportional to the code length, the LDPC code has advantages of a block error probability characteristic being superior and a so-called error floor phenomenon observed in a decoding characteristic of the turbo code being rarely generated, as characteristics thereof.

CITATION LIST

Non-Patent Literature

Non-Patent Literature 1: DVB-S.2: ETSI EN 302 307 V1.2.1 (August 2009)

SUMMARY OF INVENTION

Technical Problem

In data transmission using LDPC codes, for example, an LDPC code serves as a symbol (becomes a symbol) of quadrature modulation (digital modulation) such as Quadrature Phase Shift Keying (QPSK), and the symbol is mapped to a signal point of the quadrature modulation and is transmitted.

Such data transmission using LDPC codes continues to become widespread worldwide and ensuring communication (transmission) quality is being demanded.

The present technology takes the above situation into account, and aims to ensure excellent communication quality in data transmission using LDPC codes.

Solution to Problem

A first data processing device/method according to the present technology includes: an encoding unit/step configured to perform LDPC encoding based on a parity check matrix of an LDPC code having a code length N of 64800 bits and an encoding rate r of 5/15; a group-wise interleaving unit/step configured to perform group-wise interleaving of interleaving the LDPC code in a unit of a bit group of 360 bits; and a mapping unit/step configured to map the LDPC code to any one of four signal points decided using a modulation method in a unit of 2 bits. In the group-wise interleaving, setting an i+1-th bit group from a head of the LDPC code as a bit group i, arrangement of bit groups 0 to 179 of the LDPC code of 64800 bits is interleaved into arrangement of bit groups 39, 47, 96, 176, 33, 75, 165, 38, 27, 58, 90, 76, 17, 46, 10, 91, 133, 69, 171, 32, 117, 78, 13, 146, 101, 36, 0, 138, 25, 77, 122, 49, 14, 125, 140, 93, 130, 2, 104, 102, 128, 4, 111, 151, 84, 167, 35, 127, 156, 55, 82, 85, 66, 114, 8, 147, 115, 113, 5, 31, 100, 106, 48, 52, 67, 107, 18, 126, 112, 50, 9, 143, 28, 160, 71, 79, 43, 98, 86, 94, 64, 3, 166, 105, 103, 118, 63, 51, 139, 172, 141, 175, 56, 74, 95, 29, 45, 129, 120, 168, 92, 150, 7, 162, 153, 137, 108, 159, 157, 173, 23, 89, 132, 57, 37, 70, 134, 40, 21, 149, 80, 1, 121, 59, 110, 142, 152, 15, 154, 145, 12, 170, 54, 155, 99, 22, 123, 72, 177, 131, 116, 44, 158, 73, 11, 65, 164, 119, 174, 34, 83, 53, 24, 42, 60, 26, 161, 68, 178, 41, 148, 109, 87, 144, 135, 20, 62, 81, 169, 124, 6, 19, 30, 163, 61, 179, 136, 97, 16, and 88.

The parity check matrix includes an A matrix which is on an upper left of the parity check matrix having g rows and K columns represented with a predetermined value g and an information length K=N×r of the LDPC code, a B matrix which has a staircase structure close to a right side of the A matrix having g rows and g columns, a Z matrix which is a zero matrix close to a right side of the B matrix having g rows and N−K−g columns, a C matrix which is close to a bottom side of the A matrix and the B matrix having N−K−g rows and K+g columns, and a D matrix which is a unit matrix close to a right side of the C matrix having N−K−g rows and N−K−g columns. The predetermined value g is 1440. The A matrix and the C matrix are expressed using a parity check matrix initial value table. The parity check matrix initial value table is a table representing positions of elements of 1 of the A matrix and the C matrix for every 360 columns, the table including 221 1011 1218 4299 7143 8728 11072 15533 17356 33909 36833

360 1210 1375 2313 3493 16822 21373 23588 23656 26267 34098

544 1347 1433 2457 9186 10945 13583 14858 19195 34606 37441

37 596 715 4134 8091 12106 24307 24658 34108 40591 42883

235 398 1204 2075 6742 11670 13512 23231 24784 27915 34752

204 873 890 13550 16570 19774 34012 35249 37655 39885 42890
221 371 514 11984 14972 15690 28827 29069 30531 31018 43121
280 549 1435 1889 3310 10234 11575 15243 20748 30469 36005
223 666 1248 13304 14433 14732 18943 21248 23127 38529 39272
370 819 1065 9461 10319 25294 31958 33542 37458 39681 40039
585 870 1028 5087 5216 12228 16216 16381 16937 27132 27893
164 167 1210 7386 11151 20413 22713 23134 24188 36771 38992
298 511 809 4620 7347 8873 19602 24162 29198 34304 41145
105 830 1212 2415 14759 15440 16361 16748 22123 32684 42575
659 665 668 6458 22130 25972 30697 31074 32048 36078 37129
91 808 953 8015 8988 13492 13987 15979 28355 34509 39698
594 983 1265 3028 4029 9366 11069 11512 27066 40939 41639
506 740 1321 1484 10747 16376 17384 20285 31502 38925 42606
338 356 975 2022 3578 18689 18772 19826 22914 24733 27431
709 1264 1366 4617 8893 25226 27800 29080 30277 37781 39644
840 1179 1338 2973 3541 7043 12712 15005 17149 19910 36795
1009 1267 1380 4919 12679 22889 29638 30987 34637 36232 37284
466 913 1247 1646 3049 5924 9014 20539 34546 35029 36540
374 697 984 1654 5870 10883 11684 20294 28888 31612 34031
117 240 635 5093 8673 11323 12456 14145 21397 39619 42559
122 1265 1427 13528 14282 15241 16852 17227 34723 36836 39791
595 1180 1310 6952 17916 24725 24971 27243 29555 32138 35987
140 470 1017 13222 13253 18462 20806 21117 28673 31598 37235
7 710 1072 8014 10804 13303 14292 16690 26676 36443 41966
48 189 759 12438 14523 16388 23178 27315 28656 29111 29694
285 387 410 4294 4467 5949 25386 27898 34880 41169 42614
474 545 1320 10506 13186 18126 27110 31498 35353 36193 37322
1075 1130 1424 11390 13312 14161 16927 25071 25844 34287 38151
161 396 427 5944 17281 22201 25218 30143 35566 38261 42513
233 247 694 1446 3180 3507 9069 20764 21940 33422 39358
271 508 1013 6271 21760 21858 24887 29808 31099 35475 39924
8 674 1329 3135 5110 14460 28108 28388 31043 31137 31863
1035 1222 1409 8287 16083 24450 24888 29356 30329 37834 39684
391 1090 1128 1866 4095 10643 13121 14499 20056 22195 30593
55 161 1402 6289 6837 8791 17937 21425 26602 30461 37241
110 377 1228 6875 13253 17032 19008 23274 32285 33452 41630
360 638 1355 5933 12593 13533 23377 23881 24586 26040 41663
535 1240 1333 3354 10860 16032 32573 34908 34957 39255 40759
526 936 1321 7992 10260 18527 28248 29356 32636 34666 35552
336 785 875 7530 13062 13075 18925 27963 28703 33688 36502
36 591 1062 1518 3821 7048 11197 17781 19408 22731 24783
214 1145 1223 1546 9475 11170 16061 21273 38688 40051 42479
1136 1226 1423 20227 22573 24951 26462 29586 34915 42441 43048
26 276 1425 6048 7224 7917 8747 27559 28515 35002 37649
127 294 437 4029 8585 9647 11904 24115 28514 36893 39722
748 1093 1403 9536 19305 20468 31049 38667 40502 40720 41949
96 638 743 9806 12101 17751 22732 24937 32007 32594 38504
649 904 1079 2770 3337 9158 20125 24619 32921 33698 35173
401 518 984 7372 12438 12582 18704 35874 39420 39503 39790
10 451 1077 8078 16320 17409 25807 28814 30613 41261 42955
405 592 1178 15936 18418 19585 21966 24219 30637 34536 37838
50 584 851 9720 11919 22544 22545 25851 35567 41587 41876
911 1113 1176 1806 10058 10809 14220 19044 20748 29424 36671
441 550 1135 1956 11254 18699 30249 33099 34587 35243 39952
510 1016 1281 8621 13467 13780 15170 16289 20925 26426 34479
4969 5223 17117 21950 22144 24043 27151 39809
11452 13622 18918 19670 23995 32647 37200 37399
6351 6426 13185 13973 16699 22524 31070 31916
4098 10617 14854 18004 28580 36158 37500 38552.

In the above-described first data processing device/method, LDPC encoding based on a parity check matrix of an LDPC code having a code length N of 64800 bits and an encoding rate r of 5/15 is performed; group-wise interleaving of interleaving the LDPC code is performed in a unit of a bit group of 360 bits; and the LDPC code is mapped to any one of four signal points decided using a modulation method in a unit of 2 bits. In the group-wise interleaving, setting an i+1-th bit group from a head of the LDPC code as a bit group i, arrangement of bit groups 0 to 179 of the LDPC code of 64800 bits is interleaved into arrangement of bit groups 39, 47, 96, 176, 33, 75, 165, 38, 27, 58, 90, 76, 17, 46, 10, 91, 133, 69, 171, 32, 117, 78, 13, 146, 101, 36, 0, 138, 25, 77, 122, 49, 14, 125, 140, 93, 130, 2, 104, 102, 128, 4, 111, 151, 84, 167, 35, 127, 156, 55, 82, 85, 66, 114, 8, 147, 115, 113, 5, 31, 100, 106, 48, 52, 67, 107, 18, 126, 112, 50, 9, 143, 28, 160, 71, 79, 43, 98, 86, 94, 64, 3, 166, 105, 103, 118, 63, 51, 139, 172, 141, 175, 56, 74, 95, 29, 45, 129, 120, 168, 92, 150, 7, 162, 153, 137, 108, 159, 157, 173, 23, 89, 132, 57, 37, 70, 134, 40, 21, 149, 80, 1, 121, 59, 110, 142, 152, 15, 154, 145, 12, 170, 54, 155, 99, 22, 123, 72, 177, 131, 116, 44, 158, 73, 11, 65, 164, 119, 174, 34, 83, 53, 24, 42, 60, 26, 161, 68, 178, 41, 148, 109, 87, 144, 135, 20, 62, 81, 169, 124, 6, 19, 30, 163, 61, 179, 136, 97, 16, and 88.

The parity check matrix includes an A matrix which is on an upper left of the parity check matrix having g rows and K columns represented with a predetermined value g and an information length K=N×r of the LDPC code, a B matrix which has a staircase structure close to a right side of the A matrix having g rows and g columns, a Z matrix which is a zero matrix close to a right side of the B matrix having g rows and N−K−g columns, a C matrix which is close to a bottom side of the A matrix and the B matrix having N−K−g rows and K+g columns, and a D matrix which is a unit matrix close to a right side of the C matrix having N−K−g rows and N−K−g columns. The predetermined value g is 1440. The A matrix and the C matrix are expressed using a parity check matrix initial value table. The parity check matrix initial value table is a table representing positions of elements of 1 of the A matrix and the C matrix for every 360 columns, the table including 221 1011 1218 4299 7143 8728 11072 15533 17356 33909 36833
360 1210 1375 2313 3493 16822 21373 23588 23656 26267 34098
544 1347 1433 2457 9186 10945 13583 14858 19195 34606 37441
37 596 715 4134 8091 12106 24307 24658 34108 40591 42883
235 398 1204 2075 6742 11670 13512 23231 24784 27915 34752
204 873 890 13550 16570 19774 34012 35249 37655 39885 42890
221 371 514 11984 14972 15690 28827 29069 30531 31018 43121
280 549 1435 1889 3310 10234 11575 15243 20748 30469 36005
223 666 1248 13304 14433 14732 18943 21248 23127 38529 39272
370 819 1065 9461 10319 25294 31958 33542 37458 39681 40039
585 870 1028 5087 5216 12228 16216 16381 16937 27132 27893
164 167 1210 7386 11151 20413 22713 23134 24188 36771 38992
298 511 809 4620 7347 8873 19602 24162 29198 34304 41145
105 830 1212 2415 14759 15440 1 6361 16748 22123 32684 42575
659 665 668 6458 22130 25972 30697 31074 32048 36078 37129
91 808 953 8015 8988 13492 13987 15979 28355 34509 39698
594 983 1265 3028 4029 9366 11069 11512 27066 40939 41639
506 740 1321 1484 10747 16376 17384 20285 31502 38925 42606
338 356 975 2022 3578 18689 18772 19826 22914 24733 27431
709 1264 1366 4617 8893 25226 27800 29080 30277 37781 39644
840 1179 1338 2973 3541 7043 12712 15005 17149 19910 36795
1009 1267 1380 4919 12679 22889 29638 30987 34637 36232 37284
466 913 1247 1646 3049 5924 9014 20539 34546 35029 36540
374 697 984 1654 5870 10883 11684 20294 28888 31612 34031
117 240 635 5093 8673 11323 12456 14145 21397 39619 42559
122 1265 1427 13528 14282 15241 16852 17227 34723 36836 39791
595 1180 1310 6952 17916 24725 24971 27243 29555 32138 35987
140 470 1017 13222 13253 18462 20806 21117 28673 31598 37235
7 710 1072 8014 10804 13303 14292 16690 26676 36443 41966
48 189 759 12438 14523 16388 23178 27315 28656 29111 29694
285 387 410 4294 4467 5949 25386 27898 34880 41169 42614
474 545 1320 10506 13186 18126 27110 31498 35353 36193 37322
1075 1130 1424 11390 13312 14161 16927 25071 25844 34287 38151
161 396 427 5944 17281 22201 25218 30143 35566 38261 42513
233 247 694 1446 3180 3507 9069 20764 21940 33422 39358
271 508 1013 6271 21760 21858 24887 29808 31099 35475 39924
8 674 1329 3135 5110 14460 28108 28388 31043 31137 31863
1035 1222 1409 8287 16083 24450 24888 29356 30329 37834 39684
391 1090 1128 1866 4095 10643 13121 14499 20056 22195 30593
55 161 1402 6289 6837 8791 17937 21425 26602 30461 37241
110 377 1228 6875 13253 17032 19008 23274 32285 33452 41630
360 638 1355 5933 12593 13533 23377 23881 24586 26040 41663
535 1240 1333 3354 10860 16032 32573 34908 34957 39255 40759
526 936 1321 7992 10260 18527 28248 29356 32636 34666 35552
336 785 875 7530 13062 13075 18925 27963 28703 33688 36502
36 591 1062 1518 3821 7048 11197 17781 19408 22731 24783
214 1145 1223 1546 9475 11170 16061 21273 38688 40051 42479
1136 1226 1423 20227 22573 24951 26462 29586 34915 42441 43048
26 276 1425 6048 7224 7917 8747 27559 28515 35002 37649
127 294 437 4029 8585 9647 11904 24115 28514 36893 39722
748 1093 1403 9536 19305 20468 31049 38667 40502 40720 41949
96 638 743 9806 12101 17751 22732 24937 32007 32594 38504
649 904 1079 2770 3337 9158 20125 24619 32921 33698 35173
401 518 984 7372 12438 12582 18704 35874 39420 39503 39790
10 451 1077 8078 16320 17409 25807 28814 30613 41261 42955

405 592 1178 15936 18418 19585 21966 24219 30637 34536 37838
50 584 851 9720 11919 22544 22545 25851 35567 41587 41876
911 1113 1176 1806 10058 10809 14220 19044 20748 29424 36671
441 550 1135 1956 11254 18699 30249 33099 34587 35243 39952
510 1016 1281 8621 13467 13780 15170 16289 20925 26426 34479
4969 5223 17117 21950 22144 24043 27151 39809
11452 13622 18918 19670 23995 32647 37200 37399
6351 6426 13185 13973 16699 22524 31070 31916
4098 10617 14854 18004 28580 36158 37500 38552.

A second data processing device/method according to the present technology includes: a group-wise deinterleaving unit/step configured to return an arrangement of the LDPC code that has undergone group-wise interleaving obtained from data transmitted from a transmitting device to an original arrangement, the transmitting device including an encoding unit configured to perform LDPC encoding based on a parity check matrix of an LDPC code having a code length N of 64800 bits and an encoding rate r of 5/15; a group-wise interleaving unit configured to perform group-wise interleaving of interleaving the LDPC code in a unit of a bit group of 360 bits; and a mapping unit configured to map the LDPC code to any one of four signal points decided using a modulation method in a unit of 2 bits. In the group-wise interleaving, setting an i+1-th bit group from a head of the LDPC code as a bit group i, arrangement of bit groups 0 to 179 of the LDPC code of 64800 bits is interleaved into arrangement of bit groups 39, 47, 96, 176, 33, 75, 165, 38, 27, 58, 90, 76, 17, 46, 10, 91, 133, 69, 171, 32, 117, 78, 13, 146, 101, 36, 0, 138, 25, 77, 122, 49, 14, 125, 140, 93, 130, 2, 104, 102, 128, 4, 111, 151, 84, 167, 35, 127, 156, 55, 82, 85, 66, 114, 8, 147, 115, 113, 5, 31, 100, 106, 48, 52, 67, 107, 18, 126, 112, 50, 9, 143, 28, 160, 71, 79, 43, 98, 86, 94, 64, 3, 166, 105, 103, 118, 63, 51, 139, 172, 141, 175, 56, 74, 95, 29, 45, 129, 120, 168, 92, 150, 7, 162, 153, 137, 108, 159, 157, 173, 23, 89, 132, 57, 37, 70, 134, 40, 21, 149, 80, 1, 121, 59, 110, 142, 152, 15, 154, 145, 12, 170, 54, 155, 99, 22, 123, 72, 177, 131, 116, 44, 158, 73, 11, 65, 164, 119, 174, 34, 83, 53, 24, 42, 60, 26, 161, 68, 178, 41, 148, 109, 87, 144, 135, 20, 62, 81, 169, 124, 6, 19, 30, 163, 61, 179, 136, 97, 16, and 88.

The parity check matrix includes an A matrix which is on an upper left of the parity check matrix having g rows and K columns represented with a predetermined value g and an information length K=N×r of the LDPC code, a B matrix which has a staircase structure close to a right side of the A matrix having g rows and g columns, a Z matrix which is a zero matrix close to a right side of the B matrix having g rows and N−K−g columns, a C matrix which is close to a bottom side of the A matrix and the B matrix having N−K−g rows and K+g columns, and a D matrix which is a unit matrix close to a right side of the C matrix having N−K−g rows and N−K−g columns. The predetermined value g is 1440. The A matrix and the C matrix are expressed using a parity check matrix initial value table. The parity check matrix initial value table is a table representing positions of elements of 1 of the A matrix and the C matrix for every 360 columns, the table including 221 1011 1218 4299 7143 8728 11072 15533 17356 33909 36833
360 1210 1375 2313 3493 16822 21373 23588 23656 26267 34098
544 1347 1433 2457 9186 10945 13583 14858 19195 34606 37441
37 596 715 4134 8091 12106 24307 24658 34108 40591 42883
235 398 1204 2075 6742 11670 13512 23231 24784 27915 34752
204 873 890 13550 16570 19774 34012 35249 37655 39885 42890
221 371 514 11984 14972 15690 28827 29069 30531 31018 43121
280 549 1435 1889 3310 10234 11575 15243 20748 30469 36005
223 666 1248 13304 14433 14732 18943 21248 23127 38529 39272
370 819 1065 9461 10319 25294 31958 33542 37458 39681 40039
585 870 1028 5087 5216 12228 16216 16381 16937 27132 27893
164 167 1210 7386 11151 20413 22713 23134 24188 36771 38992
298 511 809 4620 7347 8873 19602 24162 29198 34304 41145
105 830 1212 2415 14759 15440 16361 16748 22123 32684 42575
659 665 668 6458 22130 25972 30697 31074 32048 36078 37129
91 808 953 8015 8988 13492 13987 15979 28355 34509 39698
594 983 1265 3028 4029 9366 11069 11512 27066 40939 41639
506 740 1321 1484 10747 16376 17384 20285 31502 38925 42606
338 356 975 2022 3578 18689 18772 19826 22914 24733 27431
709 1264 1366 4617 8893 25226 27800 29080 30277 37781 39644
840 1179 1338 2973 3541 7043 12712 15005 17149 19910 36795
1009 1267 1380 4919 12679 22889 29638 30987 34637 36232 37284
466 913 1247 1646 3049 5924 9014 20539 34546 35029 36540
374 697 984 1654 5870 10883 11684 20294 28888 31612 34031
117 240 635 5093 8673 11323 12456 14145 21397 39619 42559
122 1265 1427 13528 14282 15241 16852 17227 34723 36836 39791
595 1180 1310 6952 17916 24725 24971 27243 29555 32138 35987
140 470 1017 13222 13253 18462 20806 21117 28673 31598 37235
7 710 1072 8014 10804 13303 14292 16690 26676 36443 41966
48 189 759 12438 14523 16388 23178 27315 28656 29111 29694
285 387 410 4294 4467 5949 25386 27898 34880 41169 42614
474 545 1320 10506 13186 18126 27110 31498 35353 36193 37322
1075 1130 1424 11390 13312 14161 16927 25071 25844 34287 38151
161 396 427 5944 17281 22201 25218 30143 35566 38261 42513
233 247 694 1446 3180 3507 9069 20764 21940 33422 39358

271 508 1013 6271 21760 21858 24887 29808 31099 35475 39924
8 674 1329 3135 5110 14460 28108 28388 31043 31137 31863
1035 1222 1409 8287 16083 24450 24888 29356 30329 37834 39684
391 1090 1128 1866 4095 10643 13121 14499 20056 22195 30593
55 161 1402 6289 6837 8791 17937 21425 26602 30461 37241
110 377 1228 6875 13253 17032 19008 23274 32285 33452 41630
360 638 1355 5933 12593 13533 23377 23881 24586 26040 41663
535 1240 1333 3354 10860 16032 32573 34908 34957 39255 40759
526 936 1321 7992 10260 18527 28248 29356 32636 34666 35552
336 785 875 7530 13062 13075 18925 27963 28703 33688 36502
36 591 1062 1518 3821 7048 11197 17781 19408 22731 24783
214 1145 1223 1546 9475 11170 16061 21273 38688 40051 42479
1136 1226 1423 20227 22573 24951 26462 29586 34915 42441 43048
26 276 1425 6048 7224 7917 8747 27559 28515 35002 37649
127 294 437 4029 8585 9647 11904 24115 28514 36893 39722
748 1093 1403 9536 19305 20468 31049 38667 40502 40720 41949
96 638 743 9806 12101 17751 22732 24937 32007 32594 38504
649 904 1079 2770 3337 9158 20125 24619 32921 33698 35173
401 518 984 7372 12438 12582 18704 35874 39420 39503 39790
10 451 1077 8078 16320 17409 25807 28814 30613 41261 42955
405 592 1178 15936 18418 19585 21966 24219 30637 34536 37838
50 584 851 9720 11919 22544 22545 25851 35567 41587 41876
911 1113 1176 1806 10058 10809 14220 19044 20748 29424 36671
441 550 1135 1956 11254 18699 30249 33099 34587 35243 39952
510 1016 1281 8621 13467 13780 15170 16289 20925 26426 34479
4969 5223 17117 21950 22144 24043 27151 39809
11452 13622 18918 19670 23995 32647 37200 37399
6351 6426 13185 13973 16699 22524 31070 31916
4098 10617 14854 18004 28580 36158 37500 38552.

In the above-described second data processing device/method, an arrangement of the LDPC code that has undergone group-wise interleaving obtained from data transmitted from a transmitting device is returned to an original arrangement, the transmitting device including an encoding unit configured to perform LDPC encoding based on a parity check matrix of an LDPC code having a code length N of 64800 bits and an encoding rate r of 5/15; a group-wise interleaving unit configured to perform group-wise interleaving of interleaving the LDPC code in a unit of a bit group of 360 bits; and a mapping unit configured to map the LDPC code to any one of four signal points decided using a modulation method in a unit of 2 bits. In the group-wise interleaving, setting an i+1-th bit group from a head of the LDPC code as a bit group i, arrangement of bit groups 0 to 179 of the LDPC code of 64800 bits is interleaved into arrangement of bit groups 39, 47, 96, 176, 33, 75, 165, 38, 27, 58, 90, 76, 17, 46, 10, 91, 133, 69, 171, 32, 117, 78, 13, 146, 101, 36, 0, 138, 25, 77, 122, 49, 14, 125, 140, 93, 130, 2, 104, 102, 128, 4, 111, 151, 84, 167, 35, 127, 156, 55, 82, 85, 66, 114, 8, 147, 115, 113, 5, 31, 100, 106, 48, 52, 67, 107, 18, 126, 112, 50, 9, 143, 28, 160, 71, 79, 43, 98, 86, 94, 64, 3, 166, 105, 103, 118, 63, 51, 139, 172, 141, 175, 56, 74, 95, 29, 45, 129, 120, 168, 92, 150, 7, 162, 153, 137, 108, 159, 157, 173, 23, 89, 132, 57, 37, 70, 134, 40, 21, 149, 80, 1, 121, 59, 110, 142, 152, 15, 154, 145, 12, 170, 54, 155, 99, 22, 123, 72, 177, 131, 116, 44, 158, 73, 11, 65, 164, 119, 174, 34, 83, 53, 24, 42, 60, 26, 161, 68, 178, 41, 148, 109, 87, 144, 135, 20, 62, 81, 169, 124, 6, 19, 30, 163, 61, 179, 136, 97, 16, and 88.

The parity check matrix includes an A matrix which is on an upper left of the parity check matrix having g rows and K columns represented with a predetermined value g and an information length K=N×r of the LDPC code, a B matrix which has a staircase structure close to a right side of the A matrix having g rows and g columns, a Z matrix which is a zero matrix close to a right side of the B matrix having g rows and N−K−g columns, a C matrix which is close to a bottom side of the A matrix and the B matrix having N−K−g rows and K+g columns, and a D matrix which is a unit matrix close to a right side of the C matrix having N−K−g rows and N−K−g columns. The predetermined value g is 1440. The A matrix and the C matrix are expressed using a parity check matrix initial value table. The parity check matrix initial value table is a table representing positions of elements of 1 of the A matrix and the C matrix for every 360 columns, the table including 221 1011 1218 4299 7143 8728 11072 15533 17356 33909 36833
360 1210 1375 2313 3493 16822 21373 23588 23656 26267 34098
544 1347 1433 2457 9186 10945 13583 14858 19195 34606 37441
37 596 715 4134 8091 12106 24307 24658 34108 40591 42883
235 398 1204 2075 6742 11670 13512 23231 24784 27915 34752
204 873 890 13550 16570 19774 34012 35249 37655 39885 42890
221 371 514 11984 14972 15690 28827 29069 30531 31018 43121
280 549 1435 1889 3310 10234 11575 15243 20748 30469 36005
223 666 1248 13304 14433 14732 18943 21248 23127 38529 39272
370 819 1065 9461 10319 25294 31958 33542 37458 39681 40039
585 870 1028 5087 5216 12228 16216 16381 16937 27132 27893
164 167 1210 7386 11151 20413 22713 23134 24188 36771 38992
298 511 809 4620 7347 8873 19602 24162 29198 34304 41145
105 830 1212 2415 14759 15440 16361 16748 22123 32684 42575
659 665 668 6458 22130 25972 30697 31074 32048 36078 37129
91 808 953 8015 8988 13492 13987 15979 28355 34509 39698

594 983 1265 3028 4029 9366 11069 11512 27066 40939 41639
506 740 1321 1484 10747 16376 17384 20285 31502 38925 42606
338 356 975 2022 3578 18689 18772 19826 22914 24733 27431
709 1264 1366 4617 8893 25226 27800 29080 30277 37781 39644
840 1179 1338 2973 3541 7043 12712 15005 17149 19910 36795
1009 1267 1380 4919 12679 22889 29638 30987 34637 36232 37284
466 913 1247 1646 3049 5924 9014 20539 34546 35029 36540
374 697 984 1654 5870 10883 11684 20294 28888 31612 34031
117 240 635 5093 8673 11323 12456 14145 21397 39619 42559
122 1265 1427 13528 14282 15241 16852 17227 34723 36836 39791
595 1180 1310 6952 17916 24725 24971 27243 29555 32138 35987
140 470 1017 13222 13253 18462 20806 21117 28673 31598 37235
7 710 1072 8014 10804 13303 14292 16690 26676 36443 41966
48 189 759 12438 14523 16388 23178 27315 28656 29111 29694
285 387 410 4294 4467 5949 25386 27898 34880 41169 42614
474 545 1320 10506 13186 18126 27110 31498 35353 36193 37322
1075 1130 1424 11390 13312 14161 16927 25071 25844 34287 38151
161 396 427 5944 17281 22201 25218 30143 35566 38261 42513
233 247 694 1446 3180 3507 9069 20764 21940 33422 39358
271 508 1013 6271 21760 21858 24887 29808 31099 35475 39924
8 674 1329 3135 5110 14460 28108 28388 31043 31137 31863
1035 1222 1409 8287 16083 24450 24888 29356 30329 37834 39684
391 1090 1128 1866 4095 10643 13121 14499 20056 22195 30593
55 161 1402 6289 6837 8791 17937 21425 26602 30461 37241
110 377 1228 6875 13253 17032 19008 23274 32285 33452 41630
360 638 1355 5933 12593 13533 23377 23881 24586 26040 41663
535 1240 1333 3354 10860 16032 32573 34908 34957 39255 40759
526 936 1321 7992 10260 18527 28248 29356 32636 34666 35552
336 785 875 7530 13062 13075 18925 27963 28703 33688 36502
36 591 1062 1518 3821 7048 11197 17781 19408 22731 24783
214 1145 1223 1546 9475 11170 16061 21273 38688 40051 42479
1136 1226 1423 20227 22573 24951 26462 29586 34915 42441 43048
26 276 1425 6048 7224 7917 8747 27559 28515 35002 37649
127 294 437 4029 8585 9647 11904 24115 28514 36893 39722
748 1093 1403 9536 19305 20468 31049 38667 40502 40720 41949
96 638 743 9806 12101 17751 22732 24937 32007 32594 38504
649 904 1079 2770 3337 9158 20125 24619 32921 33698 35173
401 518 984 7372 12438 12582 18704 35874 39420 39503 39790
10 451 1077 8078 16320 17409 25807 28814 30613 41261 42955
405 592 1178 15936 18418 19585 21966 24219 30637 34536 37838
50 584 851 9720 11919 22544 22545 25851 35567 41587 41876
911 1113 1176 1806 10058 10809 14220 19044 20748 29424 36671
441 550 1135 1956 11254 18699 30249 33099 34587 35243 39952
510 1016 1281 8621 13467 13780 15170 16289 20925 26426 34479
4969 5223 17117 21950 22144 24043 27151 39809
11452 13622 18918 19670 23995 32647 37200 37399
6351 6426 13185 13973 16699 22524 31070 31916
4098 10617 14854 18004 28580 36158 37500 38552.

A third data processing device/method according to the present technology includes: an encoding unit/step configured to perform LDPC encoding based on a parity check matrix of an LDPC code having a code length N of 64800 bits and an encoding rate r of 5/15; a group-wise interleaving unit/step configured to perform group-wise interleaving of interleaving the LDPC code in a unit of a bit group of 360 bits; and a mapping unit/step configured to map the LDPC code to any one of 16 signal points decided using a modulation method in a unit of 4 bits. In the group-wise interleaving, setting an i+1-th bit group from a head of the LDPC code as a bit group i, arrangement of bit groups 0 to 179 of the LDPC code of 64800 bits is interleaved into arrangement of bit groups 6, 14, 1, 127, 161, 177, 75, 123, 62, 103, 17, 18, 167, 88, 27, 34, 8, 110, 7, 78, 94, 44, 45, 166, 149, 61, 163, 145, 155, 157, 82, 130, 70, 92, 151, 139, 160, 133, 26, 2, 79, 15, 95, 122, 126, 178, 101, 24, 138, 146, 179, 30, 86, 58, 11, 121, 159, 49, 84, 132, 117, 119, 50, 52, 4, 51, 48, 74, 114, 59, 40, 131, 33, 89, 66, 136, 72, 16, 134, 37, 164, 77, 99, 173, 20, 158, 156, 90, 41, 176, 81, 42, 60, 109, 22, 150, 105, 120, 12, 64, 56, 68, 111, 21, 148, 53, 169, 97, 108, 35, 140, 91, 115, 152, 36, 106, 154, 0, 25, 54, 63, 172, 80, 168, 142, 118, 162, 135, 73, 83, 153, 141, 9, 28, 55, 31, 112, 107, 85, 100, 175, 23, 57, 47, 38, 170, 137, 76, 147, 93, 19, 98, 124, 39, 87, 174, 144, 46, 10, 129, 69, 71, 125, 96, 116, 171, 128, 65, 102, 5, 43, 143, 104, 13, 67, 29, 3, 113, 32, and 165.

The parity check matrix includes an A matrix which is on an upper left of the parity check matrix having g rows and K columns represented with a predetermined value g and an information length K=N×r of the LDPC code, a B matrix which has a staircase structure close to a right side of the A matrix having g rows and g columns, a Z matrix which is a zero matrix close to a right side of the B matrix having g rows and N−K−g columns, a C matrix which is close to a bottom side of the A matrix and the B matrix having N−K−g rows and K+g columns, and a D matrix which is a unit matrix close to a right side of the C matrix having N−K−g rows and N−K−g columns. The predetermined value g is 1440. The A matrix and the C matrix are expressed using a parity check matrix initial value table. The parity check matrix initial value table is a table representing positions of elements of 1 of the A matrix and the C matrix for every 360 columns, the table including 221 1011 1218 4299 7143 8728 11072 15533 17356 33909 36833
360 1210 1375 2313 3493 16822 21373 23588 23656 26267 34098
544 1347 1433 2457 9186 10945 13583 14858 19195 34606 37441
37 596 715 4134 8091 12106 24307 24658 34108 40591 42883
235 398 1204 2075 6742 11670 13512 23231 24784 27915 34752
204 873 890 13550 16570 19774 34012 35249 37655 39885 42890
221 371 514 11984 14972 15690 28827 29069 30531 31018 43121
280 549 1435 1889 3310 10234 11575 15243 20748 30469 36005
223 666 1248 13304 14433 14732 18943 21248 23127 38529 39272
370 819 1065 9461 10319 25294 31958 33542 37458 39681 40039
585 870 1028 5087 5216 12228 16216 16381 16937 27132 27893
164 167 1210 7386 11151 20413 22713 23134 24188 36771 38992
298 511 809 4620 7347 8873 19602 24162 29198 34304 41145
105 830 1212 2415 14759 15440 16361 16748 22123 32684 42575
659 665 668 6458 22130 25972 30697 31074 32048 36078 37129
91 808 953 8015 8988 13492 13987 15979 28355 34509 39698
594 983 1265 3028 4029 9366 11069 11512 27066 40939 41639
506 740 1321 1484 10747 16376 17384 20285 31502 38925 42606
338 356 975 2022 3578 18689 18772 19826 22914 24733 27431
709 1264 1366 4617 8893 25226 27800 29080 30277 37781 39644
840 1179 1338 2973 3541 7043 12712 15005 17149 19910 36795
1009 1267 1380 4919 12679 22889 29638 30987 34637 36232 37284
466 913 1247 1646 3049 5924 9014 20539 34546 35029 36540
374 697 984 1654 5870 10883 11684 20294 28888 31612 34031
117 240 635 5093 8673 11323 12456 14145 21397 39619 42559
122 1265 1427 13528 14282 15241 16852 17227 34723 36836 39791
595 1180 1310 6952 17916 24725 24971 27243 29555 32138 35987
140 470 1017 13222 13253 18462 20806 21117 28673 31598 37235
7 710 1072 8014 10804 13303 14292 16690 26676 36443 41966
48 189 759 12438 14523 16388 23178 27315 28656 29111 29694
285 387 410 4294 4467 5949 25386 27898 34880 41169 42614
474 545 1320 10506 13186 18126 27110 31498 35353 36193 37322
1075 1130 1424 11390 13312 14161 16927 25071 25844 34287 38151
161 396 427 5944 17281 22201 25218 30143 35566 38261 42513
233 247 694 1446 3180 3507 9069 20764 21940 33422 39358
271 508 1013 6271 21760 21858 24887 29808 31099 35475 39924
8 674 1329 3135 5110 14460 28108 28388 31043 31137 31863
1035 1222 1409 8287 16083 24450 24888 29356 30329 37834 39684
391 1090 1128 1866 4095 10643 13121 14499 20056 22195 30593
55 161 1402 6289 6837 8791 17937 21425 26602 30461 37241
110 377 1228 6875 13253 17032 19008 23274 32285 33452 41630
360 638 1355 5933 12593 13533 23377 23881 24586 26040 41663
535 1240 1333 3354 10860 16032 32573 34908 34957 39255 40759
526 936 1321 7992 10260 18527 28248 29356 32636 34666 35552
336 785 875 7530 13062 13075 18925 27963 28703 33688 36502
36 591 1062 1518 3821 7048 11197 17781 19408 22731 24783
214 1145 1223 1546 9475 11170 16061 21273 38688 40051 42479
1136 1226 1423 20227 22573 24951 26462 29586 34915 42441 43048
26 276 1425 6048 7224 7917 8747 27559 28515 35002 37649
127 294 437 4029 8585 9647 11904 24115 28514 36893 39722
748 1093 1403 9536 19305 20468 31049 38667 40502 40720 41949
96 638 743 9806 12101 17751 22732 24937 32007 32594 38504
649 904 1079 2770 3337 9158 20125 24619 32921 33698 35173
401 518 984 7372 12438 12582 18704 35874 39420 39503 39790
10 451 1077 8078 16320 17409 25807 28814 30613 41261 42955
405 592 1178 15936 18418 19585 21966 24219 30637 34536 37838
50 584 851 9720 11919 22544 22545 25851 35567 41587 41876
911 1113 1176 1806 10058 10809 14220 19044 20748 29424 36671
441 550 1135 1956 11254 18699 30249 33099 34587 35243 39952
510 1016 1281 8621 13467 13780 15170 16289 20925 26426 34479
4969 5223 17117 21950 22144 24043 27151 39809
11452 13622 18918 19670 23995 32647 37200 37399
6351 6426 13185 13973 16699 22524 31070 31916
4098 10617 14854 18004 28580 36158 37500 38552.

In the above-described third data processing device/method, LDPC encoding based on a parity check matrix of an LDPC code having a code length N of 64800 bits and an encoding rate r of 5/15 is performed, group-wise interleaving of interleaving the LDPC code is performed in a unit of a bit group of 360 bits; and the LDPC code is mapped to any one of 16 signal points decided using a modulation method in a unit of 4 bits. In the group-wise interleaving, setting an i+1-th bit group from a head of the LDPC code as a bit group i, arrangement of bit groups 0 to 179 of the LDPC code of 64800 bits is interleaved into arrangement of bit groups 6, 14, 1, 127, 161, 177, 75, 123, 62, 103, 17, 18, 167, 88, 27, 34, 8, 110, 7, 78, 94, 44, 45, 166, 149, 61, 163, 145, 155, 157, 82, 130, 70, 92, 151, 139, 160, 133, 26, 2, 79, 15, 95, 122, 126, 178, 101, 24, 138, 146, 179, 30, 86, 58, 11, 121, 159, 49, 84, 132, 117, 119, 50, 52, 4, 51, 48, 74, 114, 59, 40, 131, 33, 89, 66, 136, 72, 16, 134, 37, 164, 77, 99, 173, 20, 158, 156, 90, 41, 176, 81, 42, 60, 109, 22, 150, 105, 120, 12, 64, 56, 68, 111, 21, 148, 53, 169, 97, 108, 35, 140, 91, 115, 152, 36, 106, 154, 0, 25, 54, 63, 172, 80, 168, 142, 118, 162, 135, 73, 83, 153, 141, 9, 28, 55, 31, 112, 107, 85, 100, 175, 23, 57, 47, 38, 170, 137, 76, 147, 93, 19, 98, 124, 39, 87, 174, 144, 46, 10, 129, 69, 71, 125, 96, 116, 171, 128, 65, 102, 5, 43, 143, 104, 13, 67, 29, 3, 113, 32, and 165.

The parity check matrix includes an A matrix which is on an upper left of the parity check matrix having g rows and K columns represented with a predetermined value g and an information length K=N×r of the LDPC code, a B matrix which has a staircase structure close to a right side of the A matrix having g rows and g columns, a Z matrix which is a zero matrix close to a right side of the B matrix having g rows and N−K−g columns, a C matrix which is close to a bottom side of the A matrix and the B matrix having N−K−g rows and K+g columns, and a D matrix which is a unit matrix close to a right side of the C matrix having N−K−g rows and N−K−g columns. The predetermined value g is 1440. The A matrix and the C matrix are expressed using a parity check matrix initial value table. The parity check matrix initial value table is a table representing positions of elements of 1 of the A matrix and the C matrix for every 360 columns, the table including 221 1011 1218 4299 7143 8728 11072 15533 17356 33909 36833
360 1210 1375 2313 3493 16822 21373 23588 23656 26267 34098
544 1347 1433 2457 9186 10945 13583 14858 19195 34606 37441
37 596 715 4134 8091 12106 24307 24658 34108 40591 42883
235 398 1204 2075 6742 11670 13512 23231 24784 27915 34752
204 873 890 13550 16570 19774 34012 35249 37655 39885 42890
221 371 514 11984 14972 15690 28827 29069 30531 31018 43121
280 549 1435 1889 3310 10234 11575 15243 20748 30469 36005
223 666 1248 13304 14433 14732 18943 21248 23127 38529 39272
370 819 1065 9461 10319 25294 31958 33542 37458 39681 40039
585 870 1028 5087 5216 12228 16216 16381 16937 27132 27893
164 167 1210 7386 11151 20413 22713 23134 24188 36771 38992
298 511 809 4620 7347 8873 19602 24162 29198 34304 41145
105 830 1212 2415 14759 15440 16361 16748 22123 32684 42575
659 665 668 6458 22130 25972 30697 31074 32048 36078 37129
91 808 953 8015 8988 13492 13987 15979 28355 34509 39698
594 983 1265 3028 4029 9366 11069 11512 27066 40939 41639
506 740 1321 1484 10747 16376 17384 20285 31502 38925 42606
338 356 975 2022 3578 18689 18772 19826 22914 24733 27431
709 1264 1366 4617 8893 25226 27800 29080 30277 37781 39644
840 1179 1338 2973 3541 7043 12712 15005 17149 19910 36795
1009 1267 1380 4919 12679 22889 29638 30987 34637 36232 37284
466 913 1247 1646 3049 5924 9014 20539 34546 35029 36540
374 697 984 1654 5870 10883 11684 20294 28888 31612 34031
117 240 635 5093 8673 11323 12456 14145 21397 39619 42559
122 1265 1427 13528 14282 15241 16852 17227 34723 36836 39791
595 1180 1310 6952 17916 24725 24971 27243 29555 32138 35987
140 470 1017 13222 13253 18462 20806 21117 28673 31598 37235
7 710 1072 8014 10804 13303 14292 16690 26676 36443 41966
48 189 759 12438 14523 16388 23178 27315 28656 29111 29694
285 387 410 4294 4467 5949 25386 27898 34880 41169 42614
474 545 1320 10506 13186 18126 27110 31498 35353 36193 37322
1075 1130 1424 11390 13312 14161 16927 25071 25844 34287 38151
161 396 427 5944 17281 22201 25218 30143 35566 38261 42513
233 247 694 1446 3180 3507 9069 20764 21940 33422 39358
271 508 1013 6271 21760 21858 24887 29808 31099 35475 39924
8 674 1329 3135 5110 14460 28108 28388 31043 31137 31863
1035 1222 1409 8287 16083 24450 24888 29356 30329 37834 39684
391 1090 1128 1866 4095 10643 13121 14499 20056 22195 30593
55 161 1402 6289 6837 8791 17937 21425 26602 30461 37241
110 377 1228 6875 13253 17032 19008 23274 32285 33452 41630
360 638 1355 5933 12593 13533 23377 23881 24586 26040 41663
535 1240 1333 3354 10860 16032 32573 34908 34957 39255 40759
526 936 1321 7992 10260 18527 28248 29356 32636 34666 35552
336 785 875 7530 13062 13075 18925 27963 28703 33688 36502
36 591 1062 1518 3821 7048 11197 17781 19408 22731 24783
214 1145 1223 1546 9475 11170 16061 21273 38688 40051 42479
1136 1226 1423 20227 22573 24951 26462 29586 34915 42441 43048
26 276 1425 6048 7224 7917 8747 27559 28515 35002 37649

127 294 437 4029 8585 9647 11904 24115 28514 36893 39722
748 1093 1403 9536 19305 20468 31049 38667 40502 40720 41949
96 638 743 9806 12101 17751 22732 24937 32007 32594 38504
649 904 1079 2770 3337 9158 20125 24619 32921 33698 35173
401 518 984 7372 12438 12582 18704 35874 39420 39503 39790
10 451 1077 8078 16320 17409 25807 28814 30613 41261 42955
405 592 1178 15936 18418 19585 21966 24219 30637 34536 37838
50 584 851 9720 11919 22544 22545 25851 35567 41587 41876
911 1113 1176 1806 10058 10809 14220 19044 20748 29424 36671
441 550 1135 1956 11254 18699 30249 33099 34587 35243 39952
510 1016 1281 8621 13467 13780 15170 16289 20925 26426 34479
4969 5223 17117 21950 22144 24043 27151 39809
11452 13622 18918 19670 23995 32647 37200 37399
6351 6426 13185 13973 16699 22524 31070 31916
4098 10617 14854 18004 28580 36158 37500 38552.

A fourth data processing device/method according to the present technology includes: a group-wise deinterleaving unit/step configured to return an arrangement of the LDPC code that has undergone group-wise interleaving obtained from data transmitted from a transmitting device to an original arrangement, the transmitting device including an encoding unit configured to perform LDPC encoding based on a parity check matrix of an LDPC code having a code length N of 64800 bits and an encoding rate r of 5/15, a group-wise interleaving unit configured to perform group-wise interleaving of interleaving the LDPC code in a unit of a bit group of 360 bits, and a mapping unit configured to map the LDPC code to any one of 16 signal points decided using a modulation method in a unit of 4 bits. In the group-wise interleaving, setting an i+1-th bit group from a head of the LDPC code as a bit group i, arrangement of bit groups 0 to 179 of the LDPC code of 64800 bits is interleaved into arrangement of bit groups 6, 14, 1, 127, 161, 177, 75, 123, 62, 103, 17, 18, 167, 88, 27, 34, 8, 110, 7, 78, 94, 44, 45, 166, 149, 61, 163, 145, 155, 157, 82, 130, 70, 92, 151, 139, 160, 133, 26, 2, 79, 15, 95, 122, 126, 178, 101, 24, 138, 146, 179, 30, 86, 58, 11, 121, 159, 49, 84, 132, 117, 119, 50, 52, 4, 51, 48, 74, 114, 59, 40, 131, 33, 89, 66, 136, 72, 16, 134, 37, 164, 77, 99, 173, 20, 158, 156, 90, 41, 176, 81, 42, 60, 109, 22, 150, 105, 120, 12, 64, 56, 68, 111, 21, 148, 53, 169, 97, 108, 35, 140, 91, 115, 152, 36, 106, 154, 0, 25, 54, 63, 172, 80, 168, 142, 118, 162, 135, 73, 83, 153, 141, 9, 28, 55, 31, 112, 107, 85, 100, 175, 23, 57, 47, 38, 170, 137, 76, 147, 93, 19, 98, 124, 39, 87, 174, 144, 46, 10, 129, 69, 71, 125, 96, 116, 171, 128, 65, 102, 5, 43, 143, 104, 13, 67, 29, 3, 113, 32, and 165.

The parity check matrix includes an A matrix which is on an upper left of the parity check matrix having g rows and K columns represented with a predetermined value g and an information length K=N×r of the LDPC code, a B matrix which has a staircase structure close to a right side of the A matrix having g rows and g columns, a Z matrix which is a zero matrix close to a right side of the B matrix having g rows and N−K−g columns, a C matrix which is close to a bottom side of the A matrix and the B matrix having N−K−g rows and K+g columns, and a D matrix which is a unit matrix close to a right side of the C matrix having N−K−g rows and N−K−g columns. The predetermined value g is 1440. The A matrix and the C matrix are expressed using a parity check matrix initial value table. The parity check matrix initial value table is a table representing positions of elements of 1 of the A matrix and the C matrix for every 360 columns, the table including 221 1011 1218 4299 7143 8728 11072 15533 17356 33909 36833
360 1210 1375 2313 3493 16822 21373 23588 23656 26267 34098
544 1347 1433 2457 9186 10945 13583 14858 19195 34606 37441
37 596 715 4134 8091 12106 24307 24658 34108 40591 42883
235 398 1204 2075 6742 11670 13512 23231 24784 27915 34752
204 873 890 13550 16570 19774 34012 35249 37655 39885 42890
221 371 514 11984 14972 15690 28827 29069 30531 31018 43121
280 549 1435 1889 3310 10234 11575 15243 20748 30469 36005
223 666 1248 13304 14433 14732 1 8943 21248 23127 38529 39272
370 819 1065 9461 10319 25294 31958 33542 37458 39681 40039
585 870 1028 5087 5216 12228 16216 16381 16937 27132 27893
164 167 1210 7386 11151 20413 22713 23134 24188 36771 38992
298 511 809 4620 7347 8873 19602 24162 29198 34304 41145
105 830 1212 2415 14759 15440 16361 16748 22123 32684 42575
659 665 668 6458 22130 25972 30697 31074 32048 36078 37129
91 808 953 8015 8988 13492 13987 15979 28355 34509 39698
594 983 1265 3028 4029 9366 11069 11512 27066 40939 41639
506 740 1321 1484 10747 16376 17384 20285 31502 38925 42606
338 356 975 2022 3578 18689 18772 19826 22914 24733 27431
709 1264 1366 4617 8893 25226 27800 29080 30277 37781 39644
840 1179 1338 2973 3541 7043 12712 15005 17149 19910 36795
1009 1267 1380 4919 12679 22889 29638 30987 34637 36232 37284
466 913 1247 1646 3049 5924 9014 20539 34546 35029 36540
374 697 984 1654 5870 10883 11684 20294 28888 31612 34031
117 240 635 5093 8673 11323 12456 14145 21397 39619 42559
122 1265 1427 13528 14282 15241 16852 17227 34723 36836 39791
595 1180 1310 6952 17916 24725 24971 27243 29555 32138 35987
140 470 1017 13222 13253 18462 20806 21117 28673 31598 37235
7 710 1072 8014 10804 13303 14292 16690 26676 36443 41966
48 189 759 12438 14523 16388 23178 27315 28656 29111 29694

285 387 410 4294 4467 5949 25386 27898 34880 41169 42614
474 545 1320 10506 13186 18126 27110 31498 35353 36193 37322
1075 1130 1424 11390 13312 14161 16927 25071 25844 34287 38151
161 396 427 5944 17281 22201 25218 30143 35566 38261 42513
233 247 694 1446 3180 3507 9069 20764 21940 33422 39358
271 508 1013 6271 21760 21858 24887 29808 31099 35475 39924
8 674 1329 3135 5110 14460 28108 28388 31043 31137 31863
1035 1222 1409 8287 16083 24450 24888 29356 30329 37834 39684
391 1090 1128 1866 4095 10643 13121 14499 20056 22195 30593
55 161 1402 6289 6837 8791 17937 21425 26602 30461 37241
110 377 1228 6875 13253 17032 19008 23274 32285 33452 41630
360 638 1355 5933 12593 13533 23377 23881 24586 26040 41663
535 1240 1333 3354 10860 16032 32573 34908 34957 39255 40759
526 936 1321 7992 10260 18527 28248 29356 32636 34666 35552
336 785 875 7530 13062 13075 18925 27963 28703 33688 36502
36 591 1062 1518 3821 7048 11197 17781 19408 22731 24783
214 1145 1223 1546 9475 11170 16061 21273 38688 40051 42479
1136 1226 1423 20227 22573 24951 26462 29586 34915 42441 43048
26 276 1425 6048 7224 7917 8747 27559 28515 35002 37649
127 294 437 4029 8585 9647 11904 24115 28514 36893 39722
748 1093 1403 9536 19305 20468 31049 38667 40502 40720 41949
96 638 743 9806 12101 17751 22732 24937 32007 32594 38504
649 904 1079 2770 3337 9158 20125 24619 32921 33698 35173
401 518 984 7372 12438 12582 18704 35874 39420 39503 39790
10 451 1077 8078 16320 17409 25807 28814 30613 41261 42955
405 592 1178 15936 18418 19585 21966 24219 30637 34536 37838
50 584 851 9720 11919 22544 22545 25851 35567 41587 41876
911 1113 1176 1806 10058 10809 14220 19044 20748 29424 36671
441 550 1135 1956 11254 18699 30249 33099 34587 35243 39952
510 1016 1281 8621 13467 13780 15170 16289 20925 26426 34479
4969 5223 17117 21950 22144 24043 27151 39809
11452 13622 18918 19670 23995 32647 37200 37399
6351 6426 13185 13973 16699 22524 31070 31916
4098 10617 14854 18004 28580 36158 37500 38552.

In the above-described fourth data processing device/method, an arrangement of the LDPC code that has undergone group-wise interleaving obtained from data transmitted from a transmitting device is returned to an original arrangement, the transmitting device including an encoding unit configured to perform LDPC encoding based on a parity check matrix of an LDPC code having a code length N of 64800 bits and an encoding rate r of 5/15, a group-wise interleaving unit configured to perform group-wise interleaving of interleaving the LDPC code in a unit of a bit group of 360 bits, and a mapping unit configured to map the LDPC code to any one of 16 signal points decided using a modulation method in a unit of 4 bits. In the group-wise interleaving, setting an i+1-th bit group from a head of the LDPC code as a bit group i, arrangement of bit groups 0 to 179 of the LDPC code of 64800 bits is interleaved into arrangement of bit groups 6, 14, 1, 127, 161, 177, 75, 123, 62, 103, 17, 18, 167, 88, 27, 34, 8, 110, 7, 78, 94, 44, 45, 166, 149, 61, 163, 145, 155, 157, 82, 130, 70, 92, 151, 139, 160, 133, 26, 2, 79, 15, 95, 122, 126, 178, 101, 24, 138, 146, 179, 30, 86, 58, 11, 121, 159, 49, 84, 132, 117, 119, 50, 52, 4, 51, 48, 74, 114, 59, 40, 131, 33, 89, 66, 136, 72, 16, 134, 37, 164, 77, 99, 173, 20, 158, 156, 90, 41, 176, 81, 42, 60, 109, 22, 150, 105, 120, 12, 64, 56, 68, 111, 21, 148, 53, 169, 97, 108, 35, 140, 91, 115, 152, 36, 106, 154, 0, 25, 54, 63, 172, 80, 168, 142, 118, 162, 135, 73, 83, 153, 141, 9, 28, 55, 31, 112, 107, 85, 100, 175, 23, 57, 47, 38, 170, 137, 76, 147, 93, 19, 98, 124, 39, 87, 174, 144, 46, 10, 129, 69, 71, 125, 96, 116, 171, 128, 65, 102, 5, 43, 143, 104, 13, 67, 29, 3, 113, 32, and 165, The parity check matrix includes an A matrix which is on an upper left of the parity check matrix having g rows and K columns represented with a predetermined value g and an information length K=N×r of the LDPC code, a B matrix which has a staircase structure close to a right side of the A matrix having g rows and g columns, a Z matrix which is a zero matrix close to a right side of the B matrix having g rows and N−K−g columns, a C matrix which is close to a bottom side of the A matrix and the B matrix having N−K−g rows and K+g columns, and a D matrix which is a unit matrix close to a right side of the C matrix having N−K−g rows and N−K−g columns. The predetermined value g is 1440. The A matrix and the C matrix are expressed using a parity check matrix initial value table. The parity check matrix initial value table is a table representing positions of elements of 1 of the A matrix and the C matrix for every 360 columns, the table including 221 1011 1218 4299 7143 8728 11072 15533 17356 33909 36833
360 1210 1375 2313 3493 16822 21373 23588 23656 26267 34098
544 1347 1433 2457 9186 10945 13583 14858 19195 34606 37441
37 596 715 4134 8091 12106 24307 24658 34108 40591 42883
235 398 1204 2075 6742 11670 13512 23231 24784 27915 34752
204 873 890 13550 16570 19774 34012 35249 37655 39885 42890
221 371 514 11984 14972 15690 28827 29069 30531 31018 43121
280 549 1435 1889 3310 10234 11575 15243 20748 30469 36005
223 666 1248 13304 14433 14732 18943 21248 23127 38529 39272
370 819 1065 9461 10319 25294 31958 33542 37458 39681 40039
585 870 1028 5087 5216 12228 16216 16381 16937 27132 27893

164 167 1210 7386 11151 20413 22713 23134 24188 36771 38992
298 511 809 4620 7347 8873 19602 24162 29198 34304 41145
105 830 1212 2415 14759 15440 16361 16748 22123 32684 42575
659 665 668 6458 22130 25972 30697 31074 32048 36078 37129
91 808 953 8015 8988 13492 13987 15979 28355 34509 39698
594 983 1265 3028 4029 9366 11069 11512 27066 40939 41639
506 740 1321 1484 10747 16376 17384 20285 31502 38925 42606
338 356 975 2022 3578 18689 18772 19826 22914 24733 27431
709 1264 1366 4617 8893 25226 27800 29080 30277 37781 39644
840 1179 1338 2973 3541 7043 12712 15005 17149 19910 36795
1009 1267 1380 4919 12679 22889 29638 30987 34637 36232 37284
466 913 1247 1646 3049 5924 9014 20539 34546 35029 36540
374 697 984 1654 5870 10883 11684 20294 28888 31612 34031
117 240 635 5093 8673 11323 12456 14145 21397 39619 42559
122 1265 1427 13528 14282 15241 16852 17227 34723 36836 39791
595 1180 1310 6952 17916 24725 24971 27243 29555 32138 35987
140 470 1017 13222 13253 18462 20806 21117 28673 31598 37235
7 710 1072 8014 10804 13303 14292 16690 26676 36443 41966
48 189 759 12438 14523 16388 23178 27315 28656 29111 29694
285 387 410 4294 4467 5949 25386 27898 34880 41169 42614
474 545 1320 10506 13186 18126 27110 31498 35353 36193 37322
1075 1130 1424 11390 13312 14161 16927 25071 25844 34287 38151
161 396 427 5944 17281 22201 25218 30143 35566 38261 42513
233 247 694 1446 3180 3507 9069 20764 21940 33422 39358
271 508 1013 6271 21760 21858 24887 29808 31099 35475 39924
8 674 1329 3135 5110 14460 28108 28388 31043 31137 31863
1035 1222 1409 8287 16083 24450 24888 29356 30329 37834 39684
391 1090 1128 1866 4095 10643 13121 14499 20056 22195 30593
55 161 1402 6289 6837 8791 17937 21425 26602 30461 37241
110 377 1228 6875 13253 17032 19008 23274 32285 33452 41630
360 638 1355 5933 12593 13533 23377 23881 24586 26040 41663
535 1240 1333 3354 10860 16032 32573 34908 34957 39255 40759
526 936 1321 7992 10260 18527 28248 29356 32636 34666 35552
336 785 875 7530 13062 13075 18925 27963 28703 33688 36502
36 591 1062 1518 3821 7048 11197 17781 19408 22731 24783
214 1145 1223 1546 9475 11170 16061 21273 38688 40051 42479
1136 1226 1423 20227 22573 24951 26462 29586 34915 42441 43048
26 276 1425 6048 7224 7917 8747 27559 28515 35002 37649
127 294 437 4029 8585 9647 11904 24115 28514 36893 39722
748 1093 1403 9536 19305 20468 31049 38667 40502 40720 41949
96 638 743 9806 12101 17751 22732 24937 32007 32594 38504
649 904 1079 2770 3337 9158 20125 24619 32921 33698 35173
401 518 984 7372 12438 12582 18704 35874 39420 39503 39790
10 451 1077 8078 16320 17409 25807 28814 30613 41261 42955
405 592 1178 15936 18418 19585 21966 24219 30637 34536 37838
50 584 851 9720 11919 22544 22545 25851 35567 41587 41876
911 1113 1176 1806 10058 10809 14220 19044 20748 29424 36671
441 550 1135 1956 11254 18699 30249 33099 34587 35243 39952
510 1016 1281 8621 13467 13780 15170 16289 20925 26426 34479
4969 5223 17117 21950 22144 24043 27151 39809
11452 13622 18918 19670 23995 32647 37200 37399
6351 6426 13185 13973 16699 22524 31070 31916
4098 10617 14854 18004 28580 36158 37500 38552.

A fifth data processing device/method according to the present technology includes: an encoding unit/step configured to perform LDPC encoding based on a parity check matrix of an LDPC code having a code length N of 64800 bits and an encoding rate r of 5/15; a group-wise interleaving unit/step configured to perform group-wise interleaving of interleaving the LDPC code in a unit of a bit group of 360 bits; and a mapping unit/step configured to map the LDPC code to any one of 64 signal points decided using a modulation method in a unit of 6 bits. In the group-wise interleaving, setting an i+1-th bit group from a head of the LDPC code as a bit group i, arrangement of bit groups 0 to 179 of the LDPC code of 64800 bits is interleaved into arrangement of bit groups 103, 116, 158, 0, 27, 73, 140, 30, 148, 36, 153, 154, 10, 174, 122, 178, 6, 106, 162, 59, 142, 112, 7, 74, 11, 51, 49, 72, 31, 65, 156, 95, 171, 105, 173, 168, 1, 155, 125, 82, 86, 161, 57, 165, 54, 26, 121, 25, 157, 93, 22, 34, 33, 39, 19, 46, 150, 141, 12, 9, 79, 118, 24, 17, 85, 117, 67, 58, 129, 160, 89, 61, 146, 77, 130, 102, 101, 137, 94, 69, 14, 133, 60, 149, 136, 16, 108, 41, 90, 28, 144, 13, 175, 114, 2, 18, 63, 68, 21, 109, 53, 123, 75, 81, 143, 169, 42, 119, 138, 104, 4, 131, 145, 8, 5, 76, 15, 88, 177, 124, 45, 97, 64, 100, 37, 132, 38, 44, 107, 35, 43, 80, 50, 91, 152, 78, 166, 55, 115, 170, 159, 147, 167, 87, 83, 29, 96, 172, 48, 98, 62, 139, 70, 164, 84, 47, 151, 134, 126, 113, 179, 110, 111, 128, 32, 52, 66, 40, 135, 176, 99, 127, 163, 3, 120, 71, 56, 92, 23, and 20.

The parity check matrix includes an A matrix which is on an upper left of the parity check matrix having g rows and K columns represented with a predetermined value g and an information length K=N×r of the LDPC code, a B matrix which has a staircase structure close to a right side of the A matrix having g rows and g columns, a Z matrix which is a zero matrix close to a right side of the B matrix having g rows and N−K−g columns, a C matrix which is close to a bottom side of the A matrix and the B matrix having N−K−g rows and K+g columns, and a D matrix which is a unit matrix close to a right side of the C matrix having N−K−g rows and N−K−g columns. The predetermined value g is 1440. The A matrix and the C matrix are expressed using a parity check matrix initial value table. The parity check matrix initial value table is a table representing positions of elements of 1 of the A matrix and the C matrix for every 360 columns, the table including 221 1011 1218 4299 7143 8728 11072 15533 17356 33909 36833
360 1210 1375 2313 3493 16822 21373 23588 23656 26267 34098
544 1347 1433 2457 9186 10945 13583 14858 19195 34606 37441
37 596 715 4134 8091 12106 24307 24658 34108 40591 42883
235 398 1204 2075 6742 11670 13512 23231 24784 27915 34752
204 873 890 13550 16570 19774 34012 35249 37655 39885 42890
221 371 514 11984 14972 15690 28827 29069 30531 31018 43121
280 549 1435 1889 3310 10234 11575 15243 20748 30469 36005
223 666 1248 13304 14433 14732 18943 21248 23127 38529 39272
370 819 1065 9461 10319 25294 31958 33542 37458 39681 40039
585 870 1028 5087 5216 12228 16216 16381 16937 27132 27893
164 167 1210 7386 11151 20413 22713 23134 24188 36771 38992
298 511 809 4620 7347 8873 19602 24162 29198 34304 41145
105 830 1212 2415 14759 15440 16361 16748 22123 32684 42575
659 665 668 6458 22130 25972 30697 31074 32048 36078 37129
91 808 953 8015 8988 13492 13987 15979 28355 34509 39698
594 983 1265 3028 4029 9366 11069 11512 27066 40939 41639
506 740 1321 1484 10747 16376 17384 20285 31502 38925 42606
338 356 975 2022 3578 18689 18772 19826 22914 24733 27431
709 1264 1366 4617 8893 25226 27800 29080 30277 37781 39644
840 1179 1338 2973 3541 7043 12712 15005 17149 19910 36795
1009 1267 1380 4919 12679 22889 29638 30987 34637 36232 37284
466 913 1247 1646 3049 5924 9014 20539 34546 35029 36540
374 697 984 1654 5870 10883 11684 20294 28888 31612 34031
117 240 635 5093 8673 11323 12456 14145 21397 39619 42559
122 1265 1427 13528 14282 15241 16852 17227 34723 36836 39791
595 1180 1310 6952 17916 24725 24971 27243 29555 32138 35987
140 470 1017 13222 13253 18462 20806 21117 28673 31598 37235
7 710 1072 8014 1 0804 13303 14292 16690 26676 36443 41966
48 189 759 12438 14523 16388 23178 27315 28656 29111 29694
285 387 410 4294 4467 5949 25386 27898 34880 41169 42614
474 545 1320 10506 13186 18126 27110 31498 35353 36193 37322
1075 1130 1424 11390 13312 14161 16927 25071 25844 34287 38151
161 396 427 5944 17281 22201 25218 30143 35566 38261 42513
233 247 694 1446 3180 3507 9069 20764 21940 33422 39358
271 508 1013 6271 21760 21858 24887 29808 31099 35475 39924
8 674 1329 3135 5110 14460 28108 28388 31043 31137 31863
1035 1222 1409 8287 16083 24450 24888 29356 30329 37834 39684
391 1090 1128 1866 4095 10643 13121 14499 20056 22195 30593
55 161 1402 6289 6837 8791 17937 21425 26602 30461 37241
110 377 1228 6875 13253 17032 19008 23274 32285 33452 41630
360 638 1355 5933 12593 13533 23377 23881 24586 26040 41663
535 1240 1333 3354 10860 16032 32573 34908 34957 39255 40759
526 936 1321 7992 10260 18527 28248 29356 32636 34666 35552
336 785 875 7530 13062 13075 18925 27963 28703 33688 36502
36 591 1062 1518 3821 7048 11197 17781 19408 22731 24783
214 1145 1223 1546 9475 11170 16061 21273 38688 40051 42479
1136 1226 1423 20227 22573 24951 26462 29586 34915 42441 43048
26 276 1425 6048 7224 7917 8747 27559 28515 35002 37649
127 294 437 4029 8585 9647 11904 24115 28514 36893 39722
748 1093 1403 9536 19305 20468 31049 38667 40502 40720 41949
96 638 743 9806 12101 17751 22732 24937 32007 32594 38504
649 904 1079 2770 3337 9158 20125 24619 32921 33698 35173
401 518 984 7372 12438 12582 18704 35874 39420 39503 39790
10 451 1077 8078 16320 17409 25807 28814 30613 41261 42955
405 592 1178 15936 18418 19585 21966 24219 30637 34536 37838
50 584 851 9720 11919 22544 22545 25851 35567 41587 41876
911 1113 1176 1806 10058 10809 14220 19044 20748 29424 36671
441 550 1135 1956 11254 18699 30249 33099 34587 35243 39952
510 1016 1281 8621 13467 13780 15170 16289 20925 26426 34479
4969 5223 1 7117 21950 22144 24043 27151 39809

11452 13622 18918 19670 23995 32647 37200 37399
6351 6426 13185 13973 16699 22524 31070 31916
4098 10617 14854 18004 28580 36158 37500 38552.

In the fifth data processing device/method according to the present technology, a LDPC encoding based on a parity check matrix of an LDPC code having a code length N of 64800 bits and an encoding rate r of 5/15 is performed; group-wise interleaving of interleaving the LDPC code is performed in a unit of a bit group of 360 bits; and the LDPC code is mapped to any one of 64 signal points decided using a modulation method in a unit of 6 bits. In the group-wise interleaving, setting an i+1-th bit group from a head of the LDPC code as a bit group i, arrangement of bit groups 0 to 179 of the LDPC code of 64800 bits is interleaved into arrangement of bit groups 103, 116, 158, 0, 27, 73, 140, 30, 148, 36, 153, 154, 10, 174, 122, 178, 6, 106, 162, 59, 142, 112, 7, 74, 11, 51, 49, 72, 31, 65, 156, 95, 171, 105, 173, 168, 1, 155, 125, 82, 86, 161, 57, 165, 54, 26, 121, 25, 157, 93, 22, 34, 33, 39, 19, 46, 150, 141, 12, 9, 79, 118, 24, 17, 85, 117, 67, 58, 129, 160, 89, 61, 146, 77, 130, 102, 101, 137, 94, 69, 14, 133, 60, 149, 136, 16, 108, 41, 90, 28, 144, 13, 175, 114, 2, 18, 63, 68, 21, 109, 53, 123, 75, 81, 143, 169, 42, 119, 138, 104, 4, 131, 145, 8, 5, 76, 15, 88, 177, 124, 45, 97, 64, 100, 37, 132, 38, 44, 107, 35, 43, 80, 50, 91, 152, 78, 166, 55, 115, 170, 159, 147, 167, 87, 83, 29, 96, 172, 48, 98, 62, 139, 70, 164, 84, 47, 151, 134, 126, 113, 179, 110, 111, 128, 32, 52, 66, 40, 135, 176, 99, 127, 163, 3, 120, 71, 56, 92, 23, and 20.

The parity check matrix includes an A matrix which is on an upper left of the parity check matrix having g rows and K columns represented with a predetermined value g and an information length K=N×r of the LDPC code, a B matrix which has a staircase structure close to a right side of the A matrix having g rows and g columns, a Z matrix which is a zero matrix close to a right side of the B matrix having g rows and N−K−g columns, a C matrix which is close to a bottom side of the A matrix and the B matrix having N−K−g rows and K+g columns, and a D matrix which is a unit matrix close to a right side of the C matrix having N−K−g rows and N−K−g columns. The predetermined value g is 1440. The A matrix and the C matrix are expressed using a parity check matrix initial value table. The parity check matrix initial value table is a table representing positions of elements of 1 of the A matrix and the C matrix for every 360 columns, the table including 221 1011 1218 4299 7143 8728 11072 15533 17356 33909 36833
360 1210 1375 2313 3493 16822 21373 23588 23656 26267 34098
544 1347 1433 2457 9186 10945 13583 14858 19195 34606 37441
37 596 715 4134 8091 12106 24307 24658 34108 40591 42883
235 398 1204 2075 6742 11670 13512 23231 24784 27915 34752
204 873 890 13550 16570 19774 34012 35249 37655 39885 42890
221 371 514 11984 14972 15690 28827 29069 30531 31018 43121
280 549 1435 1889 3310 10234 11575 15243 20748 30469 36005
223 666 1248 13304 14433 14732 18943 21248 23127 38529 39272
370 819 1065 9461 10319 25294 31958 33542 37458 39681 40039
585 870 1028 5087 5216 12228 16216 16381 16937 27132 27893
164 167 1210 7386 11151 20413 22713 23134 24188 36771 38992
298 511 809 4620 7347 8873 19602 24162 29198 34304 41145
105 830 1212 2415 14759 15440 16361 16748 22123 32684 42575
659 665 668 6458 22130 25972 30697 31074 32048 36078 37129
91 808 953 8015 8988 13492 13987 15979 28355 34509 39698
594 983 1265 3028 4029 9366 11069 11512 27066 40939 41639
506 740 1321 1484 10747 16376 17384 20285 31502 38925 42606
338 356 975 2022 3578 18689 18772 19826 22914 24733 27431
709 1264 1366 4617 8893 25226 27800 29080 30277 37781 39644
840 1179 1338 2973 3541 7043 12712 15005 17149 19910 36795
1009 1267 1380 4919 12679 22889 29638 30987 34637 36232 37284
466 913 1247 1646 3049 5924 9014 20539 34546 35029 36540
374 697 984 1654 5870 10883 11684 20294 28888 31612 34031
117 240 635 5093 8673 11323 12456 14145 21397 39619 42559
122 1265 1427 13528 14282 15241 16852 17227 34723 36836 39791
595 1180 1310 6952 17916 24725 24971 27243 29555 32138 35987
140 470 1017 13222 13253 18462 20806 21117 28673 31598 37235
7 710 1072 8014 10804 13303 14292 16690 26676 36443 41966
48 189 759 12438 14523 16388 23178 27315 28656 29111 29694
285 387 410 4294 4467 5949 25386 27898 34880 41169 42614
474 545 1320 10506 13186 18126 27110 31498 35353 36193 37322
1075 1130 1424 11390 13312 14161 16927 25071 25844 34287 38151
161 396 427 5944 17281 22201 25218 30143 35566 38261 42513
233 247 694 1446 3180 3507 9069 20764 21940 33422 39358
271 508 1013 6271 21760 21858 24887 29808 31099 35475 39924
8 674 1329 3135 5110 14460 28108 28388 31043 31137 31863
1035 1222 1409 8287 16083 24450 24888 29356 30329 37834 39684
391 1090 1128 1866 4095 10643 13121 14499 20056 22195 30593
55 161 1402 6289 6837 8791 17937 21425 26602 30461 37241
110 377 1228 6875 13253 17032 19008 23274 32285 33452 41630
360 638 1355 5933 12593 13533 23377 23881 24586 26040 41663
535 1240 1333 3354 10860 16032 32573 34908 34957 39255 40759
526 936 1321 7992 10260 18527 28248 29356 32636 34666 35552

336 785 875 7530 13062 13075 18925 27963 28703 33688 36502
36 591 1062 1518 3821 7048 11197 17781 19408 22731 24783
214 1145 1223 1546 9475 11170 16061 21273 38688 40051 42479
1136 1226 1423 20227 22573 24951 26462 29586 34915 42441 43048
26 276 1425 6048 7224 7917 8747 27559 28515 35002 37649
127 294 437 4029 8585 9647 11904 24115 28514 36893 39722
748 1093 1403 9536 19305 20468 31049 38667 40502 40720 41949
96 638 743 9806 12101 17751 22732 24937 32007 32594 38504
649 904 1079 2770 3337 9158 20125 24619 32921 33698 35173
401 518 984 7372 12438 12582 18704 35874 39420 39503 39790
10 451 1077 8078 16320 17409 25807 28814 30613 41261 42955
405 592 1178 15936 18418 19585 21966 24219 30637 34536 37838
50 584 851 9720 11919 22544 22545 25851 35567 41587 41876
911 1113 1176 1806 10058 10809 14220 19044 20748 29424 36671
441 550 1135 1956 11254 18699 30249 33099 34587 35243 39952
510 1016 1281 8621 13467 13780 15170 16289 20925 26426 34479
4969 5223 17117 21950 22144 24043 27151 39809
11452 13622 18918 19670 23995 32647 37200 37399
6351 6426 13185 13973 16699 22524 31070 31916
4098 10617 14854 18004 28580 36158 37500 38552.

A sixth data processing device/method according to the present technology includes: a group-wise deinterleaving unit/step configured to return an arrangement of the LDPC code that has undergone group-wise interleaving obtained from data transmitted from a transmitting device to an original arrangement, the transmitting device including an encoding unit configured to perform LDPC encoding based on a parity check matrix of an LDPC code having a code length N of 64800 bits and an encoding rate r of 5/15, a group-wise interleaving unit configured to perform group-wise interleaving of interleaving the LDPC code in a unit of a bit group of 360 bits, and a mapping unit configured to map the LDPC code to any one of 64 signal points decided using a modulation method in a unit of 6 bits. In the group-wise interleaving, setting an i+1-th bit group from a head of the LDPC code as a bit group i, arrangement of bit groups 0 to 179 of the LDPC code of 64800 bits is interleaved into arrangement of bit groups 103, 116, 158, 0, 27, 73, 140, 30, 148, 36, 153, 154, 10, 174, 122, 178, 6, 106, 162, 59, 142, 112, 7, 74, 11, 51, 49, 72, 31, 65, 156, 95, 171, 105, 173, 168, 1, 155, 125, 82, 86, 161, 57, 165, 54, 26, 121, 25, 157, 93, 22, 34, 33, 39, 19, 46, 150, 141, 12, 9, 79, 118, 24, 17, 85, 117, 67, 58, 129, 160, 89, 61, 146, 77, 130, 102, 101, 137, 94, 69, 14, 133, 60, 149, 136, 16, 108, 41, 90, 28, 144, 13, 175, 114, 2, 18, 63, 68, 21, 109, 53, 123, 75, 81, 143, 169, 42, 119, 138, 104, 4, 131, 145, 8, 5, 76, 15, 88, 177, 124, 45, 97, 64, 100, 37, 132, 38, 44, 107, 35, 43, 80, 50, 91, 152, 78, 166, 55, 115, 170, 159, 147, 167, 87, 83, 29, 96, 172, 48, 98, 62, 139, 70, 164, 84, 47, 151, 134, 126, 113, 179, 110, 111, 128, 32, 52, 66, 40, 135, 176, 99, 127, 163, 3, 120, 71, 56, 92, 23, and 20.

The parity check matrix includes an A matrix which is on an upper left of the parity check matrix having g rows and K columns represented with a predetermined value g and an information length K=N×r of the LDPC code, a B matrix which has a staircase structure close to a right side of the A matrix having g rows and g columns, a Z matrix which is a zero matrix close to a right side of the B matrix having g rows and N−K−g columns, a C matrix which is close to a bottom side of the A matrix and the B matrix having N−K−g rows and K+g columns, and a D matrix which is a unit matrix close to a right side of the C matrix having N−K−g rows and N−K−g columns. The predetermined value g is 1440. The A matrix and the C matrix are expressed using a parity check matrix initial value table. The parity check matrix initial value table is a table representing positions of elements of 1 of the A matrix and the C matrix for every 360 columns, the table including 221 1011 1218 4299 7143 8728 11072 15533 17356 33909 36833
360 1210 1375 2313 3493 16822 21373 23588 23656 26267 34098
544 1347 1433 2457 9186 10945 13583 14858 19195 34606 37441
37 596 715 4134 8091 12106 24307 24658 34108 40591 42883
235 398 1204 2075 6742 11670 13512 23231 24784 27915 34752
204 873 890 13550 16570 19774 34012 35249 37655 39885 42890
221 371 514 11984 14972 15690 28827 29069 30531 31018 43121
280 549 1435 1889 3310 10234 11575 15243 20748 30469 36005
223 666 1248 13304 14433 14732 18943 21248 23127 38529 39272
370 819 1065 9461 10319 25294 31958 33542 37458 39681 40039
585 870 1028 5087 5216 12228 16216 16381 16937 27132 27893
164 167 1210 7386 11151 20413 22713 23134 24188 36771 38992
298 511 809 4620 7347 8873 19602 24162 29198 34304 41145
105 830 1212 2415 14759 15440 16361 16748 22123 32684 42575
659 665 668 6458 22130 25972 30697 31074 32048 36078 37129
91 808 953 8015 8988 13492 13987 15979 28355 34509 39698
594 983 1265 3028 4029 9366 11069 11512 27066 40939 41639
506 740 1321 1484 10747 16376 17384 20285 31502 38925 42606
338 356 975 2022 3578 18689 18772 19826 22914 24733 27431
709 1264 1366 4617 8893 25226 27800 29080 30277 37781 39644
840 1179 1338 2973 3541 7043 12712 15005 17149 19910 36795
1009 1267 1380 4919 12679 22889 29638 30987 34637 36232 37284
466 913 1247 1646 3049 5924 9014 20539 34546 35029 36540
374 697 984 1654 5870 10883 11684 20294 28888 31612 34031
117 240 635 5093 8673 11323 12456 14145 21397 39619 42559

122 1265 1427 13528 14282 15241 16852 17227 34723 36836 39791
595 1180 1310 6952 17916 24725 24971 27243 29555 32138 35987
140 470 1017 13222 13253 18462 20806 21117 28673 31598 37235
7 710 1072 8014 10804 13303 14292 16690 26676 36443 41966
48 189 759 12438 14523 16388 23178 27315 28656 29111 29694
285 387 410 4294 4467 5949 25386 27898 34880 41169 42614
474 545 1320 10506 13186 18126 27110 31498 35353 36193 37322
1075 1130 1424 11390 13312 14161 16927 25071 25844 34287 38151
161 396 427 5944 17281 22201 25218 30143 35566 38261 42513
233 247 694 1446 3180 3507 9069 20764 21940 33422 39358
271 508 1013 6271 21760 21858 24887 29808 31099 35475 39924
8 674 1329 3135 5110 14460 28108 28388 31043 31137 31863
1035 1222 1409 8287 16083 24450 24888 29356 30329 37834 39684
391 1090 1128 1866 4095 10643 13121 14499 20056 22195 30593
55 161 1402 6289 6837 8791 17937 21425 26602 30461 37241
110 377 1228 6875 13253 17032 19008 23274 32285 33452 41630
360 638 1355 5933 12593 13533 23377 23881 24586 26040 41663
535 1240 1333 3354 10860 16032 32573 34908 34957 39255 40759
526 936 1321 7992 10260 18527 28248 29356 32636 34666 35552
336 785 875 7530 13062 13075 18925 27963 28703 33688 36502
36 591 1062 1518 3821 7048 11197 17781 19408 22731 24783
214 1145 1223 1546 9475 11170 16061 21273 38688 40051 42479
1136 1226 1423 20227 22573 24951 26462 29586 34915 42441 43048
26 276 1425 6048 7224 7917 8747 27559 28515 35002 37649
127 294 437 4029 8585 9647 11904 24115 28514 36893 39722
748 1093 1403 9536 19305 20468 31049 38667 40502 40720 41949
96 638 743 9806 12101 17751 22732 24937 32007 32594 38504
649 904 1079 2770 3337 9158 20125 24619 32921 33698 35173
401 518 984 7372 12438 12582 18704 35874 39420 39503 39790
10 451 1077 8078 16320 17409 25807 28814 30613 41261 42955
405 592 1178 15936 18418 19585 21966 24219 30637 34536 37838
50 584 851 9720 11919 22544 22545 25851 35567 41587 41876
911 1113 1176 1806 10058 10809 14220 19044 20748 29424 36671
441 550 1135 1956 11254 18699 30249 33099 34587 35243 39952
510 1016 1281 8621 13467 13780 15170 16289 20925 26426 34479
4969 5223 17117 21950 22144 24043 27151 39809
11452 13622 18918 19670 23995 32647 37200 37399
6351 6426 13185 13973 16699 22524 31070 31916
4098 10617 14854 18004 28580 36158 37500 38552.

In the above-described sixth data processing method, an arrangement of the LDPC code that has undergone group-wise interleaving obtained from data transmitted from a transmitting device is returned to an original arrangement, the transmitting device including an encoding unit configured to perform LDPC encoding based on a parity check matrix of an LDPC code having a code length N of 64800 bits and an encoding rate r of 5/15, a group-wise interleaving unit configured to perform group-wise interleaving of interleaving the LDPC code in a unit of a bit group of 360 bits, and a mapping unit configured to map the LDPC code to any one of 64 signal points decided using a modulation method in a unit of 6 bits. In the group-wise interleaving, setting an i+1-th bit group from a head of the LDPC code as a bit group i, arrangement of bit groups 0 to 179 of the LDPC code of 64800 bits is interleaved into arrangement of bit groups 103, 116, 158, 0, 27, 73, 140, 30, 148, 36, 153, 154, 10, 174, 122, 178, 6, 106, 162, 59, 142, 112, 7, 74, 11, 51, 49, 72, 31, 65, 156, 95, 171, 105, 173, 168, 1, 155, 125, 82, 86, 161, 57, 165, 54, 26, 121, 25, 157, 93, 22, 34, 33, 39, 19, 46, 150, 141, 12, 9, 79, 118, 24, 17, 85, 117, 67, 58, 129, 160, 89, 61, 146, 77, 130, 102, 101, 137, 94, 69, 14, 133, 60, 149, 136, 16, 108, 41, 90, 28, 144, 13, 175, 114, 2, 18, 63, 68, 21, 109, 53, 123, 75, 81, 143, 169, 42, 119, 138, 104, 4, 131, 145, 8, 5, 76, 15, 88, 177, 124, 45, 97, 64, 100, 37, 132, 38, 44, 107, 35, 43, 80, 50, 91, 152, 78, 166, 55, 115, 170, 159, 147, 167, 87, 83, 29, 96, 172, 48, 98, 62, 139, 70, 164, 84, 47, 151, 134, 126, 113, 179, 110, 111, 128, 32, 52, 66, 40, 135, 176, 99, 127, 163, 3, 120, 71, 56, 92, 23, and 20.

The parity check matrix includes an A matrix which is on an upper left of the parity check matrix having g rows and K columns represented with a predetermined value g and an information length K=N×r of the LDPC code, a B matrix which has a staircase structure close to a right side of the A matrix having g rows and g columns, a Z matrix which is a zero matrix close to a right side of the B matrix having g rows and N−K−g columns, a C matrix which is close to a bottom side of the A matrix and the B matrix having N−K−g rows and K+g columns, and a D matrix which is a unit matrix close to a right side of the C matrix having N−K−g rows and N−K−g columns. The predetermined value g is 1440. The A matrix and the C matrix are expressed using a parity check matrix initial value table. The parity check matrix initial value table is a table representing positions of elements of 1 of the A matrix and the C matrix for every 360 columns, the table including 221 1011 1218 4299 7143 8728 11072 15533 17356 33909 36833
360 1210 1375 2313 3493 16822 21373 23588 23656 26267 34098
544 1347 1433 2457 9186 10945 13583 14858 19195 34606 37441
37 596 715 4134 8091 12106 24307 24658 34108 40591 42883
235 398 1204 2075 6742 11670 13512 23231 24784 27915 34752
204 873 890 13550 16570 19774 34012 35249 37655 39885 42890

221 371 514 11984 14972 15690 28827 29069 30531 31018 43121
280 549 1435 1889 3310 10234 11575 15243 20748 30469 36005
223 666 1248 13304 14433 14732 18943 21248 23127 38529 39272
370 819 1065 9461 10319 25294 31958 33542 37458 39681 40039
585 870 1028 5087 5216 12228 16216 16381 16937 27132 27893
164 167 1210 7386 11151 20413 22713 23134 24188 36771 38992
298 511 809 4620 7347 8873 19602 24162 29198 34304 41145
105 830 1212 2415 14759 15440 16361 16748 22123 32684 42575
659 665 668 6458 22130 25972 30697 31074 32048 36078 37129
91 808 953 8015 8988 13492 13987 15979 28355 34509 39698
594 983 1265 3028 4029 9366 11069 11512 27066 40939 41639
506 740 1321 1484 10747 16376 17384 20285 31502 38925 42606
338 356 975 2022 3578 18689 18772 19826 22914 24733 27431
709 1264 1366 4617 8893 25226 27800 29080 30277 37781 39644
840 1179 1338 2973 3541 7043 12712 15005 17149 19910 36795
1009 1267 1380 4919 12679 22889 29638 30987 34637 36232 37284
466 913 1247 1646 3049 5924 9014 20539 34546 35029 36540
374 697 984 1654 5870 10883 11684 20294 28888 31612 34031
117 240 635 5093 8673 11323 12456 14145 21397 39619 42559
122 1265 1427 13528 14282 15241 16852 17227 34723 36836 39791
595 1180 1310 6952 17916 24725 24971 27243 29555 32138 35987
140 470 1017 13222 13253 18462 20806 21117 28673 31598 37235
7 710 1072 8014 10804 13303 14292 16690 26676 36443 41966
48 189 759 12438 14523 16388 23178 27315 28656 29111 29694
285 387 410 4294 4467 5949 25386 27898 34880 41169 42614
474 545 1320 10506 13186 18126 27110 31498 35353 36193 37322
1075 1130 1424 11390 13312 14161 16927 25071 25844 34287 38151
161 396 427 5944 17281 22201 25218 30143 35566 38261 42513
233 247 694 1446 3180 3507 9069 20764 21940 33422 39358
271 508 1013 6271 21760 21858 24887 29808 31099 35475 39924
8 674 1329 3135 5110 14460 28108 28388 31043 31137 31863
1035 1222 1409 8287 16083 24450 24888 29356 30329 37834 39684
391 1090 1128 1866 4095 10643 13121 14499 20056 22195 30593
55 161 1402 6289 6837 8791 17937 21425 26602 30461 37241
110 377 1228 6875 13253 17032 19008 23274 32285 33452 41630
360 638 1355 5933 12593 13533 23377 23881 24586 26040 41663
535 1240 1333 3354 10860 16032 32573 34908 34957 39255 40759
526 936 1321 7992 10260 18527 28248 29356 32636 34666 35552
336 785 875 7530 13062 13075 18925 27963 28703 33688 36502
36 591 1062 1518 3821 7048 11197 17781 19408 22731 24783
214 1145 1223 1546 9475 11170 16061 21273 38688 40051 42479
1136 1226 1423 20227 22573 24951 26462 29586 34915 42441 43048
26 276 1425 6048 7224 7917 8747 27559 28515 35002 37649
127 294 437 4029 8585 9647 11904 24115 28514 36893 39722
748 1093 1403 9536 19305 20468 31049 38667 40502 40720 41949
96 638 743 9806 12101 17751 22732 24937 32007 32594 38504
649 904 1079 2770 3337 9158 20125 24619 32921 33698 35173
401 518 984 7372 12438 12582 18704 35874 39420 39503 39790
10 451 1077 8078 16320 17409 25807 28814 30613 41261 42955
405 592 1178 15936 18418 19585 21966 24219 30637 34536 37838
50 584 851 9720 11919 22544 22545 25851 35567 41587 41876
911 1113 1176 1806 10058 10809 14220 19044 20748 29424 36671
441 550 1135 1956 11254 18699 30249 33099 34587 35243 39952
510 1016 1281 8621 13467 13780 15170 16289 20925 26426 34479
4969 5223 17117 21950 22144 24043 27151 39809
11452 13622 18918 19670 23995 32647 37200 37399
6351 6426 13185 13973 16699 22524 31070 31916
4098 10617 14854 18004 28580 36158 37500 38552.

The data processing device may be an independent device and may be an internal block constituting one device.

Advantageous Effects of Invention

According to the present technology, it is possible to ensure excellent communication quality in data transmission using LDPC codes.

Note that the effects described herein are not entirely limitative, and any effect described in the present disclosure is acceptable.

BRIEF DESCRIPTION OF DRAWINGS

FIG. 3 is an illustration of an example of a parity check matrix of an LDPC code.

FIG. 13 is an illustration of a parity check matrix of an LDPC code defined in a standard of DVB-T.2.

FIG. 15 is an illustration of an example of a parity matrix HT becoming a staircase structure and a Tanner graph corresponding to the parity matrix HT.

FIG. 21 is an illustration of a method of calculating a parity check matrix H from a parity check matrix initial value table.

FIG. 30 is an illustration of an example of the parity check matrix initial value table.

FIG. 31 is an illustration of an example of the parity check matrix initial value table.

FIG. 32 is an illustration of an example of the parity check matrix initial value table.

FIG. 33 is an illustration of an example of the parity check matrix initial value table.

FIG. 34 is an illustration of an example of the parity check matrix initial value table.

FIG. 35 is an illustration of an example of the parity check matrix initial value table.

FIG. 36 is an illustration of an example of the parity check matrix initial value table.

FIG. 37 is an illustration of an example of the parity check matrix initial value table.

FIG. 38 is an illustration of an example of the parity check matrix initial value table.

FIG. 39 is an illustration of an example of the parity check matrix initial value table.

FIG. 40 is an illustration of an example of the parity check matrix initial value table.

FIG. 41 is an illustration of an example of the parity check matrix initial value table.

FIG. 43 is an illustration of an example of the parity check matrix initial value table.

FIG. 44 is an illustration of an example of the parity check matrix initial value table.

FIG. 45 is an illustration of an example of the parity check matrix initial value table.

FIG. 46 is an illustration of an example of the parity check matrix initial value table.

FIG. 47 is an illustration of an example of the parity check matrix initial value table.

FIG. 48 is an illustration of an example of the parity check matrix initial value table.

FIG. 49 is an illustration of an example of the parity check matrix initial value table.

FIG. 50 is an illustration of an example of the parity check matrix initial value table.

FIG. 51 is an illustration of an example of the parity check matrix initial value table.

FIG. 52 is an illustration of an example of the parity check matrix initial value table.

FIG. 53 is an illustration of an example of the parity check matrix initial value table.

FIG. 54 is an illustration of an example of the parity check matrix initial value table.

FIG. 55 is an illustration of an example of the parity check matrix initial value table.

FIG. 56 is an illustration of an example of the parity check matrix initial value table.

FIG. 57 is an illustration of an example of the parity check matrix initial value table.

FIG. 58 is an illustration of an example of the parity check matrix initial value table.

FIG. 59 is an illustration of an example of the parity check matrix initial value table.

FIG. 60 is an illustration of an example of the parity check matrix initial value table.

FIG. 61 is an illustration of an example of the parity check matrix initial value table.

FIG. 62 is an illustration of an example of the parity check matrix initial value table.

FIG. 63 is an illustration of an example of the parity check matrix initial value table.

FIG. 64 is an illustration of an example of the parity check matrix initial value table.

FIG. 65 is an illustration of an example of the parity check matrix initial value table.

FIG. 66 is an illustration of an example of the parity check matrix initial value table.

FIG. 67 is an illustration of an example of the parity check matrix initial value table.

FIG. 68 is an illustration of an example of the parity check matrix initial value table.

FIG. 69 is an illustration of an example of the parity check matrix initial value table.

FIG. 70 is an illustration of an example of the parity check matrix initial value table.

FIG. 71 is an illustration of an example of the parity check matrix initial value table.

FIG. 72 is an illustration of an example of the parity check matrix initial value table.

FIG. 87 is an illustration of an example of coordinates of a signal point of a UC when a modulation method is QPSK.

FIG. 88 is an illustration of an example of coordinates of a signal point of a 2D NUC when a modulation method is 16QAM.

FIG. 89 is an illustration of an example of coordinates of a signal point of a 2D NUC when a modulation method is 64QAM.

FIG. 90 is an illustration of an example of coordinates of a signal point of a 2D NUC when a modulation method is 256QAM.

FIG. 91 is an illustration of an example of coordinates of a signal point of a 2D NUC when a modulation method is 1024QAM.

FIG. 92 is an illustration of relations between a symbol y and each of a real part Re ($z_q$) and an imaginary part Im ($z_q$) of complex numbers as the coordinate of a signal point $z_q$ of a 1D NUC corresponding to the symbol y.

FIG. 94 is an illustration of examples of a number of columns C of parts 1 and 2 corresponding to a combination of a code length N and a modulation system and part column lengths R1 and R2.

FIG. 97 is an illustration of a first example of a GW pattern for an LDPC code with a code length N of 64 k bits.

FIG. 98 is an illustration of a second example of a GW pattern for an LDPC code with a code length N of 64 k bits.

FIG. 99 is an illustration of a third example of a GW pattern for an LDPC code with a code length N of 64 k bits.

FIG. 100 is an illustration of a fourth example of a GW pattern for an LDPC code with a code length N of 64 k bits.

FIG. 101 is an illustration of a fifth example of a GW pattern for an LDPC code with a code length N of 64 k bits.

FIG. 102 is an illustration of a sixth example of a GW pattern for an LDPC code with a code length N of 64 k bits.

FIG. 103 is an illustration of a seventh example of a GW pattern for an LDPC code with a code length N of 64 k bits.

FIG. 104 is an illustration of an eighth example of a GW pattern for an LDPC code with a code length N of 64 k bits.

FIG. 105 is an illustration of a ninth example of a GW pattern for an LDPC code with a code length N of 64 k bits.

FIG. 106 is an illustration of a 10th example of a GW pattern for an LDPC code with a code length N of 64 k bits.

FIG. 107 is an illustration of a 11th example of a GW pattern for an LDPC code with a code length N of 64 k bits.

FIG. 108 is an illustration of a 12th example of a GW pattern for an LDPC code with a code length N of 64 k bits.

FIG. 109 is an illustration of a 13th example of a GW pattern for an LDPC code with a code length N of 64 k bits.

FIG. 110 is an illustration of a 14th example of a GW pattern for an LDPC code with a code length N of 64 k bits.

FIG. 111 is an illustration of a 15th example of a GW pattern for an LDPC code with a code length N of 64 k bits.

FIG. 120 is an illustration of simulation results of simulations for measuring an error rate.

FIG. 121 is an illustration of simulation results of simulations for measuring an error rate.

FIG. 122 is an illustration of simulation results of simulations for measuring an error rate.

FIG. 123 is an illustration of simulation results of simulations for measuring an error rate.

FIG. 124 is an illustration of simulation results of simulations for measuring an error rate.

FIG. 125 is an illustration of simulation results of simulations for measuring an error rate.

FIG. 126 is an illustration of simulation results of simulations for measuring an error rate.

FIG. 127 is a block diagram illustrating an example of a configuration of the receiving device 12.

FIG. 128 is a block diagram illustrating an example of a configuration of a bit deinterleaver 165.

Figure 129:
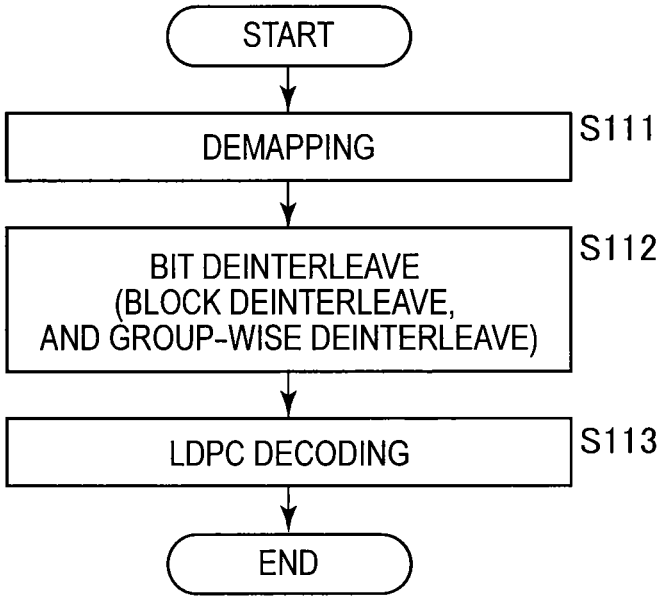

FIG. 129 is a flowchart describing an example of a process performed by a demapper 164, the bit deinterleaver 165, and an LDPC decoder 166.

Figure 130:
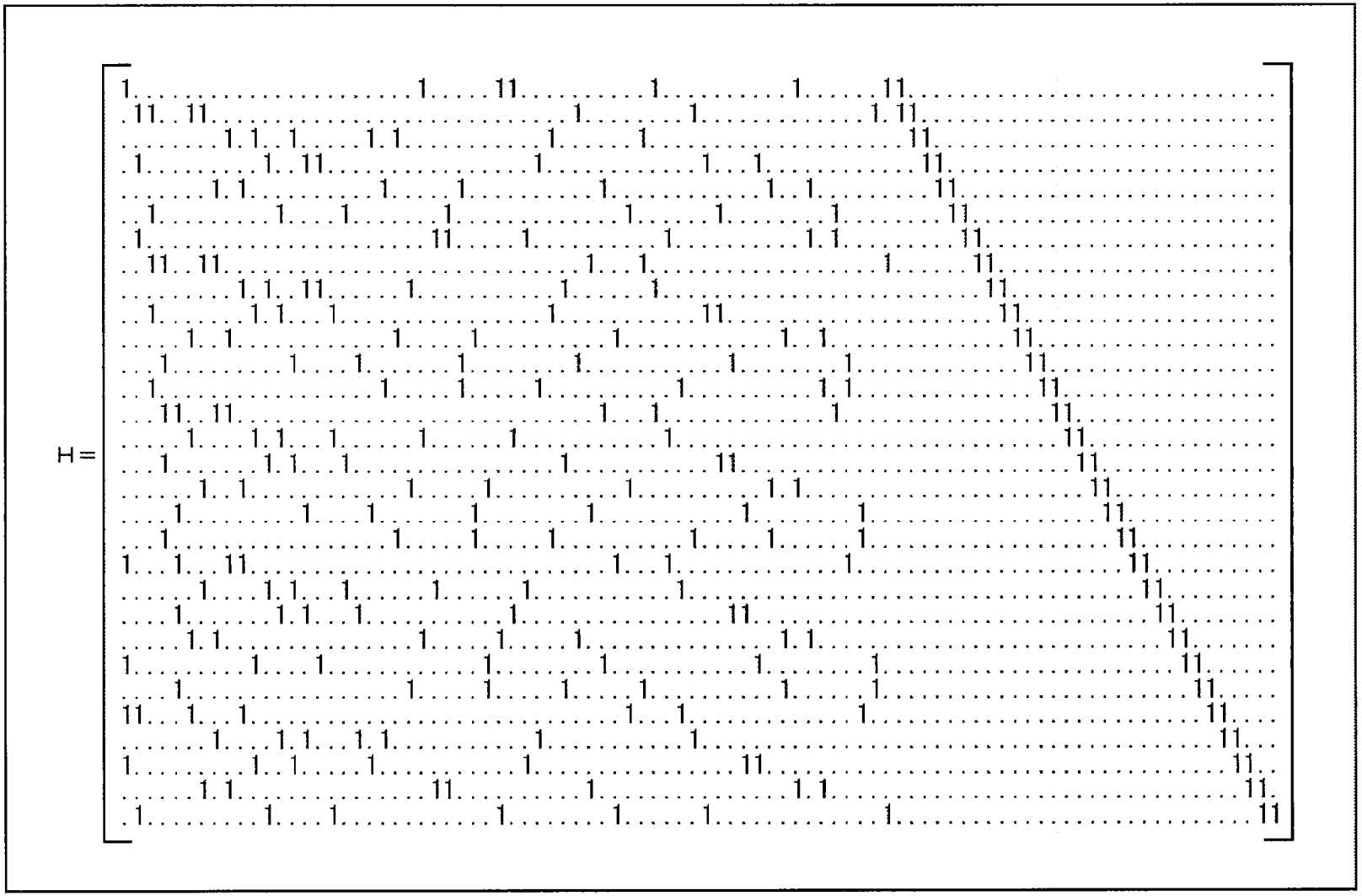

FIG. 130 is an illustration of an example of a parity check matrix of an LDPC code.

Figure 131:
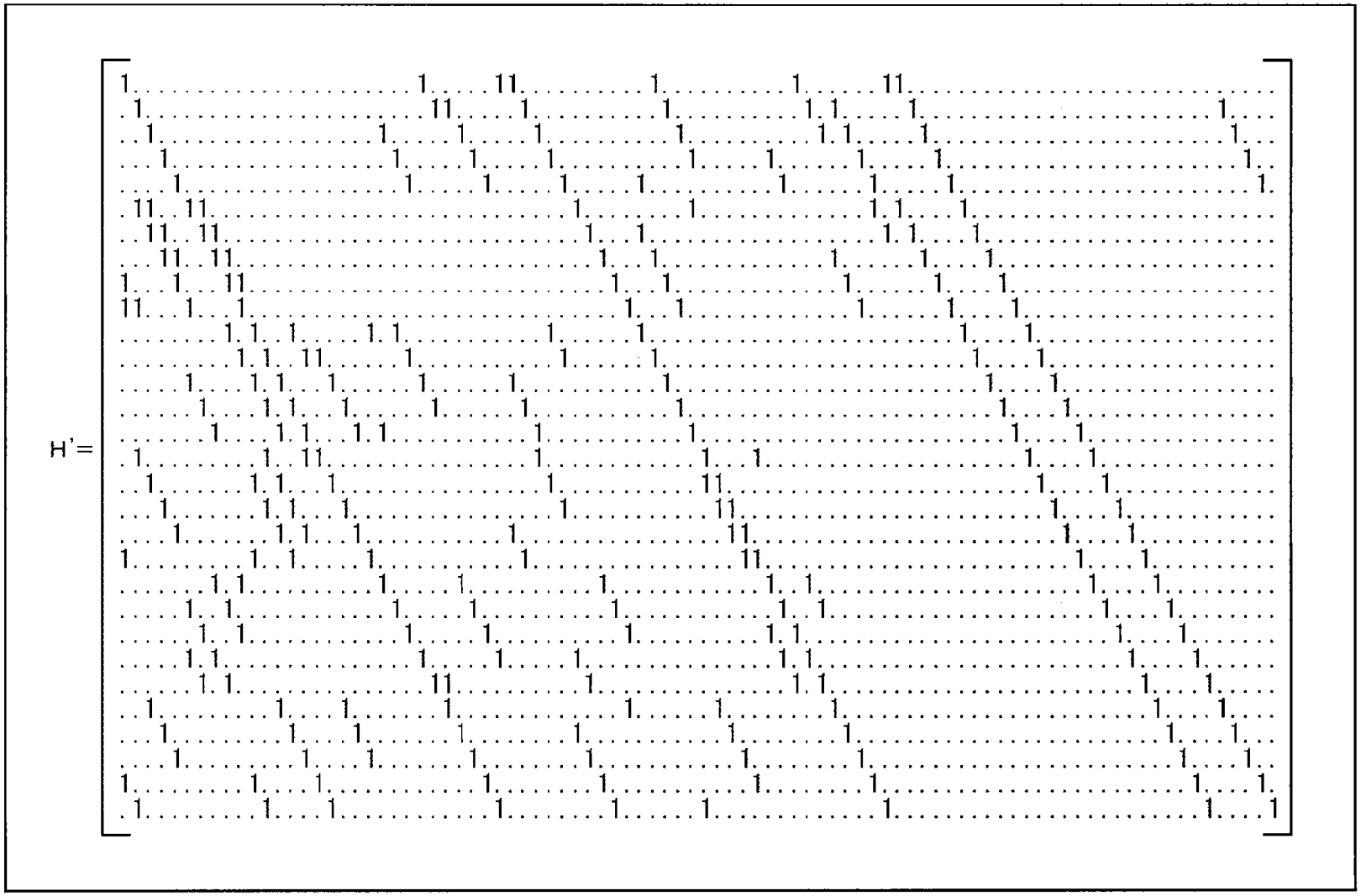

FIG. 131 is an illustration of an example of a matrix obtained by performing row permutation and column permutation on a parity check matrix (transformed parity check matrix).

Figure 132:
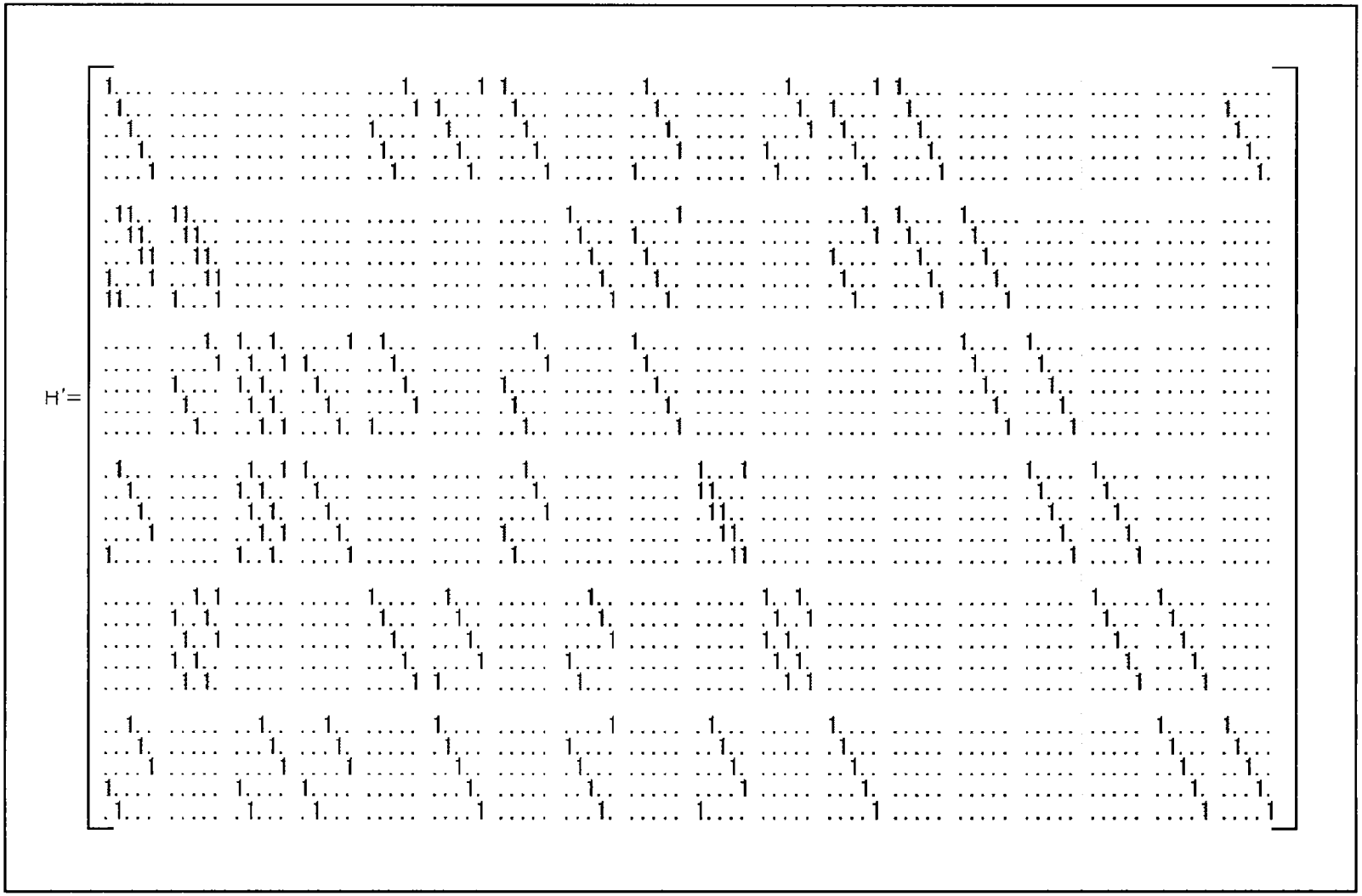

FIG. 132 is an illustration of an example of a transformed parity check matrix divided into 5×5 units.

Figure 133:
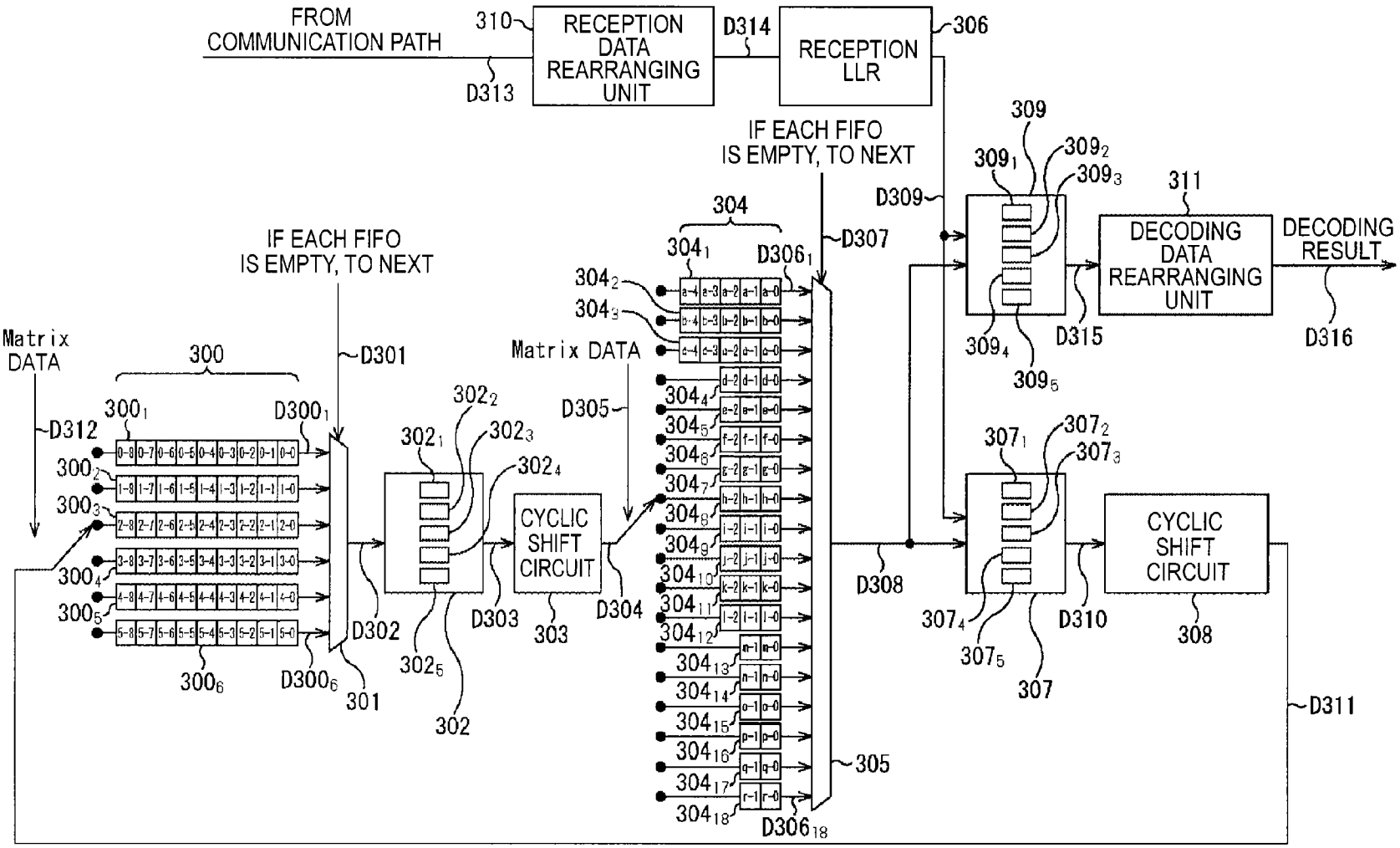

FIG. 133 is a block diagram illustrating an example of a configuration of a decoding device which collectively performs P node operations.

Figure 134:
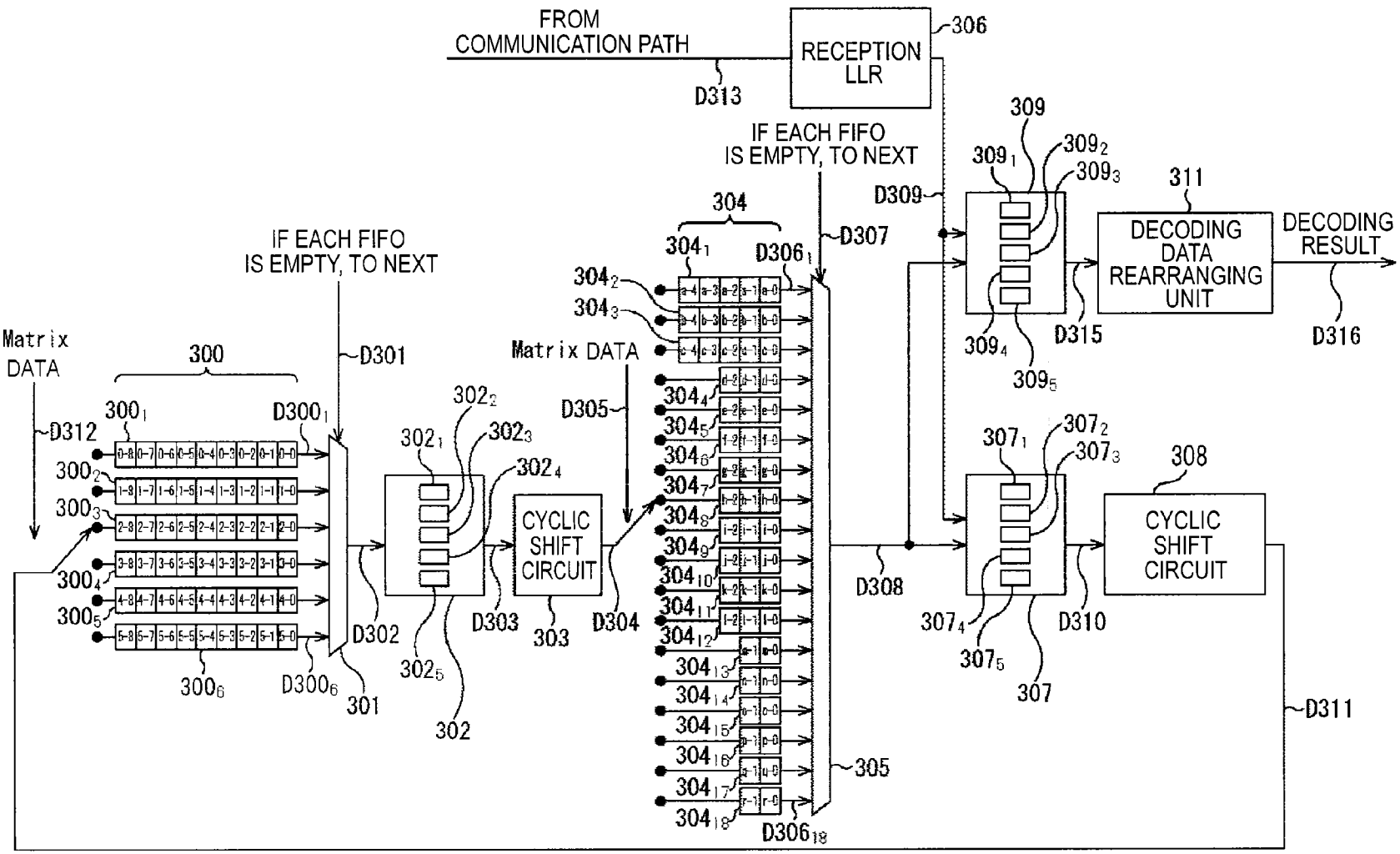

FIG. 134 is a block diagram illustrating an example of a configuration of the LDPC decoder 166.

Figure 135:
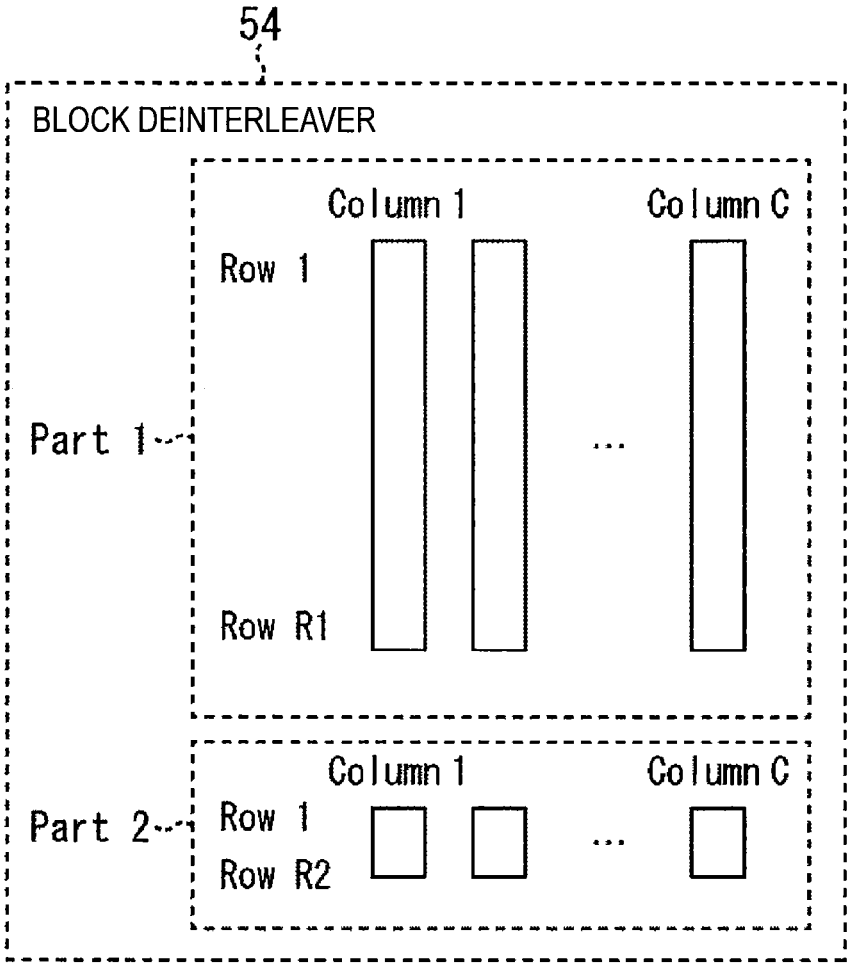

FIG. 135 is a block diagram illustrating an example of a configuration of a block deinterleaver 54.

Figure 136:
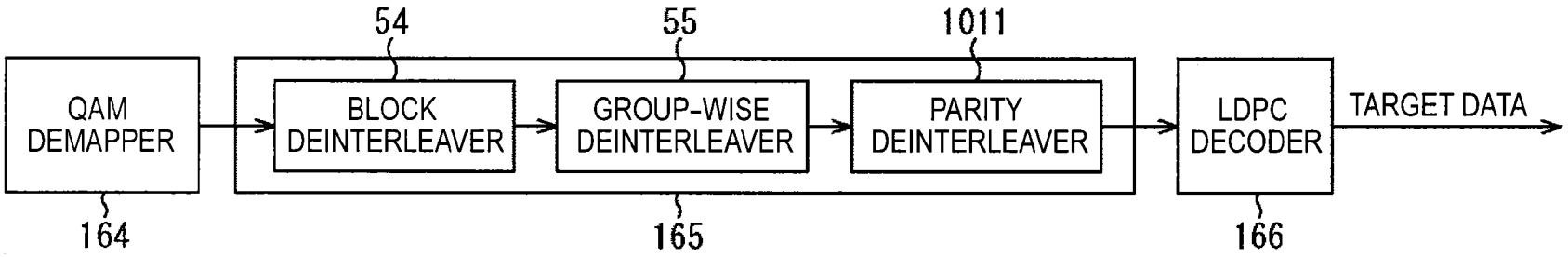

FIG. 136 is a block diagram illustrating another example of the configuration of the bit deinterleaver 165.

Figure 137:
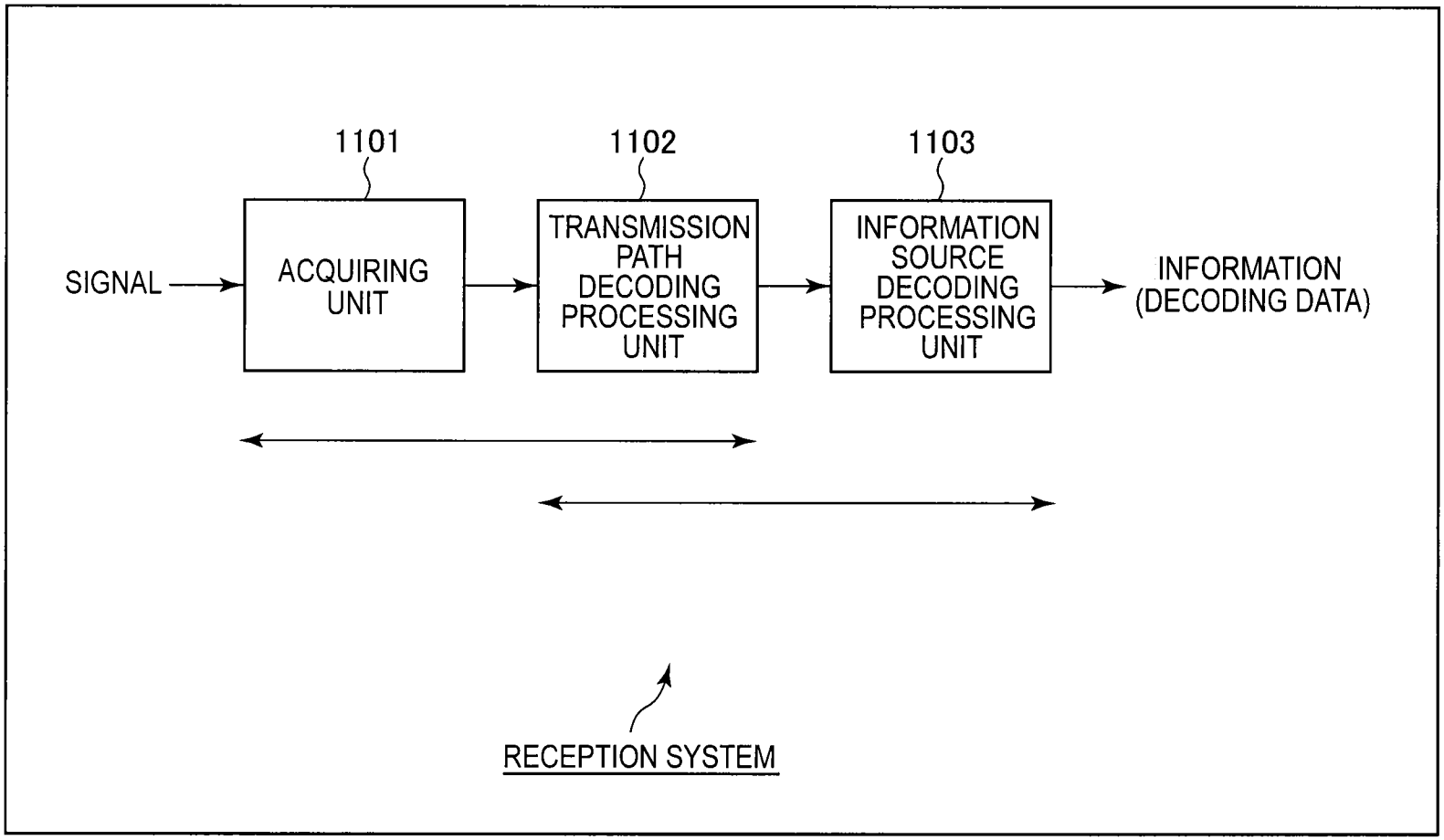

FIG. 137 is a block diagram illustrating a first example of a configuration of a reception system to which the receiving device 12 can be applied.

Figure 138:
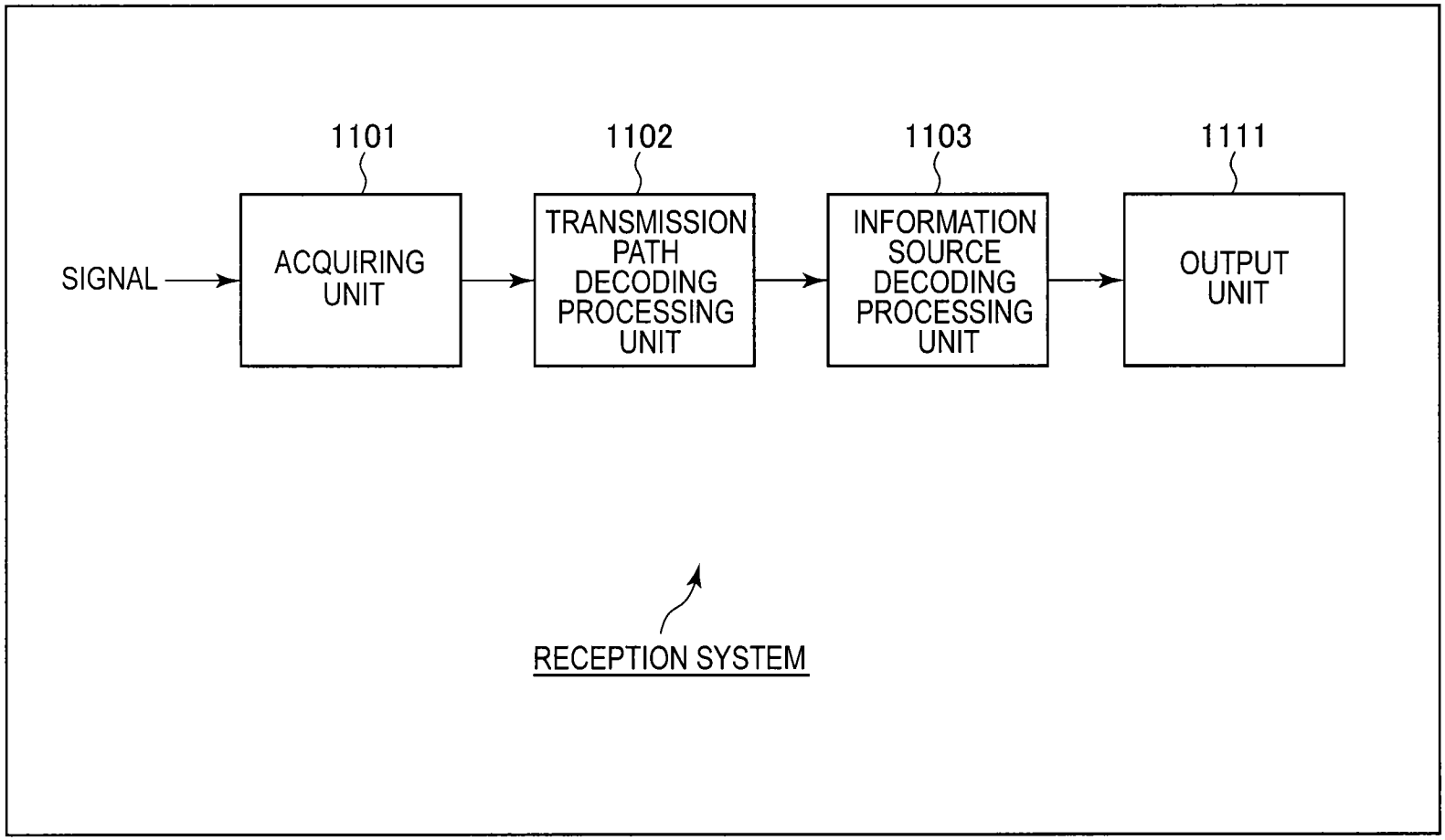

FIG. 138 is a block diagram illustrating a second example of the configuration of the reception system to which the receiving device 12 can be applied.

Figure 139:
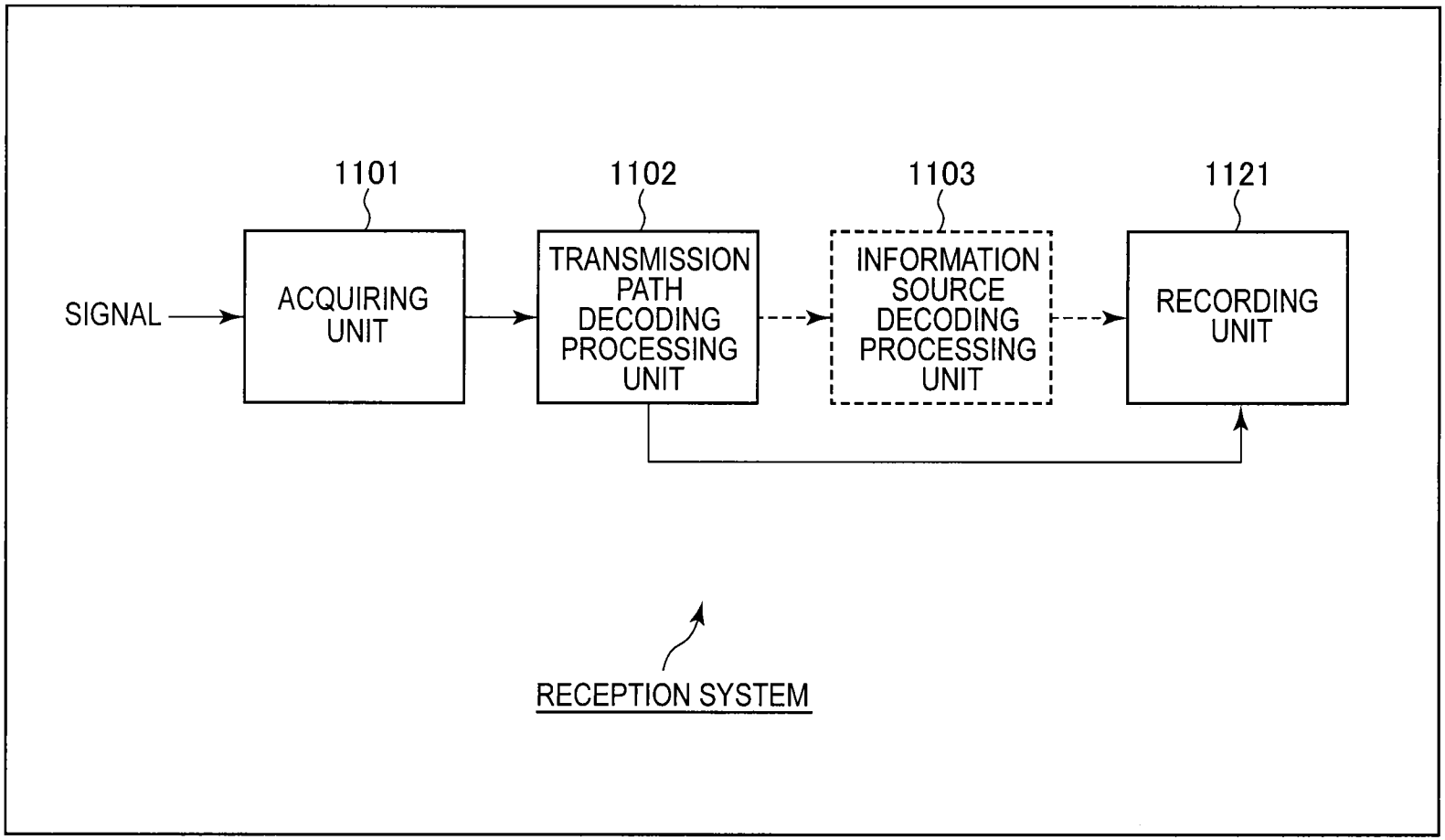

FIG. 139 is a block diagram illustrating a third example of the configuration of the reception system to which the receiving device 12 can be applied.

Figure 140:
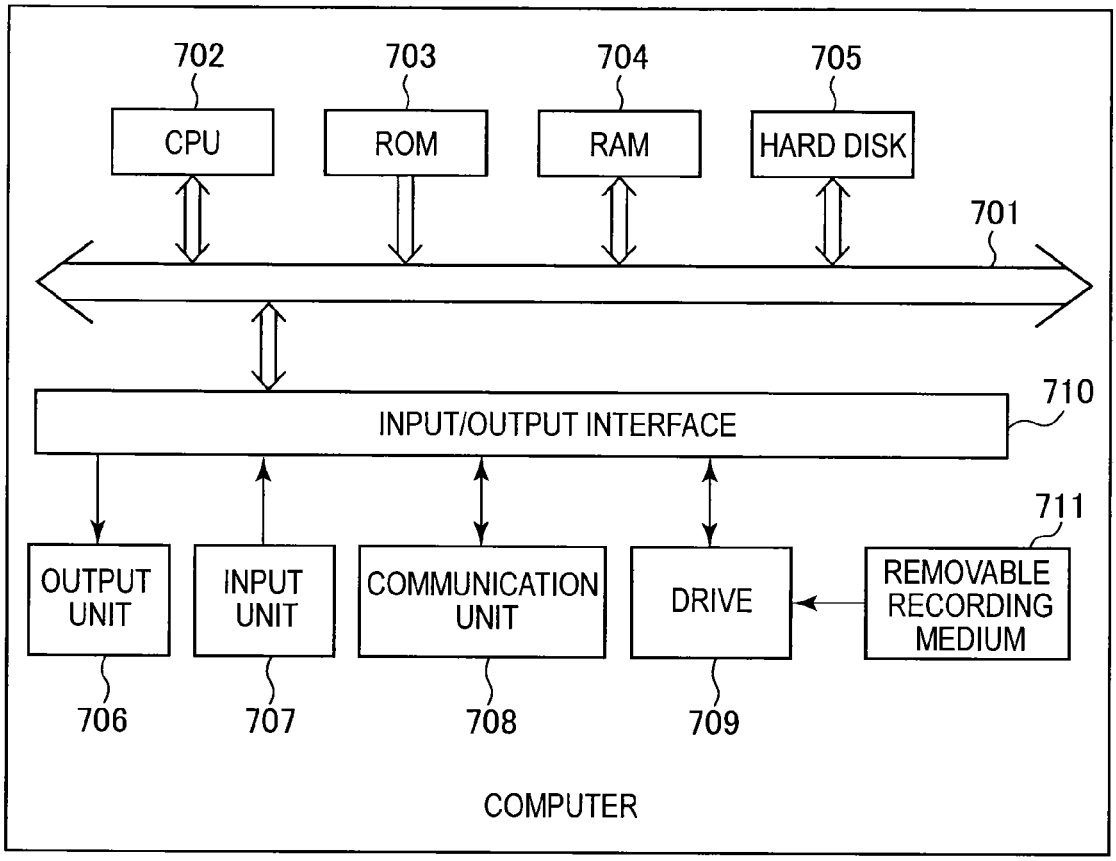

FIG. 140 is a block diagram illustrating an example of a configuration of an embodiment of a computer to which the present technology is applied.

DESCRIPTION OF EMBODIMENTS

Embodiments of the present technology will be described below; however, prior to the description, an LDPC code will be described.

<LDPC Code>

The LDPC code is a linear code and it is not necessary for the LDPC code to be a binary code. However, in this case, it is assumed that the LDPC code is the binary code.

A maximum characteristic of the LDPC code is that a parity check matrix defining the LDPC code is sparse. In this case, the sparse matrix is a matrix in which the number of "1" of elements of the matrix is very small (a matrix in which most elements are 0).

Figure 1:
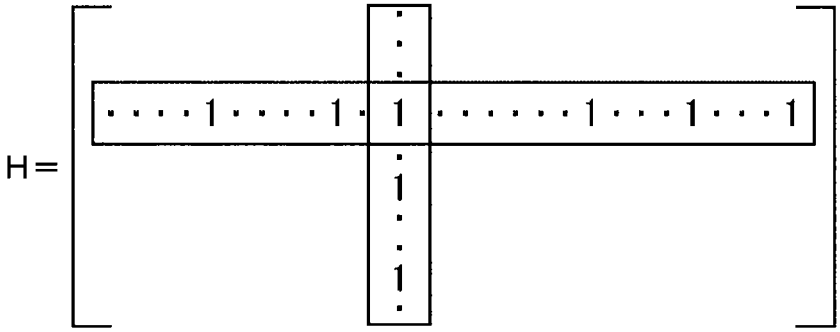
FIG. 1 is an illustration of a parity check matrix H of an LDPC code.

FIG. 1 is an illustration of an example of a parity check matrix H of an LDPC code.

In the parity check matrix H of FIG. 1, a weight of each column (the column weight) (the number of "1") becomes "3" and a weight of each row (the row weight) becomes "6".

In encoding using the LDPC code (LDPC encoding), for example, a generation matrix G is generated on the basis of the parity check matrix H and the generation matrix G is multiplied by binary information bits, so that a code word (LDPC code) is generated.

Specifically, an encoding device that performs the LDPC encoding first calculates the generation matrix G in which an expression $GH^T=0$ is realized, between a transposed matrix $H^T$ of the parity check matrix H and the generation matrix G. In this case, when the generation matrix G is a K×N matrix, the encoding device multiplies the generation matrix G with a bit string (vector u) of information bits including K bits and generates a code word c (=uG) including N bits. The code word (LDPC code) that is generated by the encoding device is received at a reception side through a predetermined communication path.

The LDPC code can be decoded by an algorithm called probabilistic decoding suggested by Gallager, that is, a message passing algorithm using belief propagation on a so-called Tanner graph, including a variable node (also referred to as a message node) and a check node. Hereinafter, the variable node and the check node are appropriately referred to as nodes simply.

Figure 2:
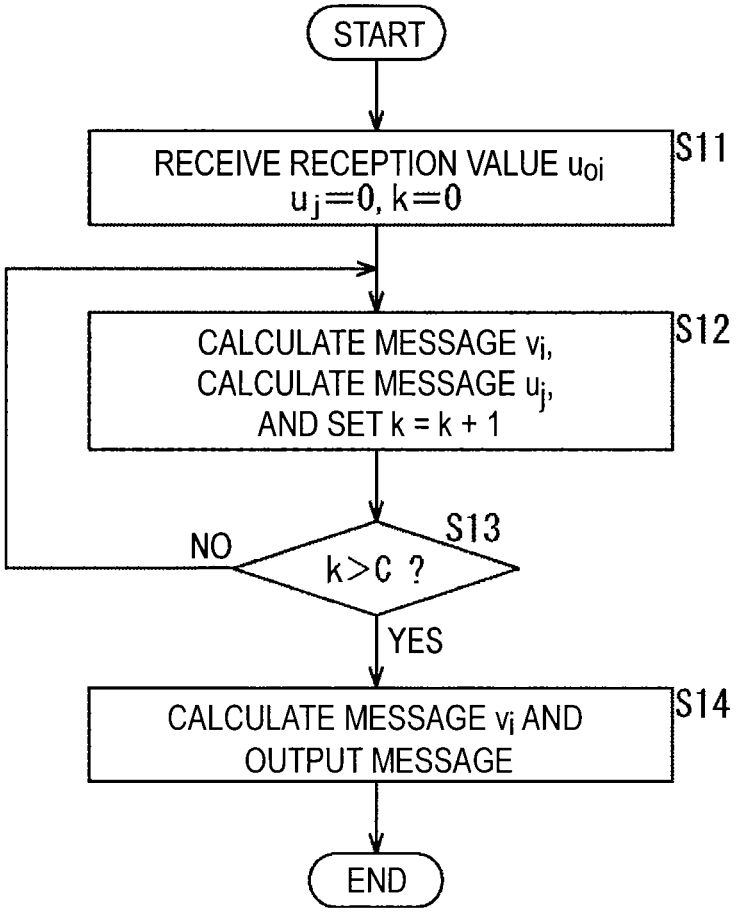
FIG. 2 is a flowchart describing a decoding sequence of an LDPC code.

FIG. 2 is a flowchart illustrating a decoding sequence of an LDPC code.

Hereinafter, a real value (a reception LLR) that is obtained by representing the likelihood of "0" of a value of an i-th code bit of the LDPC code (one code word) received by the reception side by a log likelihood ratio is appropriately referred to as a reception value $u_{0i}$. In addition, a message output from the check node is referred to as $u_j$ and a message output from the variable node is referred to as $v_i$.

First, in decoding of the LDPC code, as illustrated in FIG. 2, in Step S11, the LDPC code is received, the message (check node message) $u_j$ is initialized to "0", and a variable k taking an integer as a counter of repetition processing is initialized to "0", and the processing proceeds to Step S12. In Step S12, the message (variable node message) $v_i$ is calculated by performing an operation (variable node operation) represented by Expression (1), on the basis of the reception value $u_{0i}$ obtained by receiving the LDPC code, and the message $u_j$ is calculated by performing an operation (check node operation) represented by Expression (2), on the basis of the message $v_i$.

[Math 1]

$$v_i = u_{0i} + \sum_{j=1}^{d_v-1} u_j \tag{1}$$

[Math 2]

$$\tanh\left(\frac{u_j}{2}\right) = \prod_{i=1}^{d_c-1} \tanh\left(\frac{v_i}{2}\right) \tag{2}$$

Here, $d_v$ and $d_c$ in Expression (1) and Expression (2) are respectively parameters which can be arbitrarily selected and illustrates the number of "1" in the longitudinal direction (column) and transverse direction (row) of the parity check matrix H. For example, in the case of an LDPC code ((3, 6) LDPC code) with respect to the parity check matrix H with a column weight of 3 and a row weight of 6 as illustrated in FIG. 1, $d_v=3$ and $d_c=6$ are established.

In the variable node operation of Expression (1) and the check node operation of Expression (2), because a message input from an edge (line coupling the variable node and the check node) for outputting the message is not an operation target, an operation range becomes 1 to $d_v-1$ or 1 to $d_e-1$. The check node operation of Expression (2) is performed actually by previously making a table of a function $R(v_1, v_2)$ represented by Expression (3) defined by one output with respect to two inputs $v_1$ and $v_2$ and using the table consecutively (recursively), as represented by Expression (4).

[Math 3]

$$x=2\tanh^{-1}\{\tanh(v_1/2)\tanh(v_2/2)\}=R(v_1,v_2) \tag{3}$$

[Math 4]

$$u_j=R(V_1,R(v_2,R(v_3, \ldots R(V_{d_o}-2,V_{d_o}-1)))) \tag{4}$$

In Step S12, the variable k is incremented by "1" and the processing proceeds to Step S13. In Step S13, it is determined whether the variable k is more than the predetermined repetition decoding number of times C. When it is determined in Step S13 that the variable k is not more than C, the processing returns to Step S12 and the same processing is repeated hereinafter.

When it is determined in Step S13 that the variable k is more than C, the processing proceeds to Step S14, the message $v_i$ that corresponds to a decoding result to be finally output is calculated by performing an operation represented by Expression (5) and is output, and the decoding processing of the LDPC code ends.

[Math 5]

$$v_i = u_{0i} + \sum_{j=1}^{d_v} u_j \tag{5}$$

In this case, the operation of Expression (5) is performed using messages $u_j$ from all edges connected to the variable node, different from the variable node operation of Expression (1).

FIG. 3 is a diagram illustrating an example of the parity check matrix H of the (3, 6) LDPC code (an encoding rate of 1/2 and a code length of 12).

In the parity check matrix H of FIG. 3, a weight of a column is set to 3 and a weight of a row is set to 6, similar to FIG. 1.

Figure 4:
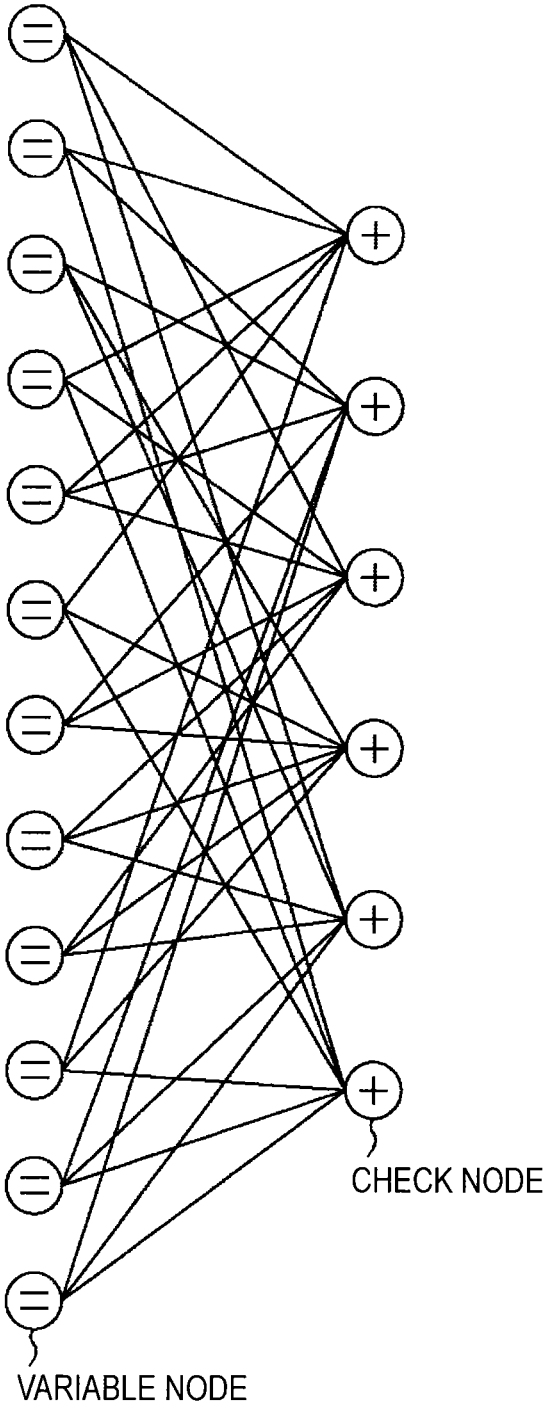
FIG. 4 is an illustration of an example of a Tanner graph of a parity check matrix.

FIG. 4 is a diagram illustrating a Tanner graph of the parity check matrix H of FIG. 3.

In FIG. 4, the check node is represented by "+" (plus) and the variable node is represented by "=" (equal). The check node and the variable node correspond to the row and the column of the parity check matrix H. A line that couples the check node and the variable node is the edge and corresponds to "1" of elements of the parity check matrix.

That is, when an element of a j-th row and an i-th column of the parity check matrix is 1, in FIG. 4, an i-th variable node (node of "=") from the upper side and a j-th check node (node of "+") from the upper side are connected by the edge. The edge shows that a code bit corresponding to the variable node has a restriction condition corresponding to the check node.

In a sum product algorithm that is a decoding method of the LDPC code, the variable node operation and the check node operation are repetitively performed.

Figure 5:
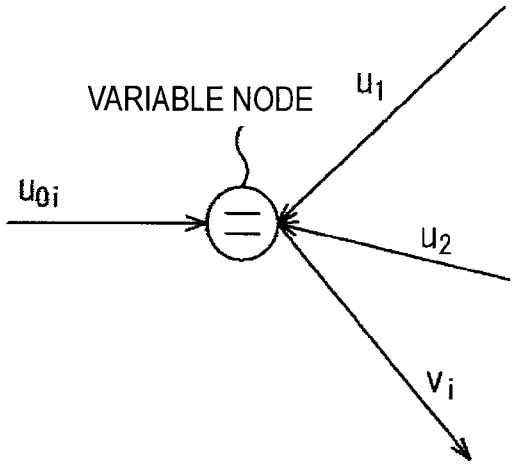
FIG. 5 is an illustration of an example of a variable node.

FIG. 5 is a diagram illustrating the variable node operation that is performed by the variable node.

In the variable node, the message $v_i$ that corresponds to the edge for calculation is calculated by the variable node operation of Expression (1) using messages $u_1$ and $u_2$ from the remaining edges connected to the variable node and the reception value $u_{0i}$. The messages that correspond to the other edges are also calculated by the same method.

Figure 6:
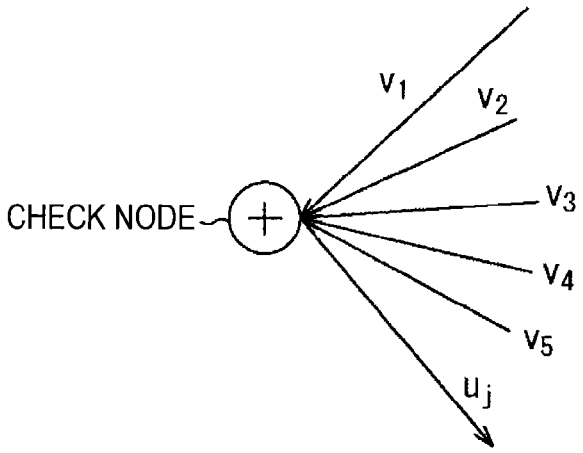
FIG. 6 is an illustration of an example of a check node.

FIG. 6 is a diagram illustrating the check node operation that is performed by the check node.

In this case, the check node operation of Expression (2) can be rewritten by Expression (6) using a relation of an expression $a \times b = \exp\{\ln(|a|)+\ln(|b|)\} \times \mathrm{sign}(a) \times \mathrm{sign}(b)$. However, sign (x) is 1 in the case of $x \geq 0$ and is −1 in the case of $x<0$.

[Math 6]

$$\begin{aligned} u_j &= 2\tanh^{-1}\left(\prod_{i=1}^{d_c-1} \tanh\left(\frac{v_i}{2}\right)\right) \\ &= 2\tanh^{-1}\left[\exp\left\{\sum_{i=1}^{d_c-1} \ln\left(\left|\tanh\left(\frac{v_i}{2}\right)\right|\right)\right\} \times \prod_{i=1}^{d_c-1} \mathrm{sign}\left(\tanh\left(\frac{v_i}{2}\right)\right)\right] \end{aligned} \tag{6}$$

-continued $$= 2\tanh^{-1}\left[\exp\left\{-\left(\sum_{i=1}^{d_c-1} -\ln\left(\tanh\left(\frac{|v_i|}{2}\right)\right)\right)\right\}\right] \times \prod_{i=1}^{d_c-1} \mathrm{sign}(v_i)$$

In $x \geq 0$, if a function $\varphi(x)$ is defined as an expression $\varphi(x)=\ln(\tan h(x/2))$, an expression $\varphi^{-1}(x)=2 \tan h^{-1}(e^{-X})$ is realized. For this reason, Expression (6) can be changed to Expression (7).

[Math 7]

$$u_j = \phi^{-1}\left(\sum_{i=1}^{d_c-1} \phi(|v_i|)\right) \times \prod_{i=1}^{d_c-1} \mathrm{sign}(v_i) \tag{7}$$

In the check node, the check node operation of Expression (2) is performed according to Expression (7).

That is, in the check node, as illustrated in FIG. 6, the message $u_j$ that corresponds to the edge for calculation is calculated by the check node operation of Expression (7) using messages $v_1$, $v_2$, $v_3$, $v_4$, and $v_5$ from the remaining edges connected to the check node. The messages that correspond to the other edges are also calculated by the same method.

The function $\varphi(x)$ of Expression (7) can be represented as $\varphi(x)=\ln((e^x+1)/(e^x-1))$ and $\varphi(x)=\varphi^{-1}(x)$ is satisfied in $x>0$. When the functions $\varphi(x)$ and $\varphi^{-1}(x)$ are mounted to hardware, the functions $\varphi(x)$ and $\varphi^{-1}(x)$ may be mounted using an LUT (Look Up Table). However, both the functions $\varphi(x)$ and $\varphi^{-1}(x)$ become the same LUT.

<Configuration Example of Transmission System to which Present Disclosure is Applied>

Figure 7:
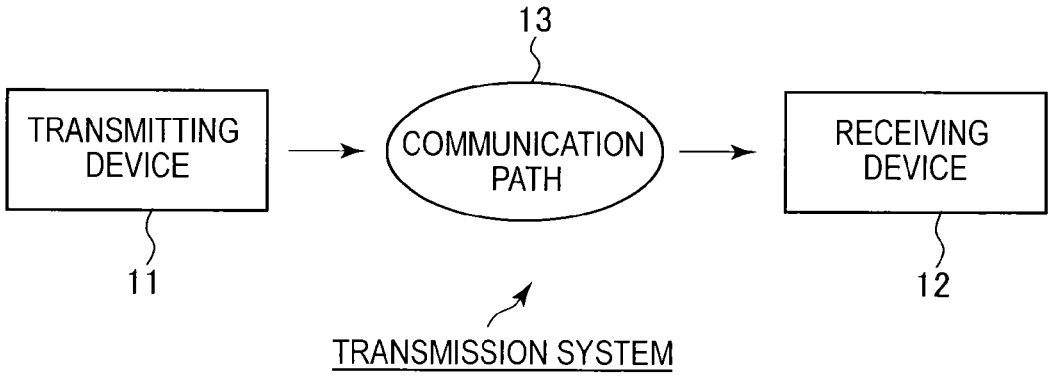
FIG. 7 is an illustration of an example of a configuration of an embodiment of a transmission system to which the present technology is applied.

FIG. 7 illustrates an example of a configuration of an embodiment of a transmission system (a system means a logical gathering of a plurality of devices and a device of each configuration may be arranged or may not be arranged in the same housing) to which the present technology is applied.

In FIG. 7, the transmission system includes a transmitting device 11 and a receiving device 12.

For example, the transmitting device 11 transmits (broadcasts) (transfers) a program of television broadcasting, and so on. That is, for example, the transmitting device 11 encodes target data that is a transmission target such as image data and audio data as a program into LDPC codes, and, for example, transmits them through a communication path 13 such as a satellite circuit, a ground wave and a cable (wire circuit).

The receiving device 12 receives the LDPC code transmitted from the transmitting device 11 through the communication path 13, decodes the LDPC code to obtain the target data, and outputs the target data.

In this case, it is known that the LDPC code used by the transmission system of FIG. 7 shows the very high capability in an Additive White Gaussian Noise (AWGN) communication path.

Meanwhile, in the communication path 13, burst error or erasure may be generated. Especially in the case where the communication path 13 is the ground wave, for example, in an Orthogonal Frequency Division Multiplexing (OFDM) system, power of a specific symbol may become 0 (erasure) according to delay of an echo (paths other than a main path), under a multi-path environment in which D/U (Desired to Undesired Ratio) is 0 dB (power of Undesired=echo is equal to power of Desired=main path).

In the flutter (communication path in which delay is 0 and an echo having a Doppler frequency is added), when D/U is 0 dB, entire power of an OFDM symbol at a specific time may become 0 (erasure) by the Doppler frequency.

In addition, the burst error may be generated due to a situation of a wiring line from a receiving unit (not illustrated in the drawings) of the side of the receiving device 12 such as an antenna receiving a signal from the transmitting device 11 to the receiving device 12 or instability of a power supply of the receiving device 12.

Meanwhile, in decoding of the LDPC code, in the variable node corresponding to the column of the parity check matrix H and the code bit of the LDPC code, as illustrated in FIG. 5 described above, the variable node operation of Expression (1) with the addition of (the reception value u0i of) the code bit of the LDPC code is performed. For this reason, if error is generated in the code bits used for the variable node operation, precision of the calculated message is deteriorated.

In the decoding of the LDPC code, in the check node, the check node operation of Expression (7) is performed using the message calculated by the variable node connected to the check node. For this reason, if the number of check nodes in which error (including erasure) is generated simultaneously in (the code bits of the LDPC codes corresponding to) the plurality of connected variable nodes increases, decoding performance is deteriorated.

That is, if the two or more variable nodes of the variable nodes connected to the check node become simultaneously erasure, the check node returns a message in which the probability of a value being 0 and the probability of a value being 1 are equal to each other, to all the variable nodes. In this case, the check node that returns the message of the equal probabilities does not contribute to one decoding processing (one set of the variable node operation and the check node operation). As a result, it is necessary to increase the repetition number of times of the decoding processing, the decoding performance is deteriorated, and consumption power of the receiving device 12 that performs decoding of the LDPC code increases.

Therefore, in the transmission system of FIG. 7, tolerance against the burst error or the erasure can be improved while performance in the AWGN communication path (AWGN channel) is maintained.

<Example of Configuration of Transmitting Device 11>

Figure 8:
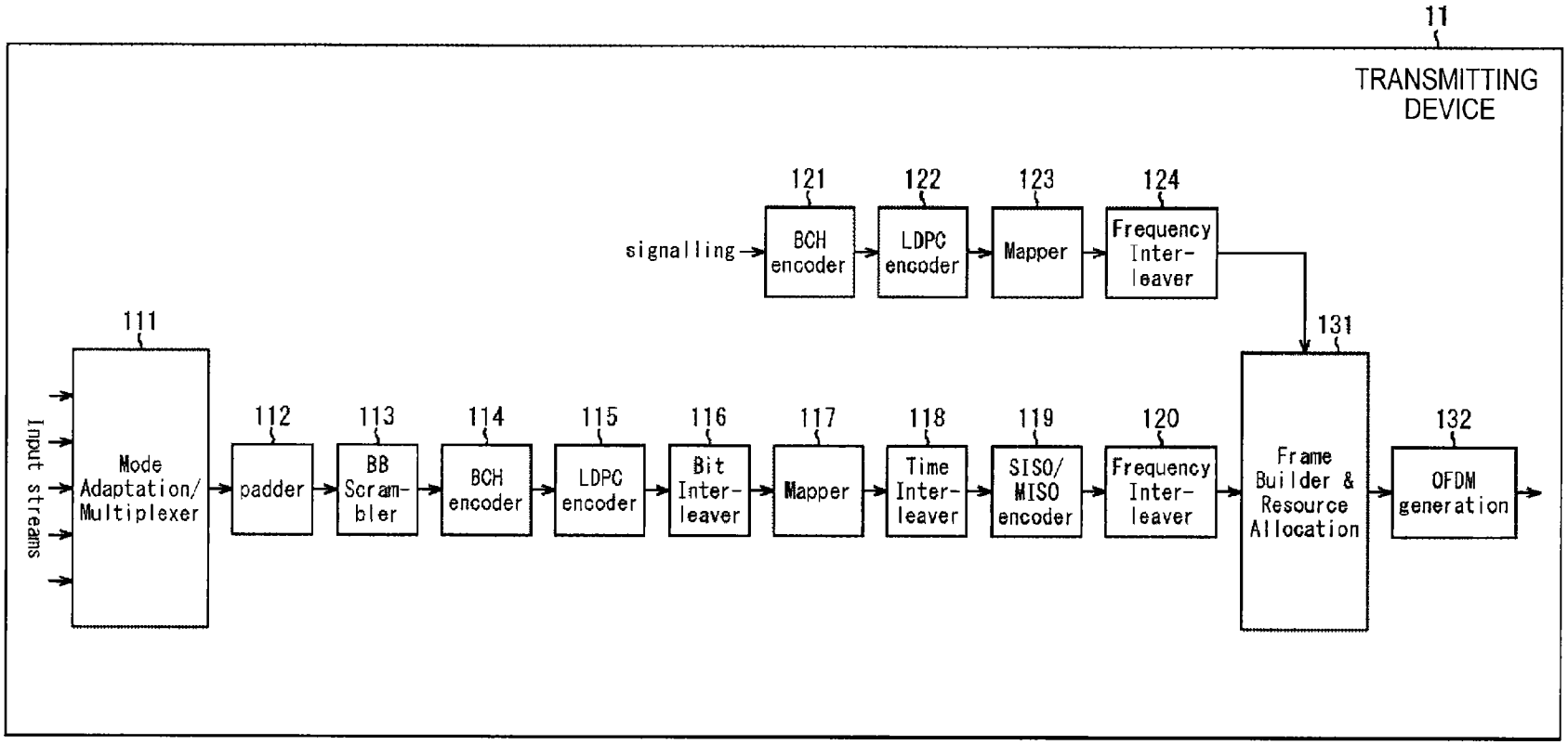
FIG. 8 is a block diagram illustrating an example of a configuration of a transmitting device 11.

FIG. 8 is a block diagram illustrating an example of a configuration of the transmitting device 11 of FIG. 7.

In the transmitting device 11, one or more input streams corresponding to target data are supplied to a mode adaptation/multiplexer 111.

The mode adaptation/multiplexer 111 performs mode selection and processes such as multiplexing of one or more input streams supplied thereto, as needed, and supplies data obtained as a result to a padder 112.

The padder 112 performs necessary zero padding (insertion of Null) with respect to the data supplied from the mode adaptation/multiplexer 111 and supplies data obtained as a result to a BB scrambler 113.

The BB scrambler 113 performs base-band scrambling (BB scrambling) with respect to the data supplied from the padder 112 and supplies data obtained as a result to a BCH encoder 114.

The BCH encoder 114 performs BCH encoding with respect to the data supplied from the BB scrambler 113 and supplies data obtained as a result as LDPC target data to be an LDPC encoding target to an LDPC encoder 115.

The LDPC encoder 115 performs, for example, LDPC encoding according to a parity check matrix in which a parity matrix to be a portion corresponding to a parity bit of an LDPC code becomes a staircase (dual diagonal) structure with respect to the LDPC target data supplied from the BCH encoder 114, and outputs an LDPC code in which the LDPC target data is information bits.

That is, the LDPC encoder 115 performs the LDPC encoding to encode the LDPC target data with an LDPC such as the LDPC code (corresponding to the parity check matrix) defined in the predetermined standard of the DVB-S.2, the DVB-T.2, the DVB-C.2 or the like and outputs the LDPC code that is yet to be applied by ATSC 3.0 (corresponding to the parity check matrix) or the like obtained as a result.

The LDPC code defined in the standard of the DVB-T.2 and the LDPC code that is to be adopted by the ATSC 3.0 are an Irregular Repeat Accumulate (IRA) code and a parity matrix of the parity check matrix of the LDPC code becomes a staircase structure. The parity matrix and the staircase structure will be described later. The IRA code is described in "Irregular Repeat-Accumulate Codes", H. Jin, A. Khandekar, and R. J. McEliece, in Proceedings of 2nd International Symposium on Turbo codes and Related Topics, pp. 1 to 8, September 2000, for example.

The LDPC code that is output by the LDPC encoder 115 is supplied to the bit interleaver 116.

The bit interleaver 116 performs bit interleaving to be described later with respect to the LDPC code supplied from the LDPC encoder 115 and supplies the LDPC code after the bit interleaving to a mapper 117.

The mapper 117 maps the LDPC code supplied from the bit interleaver 116 to a signal point representing one symbol of quadrature modulation in a unit (symbol unit) of code bits of one or more bits of the LDPC code and performs the quadrature modulation (multilevel modulation).

That is, the mapper 117 performs mapping the LDPC code supplied from the bit interleaver 116 to a signal point determined by a modulation method performing the quadrature modulation of the LDPC code, on an IQ plane (IQ constellation) defined by an I axis representing an I component of the same phase as a carrier and a Q axis representing a Q component orthogonal to the carrier, and performs the quadrature modulation.

When the number of signal points decided using a modulation method of quadrature modulation performed by the mapper 117 is $2^m$, code bits having m bits of an LDPC code are set as a symbol (one symbol) and the mapper 117 maps the LDPC code from the bit interleaver 116 to a signal point indicating the symbol among the $2^m$ signal points in units of symbols.

In this case, as the modulation method of the quadrature modulation performed by the mapper 117, there are modulation methods including the modulation method defined in the standard of the DVB-T.2 or the like, and other modulation method to be adopted by the ATSC 3.0, that is, BPSK (Binary Phase Shift Keying), QPSK (Quadrature Phase Shift Keying), 8PSK (Phase-Shift Keying), 16APSK (Amplitude Phase-Shift Keying), 32APSK, 16QAM (Quadrature Amplitude Modulation), 16QAM, 64QAM, 256QAM, 1024QAM, 4096QAM, 4PAM (Pulse Amplitude Modulation), or the like. In the mapper 117, to perform the quadrature modulation based on which modulation method is previously set according to an operation of an operator of the transmitting device 11.

Data (mapping result in which the symbol is mapped to the signal point) that is obtained by processing in the mapper 117 is supplied to the time interleaver 118.

The time interleaver 118 performs time interleaving (interleaving in a time direction) in a unit of symbol with respect to the data supplied from the mapper 117 and supplies data obtained as a result to an SISO/MISO encoder (SISO/MISO (Single Input Single Output/Multiple Input Single Output) encoder) 119.

The SISO/MISO encoder 119 performs spatiotemporal encoding with respect to the data supplied from the time interleaver 118 and supplies the data to the frequency interleaver 120.

The frequency interleaver 120 performs frequency interleaving (interleaving in a frequency direction) in a unit of symbol with respect to the data supplied from the SISO/MISO encoder 119 and supplies the data to a frame builder/resource allocation unit 131.

On the other hand, for example, control data (signaling) for transfer control such as BB signaling (Base Band Signaling) (BB Header) is supplied to the BCH encoder 121.

The BCH encoder 121 performs the BCH encoding with respect to the signaling supplied thereto and supplies data obtained as a result to an LDPC encoder 122, similar to the BCH encoder 114.

The LDPC encoder 122 sets the data supplied from the BCH encoder 121 as LDPC target data, performs the LDPC encoding with respect to the data, and supplies an LDPC code obtained as a result to a mapper 123, similar to the LDPC encoder 115.

The mapper 123 maps the LDPC code supplied from the LDPC encoder 122 to a signal point representing one symbol of quadrature modulation in a unit (symbol unit) of code bits of one or more bits of the LDPC code, performs the quadrature modulation, and supplies data obtained as a result to the frequency interleaver 124, similar to the mapper 117.

The frequency interleaver 124 performs the frequency interleaving in a unit of symbol with respect to the data supplied from the mapper 123 and supplies the data to the frame builder/resource allocation unit 131, similar to the frequency interleaver 120.

The frame builder/resource allocation unit 131 inserts symbols of pilots into necessary positions of the data (symbols) supplied from the frequency interleavers 120 and 124, configures a frame (for example, a physical layer (PL) frame, a T2 frame, a C2 frame, and so on) including symbols of a predetermined number from data (symbols) obtained as a result, and supplies the frame to an OFDM generating unit 132.

The OFDM generating unit 132 generates an OFDM signal corresponding to the frame from the frame supplied from the frame builder/resource allocation unit 131 and transmits the OFDM signal through the communication path 13 (FIG. 7).

Here, for example, the transmitting device 11 can be configured without including part of the blocks illustrated in FIG. 8 such as the time interleaver 118, the SISO/MISO encoder 119, the frequency interleaver 120 and the frequency interleaver 124.

<Configuration of Bit Interleaver 116>

Figure 9:
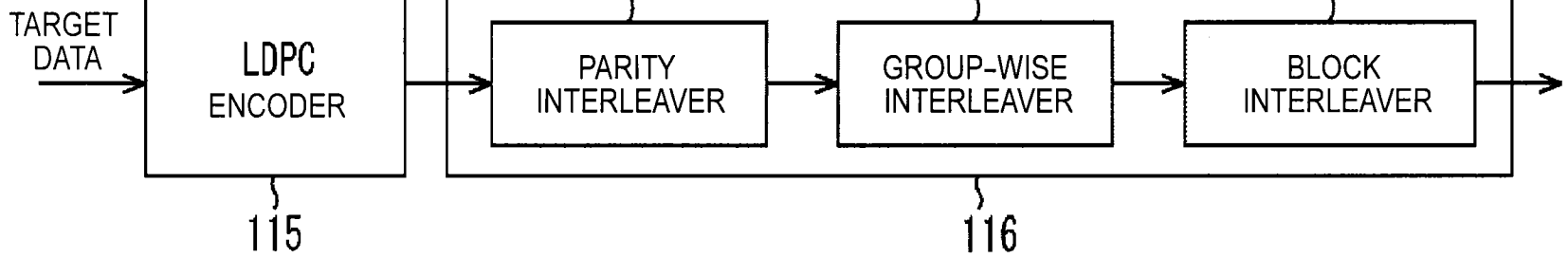
FIG. 9 is a block diagram illustrating an example of a configuration of a bit interleaver 116.

FIG. 9 is a block diagram illustrating an example of a configuration of the bit interleaver 116 in FIG. 8.

The bit interleaver 116 has a function of interleaving data and includes a parity interleaver 23, a group-wise interleaver 24, and a block interleaver 25.

The parity interleaver 23 performs parity interleaving of interleaving a parity bit of an LDPC code from the LDPC encoder 115 to a position of another parity bit, and supplies the parity-interleaved LDPC code to the group-wise interleaver 24.

The group-wise interleaver 24 performs group-wise interleaving on the LDPC code from the parity interleaver 23, and supplies the group-wise-interleaved LDPC code to the block interleaver 25.

Here, in the group-wise interleaving, with a bit group of 360 bits of one section obtained by sectioning the LDPC code corresponding to one code in a unit of 360 bits that is equal to a unit size P to be described later from the head of the code, the LDPC code from the parity interleaver 23 is interleaved in units of bit groups.

When group-wise interleaving is performed, an error rate can be improved more than when group-wise interleaving is not performed, and as a result, excellent communication quality can be ensured in data transmission.

The block interleaver 25 performs block interleaving for inversely multiplexing the LDPC code from the group-wise interleaver 24, then makes the LDPC code corresponding to one code, for example, into a symbol having m bits that is a unit of mapping, and supplies the symbol to the mapper 117 (FIG. 8).

Here, in block interleaving, for example, in a storage region in which columns serving as a storage region storing a predetermined number of bits in the column (longitudinal) direction are arrayed in a number equal to the number of bits m of the symbol in the row (transverse) direction, the LDPC code from the group-wise interleaver 24 is written in the column direction and read in the row direction, and thereby the LDPC code corresponding to one code is made into a symbol of m bits.

<Parity Check Matrix of LDPC Code>

Figure 10:
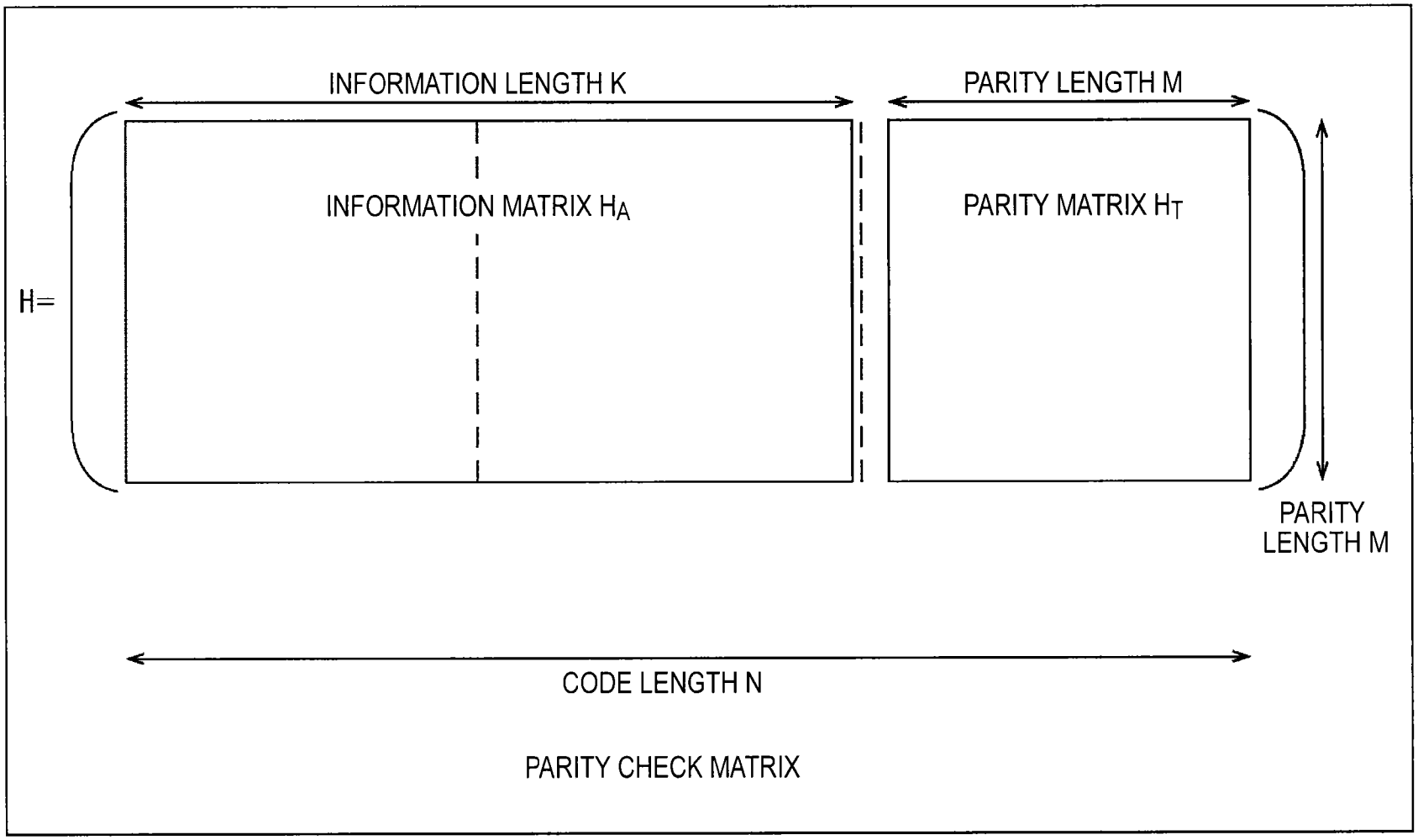
FIG. 10 is an illustration of an example of a parity check matrix.

FIG. 10 is a diagram illustrating an example of the parity check matrix H that is used for LDPC encoding by the LDPC encoder 115 of FIG. 8.

The parity check matrix H becomes an LDGM (Low-Density Generation Matrix) structure and can be represented by Expression $H=[H_A|H_T]$ (a matrix in which elements of the information matrix $H_A$ are set to left elements and elements of the parity matrix $H_T$ are set to right elements), using an information matrix $H_A$ of a portion corresponding to information bits among the code bits of the LDPC code and a parity matrix $H_T$ corresponding to the parity bits.

In this case, a bit number of the information bits among the code bits of one LDPC code and a bit number of the parity bits are referred to as an information length K and a parity length M, respectively, and a bit number of the code bits of one LDPC code (one code word) is referred to as a code length N (=K+M).

The information length K and the parity length M of the LDPC code having the certain code length N are determined by an encoding rate. The parity check matrix H becomes a matrix in which row×column is M×N (a matrix whose row is M and column is N). The information matrix $H_A$ becomes a matrix of M×K and the parity matrix $H_T$ becomes a matrix of M×M.

Figure 11:
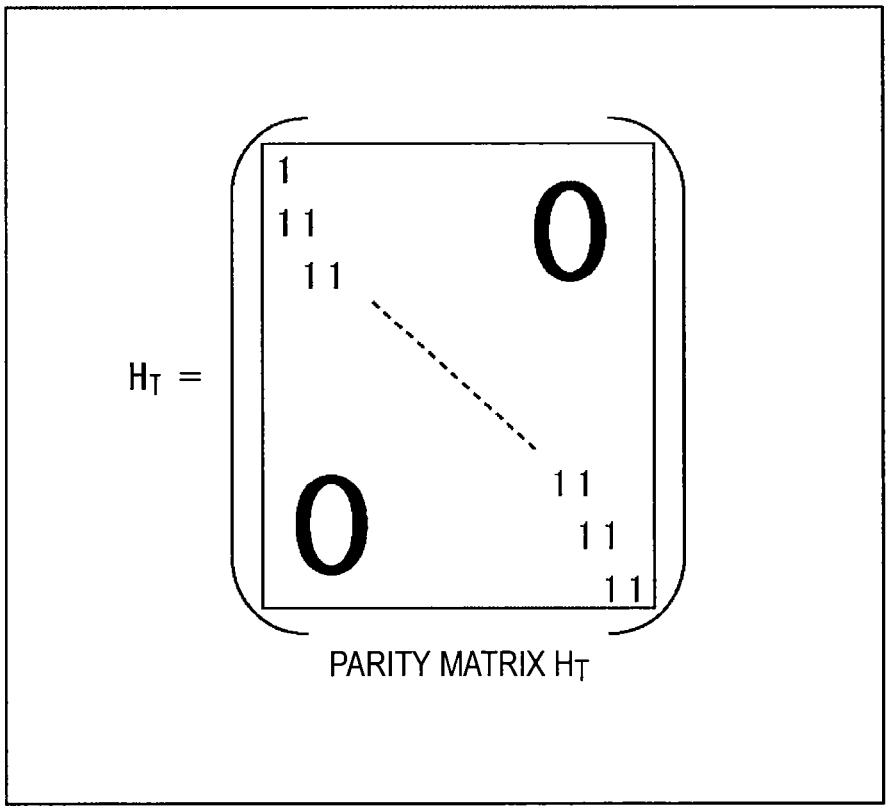
FIG. 11 is an illustration of an example of a parity matrix.

FIG. 11 is a diagram illustrating an example of the parity matrix $H_T$ of the parity check matrix H that is used for LDPC encoding by the LDPC encoder 115 of FIG. 8.

The parity matrix $H_T$ of the parity check matrix H that is used for LDPC encoding by the LDPC encoder 115 becomes the same as the parity matrix $H_T$ of the parity check matrix H of the LDPC code defined in the standard of, for example, DVB-T.2, or the like.

The parity matrix $H_T$ of the parity check matrix H of the LDPC code that is defined in the standard of the DVB-T.2 or the like becomes a staircase structure matrix (lower bidagonal matrix) in which elements of 1 are arranged in a staircase shape, as illustrated in FIG. 11. The row weight of the parity matrix $H_T$ becomes 1 with respect to the first row and becomes 2 with respect to the remaining rows. The column weight becomes 1 with respect to the final column and becomes 2 with respect to the remaining columns.

As described above, the LDPC code of the parity check matrix H in which the parity matrix $H_T$ becomes the staircase structure can be easily generated using the parity check matrix H.

That is, the LDPC code (one code word) is represented by a row vector c and a column vector obtained by transposing the row vector is represented by $C^T$. In addition, a portion of information bits of the row vector c to be the LDPC code is represented by a row vector A and a portion of the parity bits is represented by a row vector T.

The row vector c can be represented by Expression c=[A|T] (a row vector in which elements of the row vector A are set to left elements and elements of the row vector T are set to right elements), using the row vector A corresponding to the information bits and the row vector T corresponding to the parity bits.

In the parity check matrix H and the row vector c=[A|T] corresponding to the LDPC code, it is necessary to satisfy Expression $Hc^T=0$. The row vector T that corresponds to the parity bits constituting the row vector c=[A|T] satisfying Expression $Hc^T=0$ can be sequentially calculated by setting elements of each row to 0, sequentially (in order) from elements of a first row of the column vector $Hc^T$ in Expression $Hc^T=0$, when the parity matrix $H_T$ of the parity check matrix $H=[H_A|H_T]$ becomes the staircase structure illustrated in FIG. 11.

Figure 12:
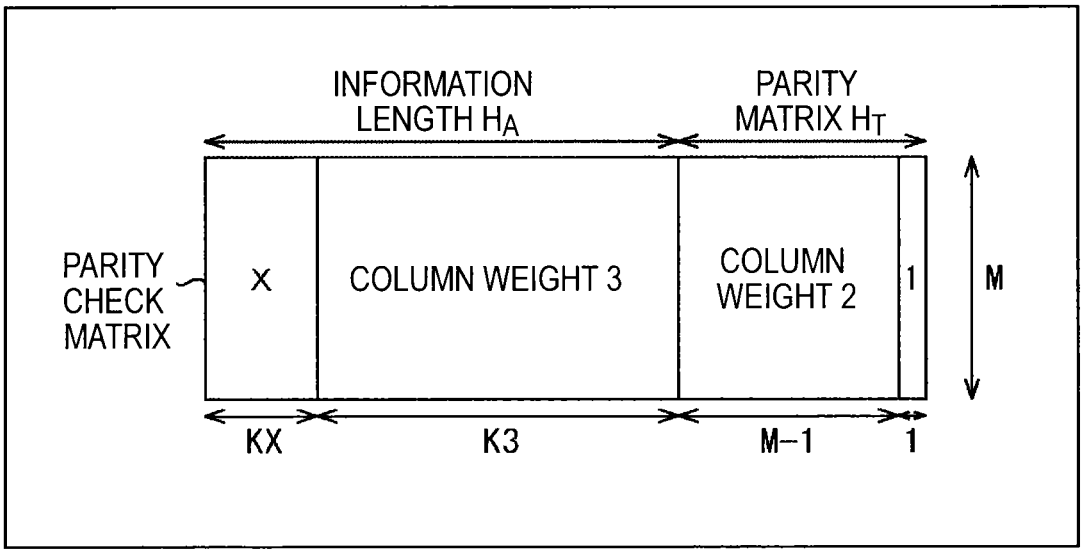
FIG. 12 is an illustration of a parity check matrix of an LDPC code defined in a standard of DVB-T.2.

FIG. 12 is an illustration of the parity check matrix H of the LDPC code that is defined in the standard of the DVB-T.2 or the like.

The column weight becomes X with respect KX columns from a first column of the parity check matrix H of the LDPC code defined in the standard of the DVB-T.2 or the like, becomes 3 with respect to the following K3 columns, becomes 2 with respect to the following (M−1) columns, and becomes 1 with respect to a final column.

In this case, KX+K3+M−1+1 is equal to the code length N.

FIG. 13 is an illustration of column numbers KX, K3, and M and a column weight X, with respect to each encoding rate r of the LDPC code defined in the standard of the DVB-T.2 or the like.

In the standard of the DVB-T.2 or the like, LDPC codes that have code lengths N of 64800 bits and 16200 bits are defined.

With respect to the LDPC code having the code length N of 64800 bits, 11 encoding rates (nominal rates) of 1/4, 1/3, 2/5, 1/2, 3/5, 2/3, 3/4, 4/5, 5/6, 8/9, and 9/10 are defined. With respect to the LDPC code having the code length N of 16200 bits, 10 encoding rates of 1/4, 1/3, 2/5, 1/2, 3/5, 2/3, 3/4, 4/5, 5/6, and 8/9 are defined.

Hereinafter, the code length N of the 64800 bits is referred to as 64 k bits and the code length N of the 16200 is referred to as 16 k bits.

With respect to the LDPC code, an error rate tends to be low in a code bit corresponding to a column of which a column weight of the parity check matrix H is large.

In the parity check matrix H that is illustrated in FIGS. 12 and 13 and is defined in the standard of the DVB-T.2 or the like, a column weight of a column of a head side (left side) tends to be large. Therefore, with respect to the LDPC code corresponding to the parity check matrix H, a code bit of a head side tends to be strong for error (there is tolerance against the error) and a code bit of an ending side tends to be weak for the error.

<Parity Interleaving>

The parity interleaving by the parity interleaver 23 of FIG. 9 will be described with reference to FIGS. 14 to 16.

Figure 14:
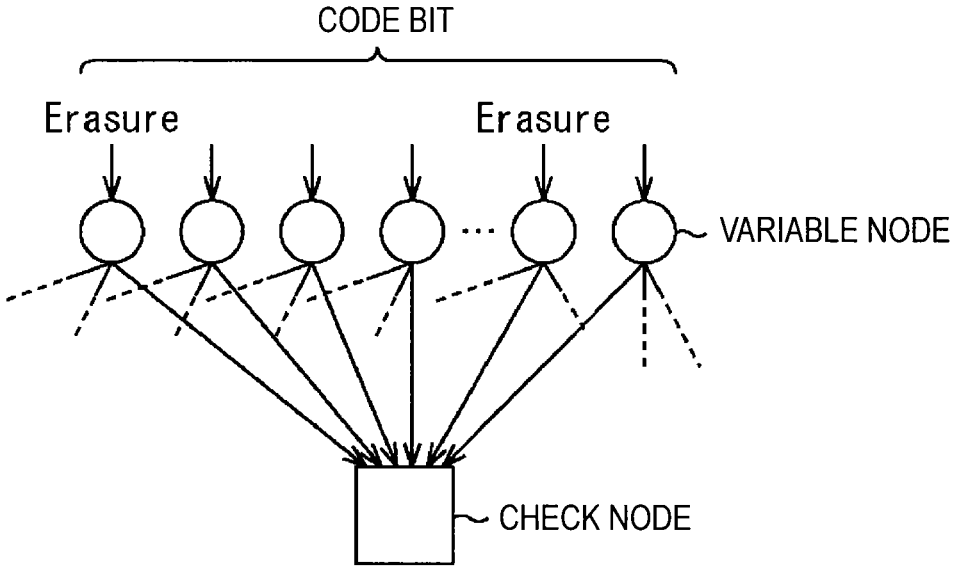
FIG. 14 is an illustration of an example of a Tanner graph for decoding of an LDPC code.

FIG. 14 is a diagram illustrating an example of (a part of) a Tanner graph of the parity check matrix of the LDPC code.

As illustrated in FIG. 14, if a plurality of, for example, two variable nodes among (the code bits corresponding to) the variable nodes connected to the check node simultaneously become the error such as the erasure, the check node returns a message in which the probability of a value being 0 and the probability of a value being 1 are equal to each other, to all the variable nodes connected to the check node. For this reason, if the plurality of variable nodes connected to the same check node simultaneously become the erasure, decoding performance is deteriorated.

Meanwhile, the LDPC code that is output by the LDPC encoder 115 of FIG. 8 is, similar to the LDPC code defined in the standard of the DVB-T.2 or the like, an IRA code and the parity matrix $H_T$ of the parity check matrix H becomes a staircase structure, as illustrated in FIG. 11.

FIG. 15 is a diagram illustrating an example of the parity matrix $H_T$ becoming the staircase structure and a Tanner graph corresponding to the parity matrix $H_T$.

A of FIG. 15 illustrates an example of the parity matrix HT becoming the staircase structure and B of FIG. 15 illustrates the Tanner graph corresponding to the parity matrix HT of A of FIG. 15.

In the parity matrix $H_T$ with a staircase structure, elements of 1 are adjacent in each row (excluding the first row). Therefore, in the Tanner graph of the parity matrix $H_T$, two adjacent variable nodes corresponding to a column of two adjacent elements in which the value of the parity matrix $H_T$ is 1 are connected with the same check node.

Therefore, when parity bits corresponding to two above-mentioned adjacent variable nodes become errors at the same time by burst error and erasure, and so on, the check node connected with two variable nodes (variable nodes to find a message by the use of parity bits) corresponding to those two parity bits that became errors returns message that the probability with a value of 0 and the probability with a value of 1 are equal probability, to the variable nodes connected with the check node, and therefore the performance of decoding is deteriorated. Further, when the burst length (bit number of parity bits that continuously become errors) becomes large, the number of check nodes that return the message of equal probability increases and the performance of decoding is further deteriorated.

Therefore, the parity interleaver 23 (FIG. 9) performs the parity interleaving for interleaving the parity bits of the LDPC code from the LDPC encoder 115 into positions of other parity bits, to prevent the decoding performance from being deteriorated.

Figure 16:
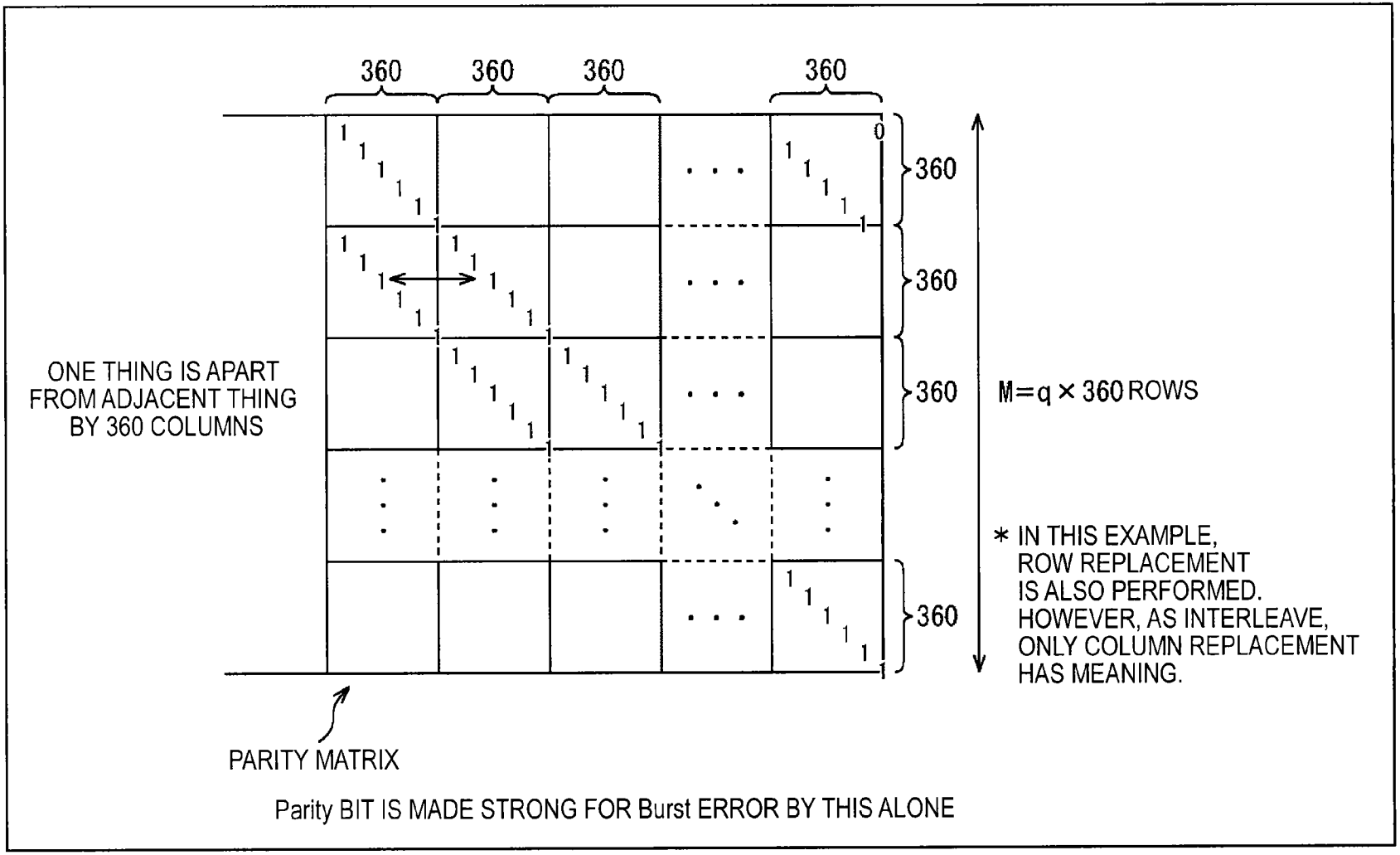
FIG. 16 is an illustration of an example of a parity matrix $H_T$ of a parity check matrix H corresponding to an LDPC code after parity interleaving.

FIG. 16 is a diagram illustrating the parity matrix $H_T$ of the parity check matrix H corresponding to the LDPC code after the parity interleaving performed by the parity interleaver 23 of FIG. 9.

In this case, the information matrix $H_A$ of the parity check matrix H corresponding to the LDPC code that is output by the LDPC encoder 115 becomes a cyclic structure, similar to the information matrix of the parity check matrix H corresponding to the LDPC code defined in the standard of the DVB-T.2 or the like.

The cyclic structure means a structure in which a certain column is matched with a column obtained by cyclically shifting another column. For example, the cyclic structure includes a structure in which a position of 1 of each row of P columns becomes a position obtained by cyclically shifting a first column of the P columns in a column direction by a predetermined value, such as a value proportional to a value q obtained by dividing a parity length M, for every P columns. Hereinafter, the P columns in the cyclic structure are appropriately referred to as a unit size.

As an LDPC code defined in a standard such as DVB-T.2, as described in FIG. 12 and FIG. 13, there are two kinds of LDPC codes whose code length N is 64800 bits and 16200 bits, and, for both of those two kinds of LDPC codes, the unit size P is defined as 360 which is one of divisors excluding 1 and M among the divisors of the parity length M.

The parity length M becomes a value other than primes represented by Expression $M=q\times P=q\times 360$, using a value q different according to the encoding rate. Therefore, similar to the unit size P, the value q is one other than 1 and M among the divisors of the parity length M and is obtained by dividing the parity length M by the unit size P (the product of P and q to be the divisors of the parity length M becomes the parity length M).

As described above, when information length is assumed to be K, an integer equal to or greater than 0 and less than P is assumed to be x and an integer equal to or greater than 0 and less than q is assumed to be y, the parity interleaver 23 interleaves the K+qx+y+1-th code bit among code bits of an LDPC code of N bits to the position of the K+Py+x+1-th code bit as parity interleaving.

Since both of the K+qx+y+1-th code bit and the K+Py+x+1-th code bit are code bits after the K+1-th one, they are parity bits, and therefore the positions of the parity bits of the LDPC code are moved according to the parity interleaving.

According to the parity interleaving, (the parity bits corresponding to) the variable nodes connected to the same check node are separated by the unit size P, that is, 360 bits in this case. For this reason, when the burst length is less than 360 bits, the plurality of variable nodes connected to the same check node can be prevented from simultaneously becoming the error. As a result, tolerance against the burst error can be improved.

The LDPC code after the interleave for interleaving the (K+qx+y+1)-th code bit into the position of the (K+Py+x+1)-th code bit is matched with an LDPC code of a parity check matrix (hereinafter, referred to as a transformed parity check matrix) obtained by performing column replacement for replacing the (K+qx+y+1)-th column of the original parity check matrix H with the (K+Py+x+1)-th column.

In the parity matrix of the transformed parity check matrix, as illustrated in FIG. 16, a pseudo-cyclic structure that uses the P columns (in FIG. 16, 360 columns) as a unit appears.

In this case, the pseudo-cyclic structure means a structure in which a cyclic structure is formed except for a part thereof.

The transformed parity check matrix that is obtained by performing the column replacement corresponding to the parity interleaving with respect to the parity check matrix of the LDPC code defined in the standard of the DVB-T.2 or the like becomes the pseudo-cyclic structure, not the (perfect) cyclic structure, because the number of elements of 1 is less than 1 (elements of 0 exist) in a portion (shifted matrix to be described later) of 360 rows×360 columns of a upper right corner portion of the transformed parity check matrix.

The transformed parity check matrix with respect to the parity check matrix of the LDPC code output by the LDPC encoder 115 has a pseudo-cyclic structure like the transformed parity check matrix with respect to the parity check matrix of the LDPC code defined in the standard of, for example, DVB-T.2, or the like The transformed parity check matrix of FIG. 16 becomes a matrix that is obtained by performing the column replacement corresponding to the parity interleaving and replacement (row replacement) of a row to configure the transformed parity check matrix with a constitutive matrix to be described later, with respect to the original parity check matrix H.

Figure 17:
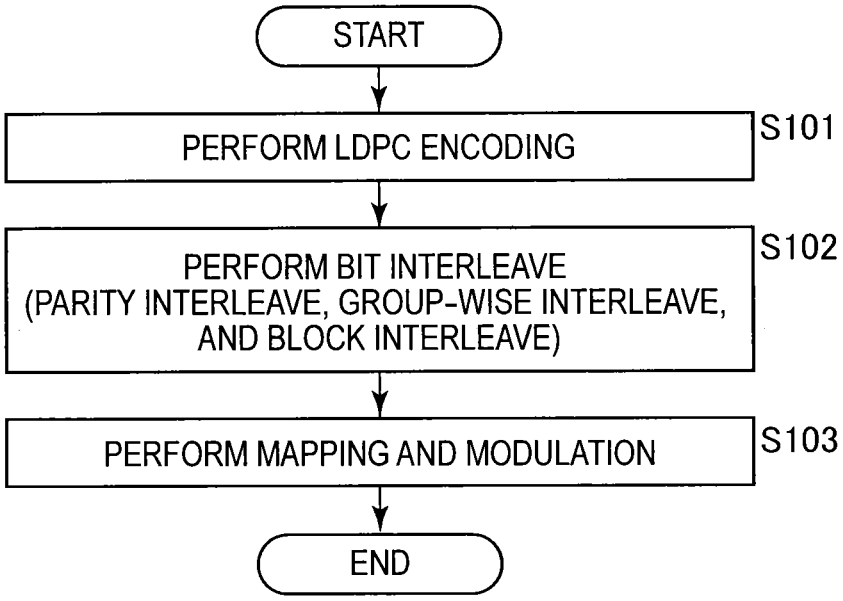
FIG. 17 is a flowchart describing an example of a process performed by the bit interleaver 116 and a mapper 117.

FIG. 17 is a flowchart illustrating processing executed by the LDPC encoder 115, the bit interleaver 116, and the mapper 117 of FIG. 8.

The LDPC encoder 115 awaits supply of the LDPC target data from the BCH encoder 114. In Step S101, the LDPC encoder 115 encodes the LDPC target data with the LDPC code and supplies the LDPC code to the bit interleaver 116. The processing proceeds to Step S102.

In Step S102, the bit interleaver 116 performs bit interleave with respect to the LDPC code supplied from the LDPC encoder 115 and supplies a symbol obtained by the bit interleave to the mapper 117. The processing proceeds to Step S103.

That is, in Step S102, in the bit interleaver 116 (FIG. 9), the parity interleaver 23 performs parity interleaving with respect to the LDPC code supplied from the LDPC encoder 115 and supplies the LDPC code after the parity interleaving to the group-wise interleaver 24.

The group-wise interleaver 24 performs group-wise interleaving with respect to the LDPC code supplied from the parity interleaver 23 and supplies the LDPC code to the block interleaver 25.

The block interleaver 25 performs the block interleave with respect to the LDPC code after the group-wise interleaving is performed by the group-wise interleaver 24 and supplies a symbol of m bits obtained as a result to the mapper 117.

In Step S103, the mapper 117 maps the symbol supplied from the block interleaver 25 to any of 2m signal points determined by the modulation method of the orthogonal modulation performed by the mapper 117, performs the orthogonal modulation, and supplies data obtained as a result to the time interleaver 118.

As described above, the parity interleaving or the group-wise interleaving is performed, so that an error rate when the plurality of code bits of the LDPC code are transmitted as one symbol can be improved.

In FIG. 9, the parity interleaver 23 to be a block to perform the parity interleaving and the group-wise interleaver 24 to be a block to perform the group-wise interleaving are individually configured for the convenience of explanation. However, the parity interleaver 23 and the group-wise interleaver 24 can be integrally configured.

That is, both the parity interleaving and the group-wise interleaving can be performed by writing and reading of the code bits with respect to the memory and can be represented by a matrix to convert an address (write address) to perform writing of the code bits into an address (read address) to perform reading of the code bits.

Therefore, if a matrix obtained by multiplying a matrix representing the parity interleaving and a matrix representing the group-wise interleaving is calculated, the code bits are converted by the matrix, the parity interleaving is performed, and a group-wise interleaving result of the LDPC code after the parity interleaving can be obtained.

In addition to the parity interleaver 23 and the group-wise interleaver 24, the block interleaver 25 can be integrally configured.

That is, the block interleave executed by the block interleaver 25 can be represented by the matrix to convert the write address of the memory 31 storing the LDPC code into the read address.

Therefore, if a matrix obtained by multiplying the matrix representing the parity interleaving, the matrix representing the group-wise interleaving, and the matrix representing the block interleaving is calculated, the parity interleaving, the group-wise interleaving, and the block interleaving can be collectively executed by the matrix.

<Configuration Example of LDPC Encoder 115>

Figure 18:
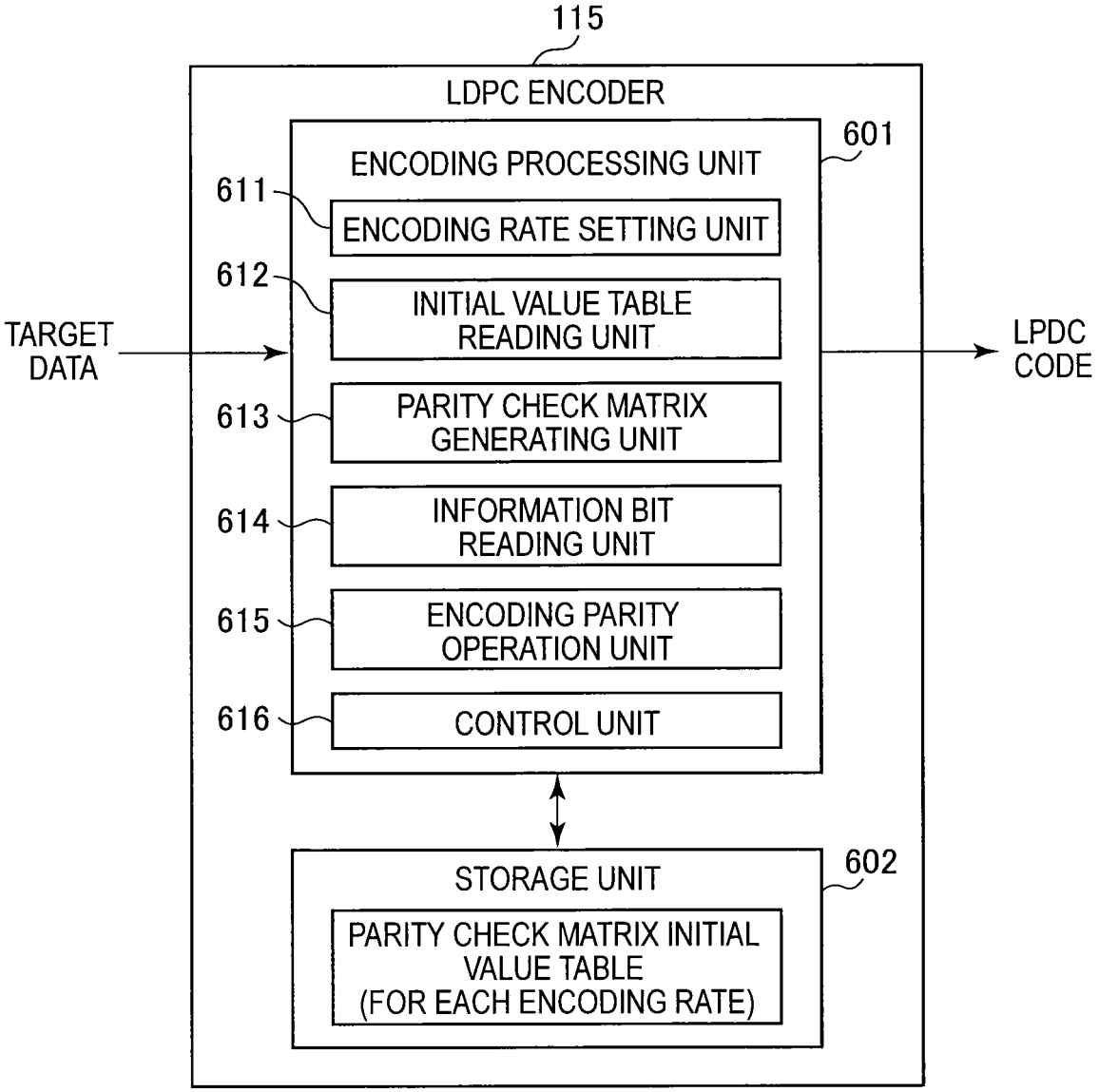
FIG. 18 is a block diagram illustrating an example of a configuration of an LDPC encoder 115.

FIG. 18 is a block diagram illustrating a configuration example of the LDPC encoder 115 of FIG. 8.

The LDPC encoder 122 of FIG. 8 is also configured in the same manner.

As described in FIGS. 12 and 13, in the standard of the DVB-T.2 or the like, the LDPC codes that have the two code lengths N of 64800 bits and 16200 bits are defined.

With respect to the LDPC code having the code length N of 64800 bits, 11 encoding rates of 1/4, 1/3, 2/5, 1/2, 3/5, 2/3, 3/4, 4/5, 5/6, 8/9, and 9/10 are defined. With respect to the LDPC code having the code length N of 16200 bits, 10 encoding rates of 1/4, 1/3, 2/5, 1/2, 3/5, 2/3, 3/4, 4/5, 5/6, and 8/9 are defined (FIGS. 12 and 13).

For example, the LDPC encoder 115 can perform encoding (error correction encoding) using the LDPC code of each encoding rate having the code length N of 64800 bits or 16200 bits, according to the parity check matrix H prepared for each code length N and each encoding rate.

The LDPC encoder 115 includes an encoding processing unit 601 and a storage unit 602.

The encoding processing unit 601 includes an encoding rate setting unit 611, an initial value table reading unit 612, a parity check matrix generating unit 613, an information bit reading unit 614, an encoding parity operation unit 615, an a control unit 616. The encoding processing unit 601 performs the LDPC encoding of LDPC target data supplied to the LDPC encoder 115 and supplies an LDPC code obtained as a result to the bit interleaver 116 (FIG. 8).

That is, the encoding rate setting unit 611 sets the code length N and the encoding rate of the LDPC code, according to an operation of an operator.

The initial value table reading unit 612 reads a parity check matrix initial value table to be described later, which corresponds to the code length N and the encoding rate set by the encoding rate setting unit 611, from the storage unit 602.

The parity check matrix generating unit 613 generates a parity check matrix H by arranging elements of 1 of an information matrix $H_A$ corresponding to an information length K (=information length N-parity length M) according to the code length N and the encoding rate set by the encoding rate setting unit 611 in the column direction with a period of 360 columns (unit size P), on the basis of the parity check matrix initial value table read by the initial value table reading unit 612, and stores the parity check matrix H in the storage unit 602.

The information bit reading unit 614 reads (extracts) information bits corresponding to the information length K, from the LDPC target data supplied to the LDPC encoder 115.

The encoding parity operation unit 615 reads the parity check matrix H generated by the parity check matrix generating unit 613 from the storage unit 602, and generates a code word (LDPC code) by calculating parity bits for the information bits read by the information bit reading unit 614 on the basis of a predetermined expression using the parity check matrix H.

The control unit 616 controls each block constituting the encoding processing unit 601.

In the storage unit 602, a plurality of parity check matrix initial value tables that correspond to the plurality of encoding rates illustrated in FIGS. 12 and 13, with respect to the code lengths N such as the 64800 bits and 16200 bits, are stored. In addition, the storage unit 602 temporarily stores data that is necessary for processing of the encoding processing unit 601.

Figures 19, 20:
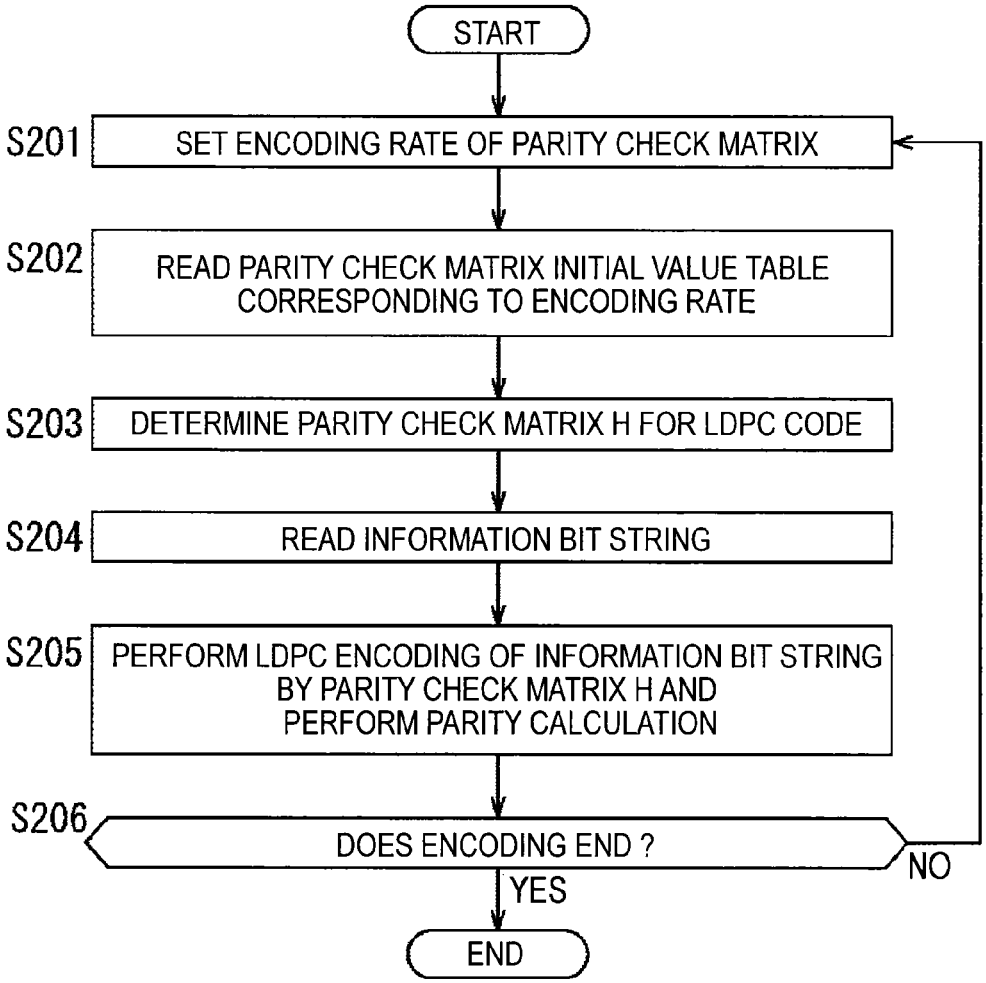
FIG. 19 is a flowchart describing an example of processing of an LDPC encoder 115.
FIG. 20 is an illustration of an example of a parity check matrix initial value table in which an encoding rate is 1/4 and a code length is 16200.

FIG. 19 is a flowchart illustrating an example of processing of the LDPC encoder 115 of FIG. 18.

In Step S201, the encoding rate setting unit 611 determines (sets) the code length N and the encoding rate r to perform the LDPC encoding.

In Step S202, the initial value table reading unit 612 reads the previously determined parity check matrix initial value table corresponding to the code length N and the encoding rate r determined by the encoding rate setting unit 611, from the storage unit 602.

In Step S203, the parity check matrix generating unit 613 calculates (generates) the parity check matrix H of the LDPC code of the code length N and the encoding rate r determined by the encoding rate setting unit 611, using the parity check matrix initial value table read from the storage unit 602 by the initial value table reading unit 612, supplies the parity check matrix to the storage unit 602, and stores the parity check matrix in the storage unit.

In Step S204, the information bit reading unit 614 reads the information bits of the information length K (=N×r) corresponding to the code length N and the encoding rate r determined by the encoding rate setting unit 611, from the LDPC target data supplied to the LDPC encoder 115, reads the parity check matrix H calculated by the parity check matrix generating unit 613 from the storage unit 602, and supplies the information bits and the parity check matrix to the encoding parity operation unit 615.

In Step S205, the encoding parity operation unit 615 sequentially operates parity bits of a code word c that satisfies Expression (8) using the information bits and the parity check matrix H that have been read from the information bit reading unit 614.

$$Hc^T=0 \tag{8}$$

In Expression (8), c represents a row vector as the code word (LDPC code) and $c^T$ represents transposition of the row vector c.

As described above, when a portion of the information bits of the row vector c as the LDPC code (one code word) is represented by a row vector A and a portion of the parity bits is represented by a row vector T, the row vector c can be represented by Expression c=[A/T], using the row vector A as the information bits and the row vector T as the parity bits.

In the parity check matrix H and the row vector c=[A|T] corresponding to the LDPC code, it is necessary to satisfy Expression $Hc^T=0$. The row vector T that corresponds to the parity bits constituting the row vector c=[A|T] satisfying Expression $Hc^T=0$ can be sequentially calculated by setting elements of each row to 0, sequentially from elements of a first row of the column vector $Hc^T$ in Expression $Hc^T=0$, when the parity matrix $H_T$ of the parity check matrix $H=[H_A|H_T]$ becomes the staircase structure illustrated in FIG. 11.

If the encoding parity operation unit 615 calculates the parity bits T with respect to the information bits A from the information bit reading unit 614, the encoding parity operation unit 615 outputs the code word c=[A/T] represented by the information bits A and the parity bits T as an LDPC encoding result of the information bits A.

Then, in Step S206, the control unit 616 determines whether the LDPC encoding ends. When it is determined in Step S206 that the LDPC encoding does not end, that is, when there is LDPC target data to perform the LDPC encoding, the processing returns to Step S201 (or Step S204). Hereinafter, the processing of Steps S201 (or Step S204) to S206 is repeated.

When it is determined in Step S206 that the LDPC encoding ends, that is, there is no LDPC target data to perform the LDPC encoding, the LDPC encoder 115 ends the processing.

As described above, the parity check matrix initial value table corresponding to each code length N and each encoding rate r is prepared and the LDPC encoder 115 performs the LDPC encoding of the predetermined code length N and the predetermined encoding rate r, using the parity check matrix H generated from the parity check matrix initial value table corresponding to the predetermined code length N and the predetermined encoding rate r.

<Example of Parity Check Matrix Initial Value Table>

The parity check matrix initial value table is a table that represents positions of elements of 1 of the information matrix $H_A$ (FIG. 10) of the parity check matrix H corresponding to the information length K according to the code length N and the encoding rate r of the LDPC code (LDPC code defined by the parity check matrix H) for every 360 columns (unit size P) and is previously made for each parity check matrix H of each code length N and each encoding rate r.

That is to say, the parity check matrix initial value table represents the positions of the elements of 1 of the information matrix $H_A$ at least for every 360 columns (unit size P).

In addition, as the parity check matrix H, there are a parity check matrix defined in DVB-T.2 or the like in which the (entire) parity matrix $H_T$ has the staircase structure and a parity check matrix proposed by CRC/ETRI in which a part of the parity matrix $H_T$ has the staircase structure and the rest is a diagonal matrix (unit matrix).

Hereinbelow, an expression method of a parity check matrix initial value table representing the parity check matrix defined in DVB-T.2 or the like in which the parity matrix $H_T$ has the staircase structure will be referred to as a DBV method and an expression method of a parity check matrix initial value table representing the parity check matrix proposed by CRC/ETRI will be referred to as an ETRI method.

FIG. 20 is an illustration of an example of the parity check matrix initial value table of the DVB method.

That is, FIG. 20 illustrates a parity check matrix initial value table with respect to the parity check matrix H that is defined in the standard of the DVB-T.2 and has the code length N of 16200 bits and the encoding rate (an encoding rate of notation of the DVB-T.2) r of 1/4.

The parity check matrix generating unit 613 (FIG. 18) calculates the parity check matrix H using the parity check matrix initial value table of the DVB method, as follows.

FIG. 21 is a diagram illustrating a method of calculating the parity check matrix H from the parity check matrix initial value table of the DVB method.

That is, FIG. 21 illustrates a parity check matrix initial value table with respect to the parity check matrix H that is defined in the standard of the DVB-T.2 and has the code length N of 16200 bits and the encoding rate r of 2/3.

The parity check matrix initial value table of the DVB method is the table that represents the positions of the elements of 1 of the entire information matrix $H_A$ corresponding to the information length K according to the code length N and the encoding rate r of the LDPC code for every 360 columns (unit size P). In the i-th row thereof, row numbers (row numbers when a row number of a first row of the parity check matrix H is set to 0) of elements of 1 of an $1+360\times(i-1)$-th column of the parity check matrix H are arranged by a number of column weights of the $1+360\times(i-1)$-th column.

Here, since the parity matrix $H_T$ (FIG. 10) of the parity check matrix H of the DVB method corresponding to the parity length M is decided to have the staircase structure illustrated in FIG. 15, if the information matrix $H_A$ (FIG. 10) corresponding to the information length K can be obtained from the parity check matrix initial value table, the parity check matrix H can be obtained.

A row number k+1 of the parity check matrix initial value table of the DVB method is different according to the information length K.

A relation of Expression (9) is realized between the information length K and the row number k+1 of the parity check matrix initial value table.

$$K=(k+1)\times 360 \tag{9}$$

In this case, 360 of Expression (9) is the unit size P described in FIG. 16.

In the parity check matrix initial value table of FIG. 21, 13 numerical values are arranged from the first row to the third row and 3 numerical values are arranged from the fourth row to the (k+1)-th row (in FIG. 21, the 30th row).

Therefore, the column weights of the parity check matrix H that are calculated from the parity check matrix initial value table of FIG. 21 are 13 from the first column to the $(1+360\times(3-1)-1)$-th column and are 3 from the $(1+360\times(3-1))$-th column to the K-th column.

The first row of the parity check matrix initial value table of FIG. 21 becomes 0, 2084, 1613, 1548, 1286, 1460, 3196, 4297, 2481, 3369, 3451, 4620, and 2622, which shows that elements of rows having row numbers of 0, 2084, 1613, 1548, 1286, 1460, 3196, 4297, 2481, 3369, 3451, 4620, and 2622 are 1 (and the other elements are 0), in the first column of the parity check matrix H.

The second row of the parity check matrix initial value table of FIG. 21 becomes 1, 122, 1516, 3448, 2880, 1407, 1847, 3799, 3529, 373, 971, 4358, and 3108, which shows that elements of rows having row numbers of 1, 122, 1516, 3448, 2880, 1407, 1847, 3799, 3529, 373, 971, 4358, and 3108 are 1, in the 361 $(=1+360\times(2-1))$-th column of the parity check matrix H.

As described above, the parity check matrix initial value table represents positions of elements of 1 of the information matrix $H_A$ of the parity check matrix H for every 360 columns.

The columns other than the $(1+360\times(i-1))$-th column of the parity check matrix H, that is, the individual columns from the (2+360×(i−1))-th column to the (360×i)-th column are arranged by cyclically shifting elements of 1 of the (1+360×(i−1))-th column determined by the parity check matrix initial value table periodically in a downward direction (downward direction of the columns) according to the parity length M.

That is, the (2+360×(i−1))-th column is obtained by cyclically shifting (1+360×(i−1))-th column in the downward direction by M/360 (=q) and the next (3+360×(i−1))-th column is obtained by cyclically shifting (1+360×(i−1))-th column in the downward direction by 2×M/360 (=2×q) (obtained by cyclically shifting (2+360×(i−1))-th column in the downward direction by M/360 (=q)).

If a numerical value of a j-th column (j-th column from the left side) of an i-th row (i-th row from the upper side) of the parity check matrix initial value table is represented as $h_{i,j}$ and a row number of the j-th element of 1 of the w-th column of the parity check matrix H is represented as $H_{w,j}$, the row number $H_{w,j}$ of the element of 1 of the w-th column to be a column other than the (1+360×(i−1))-th column of the parity check matrix H can be calculated by Expression (10).

$$H_{w,j}=\mathrm{mod}\ \{h_{i,j}+\mathrm{mod}((w-1),P)\times q,M) \quad (10)$$

In this case, mod(x, y) means a remainder that is obtained by dividing x by y.

In addition, P is a unit size described above. In the embodiment, for example, similar to the standard of the DVB-S.2, the DVB-T.2, and the DVB-C.2, P is 360. In addition, q is a value M/360 that is obtained by dividing the parity length M by the unit size P (=360).

The parity check matrix generating unit 613 (FIG. 18) specifies the row numbers of the elements of 1 of the (1+360×(i−1))-th column of the parity check matrix H by the parity check matrix initial value table.

The parity check matrix generating unit 613 (FIG. 18) calculates the row number $H_{w,j}$ of the element of 1 of the w-th column to be the column other than the (1+360×(i−1))-th column of the parity check matrix H, according to Expression (10), and generates the parity check matrix H in which the element of the obtained row number is set to 1.

Figures 22, 23:
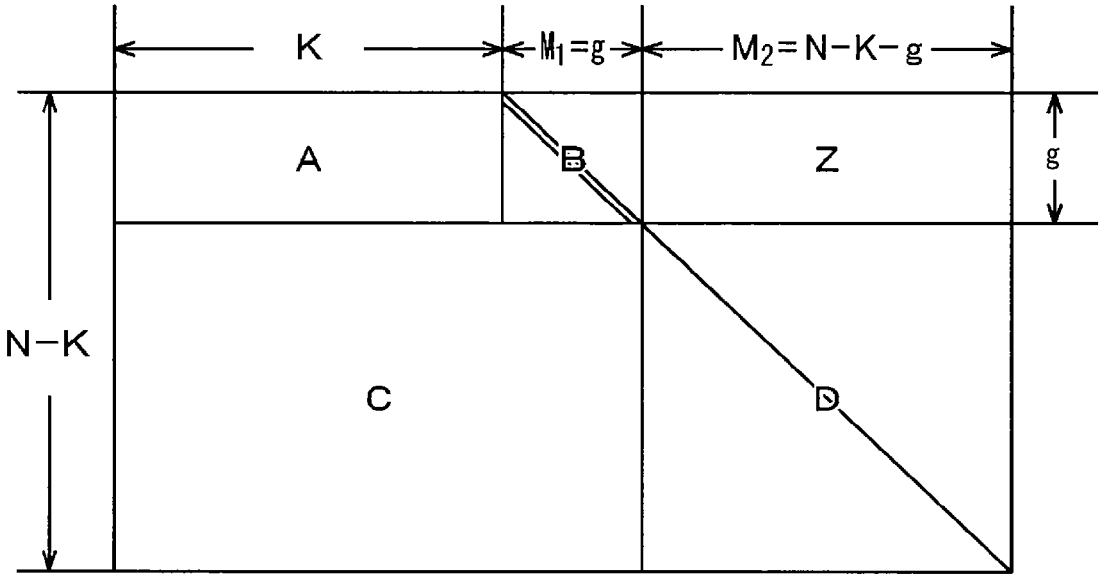
FIG. 22 is an illustration of a structure of a parity check matrix.
FIG. 23 is an illustration of an example of a parity check matrix initial value table.

FIG. 22 is an illustration of a structure of a parity check matrix of the ETRI method.

The parity check matrix of the ETRI method includes an A matrix, a B matrix, a C matrix, a D matrix, and a Z matrix.

The A matrix is a parity check matrix on the upper left side having g rows and K columns represented with the predetermined value g and the information length K of the LDPC code=code length N×encoding rate r.

The B matrix is a matrix with the staircase structure close to the right side of the A matrix, having g rows and g columns.

The C matrix is a matrix close to the bottom side of the A and B matrixes, having N−K−g rows and K+g columns.

The D matrix is a unit matrix close to the right side of the C matrix having N−K−g rows and N−K−g columns.

The Z matrix is a zero matrix (0 matrix) close to the right side of the B matrix, having g rows and N−K−g columns.

In the parity check matrix of the ETRI method including the A matrix to the D matrix and the Z matrix as described above, the A matrix and a part of the C matrix constitute an information matrix, and the B matrix, the remainder of the C matrix, the D matrix, and the Z matrix constitute a parity matrix.

Note that, since the B matrix is a matrix with the staircase structure and the D matrix is a unit matrix, the parity matrix of the parity check matrix of the ETRI method has the staircase structure in a part thereof (the portion of the B matrix) and the remaining part (the portion of the D matrix) forms a diagonal matrix (unit matrix).

The A and C matrixes have the cyclic structure for every 360 columns (unit side P), like the information matrix of the parity check matrix of the DVB method, and the parity check matrix initial value table of the ETRI method represents positions of elements of 1 of the A and C matrixes for every 360 columns.

Here, since the A matrix and the part of the C matrix constitute the information matrix as described above, the parity check matrix initial value table of the ETRI method expressing the positions of elements of 1 of the A and C matrixes for every 360 columns can be said to represent positions of elements of 1 of the information matrix $H_A$ for every 360 columns.

FIG. 23 is an illustration of an example of the parity check matrix initial value table of the ETRI method.

That is to say, FIG. 23 illustrates the example of the parity check matrix initial value with respect to a parity check matrix having the code length N of 50 bits and the encoding rate r of 1/2.

The parity check matrix initial value table of the ETRI method is a table representing the positions of the elements of 1 of the A and C matrixes for each unit size P, and in the i-th row thereof, row numbers (row numbers when a row number of a first row of the parity check matrix is set to 0) of elements of 1 of a 1+P×(i−1)-th column of the parity check matrix are arranged equal in number to column weights of the 1+P×(i−1)-th column.

Note that, in order to simplify description, the unit size P is set to, for example, 5 herein.

In addition, for the parity check matrix of the ETRI method, $g=M_1$, $M_2$, $Q_1$, and $Q_2$ are used as parameters.

$g=M_1$ is a parameter for deciding the size of the B matrix, and is set to the value of a multiple of the unit size R By adjusting $g=M_1$, performance of the LDPC code is changed, and when the parity check matrix is decided, it is adjusted to a predetermined value. Herein, for $g=M_1$, 15, which is three times the unit size P=5, is set to be employed.

$M_2$ is the value of $M-M_1$ which is obtained by subtracting $M_1$ from the parity length M.

Here, the information length K is N×r=50×1/2=25, and the parity length M is N−K=50−25=25, and thus $M_2$ is $M-M_1=25-15=10$.

$Q_1$ is obtained according to the expression $Q_1=M_1/P$, representing the number of shifts (the number of rows) of cyclic shift of the A matrix.

That is to say, columns other than the 1+P×(i−1)-th column of the A matrix of the parity check matrix of the ETRI method, i.e., columns from the 2+P×(i−1)-th column to the P×i-th column are arranged by cyclically shifting elements of 1 of the 1+360×(i−1)-th column determined by the parity check matrix initial value table periodically in a downward direction (downward direction of the columns), and $Q_1$ represents the number of shifts of the cyclic shift of the A matrix.

$Q_2$ is obtained according to the expression $Q_2=M_2/P$, representing the number of shifts (the number of rows) of cyclic shift of the C matrix.

That is to say, columns other than the 1+P×(i−1)-th column of the C matrix of the parity check matrix of the ETRI method, i.e., columns from the 2+P×(i−1)-th column to the P×i-th column are arranged by cyclically shifting elements of 1 of the 1+360×(i−1)-th column determined by the parity check matrix initial value table periodically in a downward direction (downward direction of the columns), and $Q_2$ represents the number of shifts of the cyclic shift of the C matrix.

Here, $Q_1$ is $M_1/P=15/3=5$, and $Q_2$ is $M_2/P=10/5=2$.

In the parity check matrix initial value table of FIG. 23, three numerical values are arranged in the first and second rows, one numerical value is arranged from the $3^{rd}$ to $5^{th}$ rows, and according to the arrangement of the numerical values, the column weight of the parity check matrix obtained from the parity check matrix initial value table of FIG. 23 is 3 for the first to the 1+5×(2−1)−1-th columns, 1 for the 1+5×(2−1)-th to the $5^{th}$ columns.

That is to say, the first row of the parity check matrix initial value table of FIG. 23 has 2, 6, and 18, which means elements in rows having the row numbers of 2, 6, and 18 are 1 (and the other elements are 0) in the first column of the parity check matrix.

Here, in this case, the A matrix is a matrix having 15 rows and 25 columns (g rows and K columns) and the C matrix is a matrix having 10 rows and 40 columns (N−K−g rows and K+g columns), and thus rows having the row numbers of 0 to 14 of the parity check matrix are rows of the A matrix, and rows having the row numbers of 15 to 24 of the parity check matrix are rows of the C matrix.

Thus, among rows having the row numbers of 2, 6, and 18 (hereinafter described as rows #2, #6, and #18), the rows #2 and #6 are rows of the A matrix, and the row #18 is a row of the C matrix.

The second row of the parity check matrix initial value table of FIG. 23 has 2, 10, and 19, which means that elements of rows #2, #10, and #19 are 1 in the 6 (=+5×(2−1))-th column of the parity check matrix.

Here, in the 6 (=1+5×(2−1))-th column of the parity check matrix, among the rows #2, #10, and #19, the rows #2 and #10 are rows of the A matrix, and the row #19 is a row of the C matrix.

The third row of the parity check matrix initial value table of FIG. 23 has 22, which means that elements of the row #22 are 1 in the 11 (=1+5×(3−1))-th column of the parity check matrix.

Here, in the 11 (=1+5×(3−1))-th column of the parity check matrix, the row #22 is a row of the C matrix.

Likewise, 19 in the fourth row of the parity check matrix initial value table of FIG. 23 indicates that elements of the row #19 are 1 in the 16 (=1+5×(4−1))-th column of the parity check matrix, and 15 of the fifth row of the parity check matrix initial value table of FIG. 23 indicates that elements of the row #15 are 1 in the 21 (=1+5×(5−1))-th column of the parity check matrix.

As described above, the parity check matrix initial value table represents the elements of 1 of the A and C matrixes of the parity check matrix for every unit size P=5 columns.

Columns other than the 1+5×(i−1)-th columns of the A and C matrixes, i.e., columns from the 2+5×(i−1)-th column to the 5×i-th column are arranged by cyclically shifting the elements of 1 of the 1+5×(i−1)-th column determined in the parity check matrix initial table periodically in the downward direction (downward direction of the columns) according to the parameters $Q_1$ and $Q_2$.

That is to say, for example, the 2+5×(i−1)-th column of the A matrix is obtained by cyclically shifting the 1+5×(i−1)-th column in the downward direction by $Q_1$ (=3), and the next 3+5×(i−1)-th column is obtained by cyclically shifting the 1+5×(i−1)-th column in the downward direction by $2\times Q_1$ (=2×3) (cyclically shifting the 2+5×(i−1)-th column in the downward direction by $Q_1$).

In addition, for example, the 2+5×(i−1)-th column of the C matrix is obtained by cyclically shifting the 1+5×(i−1)-th column in the downward direction by $Q_2$ (=2), and the next 3+5×(i−1)-th column is obtained by cyclically shifting the 1+5×(i−1)-th column in the downward direction by $2\times Q_2$ (=2×2) (cyclically shifting the 2+5×(i−1)-th column in the downward direction by $Q_2$).

Figure 24:
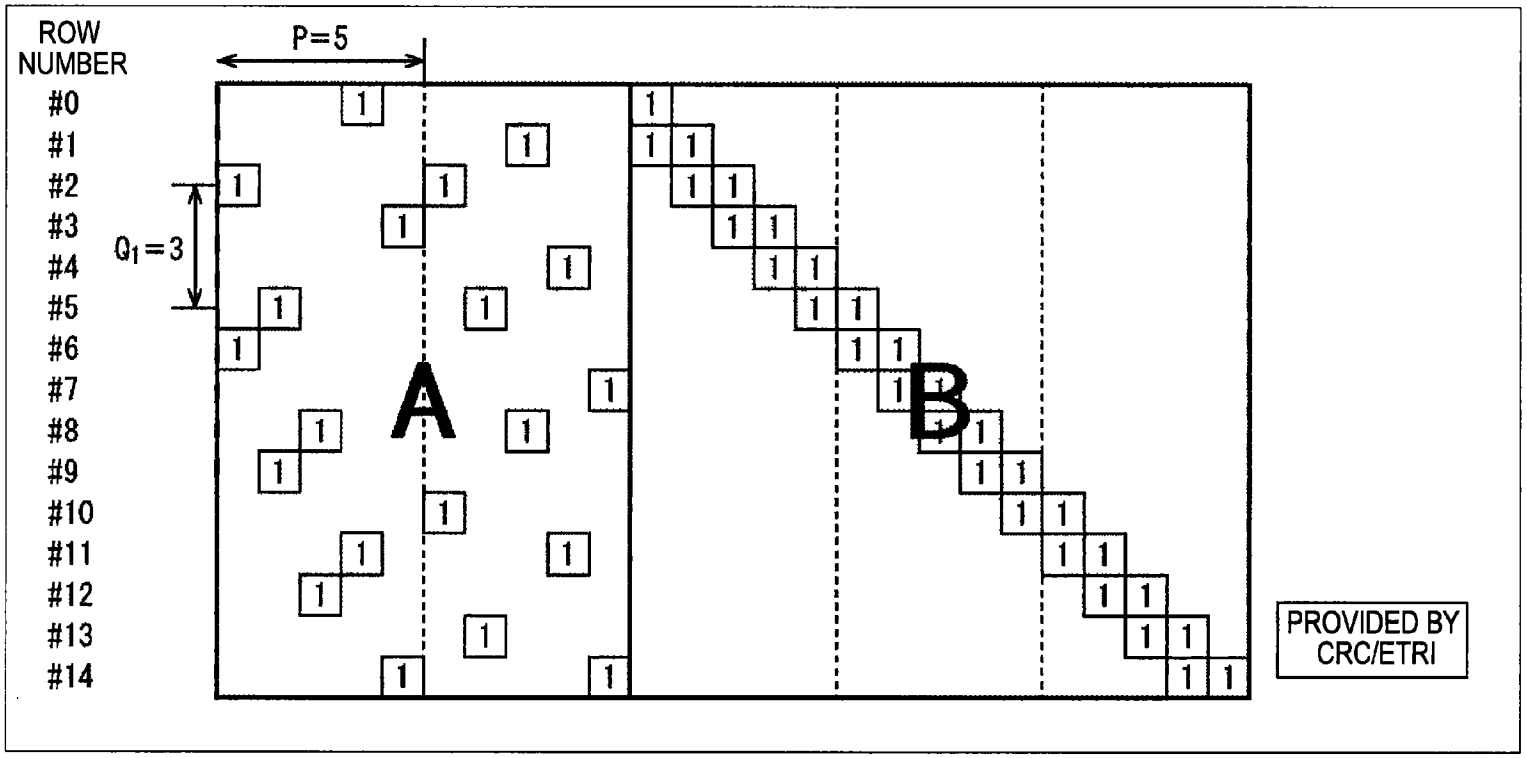
FIG. 24 is an illustration of an A matrix generated from the parity check matrix initial value table.

FIG. 24 is an illustration of the A matrix generated from the parity check matrix initial value table of FIG. 23.

In the A matrix of FIG. 24, the elements of the rows #2 and #6 of the 1 (=1+5×(1−1))-st column are 1 according to the first row of the parity check matrix initial value table of FIG. 23.

Thus, respective columns from the 2 (=2+5×(1−1))-nd column to the 5 (=5+5×(1−1))-th column are obtained by cyclically shifting their previous columns in the downward direction by $Q_1$=3.

Further, in the A matrix of FIG. 24, the elements of the rows #2 and #10 of the 6 (=1+5×(2−1))-th column are 1 according to the second row of the parity check matrix initial value table of FIG. 23.

Thus, respective columns from the 7 (=2+5×(2−1))-th column to the 10 (=5+5×(2−1))-th column are obtained by cyclically shifting their previous columns in the downward direction by $Q_1$=3.

Figure 25:
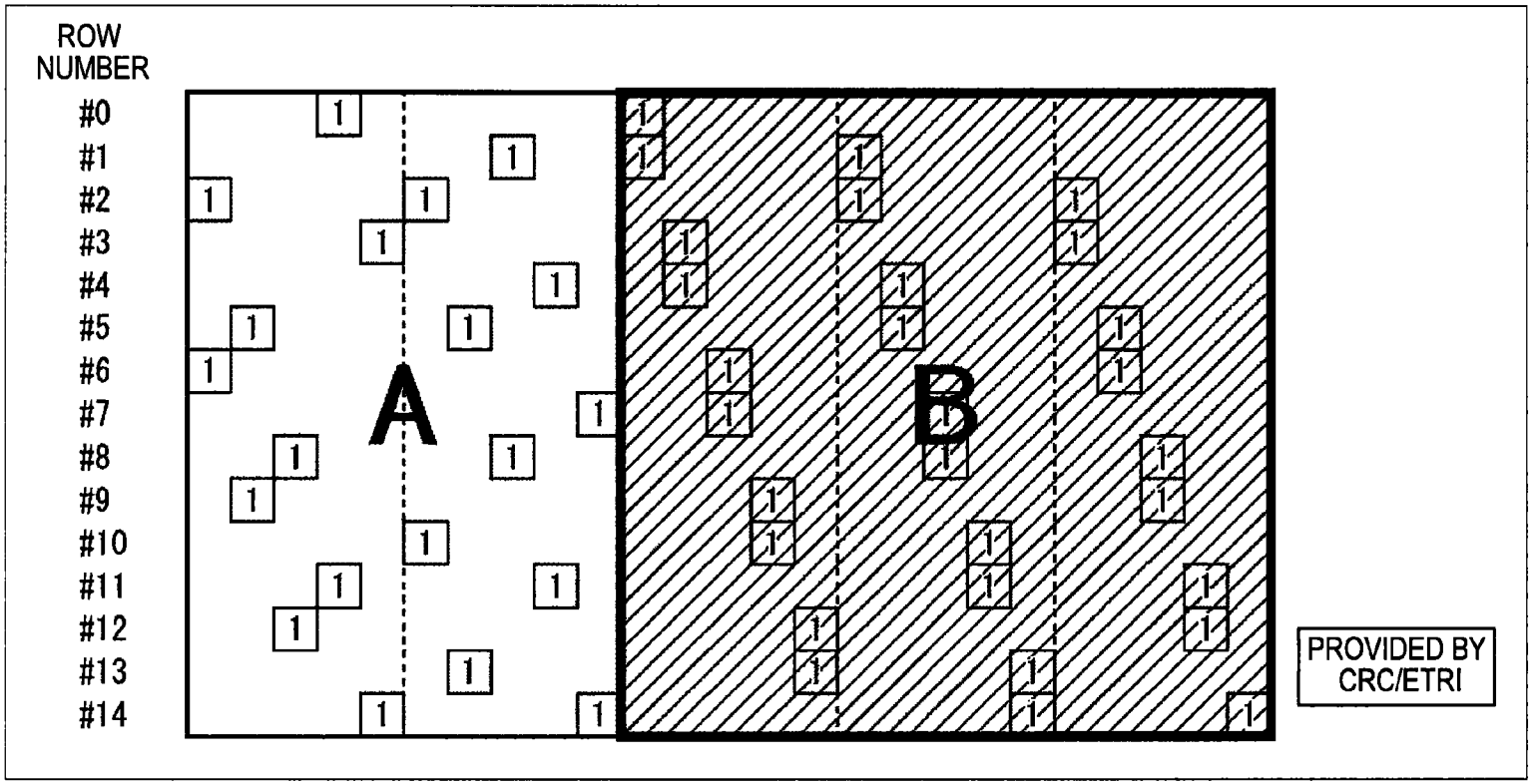
FIG. 25 is an illustration of parity interleaving of a B matrix.

FIG. 25 is an illustration of parity interleaving of the B matrix.

The parity check matrix generating unit 613 (FIG. 18) generates the A matrix using the parity check matrix initial value table, and disposes the B matrix with the staircase structure close to the right side of the A matrix. Then, the parity check matrix generating unit 613 regards the B matrix as a parity matrix, and performs parity interleaving so that the elements of 1 close to the B matrix having the staircase structure are separated the unit size P=5 from each other in the row direction.

FIG. 25 illustrates the A matrix and the B matrix after the parity interleaving of the B matrix.

Figure 26:
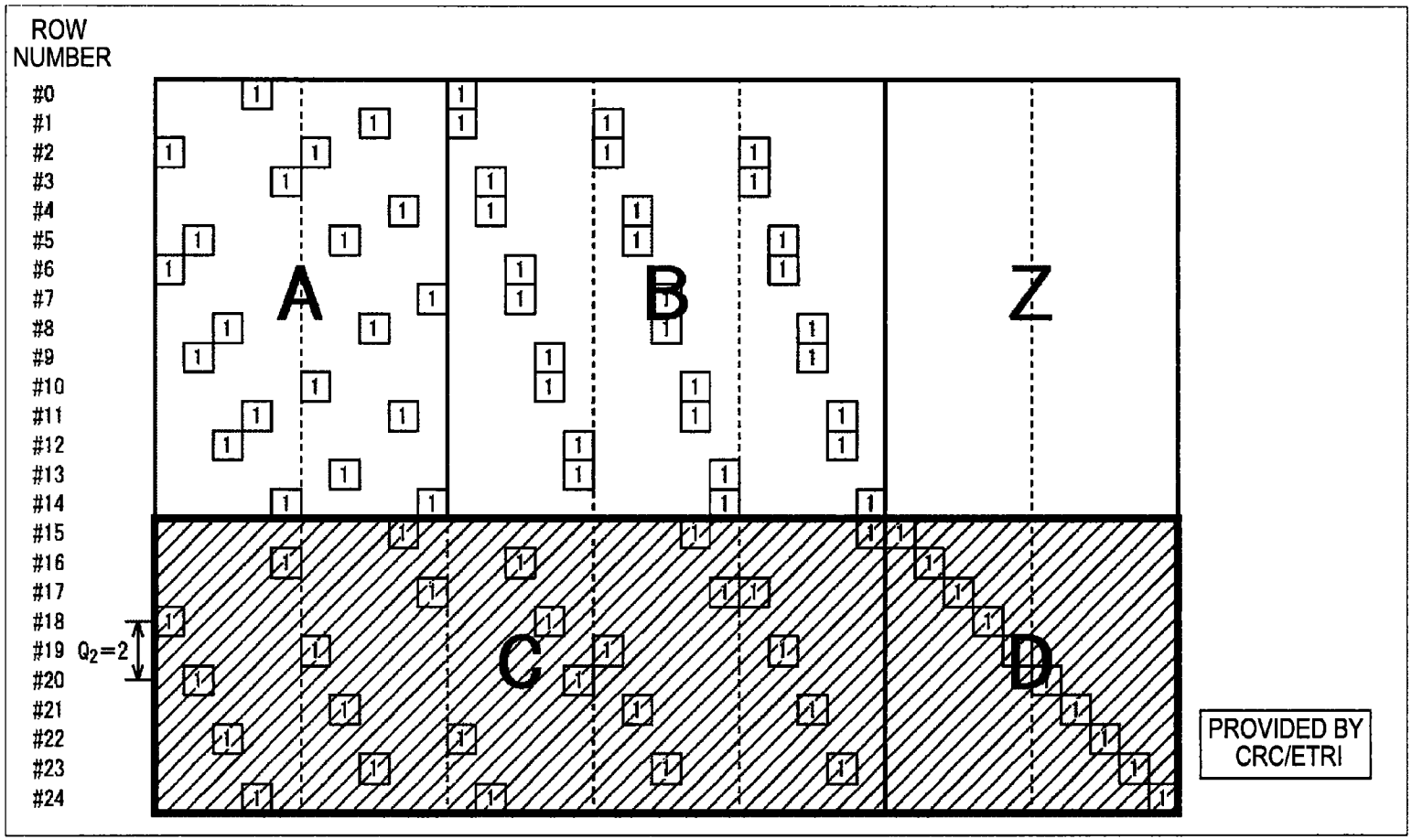
FIG. 26 is an illustration of a C matrix generated from the parity check matrix initial value table.

FIG. 26 is an illustration of the C matrix generated from the parity check matrix initial value table of FIG. 23.

In the C matrix of FIG. 26, the elements of the row #18 of the 1 (=1+5×(1−1))-st column of the parity check matrix are 1 according to the first row of the parity check matric initial value table of FIG. 23.

In addition, respective columns from the 2 (=2+5×(1−1))-nd column to the 5 (=5+5×(1−1))-th column of the C matrix are obtained by cyclically shifting their previous columns in the downward direction by $Q_2$=2.

Further, in the C matrix of FIG. 26, according to the second to fifth rows of the parity check matrix initial value table of FIG. 23, the elements of the row #19 of the 6 (=1+5×(2−1))-th column of the parity check matrix, the row #22 of the 11 (=1+5×(3−1))-th column, the row #19 of the 16 (=1+5×(4−1))-th column, and the row #15 of the 21 (=1+5×(5~1))-st column are 1.

In addition, respective columns from the 7 (=2+5×(2−1))-th column to the 10 (=5+5×(2−1))-th column, respective columns from the 12 (=2+5×(3−1))-th column to the 15 (=5+5×(3−1))-th column, respective columns from the 17 (=2+5×(4−1))-th column to the 20 (=5+5×(4−1))-th column, and respective columns from the 22 (=2+5×(5−1))-nd column to the 25 (=5+5×(5−1))-th column are obtained by cyclically shifting their previous columns in the downward direction by $Q_2$=2.

The parity check matrix generating unit 613 (FIG. 18) generates the C matrix using the parity check matrix initial value table, and disposes the C matrix below the A matrix and the (parity-interleaved) B matrix.

Further, the parity check matrix generating unit 613 disposes the Z matrix on the right side of the B matrix and the D matrix on the right side of the C matrix, thereby generating the parity check matrix illustrated in FIG. 26.

Figure 27:
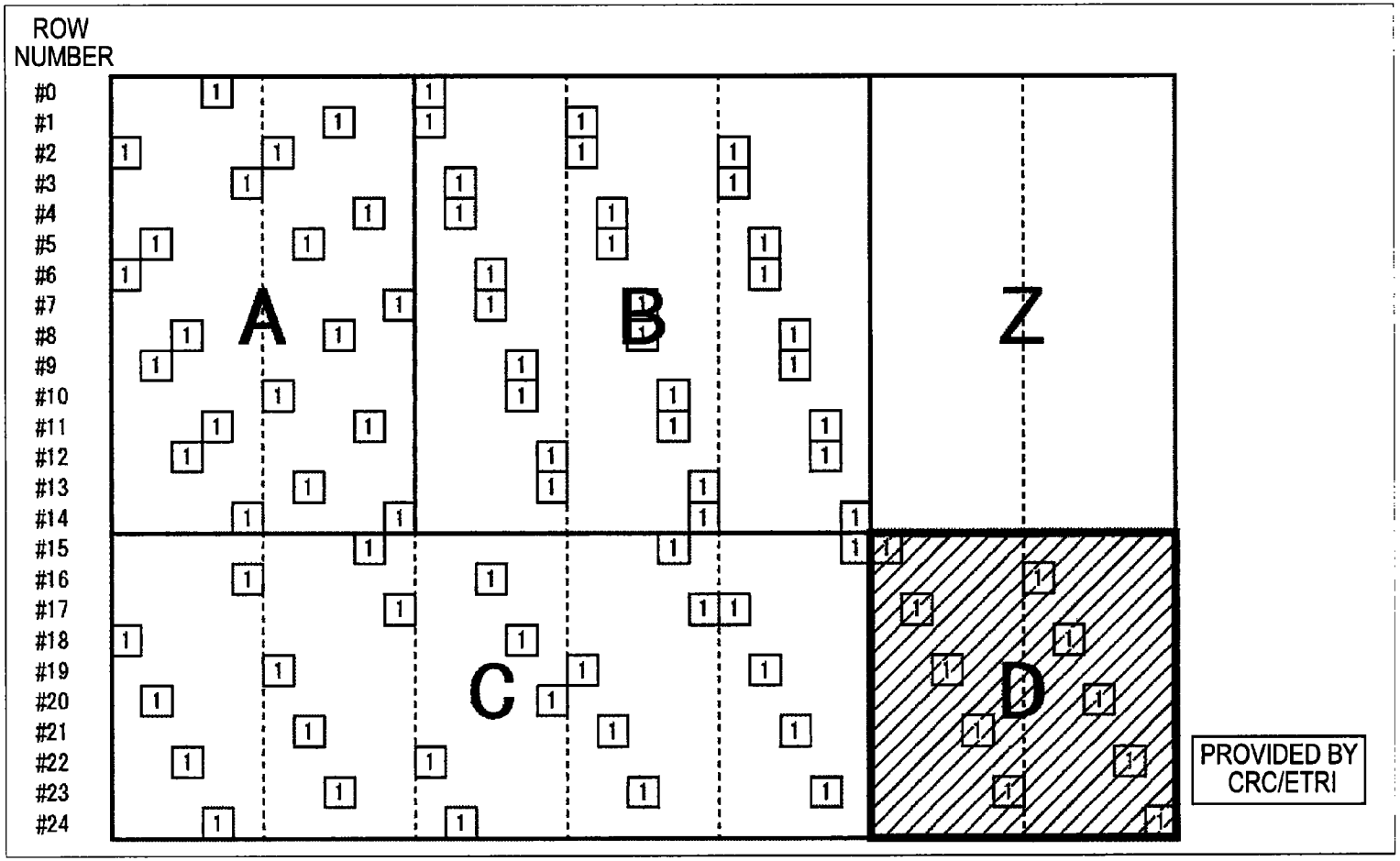
FIG. 27 is an illustration of parity interleaving of a D matrix.

FIG. 27 is an illustration of parity interleaving of the D matrix.

After generating the parity check matrix of FIG. 26, the parity check matrix generating unit 613 regards the D matrix as a parity matrix, and performs parity interleaving (only for the D matrix) so that the elements of 1 in the odd-numbered rows and the next even-numbered rows of the D matrix of the unit matrix are separated the unit size P=5 from each other in the row direction.

FIG. 27 illustrates the parity check matrix obtained by performing parity interleaving of the D matrix on the parity check matrix of FIG. 26.

The LDPC encoder 115 (especially, the encoding parity operation unit 615 thereof (FIG. 18)) performs LDPC encoding (generation of an LDPC code) using, for example, the parity check matrix of FIG. 27.

Here, the LDPC code generated using the parity check matrix of FIG. 27 is an LDPC code that has undergone parity interleaving, and thus it is not necessary for the parity interleaver 23 (FIG. 9) to perform parity interleaving on the LDPC code generated using the parity check matrix of FIG. 27.

Figure 28:
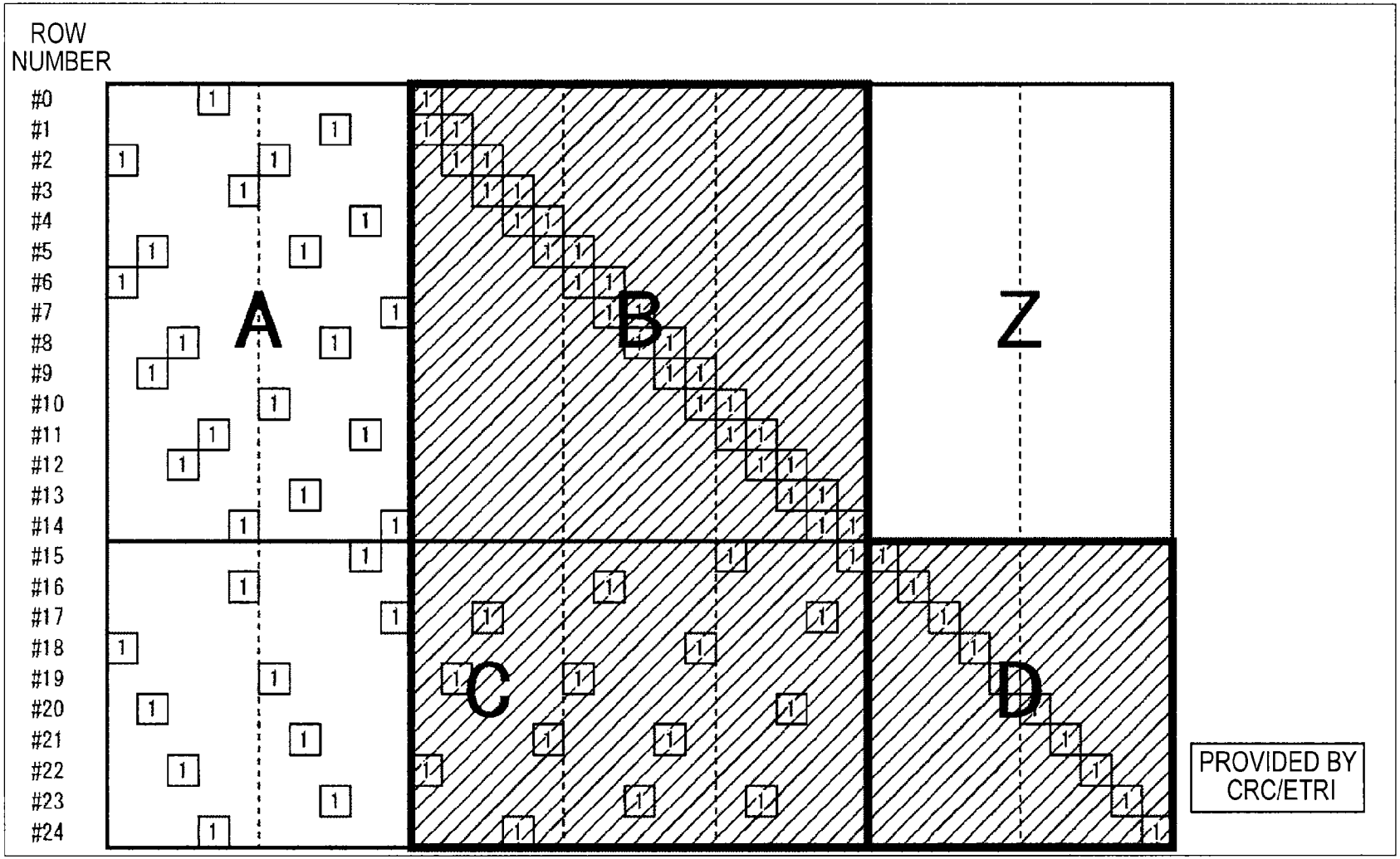
FIG. 28 is an illustration of a parity check matrix obtained by performing, on the parity check matrix, column permutation as parity deinterleaving which returns parity interleaving to an original arrangement.

FIG. 28 is an illustration of a parity check matrix obtained by performing, on the B matrix, a part of the C matrix (the portion of the C matrix disposed below the B matrix), and the D matrix of the parity check matrix of FIG. 27, column permutation as parity deinterleaving which returns parity interleaving to an original arrangement.

The LDPC encoder 115 can perform LDPC encoding (generation of the LDPC code) using the parity check matrix of FIG. 28.

When the LDPC encoding is performed using the parity check matrix of FIG. 28, an LDPC code that has not undergone parity interleaving is obtained according to the LDPC encoding. Thus, when LDPC encoding is performed using the parity check matrix of FIG. 28, the parity interleaver 23 (FIG. 9) performs parity interleaving.

Figure 29:
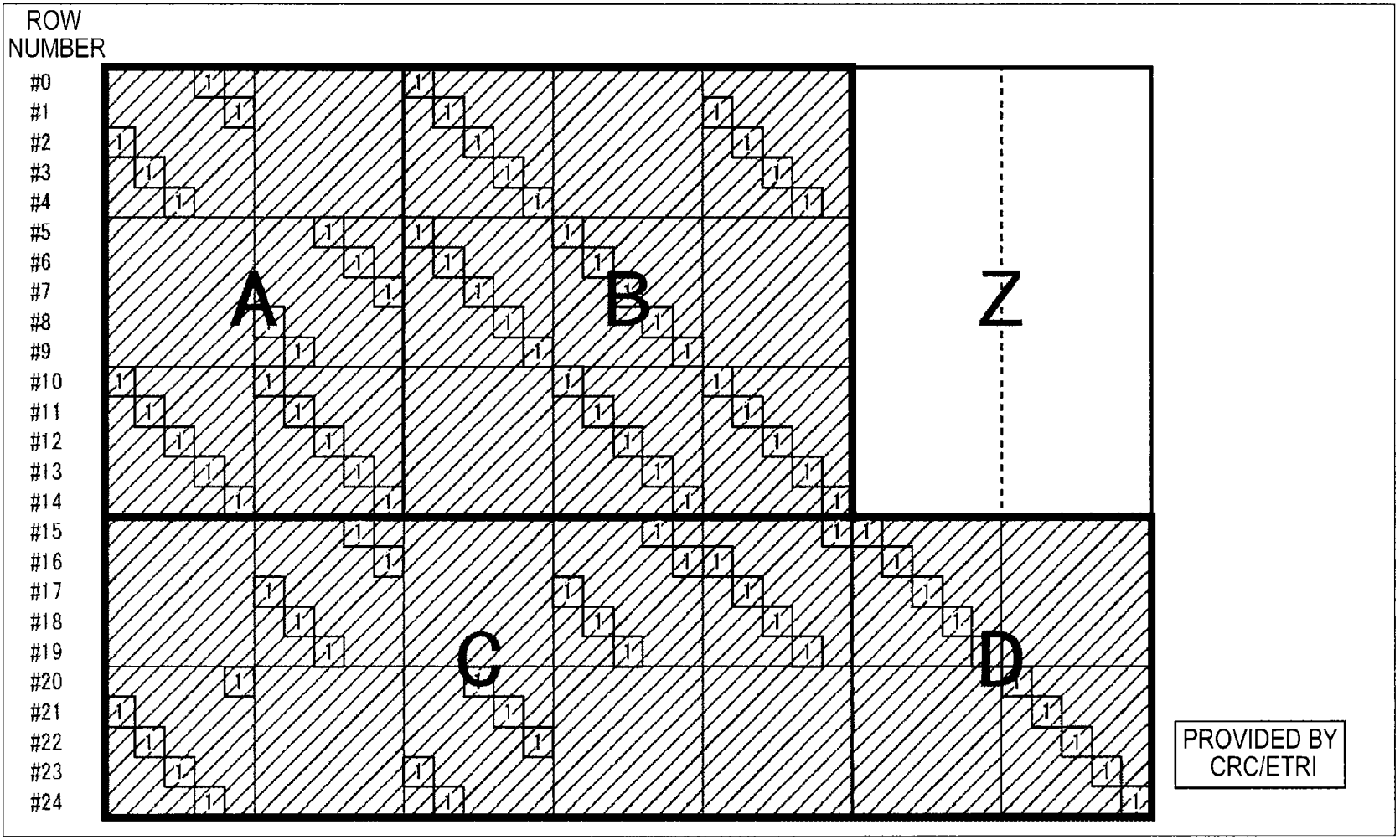
FIG. 29 is an illustration of a transformed parity check matrix obtained by performing row permutation on the parity check matrix.

FIG. 29 is an illustration of a transformed parity check matrix obtained by performing row permutation on the parity check matrix of FIG. 27.

The transformed parity check matrix is represented by a combination of a P×P unit matrix, a quasi unit matrix in which one or more 1s of the unit matrix are set to zero, a shifted matrix obtained by cyclically shifting the unit matrix or the quasi unit matrix, a sum matrix of two or more matrixes of the unit matrix, the quasi unit matrix, and the shifted matrix, and a P×P zero matrix as will be described below.

By using the transformed parity check matrix in decoding of the LDPC code, an architecture in which check node operations and variable node operations are simultaneously performed P times can be used in decoding of the LDPC code as will be described below.

<New LDPC Code>

At present, a standard for terrestrial digital television broadcasting called ATSC 3.0 is being developed.

Thus, a novel LDPC code (hereinafter also referred to as a new LDPC code) which can be used in ATSC 3.0 and other data transmission will be described.

As the new LDPC code, for example, an LDPC code of the DVB method or an LDPC code of the ETRI method corresponding to a parity check matrix having the cyclic structure and the unit size P of 360 the same as that of DVB-T.2 or the like.

The LDPC encoder 115 (FIGS. 8 and 18) can perform LDPC encoding on the new LDPC code using a parity check matrix obtained from a parity check matrix initial value table of the new LDPC code having the code length N of 16 k bits or 64 k bits and the encoding rate r of any of 5/15, 6, 15, 7/15, 8/15, 9/15, 10/15, 11/15, 12/15, and 13/15 as below.

In this case, the storage unit 602 of the LDPC encoder 115 (FIG. 8) stores the parity check matrix initial value table of the new LDPC code.

FIG. 30 is an illustration of an example of the parity check matrix initial value table of the DVB method with respect to a parity check matrix of the new LDPC code with the code length N or 16 k and the encoding rate r of 8/15 (hereinafter also referred to as a Sony code with (16 k, 8/15)) proposed by the present applicant.

FIG. 31 is an illustration of an example of the parity check matrix initial value table of the DVB method with respect to a parity check matrix of the new LDPC code with the code length N or 16 k and the encoding rate r of 10/15 (hereinafter also referred to as a Sony code with (16 k, 10/15)) proposed by the present applicant.

FIG. 32 is an illustration of an example of the parity check matrix initial value table of the DVB method with respect to a parity check matrix of the new LDPC code with the code length N or 16 k and the encoding rate r of 12/15 (hereinafter also referred to as a Sony code with (16 k, 12/15)) proposed by the present applicant.

FIGS. 33, 34, and 35 are each an illustration of an example of the parity check matrix initial value table of the DVB method with respect to a parity check matrix of the new LDPC code with the code length N or 64 k and the encoding rate r of 7/15 (hereinafter also referred to as a Sony code with (64 k, 7/15)) proposed by the present applicant.

Note that FIG. 34 is a continuation of FIG. 33, and FIG. 35 is a continuation of FIG. 34.

FIGS. 36, 37, and 38 are each an illustration of an example of the parity check matrix initial value table of the DVB method with respect to a parity check matrix of the new LDPC code with the code length N or 64 k and the encoding rate r of 9/15 (hereinafter also referred to as a Sony code with (64 k, 9/15)) proposed by the present applicant.

Note that FIG. 37 is a continuation of FIG. 36, and FIG. 38 is a continuation of FIG. 37.

FIGS. 39, 40, and 41 are each an illustration of an example of the parity check matrix initial value table of the DVB method with respect to a parity check matrix of the new LDPC code with the code length N or 64 k and the encoding rate r of 11/15 (hereinafter also referred to as a Sony code with (64 k, 11/15)) proposed by the present applicant.

Figure 42:
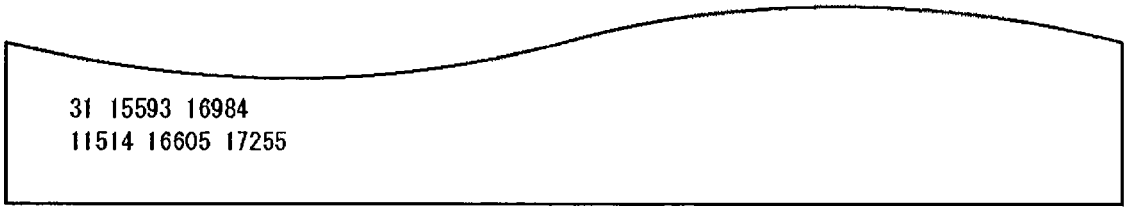
FIG. 42 is an illustration of an example of the parity check matrix initial value table.

Note that FIG. 40 is a continuation of FIG. 39, FIG. 41 is a continuation of FIG. 40, and FIG. 42 is a continuation of FIG. 41.

FIGS. 43, 44, 45, and 46 are each an illustration of an example of the parity check matrix initial value table of the DVB method with respect to a parity check matrix of the new LDPC code with the code length N or 64 k and the encoding rate r of 13/15 (hereinafter also referred to as a Sony code with (64 k, 13/15)) proposed by the present applicant.

Note that FIG. 44 is a continuation of FIG. 43, FIG. 45 is a continuation of FIG. 44, and FIG. 46 is a continuation of FIG. 45.

FIGS. 47 and 48 are each an illustration of an example of the parity check matrix initial value table of the DVB method with respect to a parity check matrix of the new LDPC code with the code length N or 64 k and the encoding rate r of 6/15 (hereinafter also referred to as a Samsung code with (64 k, 6/15)) proposed by Samsung.

Note that FIG. 48 is a continuation of FIG. 47.

FIGS. 49, 50, and 51 are each an illustration of an example of the parity check matrix initial value table of the DVB method with respect to a parity check matrix of the new LDPC code with the code length N or 64 k and the encoding rate r of 8/15 (hereinafter also referred to as a Samsung code with (64 k, 8/15)) proposed by Samsung.

Note that FIG. 50 is a continuation of FIG. 49, and FIG. 51 is a continuation of FIG. 50.

FIGS. 52, 53, and 54 are each an illustration of an example of the parity check matrix initial value table of the DVB method with respect to a parity check matrix of the new LDPC code with the code length N or 64 k and the encoding rate r of 12/15 (hereinafter also referred to as a Samsung code with (64 k, 12/15)) proposed by Samsung.

Note that FIG. 53 is a continuation of FIG. 52, and FIG. 54 is a continuation of FIG. 53.

FIG. 55 is an illustration of an example of the parity check matrix initial value table of the DVB method with respect to a parity check matrix of the new LDPC code with the code length N or 16 k and the encoding rate r of 6/15 (hereinafter also referred to as a LGE code with (16 k, 6/15)) proposed by LGE.

FIG. 56 is an illustration of an example of the parity check matrix initial value table of the DVB method with respect to a parity check matrix of the new LDPC code with the code length N or 16 k and the encoding rate r of 7/15 (hereinafter also referred to as a LGE code with (16 k, 7/15)) proposed by LGE.

FIG. 57 is an illustration of an example of the parity check matrix initial value table of the DVB method with respect to a parity check matrix of the new LDPC code with the code length N or 16 k and the encoding rate r of 9/15 (hereinafter also referred to as a LGE code with (16 k, 9/15)) proposed by LGE.

FIG. 58 is an illustration of an example of the parity check matrix initial value table of the DVB method with respect to a parity check matrix of the new LDPC code with the code length N or 16 k and the encoding rate r of 11/15 (hereinafter also referred to as a LGE code with (16 k, 11/15)) proposed by LGE.

FIG. 59 is an illustration of an example of the parity check matrix initial value table of the DVB method with respect to a parity check matrix of the new LDPC code with the code length N or 16 k and the encoding rate r of 13/15 (hereinafter also referred to as a LGE code with (16 k, 13/15)) proposed by LGE.

FIGS. 60, 61, and 62 are each an illustration of an example of the parity check matrix initial value table of the DVB method with respect to a parity check matrix of the new LDPC code with the code length N or 64 k and the encoding rate r of 10/15 (hereinafter also referred to as a LGE code with (64 k, 10/15)) proposed by LGE.

Note that FIG. 61 is a continuation of FIG. 60, and FIG. 62 is a continuation of FIG. 61.

FIGS. 63, 64, and 65 are each an illustration of an example of the parity check matrix initial value table of the DVB method with respect to a parity check matrix of the new LDPC code with the code length N or 64 k and the encoding rate r of 9/15 (hereinafter also referred to as a NERC code with (64 k, 9/15)) proposed by NERC.

Note that FIG. 64 is a continuation of FIG. 63, and FIG. 65 is a continuation of FIG. 64.

FIG. 66 is an illustration of an example of the parity check matrix initial value table of the DVB method with respect to a parity check matrix of the new LDPC code with the code length N or 16 k and the encoding rate r of 5/15 (hereinafter also referred to as a ETRI code with (16 k, 5/15)) proposed by CRC/ETRI.

FIGS. 67 and 68 are each an illustration of an example of the parity check matrix initial value table of the DVB method with respect to a parity check matrix of the new LDPC code with the code length N or 64 k and the encoding rate r of 5/15 (hereinafter also referred to as a ETRI code with (64 k, 5/15)) proposed by CRC/ETRI.

Note that FIG. 68 is a continuation of FIG. 67.

FIGS. 69 and 70 are each an illustration of an example of the parity check matrix initial value table of the DVB method with respect to a parity check matrix of the new LDPC code with the code length N or 64 k and the encoding rate r of 6/15 (hereinafter also referred to as a ETRI code with (64 k, 6/15)) proposed by CRC/ETRI.

Note that FIG. 70 is a continuation of FIG. 69.

FIGS. 71 and 72 are each an illustration of an example of the parity check matrix initial value table of the DVB method with respect to a parity check matrix of the new LDPC code with the code length N or 64 k and the encoding rate r of 7/15 (hereinafter also referred to as a ETRI code with (64 k, 7/15)) proposed by CRC/ETRI.

Note that FIG. 72 is a continuation of FIG. 71.

Among new LDPC codes, the Sony code is an LDPC code with particularly good performance.

Here, the LDPC code of good performance is an LDPC code obtained from an appropriate parity check matrix H.

Moreover, the appropriate parity check matrix H is a parity check matrix that satisfies a predetermined condition to make BER (bit error rate) (and FER (frame error rate)) smaller when an LDPC code obtained from the parity check matrix H is transmitted at low $E_s/N_0$ or $E_b/N_0$ (signal-to-noise power ratio per bit).

For example, the appropriate parity check matrix H can be found by performing simulation to measure BER when LDPC codes obtained from various parity check matrices that satisfy a predetermined condition are transmitted at low $E_s/N_0$.

As a predetermined condition to be satisfied by the appropriate parity check matrix H, for example, an analysis result obtained by a code performance analysis method called density evolution (Density Evolution) is excellent, and a loop of elements of 1 does not exist, which is called cycle 4, and so on.

Here, in the information matrix $H_A$, it is known that the decoding performance of LDPC code is deteriorated when elements of 1 are dense like cycle 4, and therefore it is requested that cycle 4 does not exist, as a predetermined condition to be satisfied by the appropriate parity check matrix H.

Here, the predetermined condition to be satisfied by the appropriate parity check matrix H can be arbitrarily determined from the viewpoint of the improvement in the decoding performance of LDPC code and the facilitation (simplification) of decoding processing of LDPC code, and so on.

Figure 73:
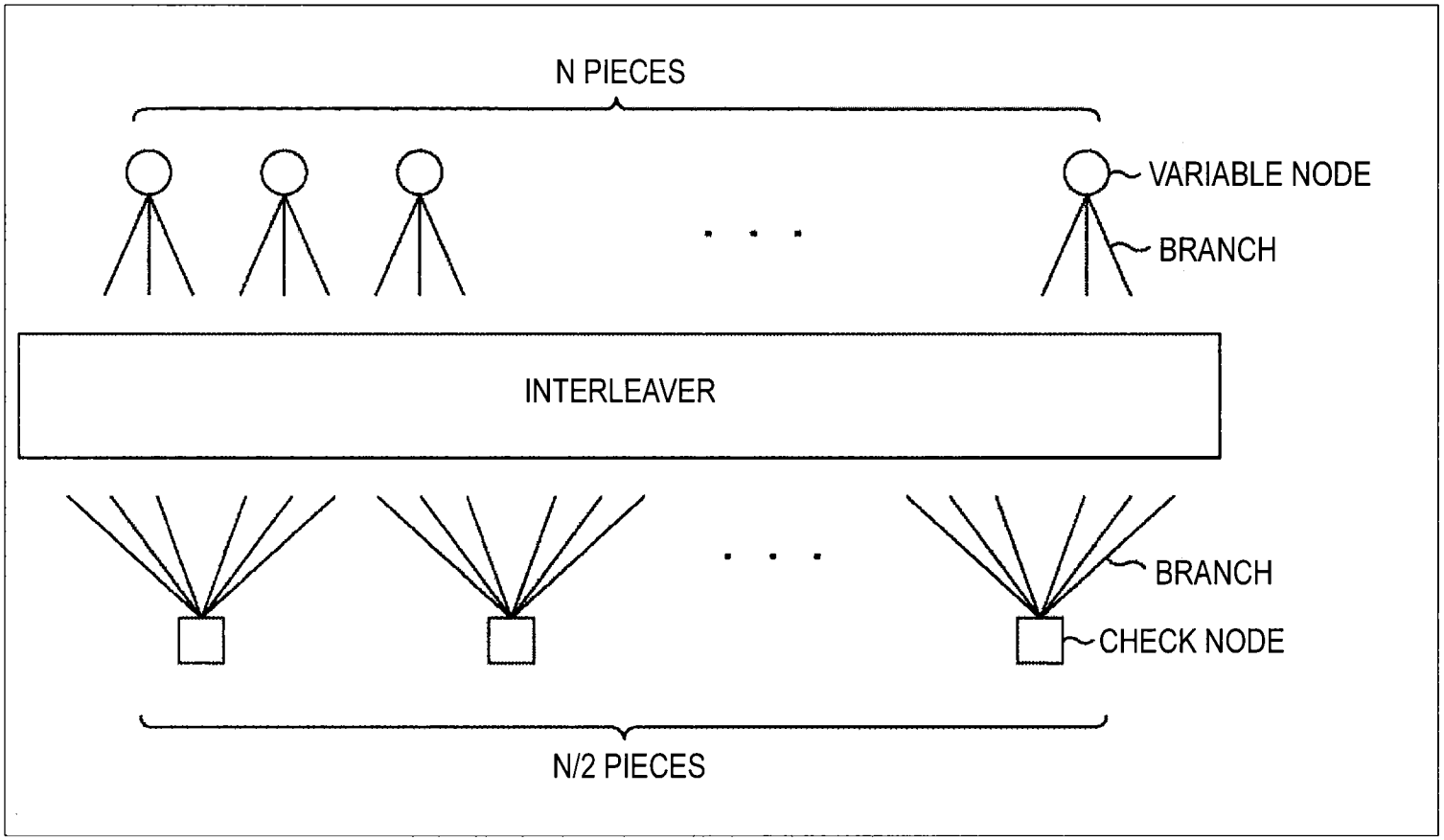
FIG. 73 is an illustration of an example of a Tanner graph of an ensemble of a degree sequence with a column weight of 3 and a row weight of 6.
Figure 74:
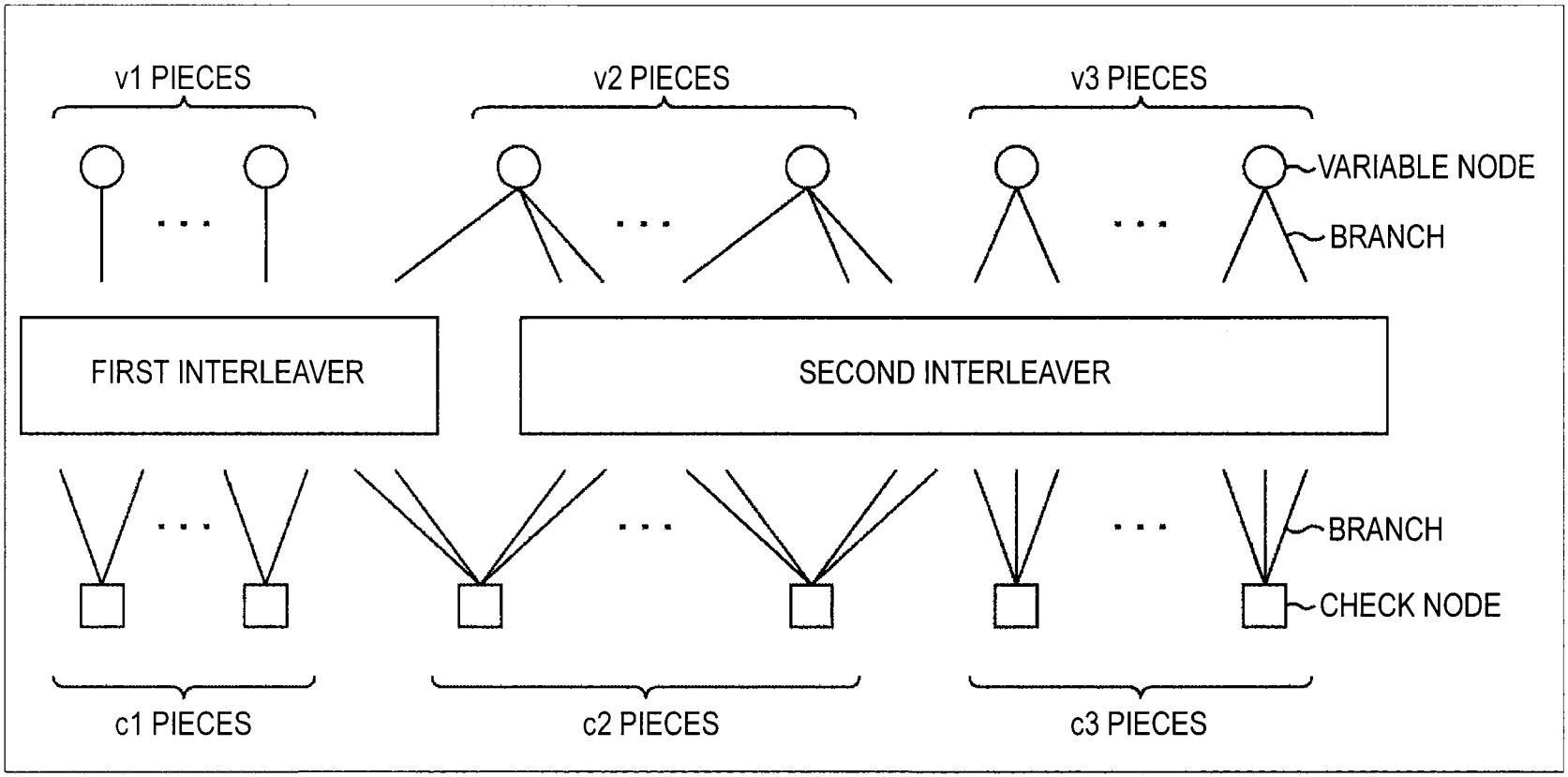
FIG. 74 is an illustration of an example of a Tanner graph of an ensemble of the multi-edge type.

FIG. 73 and FIG. 74 are diagrams to describe the density evolution that can obtain an analytical result as a predetermined condition to be satisfied by the appropriate parity check matrix H.

The density evolution is a code analysis method that calculates the expectation value of the error probability of the entire LDPC code (ensemble) with a code length N of ∞ characterized by a degree sequence described later.

For example, when the dispersion value of noise is gradually increased from 0 on the AWGN channel, the expectation value of the error probability of a certain ensemble is 0 first, but, when the dispersion value of noise becomes equal to or greater than a certain threshold, it is not 0.

According to the density evolution, by comparison of the threshold of the dispersion value of noise (which may also be called a performance threshold) in which the expectation value of the error probability is not 0, it is possible to decide the quality of ensemble performance (appropriateness of the parity check matrix).

Here, as for a specific LDPC code, when an ensemble to which the LDPC code belongs is decided and density evolution is performed for the ensemble, rough performance of the LDPC code can be expected.

Therefore, if an ensemble of good performance is found, an LDPC code of good performance can be found from LDPC codes belonging to the ensemble.

Here, the above-mentioned degree sequence shows at what percentage a variable node or check node having the weight of each value exists with respect to the code length N of an LDPC code.

For example, a regular (3,6) LDPC code with an encoding rate of 1/2 belongs to an ensemble characterized by a degree sequence in which the weight (column weight) of all variable nodes is 3 and the weight (row weight) of all check nodes is 6.

FIG. 73 illustrates a Tanner graph of such an ensemble.

In the Tanner graph of FIG. 73, there are variable nodes shown by circles (sign O) in the diagram only by N pieces equal to the code length N, and there are check nodes shown by quadrangles (sign □) only by N/2 pieces equal to a multiplication value multiplying encoding rate 1/2 by the code length N.

Three branches (edge) equal to the column weight are connected with each variable node, and therefore there are totally 3N branches connected with N variable nodes.

Moreover, six branches (edge) equal to the row weight are connected with each check node, and therefore there are totally 3N branches connected with N/2 check nodes.

In addition, there is one interleaver in the Tanner graph in FIG. 73.

The interleaver randomly rearranges 3N branches connected with N variable nodes and connects each rearranged branch with any of 3N branches connected with N/2 check nodes.

There are (3N)! (=(3N)×(3N−1)× . . . ×1) rearrangement patterns to rearrange 3N branches connected with N variable nodes in the interleaver. Therefore, an ensemble characterized by the degree sequence in which the weight of all variable nodes is 3 and the weight of all check nodes is 6, becomes aggregation of (3N)! LDPC codes.

In simulation to find an LDPC code of good performance (appropriate parity check matrix), an ensemble of a multi-edge type is used in the density evolution.

In the multi edge type, an interleaver through which the branches connected with the variable nodes and the branches connected with the check nodes pass, is divided into plural (multi edge), and, by this means, the ensemble is characterized more strictly.

FIG. 74 illustrates an example of a Tanner graph of an ensemble of the multi-edge type.

In the Tanner graph of FIG. 74, there are two interleavers of the first interleaver and the second interleaver.

Moreover, in the Tanner graph chart of FIG. 74, v1 variable nodes with one branch connected with the first interleaver and no branch connected with the second interleaver exist, v2 variable nodes with one branch connected with the first interleaver and two branches connected with the second interleaver exist, and v3 variable nodes with no branch connected with the first interleaver and two branches connected with the second interleaver exist, respectively.

Furthermore, in the Tanner graph chart of FIG. 74, c1 check nodes with two branches connected with the first interleaver and no branch connected with the second interleaver exist, c2 check nodes with two branches connected with the first interleaver and two branches connected with the second interleaver exist, and c3 check nodes with no branch connected with the first interleaver and three branches connected with the second interleaver exist, respectively.

Here, for example, the density evolution and the mounting thereof are described in "On the Design of Low-Density Parity-Check Codes within 0.0045 dB of the Shannon Limit", S. Y. Chung, G. D. Forney, T. J. Richardson, R. Urbanke, IEEE Communications Leggers, VOL. 5, NO. 2, February 2001.

In simulation to find (a parity check matrix initial value table of) a Sony code, by the density evaluation of the multi-edge type, an ensemble in which a performance threshold that is $E_b/N_0$ (signal-to-noise power ratio per bit) with deteriorating (decreasing) BER is equal to or less than a predetermined value is found, and an LDPC code that decreases BER in case of using one or more orthogonal modulation, such as QPSK, is selected from LDPC codes belonging to the ensemble as an LDPC code of good performance.

The parity check matrix initial value table of a Sony code is obtained from the simulation as described above.

Thus, according to a Sony code obtained from the parity check matrix initial value table, excellent communication quality can be ensured in data transmission.

Figure 75:
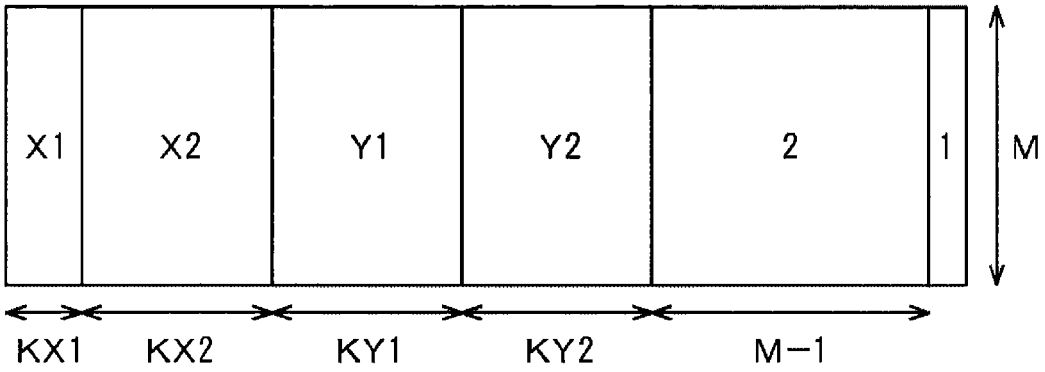
FIG. 75 is an illustration of a parity check matrix.

FIG. 75 is an illustration of a parity check matrix H obtained from the parity check matrix initial value table of Sony codes with (16 k, 8/15), (16 k, 10/15), and (16 k, 12/15) (hereinafter also described as a parity check matrix H of Sony codes with (16 k, 8/15), (16 k, 10/15), and (16 k, 12/15)).

As minimum cycle lengths of the parity check matrix H of the Sony codes with (16 k, 8/15), (16 k, 10/15), and (16 k, 12/15) are values all exceeding cycle 4, cycle 4 is not present (a loop of elements of 1 with a loop length of 4). Here, a minimum cycle length (girth) means a minimum value of the length of a loop (loop length) constituted by elements of 1 in a parity check matrix H.

In addition, a performance threshold value of the Sony code with (16 k, 8/15) is set to 0.805765, a performance threshold value of the Sony code with (16 k, 10/15) to 2.471011, and a performance threshold value of the Sony code with (16 k, 12/15) to 4.269922, respectively.

KX1 columns from the first column of the parity check matrix H of the Sony codes with (16 k, 8/15), (16 k, 10/15), and (16 k, 12/15) are set to have the column weight of X1, the next KX2 columns to have the column weight of X2, the next KY1 columns to have the column weight of Y1, the next KY2 columns to have the column weight of Y2, the next M−1 columns to have the column weight of 2, and the final one column to have the column weight of 1.

Here, KX1+KX2+KY1+KY2+M−1+1 is equal to a code length N=16200 bits of the Sony codes with (16 k, 8/15), (16 k, 10/15), and (16 k, 12/15).

The number of columns KX1, KX2, KY1, KY2, and M and the column weights X1, X2, Y1, and Y2 of the parity check matrix H of the Sony codes with (16 k, 8/15), (16 k, 10/15), and (16 k, 12/15) are set as illustrated in FIG. 75.

With respect to the parity check matrix H of the Sony codes with (16 k, 8/15), (16 k, 10/15), and (16 k, 12/15), columns on the head side (left side) tend to have a greater column weight, like the parity check matrixes described with reference to FIGS. 12 and 13, and thus code bits on the head side of the Sony codes tend to be unaffected by errors (be resistant to errors).

According to simulations performed by the present applicant, satisfactory BER/FER are obtained with respect to the Sony codes with (16 k, 8/15), (16 k, 10/15), and (16 k, 12/15), and thus excellent communication quality can be ensured in data transmission using the Sony codes with (16 k, 8/15), (16 k, 10/15), and (16 k, 12/15).

Figure 76:
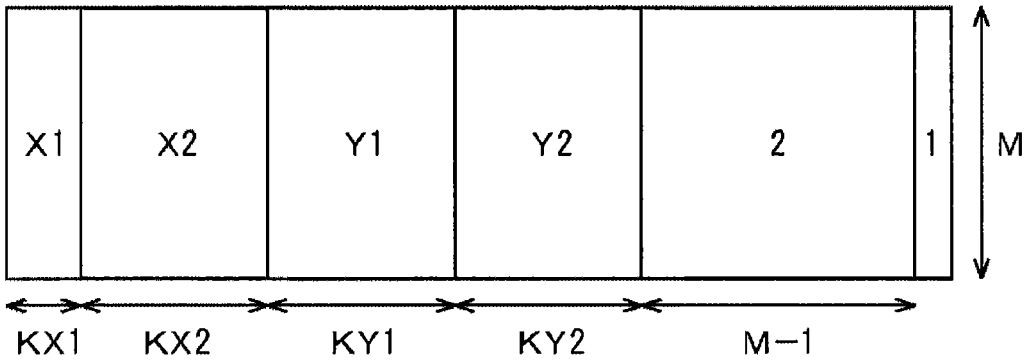
FIG. 76 is an illustration of a parity check matrix.

FIG. 76 is an illustration of a parity check matrix H of Sony codes with (64 k, 7/15), (64 k, 9/15), (64 k, 11/15), and (64 k, 13/15).

Minimum cycle lengths of the parity check matrix H of the Sony codes with (64 k, 7/15), (64 k, 9/15), (64 k, 11/15), and (64 k, 13/15) all have values exceeding cycle 4, and thus cycle 4 is not present.

In addition, a performance threshold value of the Sony code with (64 k, 7/15) is set to −0.093751, a performance threshold value of the Sony code with (64 k, 9/15) to 1.658523, a performance threshold value of the Sony code with (64 k, 11/15) to 3.351930, and a performance threshold value of the Sony code with (64 k, 13/15) to 5.301749.

KX1 columns from the first column of the parity check matrix H of the Sony codes with (64 k, 7/15), (64 k, 9/15), (64 k, 11/15), and (64 k, 13/15) are set to have the column weight of X1, the next KX2 columns to have the column weight of X2, the next KY1 columns to have the column weight of Y1, the next KY2 columns to have the column weight of Y2, the next M−1 columns to have the column weight of 2, and the final one column to have the column weight of 1.

Here, KX1+KX2+KY1+KY2+M−1+1 is equal to a code length N=64800 bits of the Sony codes with (64 k, 7/15), (64 k, 9/15), (64 k, 11/15), and (64 k, 13/15).

The number of columns KX1, KX2, KY1, KY2, and M and the column weights X1, X2, Y1, and Y2 of the parity check matrix H of the Sony codes with (64 k, 7/15), (64 k, 9/15), (64 k, 11/15), and (64 k, 13/15) are set as illustrated in FIG. 76.

With respect to the parity check matrix H of the Sony codes with (64 k, 7/15), (64 k, 9/15), (64 k, 11/15), and (64 k, 13/15), columns on the head side (left side) tend to have a greater column weight, like the parity check matrixes described with reference to FIGS. 12 and 13, and thus code bits on the head side of the Sony codes tend to be unaffected by errors.

According to simulations performed by the present applicant, satisfactory BER/FER are obtained with respect to the Sony codes with (64 k, 7/15), (64 k, 9/15), (64 k, 11/15), and (64 k, 13/15), and thus excellent communication quality can be ensured in data transmission using the Sony codes with (64 k, 7/15), (64 k, 9/15), (64 k, 11/15), and (64 k, 13/15).

Figure 77:
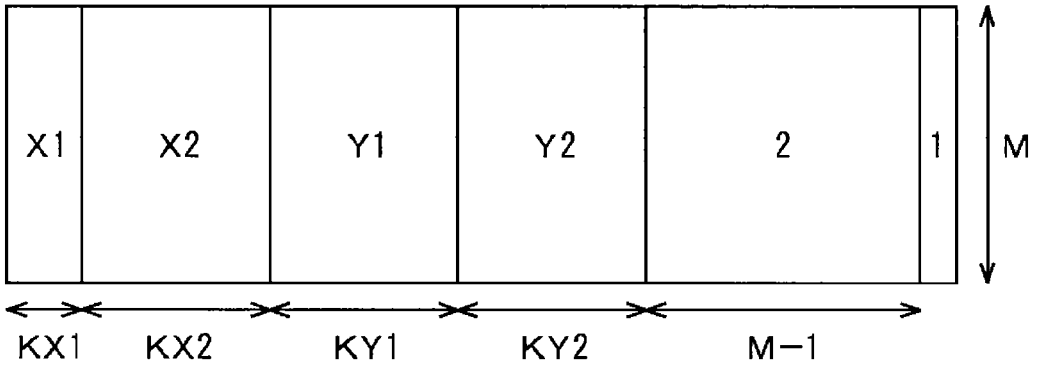
FIG. 77 is an illustration of a parity check matrix.

FIG. 77 is an illustration of a parity check matrix H of Samsung codes with (64 k, 6/15), (64 k, 8/15), and (64 k, 12/15).

KX1 columns from the first column of the parity check matrix H of the Samsung codes with (64 k, 6/15), (64 k, 8/15), and (64 k, 12/15) are set to have the column weight of X1, the next KX2 columns to have the column weight of X2, the next KY1 columns to have the column weight of Y1, the next KY2 columns to have the column weight of Y2, the next M−1 columns to have the column weight of 2, and the final one column to have the column weight of 1.

Here, KX1+KX2+KY1+KY2+M−1+1 is equal to a code length N=64800 bits of the Samsung codes with (64 k, 6/15), (64 k, 8/15), and (64 k, 12/15).

The number of columns KX1, KX2, KY1, KY2, and M and the column weights X1, X2, Y1, and Y2 of the parity check matrix H of the Samsung codes with (64 k, 6/15), (64 k, 8/15), and (64 k, 12/15) are set as illustrated in FIG. 77.

Figure 78:
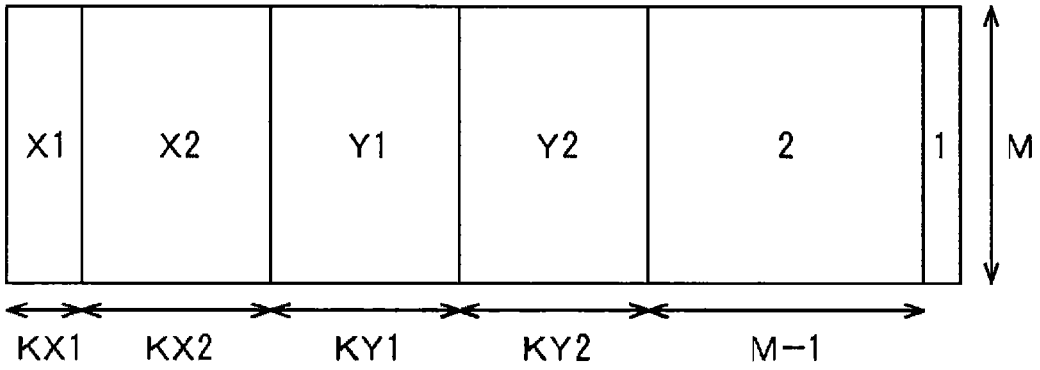
FIG. 78 is an illustration of a parity check matrix.

FIG. 78 is an illustration of a parity check matrix H of LGE codes with (16 k, 6/15), (16 k, 7/15), (16 k, 9/15), (16 k, 11/15), and (16 k, 13/15).

KX1 columns from the first column of the parity check matrix H of the LGE codes with (16 k, 6/15), (16 k, 7/15), (16 k, 9/15), (16 k, 11/15), and (16 k, 13/15) are set to have the column weight of X1, the next KX2 columns to have the column weight of X2, the next KY1 columns to have the column weight of Y1, the next KY2 columns to have the column weight of Y2, the next M−1 columns to have the column weight of 2, and the final one column to have the column weight of 1.

Here, KX1+KX2+KY1+KY2+M−1+1 is equal to a code length N=64800 bits of the LGE codes with (16 k, 6/15), (16 k, 7/15), (16 k, 9/15), (16 k, 11/15), and (16 k, 13/15).

The number of columns KX1, KX2, KY1, KY2, and M and the column weights X1, X2, Y1, and Y2 of the parity check matrix H of the LGE codes with (16 k, 6/15), (16 k, 7/15), (16 k, 9/15), (16 k, 11/15), and (16 k, 13/15) are set as illustrated in FIG. 78.

Figure 79:
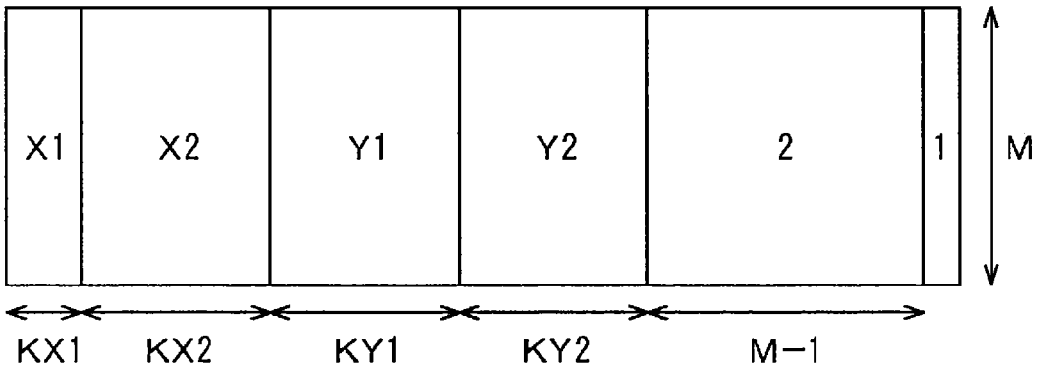
FIG. 79 is an illustration of a parity check matrix.

FIG. 79 is an illustration of a parity check matrix H of LGE codes with (64 k, 10/15).

KX1 columns from the first column of the parity check matrix H of the LGE codes with (64 k, 10/15) are set to have the column weight of X1, the next KX2 columns to have the column weight of X2, the next KY1 columns to have the column weight of Y1, the next KY2 columns to have the column weight of Y2, the next M−1 columns to have the column weight of 2, and the final one column to have the column weight of 1.

Here, KX1+KX2+KY1+KY2+M−1+1 is equal to a code length N=64800 bits of the LGE codes with (64 k, 10/15).

The number of columns KX1, KX2, KY1, KY2, and M and the column weights X1, X2, Y1, and Y2 of the parity check matrix H of the LGE codes with (64 k, 10/15) are set as illustrated in FIG. 79.

Figure 80:
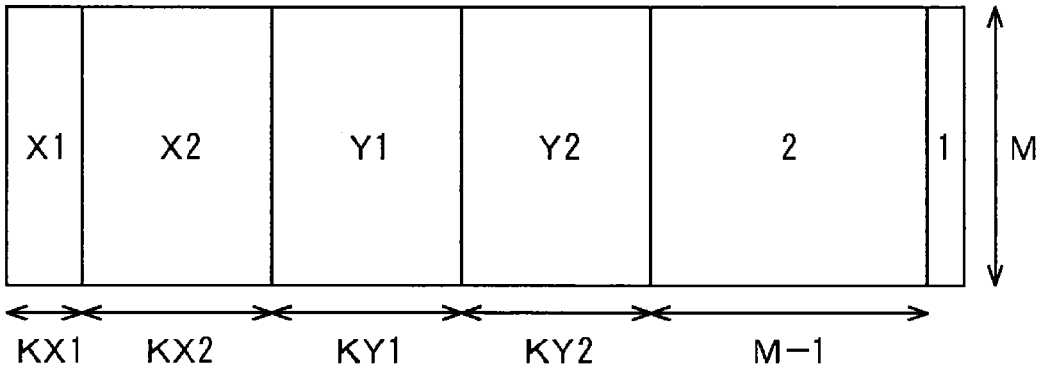
FIG. 80 is an illustration of a parity check matrix.

FIG. 80 is an illustration of a parity check matrix H of NERC codes with (64 k, 9/15).

KX1 columns from the first column of the parity check matrix H of the NERC codes with (64 k, 9/15) are set to have the column weight of X1, the next KX2 columns to have the column weight of X2, the next KY1 columns to have the column weight of Y1, the next KY2 columns to have the column weight of Y2, the next M−1 columns to have the column weight of 2, and the final one column to have the column weight of 1.

Here, KX1+KX2+KY1+KY2+M−1+1 is equal to a code length N=64800 bits of the NERC codes with (64 k, 9/15).

The number of columns KX1, KX2, KY1, KY2, and M and the column weights X1, X2, Y1, and Y2 of the parity check matrix H of the NERC codes with (64 k, 9/15) are set as illustrated in FIG. 80.

Figure 81:
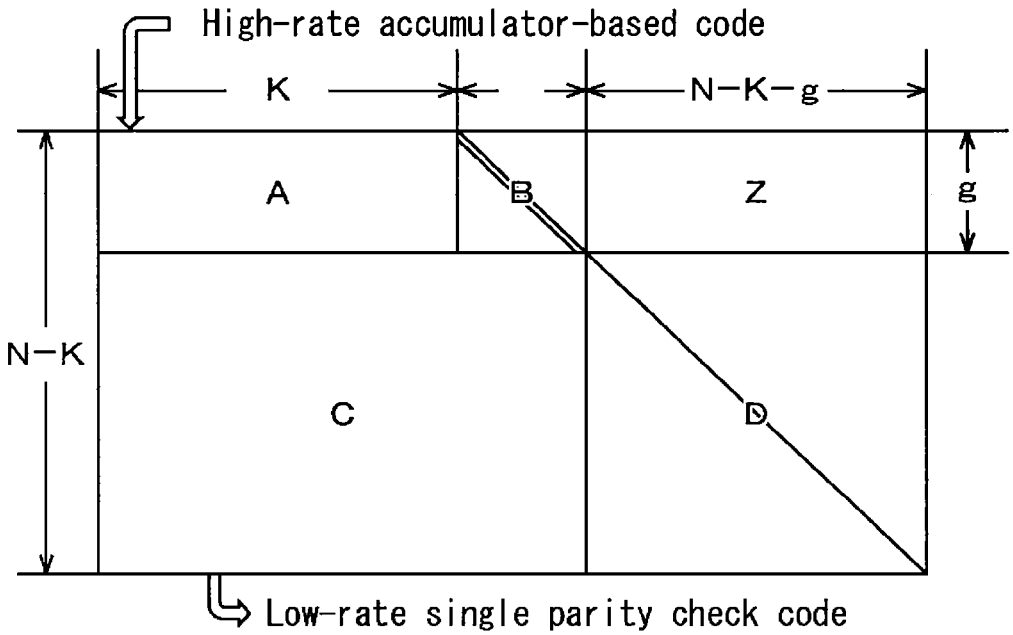
FIG. 81 is an illustration of a parity check matrix.

FIG. 81 is an illustration of a parity check matrix H of ETRI codes with (16 k, 5/15).

For the parity check matrix H of the ETRI code with (16 k, 5/15), the parameter $g=M_1$ is set to 720.

In addition, since the code length N of the ETRI code with (16 k, 5/15) is 16200 and the encoding rate r is 5/15, the information length K=N×r is 16200×5/15=5400, and the parity length M=N−K is 16200−5400=10800.

Further, the parameter $M_2=M-M_1=N-K-g$ is 10800−720=10080.

Thus, the parameter $Q_1=M_1/P$ is 720/360=2, and the parameter $Q_2=M_2/P$ is 10080/360=28.

Figure 82:
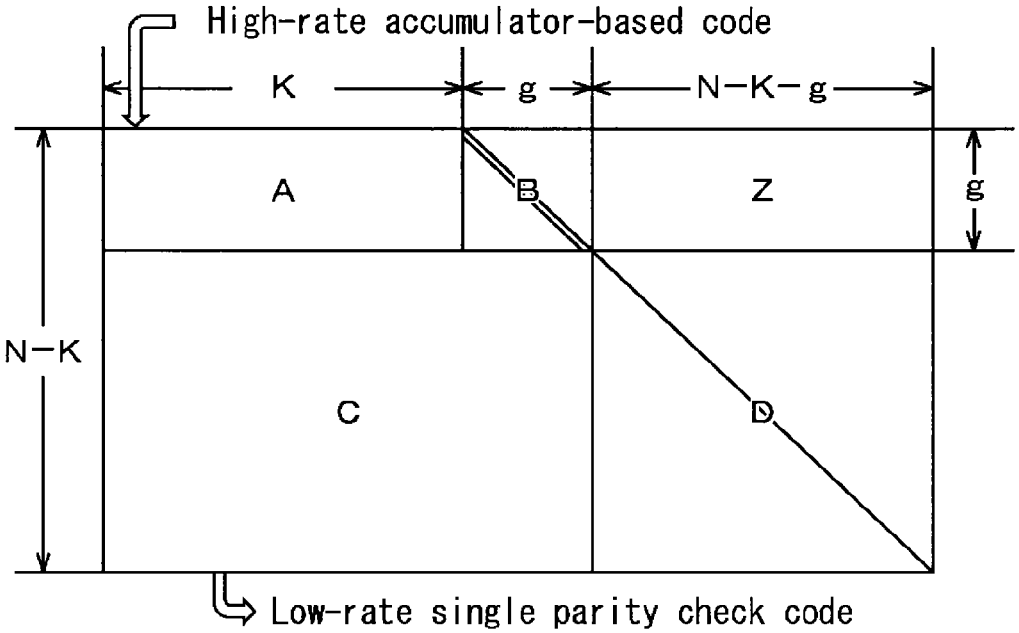
FIG. 82 is an illustration of a parity check matrix.

FIG. 82 is an illustration of a parity check matrix H of ETRI codes with (64 k, 5/15), (64 k, 6/15), and (64 k, 7/15).

The parameters $g=M_1$, $M_2$, $Q_1$, and $Q_2$ of the parity check matrix H of ETRI codes with (64 k, 5/15), (64 k, 6/15), and (64 k, 7/15) are set as illustrated in FIG. 82.

<Constellation>

FIGS. 83 to 92 are illustrations of examples of types of constellations adopted in the transmission system of FIG. 7.

In the transmission system of FIG. 7, for example, constellations that are scheduled to be adopted in ATSC 3.0 can be employed.

In ATSC 3.0, with regard to MODCOD that is a combination of a modulation method and an LDPC code, constellations to be used in MODCOD are set.

Here, in ATSC 3.0, five types of modulation methods of QPSK, 16QAM, 64QAM, 256QAM, and 1024QAM (1 kQAM) are scheduled to be adopted.

In addition, in ATSC 3.0, for each of two types of code lengths N of 16 k bits and 64 k bits, LDPC codes with 9 types of encoding rates r of 5/15, 6/15, 7/15, 8/15, 9/15, 10/15, 11/15, 12/15, and 13/15, i.e., 9×2=18 types of LDPC codes, are scheduled to be adopted.

In ATSC 3.0, the 18 types of LDPC codes are classified into 9 types according to an encoding rate r (not according to the code length N), the 9 types of LDPC codes (respective LDPC codes with the encoding rates r or 5/15, 6/15, 7/15, 8/15, 9/15, 10/15, 11/15, 12/15, and 13/15) and 5 types of modulation methods form 45 combinations (9×5), and the combinations are scheduled to be adopted as MODCOD.

In addition, in ATSC 3.0, one or more constellations are scheduled to be adopted for one piece of MODCOD.

Among constellations, there are uniform constellations (UCs) which have uniform arrangement of signal points and non-uniform constellations (NUCs) which have non-uniform arrangement thereof.

In addition, among NUCs, for example, there are constellations called 1-dimensional $M^2$-QAM non-uniform constellations (1D NUCs), constellations called 2-dimensional QQAM non-uniform constellations (2D NUCs), and the like.

In general, a 1D NUC has a more improved BER than a UC, and further, a 2D NUM has a more improved BER than a 1D NUC.

A UC is adopted as a constellation of QPSK. In addition, as a constellation of 16QAM, 64QAM, and 256QAM, for example, a 2D NUC is adopted, and as constellations of 1024QAM, for example, a 1D NUC and a 2D NUC are adopted.

Hereinbelow, a constellation of an NUC of which the modulation method is a modulation method of matching an m-bit symbol to any of $2^m$ signal points used in MODCOD in which an encoding rate of an LDPC code is r is also described as NU-$2^m$_r (here, m=2, 4, 6, 8, and 10).

For example, "NUC_16_6/15" indicates a constellation of an NUC of which the modulation method is 16QAM used in MODCOD in which an encoding rate r of an LDPC code is 6/15.

In ATSC 3.0, the same constellation is scheduled to be used for the encoding rate r of the 9 types of LDPC codes when the modulation method is QPSK.

In addition, in ATSC 3.0, different constellations of the 2D NUC are scheduled to be used for respective encoding rates r of the 9 types of LDPC codes when the modulation method is 16QAM, 64QAM, or 256QAM.

Further, in ATSC 3.0, different constellations of the 1D NUC or 2D NUC are scheduled to be used for respective encoding rates r of the 9 types of LDPC codes when the modulation method is 1024QAM.

Thus, in ATSC 3.0, 1 type of constellation is scheduled to be prepared for QPSK, 9 types of constellations of 2D NUCs for 16QAM, 64QAM, and 256QAM, and a total of 18 types of constellations including 9 types of 1D NUCs and 9 types of 2D NUCs for 1024QAM.

Figure 83:
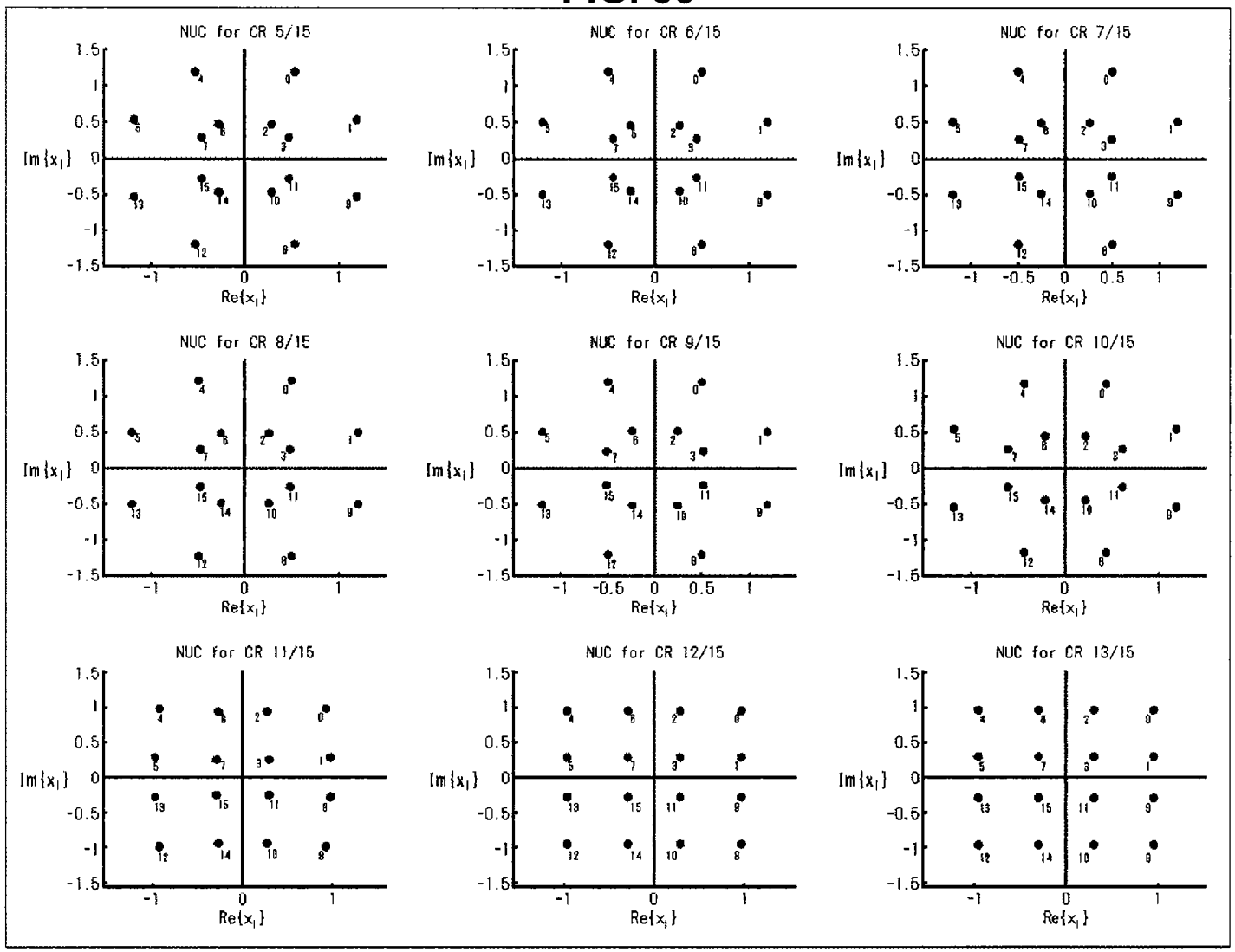
FIG. 83 is an illustration of an example of constellations when a modulation method is 16QAM.

FIG. 83 is an illustration of example of constellations for 9 types of encoding rates r (=5/15, 6/15, 7/15, 8/15, 9/15, 10/15, 11/15, 12/15, and 13/15) of the LDPC codes when the modulation method is 16QAM.

Figure 84:
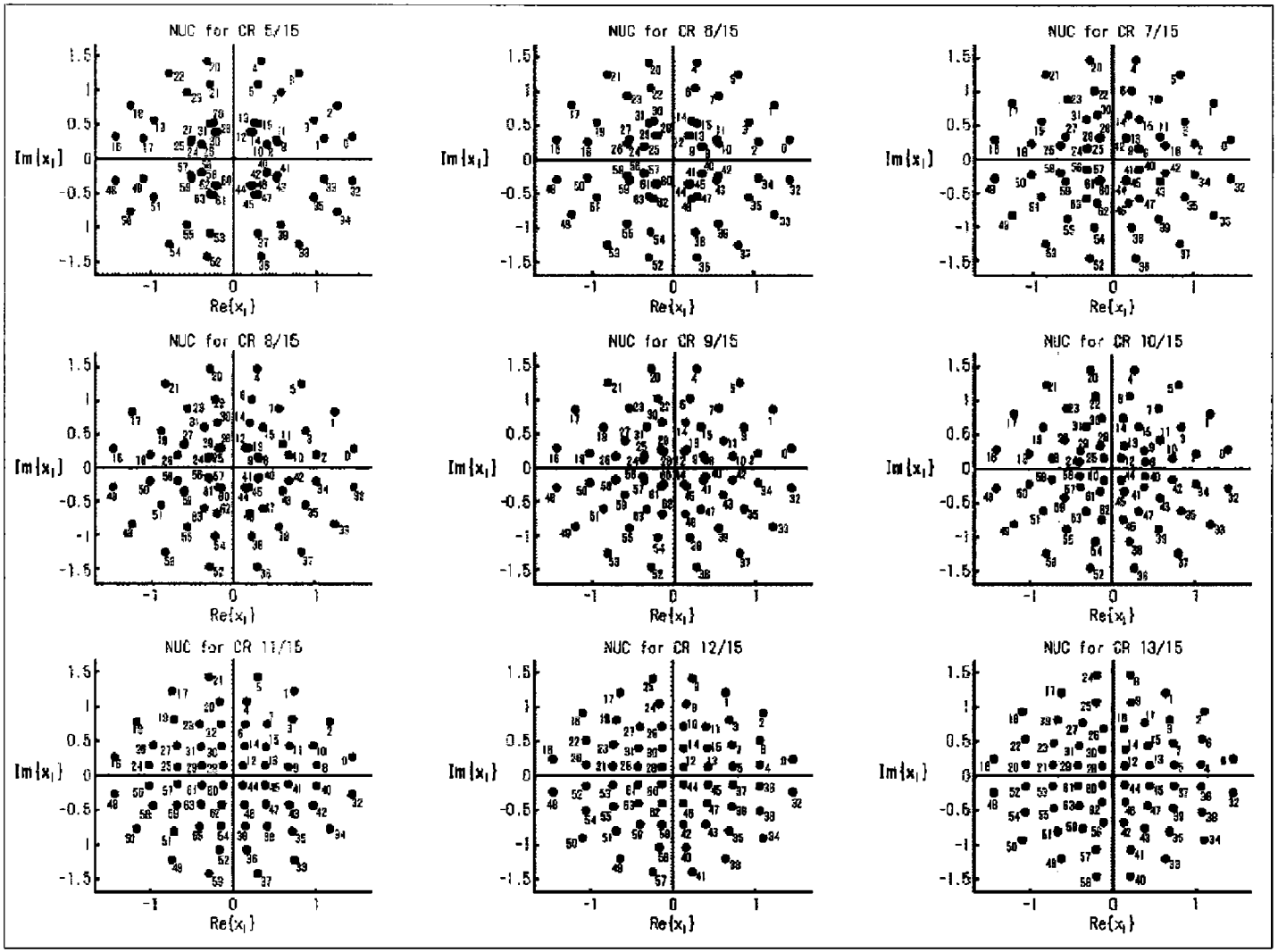
FIG. 84 is an illustration of an example of constellations when a modulation method is 64QAM.

FIG. 84 is an illustration of example of constellations for 9 types of encoding rates r (=5/15, 6/15, 7/15, 8/15, 9/15, 10/15, 11/15, 12/15, and 13/15) of the LDPC codes when the modulation method is 64QAM.

Figure 85:
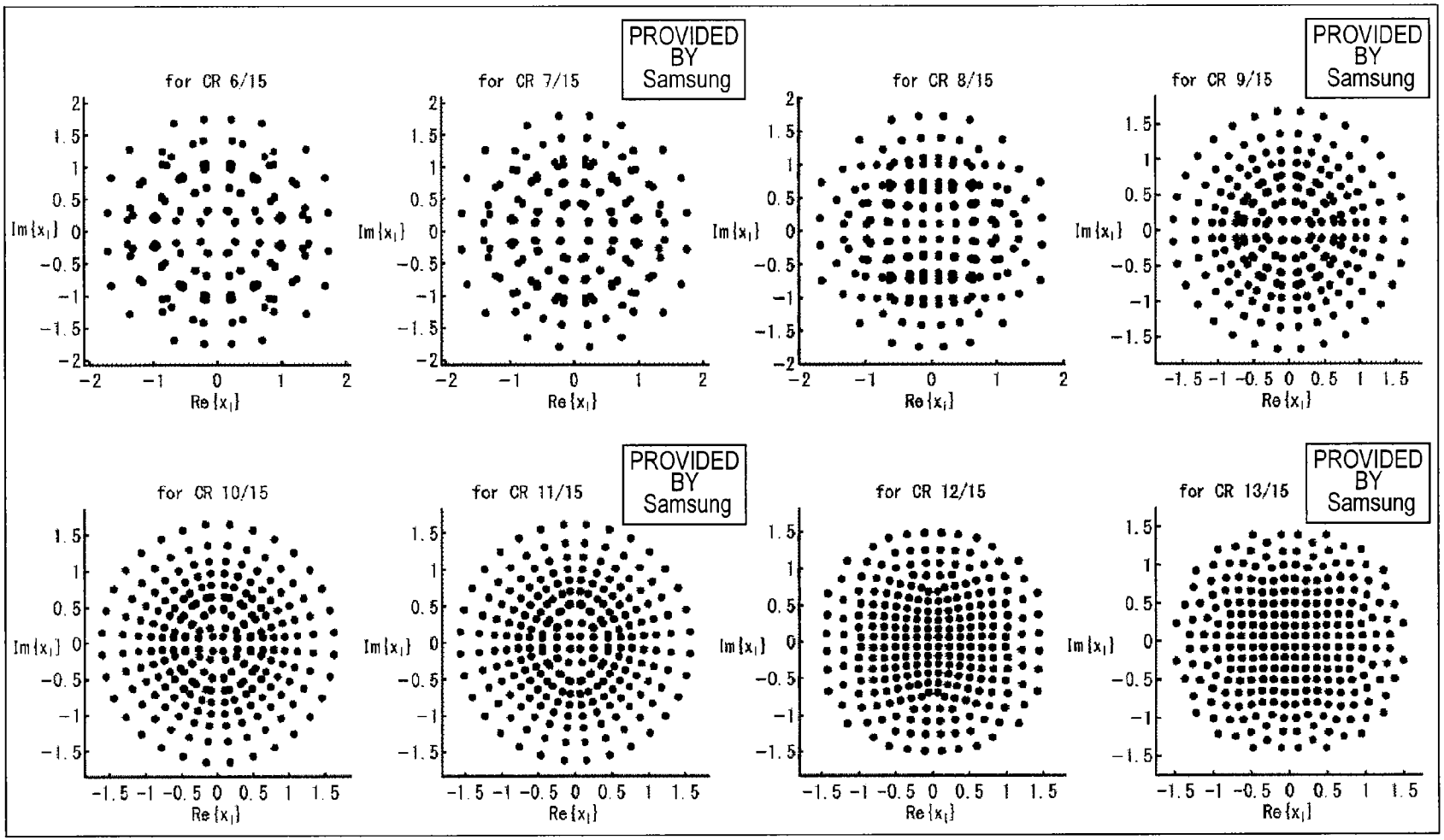
FIG. 85 is an illustration of an example of constellations when a modulation method is 256QAM.

FIG. 85 is an illustration of example of constellations for 8 types of encoding rates r (=6/15, 7/15, 8/15, 9/15, 10/15, 11/15, 12/15, and 13/15) of the LDPC codes when the modulation method is 256QAM.

Figure 86:
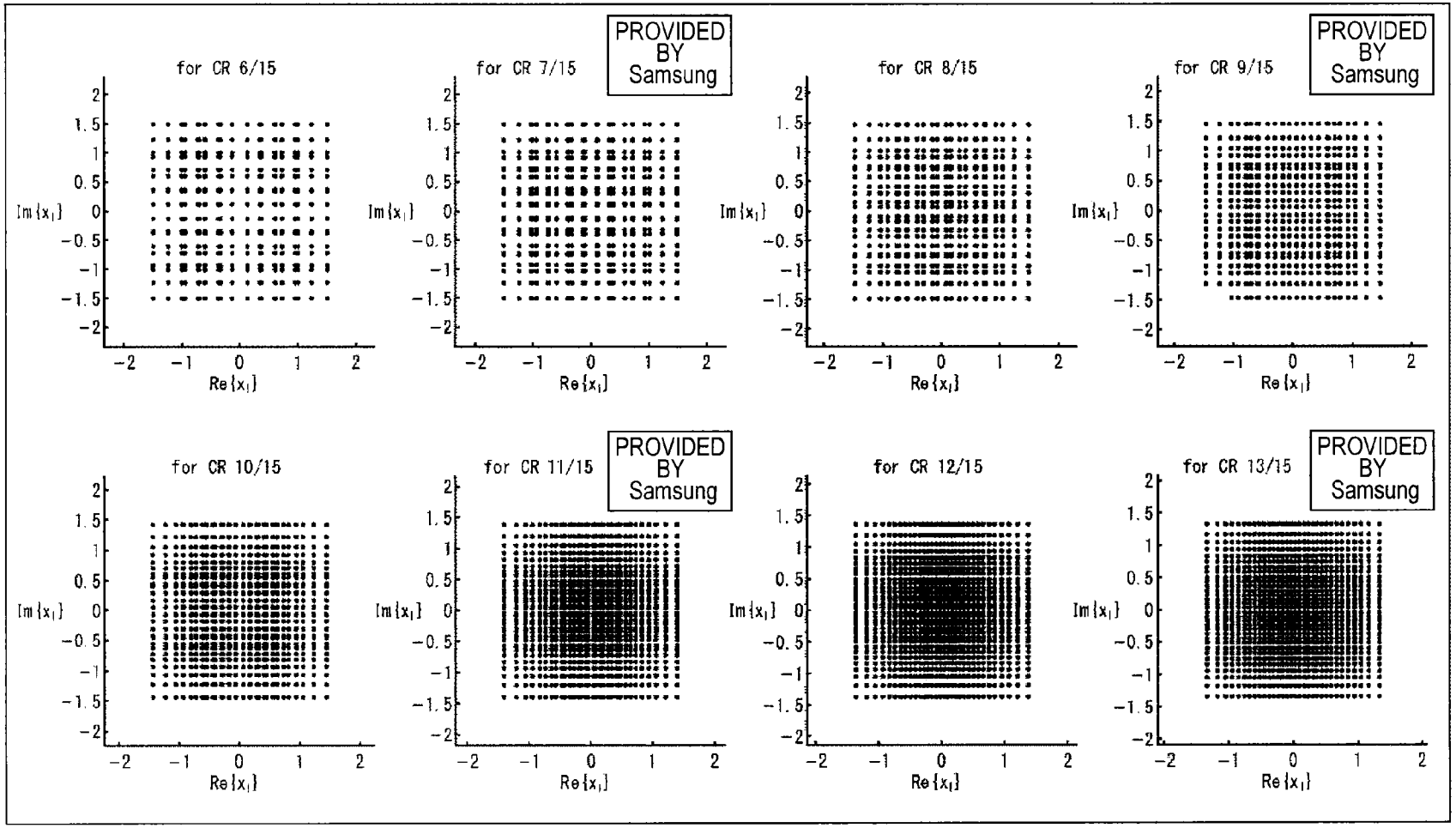
FIG. 86 is an illustration of an example of constellations when a modulation method is 1024QAM.

FIG. 86 is an illustration of example of constellations of 1D NUCs for 8 types of encoding rates r (=6/15, 7/15, 8/15, 9/15, 10/15, 11/15, 12/15, and 13/15) of the LDPC codes when the modulation method is 1024QAM.

In FIGS. 83 to 86, the horizontal and vertical axes represent an I axis and a Q axis respectively, and $\mathrm{Re}\{x_1\}$ and $\mathrm{Im}\{x_1\}$ represent a real part and an imaginary part of a signal point $x_1$ as coordinates of the signal point $x_1$.

In addition, in FIGS. 83 to 86, numerical values described after "for CR" represent encoding rates r of the LDPC codes.

FIG. 87 is an illustration of examples of coordinates of a signal point of a UC commonly used for the 9 types of encoding rates r (=5/15, 6/15, 7/15, 8/15, 9/15, 10/15, 11/15, 12/15, and 13/15) of the LDPC codes when the modulation method is QPSK.

In FIG. 87, "Input cell word y" represents a 2-bit symbol matched to the UC of QPSK, and "Constellation point $z_q$" represents the coordinates of a signal point $z_q$. Note that the index q of the signal point $z_q$ represents a discrete time of the symbol (a time interval between a symbol and the next symbol).

In FIG. 87, the coordinate of the signal point $z_q$ is expressed in the form of a complex number, and i represents an imaginary unit (√(−1)).

FIG. 88 is an illustration of example of the coordinates of a signal point of the 2D NUC used for the 9 types of encoding rates r (=5/15, 6/15, 7/15, 8/15, 9/15, 10/15, 11/15, 12/15, and 13/15) of the LDPC codes when the modulation method is 16QAM.

FIG. 89 is an illustration of example of the coordinates of a signal point of the 2D NUC used for the 9 types of encoding rates r (=5/15, 6/15, 7/15, 8/15, 9/15, 10/15, 11/15, 12/15, and 13/15) of the LDPC codes when the modulation method is 64QAM.

FIG. 90 is an illustration of example of the coordinates of a signal point of the 2D NUC used for the 8 types of encoding rates r (=6/15, 7/15, 8/15, 9/15, 10/15, 11/15, 12/15, and 13/15) of the LDPC codes when the modulation method is 256QAM.

In FIGS. 88 to 90, NUC_$2^m$_r represents the signal point of the 2D NUC used when the modulation method is $2^m$QAM and the encoding rate of the LDPC codes is r.

In FIGS. 88 to 90, the coordinate of the signal point $z_q$ is expressed in the form of a complex number, and i represents an imaginary unit as in FIG. 87.

In FIGS. 88 to 90, w#k represents the coordinates of a signal point of a first quadrant of a constellation.

In the 2D NUC, a signal point of a second quadrant of a constellation is disposed at the position obtained by symmetrically moving the signal point of the first quadrant about the Q axis, and a signal point of a third quadrant of the constellation is disposed at the position obtained by symmetrically moving the signal point of the first quadrant about the origin. In addition, a signal point of the fourth quadrant of the constellation is disposed at the position obtained by symmetrically moving the signal point of the first quadrant about the I axis.

Here, when the modulation method is $2^m$QAM, by setting m bits as one symbol, the one symbol is mapped to a signal point corresponding to the symbol.

The m-bit symbol is expressed by, for example, an integer of 0 to $2^m-1$; however, if $b=2^m/4$ is set, symbols y(0), y(1), . . . , and y($2^m-1$), each of which is expressed by an integer of 0 to $2^m-1$, can be divided into four groups of symbols y(0) to y(b−1), y(b) to y(2b−1), y(2b) to y(3b−1), and y(3b) to y(4b−1).

In FIGS. 88 to 90, the suffix k of w#k is an integer in the range of 0 to b−1, and w#k represents the coordinates of a signal point corresponding to a symbol y(k) in the range of symbols y(0) to y(b−1).

In addition, the coordinates of a signal point corresponding to a symbol y(k+b) in the range of symbols y(b) to y(2b−1) are expressed as −conj(w#k), and the coordinates of a signal point corresponding to a symbol y(k+2b) in the range of symbols y(2b) to y(3b−1) are expressed as conj (w#k). In addition, the coordinates of a signal point corresponding to a symbol y(k+3b) in the range of symbols y(3b) to y(4b−1) are expressed as −w#k.

Here, conj(w#k) indicates the complex conjugate of w#k.

For example, when the modulation method is 16QAM, symbols y(0), (1), . . . , and y(15) with m=4 bits under a condition of $b=2^4/4=4$ are divided into four groups of symbols y(0) to y(3), y(4) to y(7), y(8) to y(11), and y(12) to y(15).

Then, among the symbols y(0) to y(15), the symbol y(12) is the symbol y(k+3b)=y(0+3×4) in the range of the symbols y(3b) to y(4b−1) with k=0, and thus the coordinates of the signal point corresponding to the symbol y(12) are −w#k=−w0.

When the encoding rate r of an LDPC code is, for example, 9/15, w0 for which the modulation method is 16QAM and the encoding rate r is 9/15 (NUC_16_9/15) is 0.4967+1.1932i according to FIG. 88, and thus the coordinates −w0 of the signal point corresponding to the symbol y(12) are −(0.4967+1.1932i).

FIG. 91 is an illustration of examples of coordinates of a signal point of the 1D NUC used for the 8 types of encoding rates r (=6/15, 7/15, 8/15, 9/15, 10/15, 11/15, 12/15, and 13/15) of the LDPC codes when the modulation method is 1024QAM.

In FIG. 91, the column of NUC_1k_r represents the value of u#k indicating the coordinates of the signal point of the 1D NUC used when the modulation method is 1024QAM and the encoding rate of the LDPC code is r.

u#k represents a real part Re ($z_q$) and an imaginary part Im ($z_q$) of a complex number as the coordinates of a signal point $z_q$ of the 1D NUC.

FIG. 92 is an illustration of relation between a symbol y and u#k serving as each of the real part Re ($z_q$) and the imaginary part Im ($z_q$) of a complex number indicating the coordinate of the signal point $z_q$ of the 1D NUC corresponding to the symbol y.

Here, the 10-bit symbol y of 1024QAM is set to be expressed as $y_{0,q}$, $y_{1,q}$, $y_{2,q}$, $y_{3,q}$, $y_{4,q}$, $y_{5,q}$, $y_{6,q}$, $y_{7,q}$, $y_{8,q}$, and $y_{9,q}$ in order from the head bit (most significant bit).

A of FIG. 92 shows a correspondence between 5 bits of $y_{0,q}$, $y_{2,q}$, $y_{4,q}$, $y_{6,q}$, and $y_{8,q}$ in the odd-numbered order of the symbol y and u#k indicating the real part Re ($z_q$) of (the coordinates of) the signal point $z_q$ corresponding to the symbol y.

B of FIG. 92 shows a correspondence between 5 bits of $y_{1,q}$, $y_{3,q}$, $y_{5,q}$, $y_{7,q}$, and $y_{9,q}$ in the even-numbered order of the symbol y and u#k indicating the imaginary part Im($z_q$) of (the coordinates of) the signal point $z_q$ corresponding to the symbol y.

When the 10-bit symbol y=($y_{0,q}$, $y_{1,q}$, $y_{2,q}$, $y_{3,q}$, $y_{4,q}$, $y_{5,q}$, $y_{6,q}$, $y_{7,q}$, $y_{8,q}$, and $y_{9,q}$) of 1024QAM is, for example, (0, 0, 1, 0, 0, 1, 1, 1, 0, 0), the odd-numbered 5 bits ($y_{0,q}$, $y_{2,q}$, $y_{4,q}$, $y_{6,q}$, and $y_{8,q}$) are (0, 1, 0, 1, 0), and the even-numbered 5 bits ($y_{1,q}$, $y_{3,q}$, $y_{5,q}$, $y_{7,q}$, and $y_{9,q}$) are (0, 0, 1, 1, 0).

In A of FIG. 92, the odd-numbered 5 bits (0, 1, 0, 1, 0) are associated with u3, and thus the real part Re ($z_q$) of the signal point $z_q$ corresponding to the symbol y=(0, 0, 1, 0, 0, 1, 1, 1, 0, 0) is u3.

In addition, in B of FIG. 92, the even-numbered 5 bits (0, 0, 1, 1, 0) are associated with u11, and thus the imaginary part Im($z_q$) of the signal point $z_q$ corresponding to the symbol y=(0, 0, 1, 0, 0, 1, 1, 1, 0, 0) is u11.

On the other hand, when the encoding rate r of the LDPC code is, for example, 7/15, with regard to the 1D NUC (NUC_1k_7/15) used when the modulation method is 1024QAM and the encoding rate of the LDPC code is r=7/15, u3 is 1.04 and u11 is 6.28 according to FIG. 91 described above.

Thus, the real part Re ($z_q$) of the signal point $z_q$ corresponding to the symbol y=(0, 0, 1, 0, 0, 1, 1, 1, 0, 0) is u3=1.04 and Im ($z_q$) thereof is u11=6.28. As a result, the coordinate of the signal point $z_q$ corresponding to the symbol y=(0, 0, 1, 0, 0, 1, 1, 1, 0, 0) is expressed as 1.04+6.28i.

Note that signal points of the 1D NUC are arranged in a grid shape on a straight line parallel to the I axis or on a straight line parallel to the Q axis. An interval between the signal points, however, is not fixed. In addition, in transmission of (data mapped to) signal points, average power of the signal points on a constellation is normalized. The normalization is performed by multiplying the square mean value of the absolute values of (the coordinates of) the signal points of the constellation expressed as $P_{ave}$ and the reciprocal $1/(\sqrt{P_{ave}})$ the square root $\sqrt{P_{ave}}$ of the square mean value $P_{ave}$ by each signal point $z_q$ on the constellation.

According to the constellations described in FIGS. 83 to 92, it has been found that a good error rate is obtained.

<Block Interleaver 25>

Figure 93:
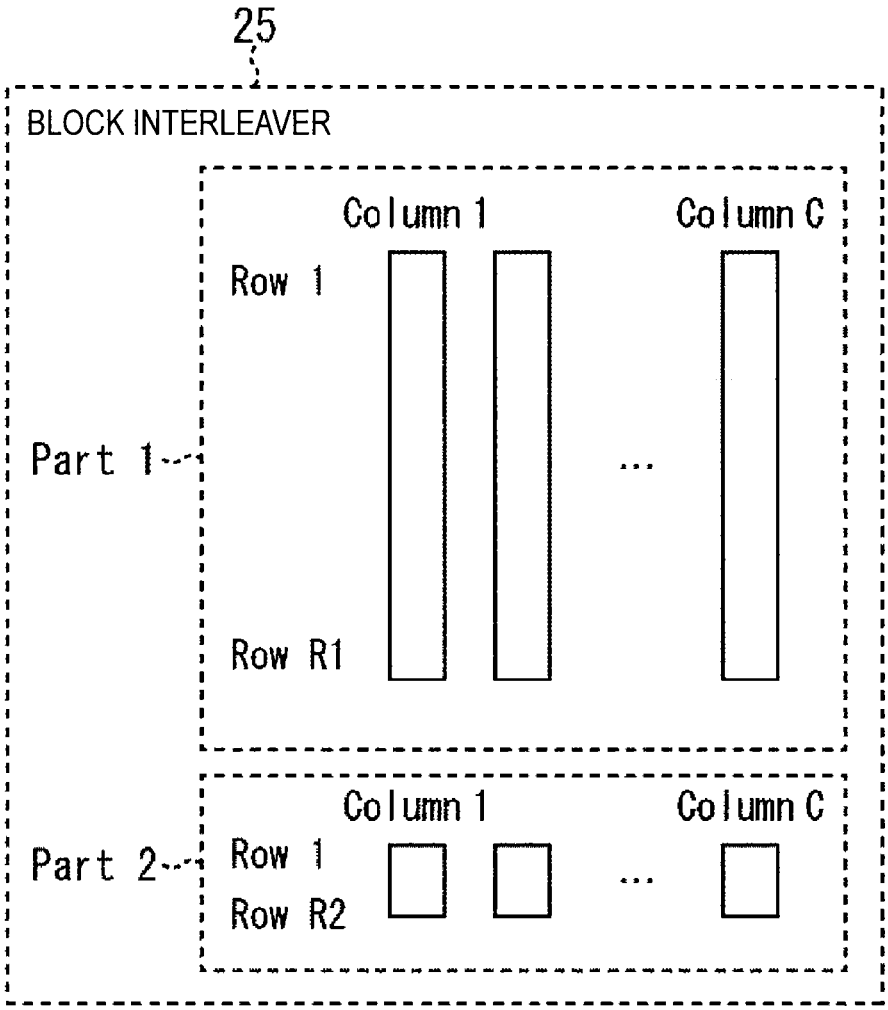
FIG. 93 is a block diagram showing an example of a configuration of a block interleaver 25.

FIG. 93 is a block diagram showing an example of a configuration of the block interleaver 25 of FIG. 9.

The block interleaver 25 has a storage region called a part 1 and a storage region called a part 2.

Both the parts 1 and 2 are configured to have columns arranged therein each serving as a storage region storing 1 bit in the row (horizontal) direction and a predetermined number of bits in the column (vertical) direction, and the number of columns arranged in the row direction is C which is equal to the number of bits m of a symbol.

When the number of bits stored in a column of the part 1 in the column direction (hereinafter also referred to as a part column length) is denoted as R1 and a part column length of a column of the part 2 is denoted as R2, (R1+R2)×C is equal to an encoding length N of an LDPC code that is a subject of block interleaving (which is 64800 bits or 16200 bits in the present embodiment).

In addition, the part column length R1 is equal to a multiple of 360 bits that is the unit size P, and the part column length R2 is equal to the remainder obtained when the sum of the part column length R1 of the part 1 and the part column length R2 of the part 2 (hereinafter also referred to as a column length), R1+R2, is divided by 360 bits that is the unit size P.

Here, the column length R1+R2 is equal to the value obtained by dividing the code length N of the LDPC code that is a subject of block interleaving by the number of bits m of a symbol.

For example, when 16QAM is adopted as the modulation method for an LDPC code having a code length N of 16200 bits, the number of bits m of a symbol is 4 bits, and thus the column length R1+R2 is 4050 (=16200/4).

Further, since the remainder obtained when the column length R1+R2=4050 is divided by 360 bits that is the unit size P is 90, the part column length R2 of the part 2 is 90 bits.

Then, the part column length R1 of the part 1 is R1+R2−R2=4050−90=3960 bits.

FIG. 94 is an illustration showing the number of columns C of the parts 1 and 2 and the part column lengths (number of rows) R1 and R2 with respect to combinations of code lengths N and modulation methods.

In FIG. 94, the number of columns C of the parts 1 and 2 and the part column lengths R1 and R2 with respect to combinations of respective LDPC codes having code lengths N of 16200 bits and 64800 bits and respective modulation methods of QPSK, 16QAM, 64QAM, 256QAM, and 1024QAM are shown.

Figure 95:
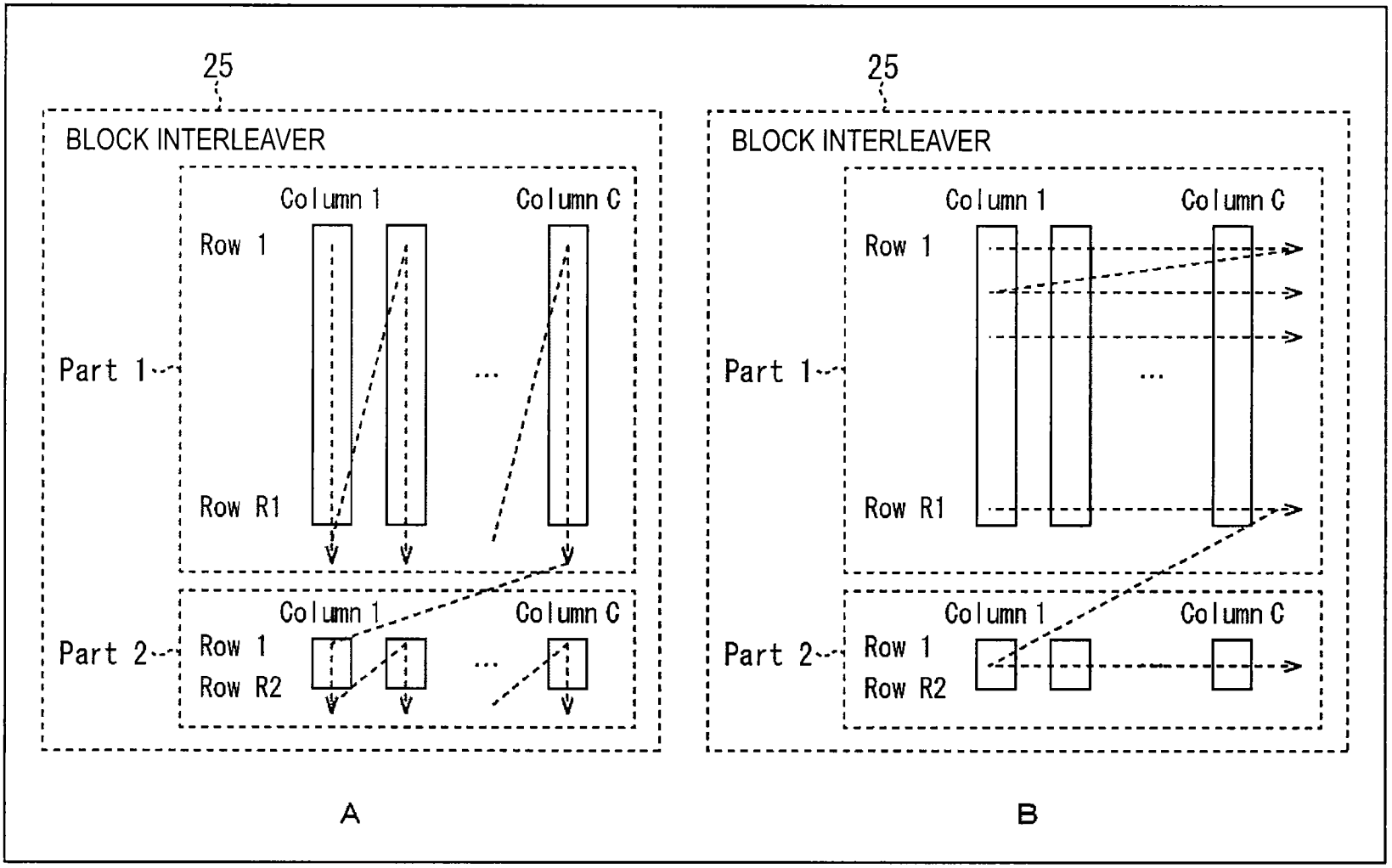
FIG. 95 is an illustration of block interleaving performed by the block interleaver 25.

FIG. 95 is an illustration of block interleaving performed by the block interleaver 25 of FIG. 93.

The block interleaver 25 performs block interleaving by writing and reading an LDPC code with respect to the parts 1 and 2.

That is to say, in block interleaving, writing code bits of an LDPC code of one code word from the top to the bottom of the columns of the part 1 (in the column direction) is performed for the columns from the left to the right direction, as illustrated in A of FIG. 95.

Then, when the writing of the code bits is completed to the bottom of the rightmost column (the C-th column) among the columns of the part 1, writing of the remaining code bits from the top to the bottom of each column (column direction) of the part 2 is performed for the columns from the left to the right.

Then, the writing of the code bits is completed to the bottom of the rightmost column (the C-th column) among the columns of the part 2, and the code bits are read from the first row of all C of the columns of the part 1 in the row direction in units of C=m bits, as illustrated in B of FIG. 95.

Then, reading of the code bits from all C of the columns of the part 1 is sequentially performed toward the lower rows, and when the reading is completed to the final R1-th row, the code bits are read from the first row of all C of the columns of the part 2 in the row direction in units of C=m bits.

Reading of the code bits from all C of the columns of the part 2 is sequentially performed toward the lower rows, and is performed to the final R2-th row.

As described above, the code bits read from the parts 1 and 2 in units of m bits are supplied as symbols to the mapper 117 (FIG. 8).

<Group-Wise Interleaving>

Figure 96:
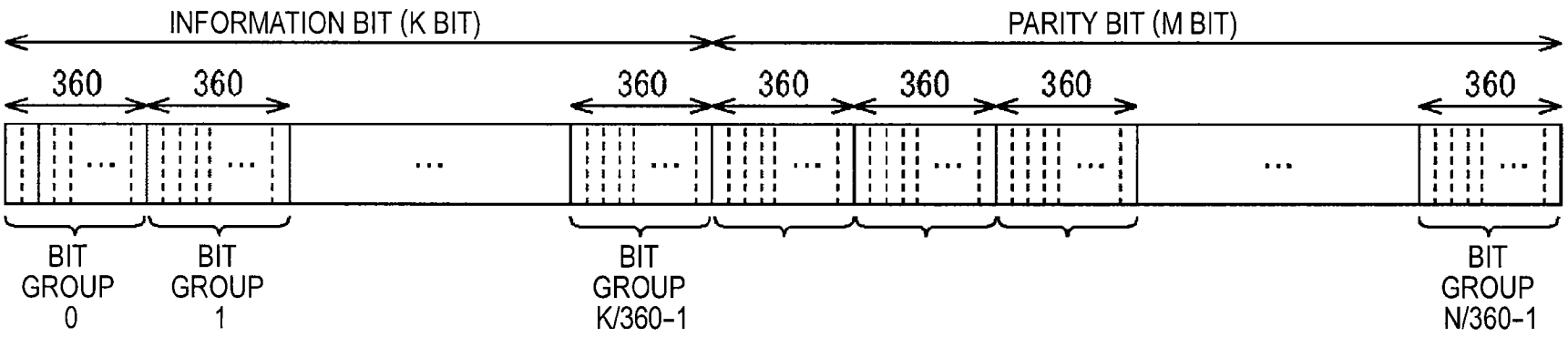
FIG. 96 is an illustration of group-wise interleaving performed by a group-wise interleaver 24.

FIG. 96 is an illustration of group-wise interleaving performed by the group-wise interleaver 24 of FIG. 9.

In group-wise interleaving, with a bit group of 360 bits of one section obtained by sectioning the LDPC code of one code word in a unit of 360 bits that is equal to the unit size P from the head of the code, the LDPC code of one code word is interleaved in units of bit groups according to a predetermined pattern (hereinafter also referred to as a GW pattern).

Here, a bit group that is in the i+1-th order from the head when the LDPC code of one code word is sectioned into bit groups is also described as a bit group i below.

When the unit size P is 360, for example, an LDPC code with a code length N of 1800 bits is sectioned into 5 (=1800/360) bit groups including bit groups 0, 1, 2, 3, and 4. Further, an LDPC code with a code length N of, for example, 16200 bits is sectioned to 45 (=16200/360) bit groups including bit groups 0, 1, . . . , and 44, and an LDPC code with a code length N of 64800 bits is sectioned into 180 (=64800/360) bit groups including bit groups 0, 1, . . . , and 179.

In addition, a GW pattern is assumed to be expressed by arrangement of numbers indicating bit groups below. For example, for an LDPC code with a code length N of 1800 bits, a GW pattern 4, 2, 0, 3, 1 indicates interleaving (reordering) the arrangement of bit groups 0, 1, 2, 3, and 4, into the arrangement of bit groups 4, 2, 0, 3, and 1.

The GW pattern can be set at least for every code length N of LDPC codes.

FIG. 97 is an illustration of a first example of a GW pattern for an LDPC code with a code length N of 64 k bits.

According to the GW pattern of FIG. 97, the arrangement of bit groups 0 to 179 of the LDPC code of 64 k bits is interleaved into the arrangement of the bit groups 39, 47, 96, 176, 33, 75, 165, 38, 27, 58, 90, 76, 17, 46, 10, 91, 133, 69, 171, 32, 117, 78, 13, 146, 101, 36, 0, 138, 25, 77, 122, 49, 14, 125, 140, 93, 130, 2, 104, 102, 128, 4, 111, 151, 84, 167, 35, 127, 156, 55, 82, 85, 66, 114, 8, 147, 115, 113, 5, 31, 100, 106, 48, 52, 67, 107, 18, 126, 112, 50, 9, 143, 28, 160, 71, 79, 43, 98, 86, 94, 64, 3, 166, 105, 103, 118, 63, 51, 139, 172, 141, 175, 56, 74, 95, 29, 45, 129, 120, 168, 92, 150, 7, 162, 153, 137, 108, 159, 157, 173, 23, 89, 132, 57, 37, 70, 134, 40, 21, 149, 80, 1, 121, 59, 110, 142, 152, 15, 154, 145, 12, 170, 54, 155, 99, 22, 123, 72, 177, 131, 116, 44, 158, 73, 11, 65, 164, 119, 174, 34, 83, 53, 24, 42, 60, 26, 161, 68, 178, 41, 148, 109, 87, 144, 135, 20, 62, 81, 169, 124, 6, 19, 30, 163, 61, 179, 136, 97, 16, and 88.

FIG. 98 is an illustration of a second example of a GW pattern for an LDPC code with a code length N of 64 k bits.

According to the GW pattern of FIG. 98, the arrangement of bit groups 0 to 179 of the LDPC code of 64 k bits is interleaved into the arrangement of the bit groups 6, 14, 1, 127, 161, 177, 75, 123, 62, 103, 17, 18, 167, 88, 27, 34, 8, 110, 7, 78, 94, 44, 45, 166, 149, 61, 163, 145, 155, 157, 82, 130, 70, 92, 151, 139, 160, 133, 26, 2, 79, 15, 95, 122, 126, 178, 101, 24, 138, 146, 179, 30, 86, 58, 11, 121, 159, 49, 84, 132, 117, 119, 50, 52, 4, 51, 48, 74, 114, 59, 40, 131, 33, 89, 66, 136, 72, 16, 134, 37, 164, 77, 99, 173, 20, 158, 156, 90, 41, 176, 81, 42, 60, 109, 22, 150, 105, 120, 12, 64, 56, 68, 111, 21, 148, 53, 169, 97, 108, 35, 140, 91, 115, 152, 36, 106, 154, 0, 25, 54, 63, 172, 80, 168, 142, 118, 162, 135, 73, 83, 153, 141, 9, 28, 55, 31, 112, 107, 85, 100, 175, 23, 57, 47, 38, 170, 137, 76, 147, 93, 19, 98, 124, 39, 87, 174, 144, 46, 10, 129, 69, 71, 125, 96, 116, 171, 128, 65, 102, 5, 43, 143, 104, 13, 67, 29, 3, 113, 32, and 165.

FIG. 99 is an illustration of a third example of a GW pattern for an LDPC code with a code length N of 64 k bits.

According to the GW pattern of FIG. 99, the arrangement of bit groups 0 to 179 of the LDPC code of 64 k bits is interleaved into the arrangement of the bit groups 103, 116, 158, 0, 27, 73, 140, 30, 148, 36, 153, 154, 10, 174, 122, 178, 6, 106, 162, 59, 142, 112, 7, 74, 11, 51, 49, 72, 31, 65, 156, 95, 171, 105, 173, 168, 1, 155, 125, 82, 86, 161, 57, 165, 54, 26, 121, 25, 157, 93, 22, 34, 33, 39, 19, 46, 150, 141, 12, 9, 79, 118, 24, 17, 85, 117, 67, 58, 129, 160, 89, 61, 146, 77, 130, 102, 101, 137, 94, 69, 14, 133, 60, 149, 136, 16, 108, 41, 90, 28, 144, 13, 175, 114, 2, 18, 63, 68, 21, 109, 53, 123, 75, 81, 143, 169, 42, 119, 138, 104, 4, 131, 145, 8, 5, 76, 15, 88, 177, 124, 45, 97, 64, 100, 37, 132, 38, 44, 107, 35, 43, 80, 50, 91, 152, 78, 166, 55, 115, 170, 159, 147, 167, 87, 83, 29, 96, 172, 48, 98, 62, 139, 70, 164, 84, 47, 151, 134, 126, 113, 179, 110, 111, 128, 32, 52, 66, 40, 135, 176, 99, 127, 163, 3, 120, 71, 56, 92, 23, and 20

FIG. 100 is an illustration of a fourth example of a GW pattern for an LDPC code with a code length N of 64 k bits.

According to the GW pattern of FIG. 100, the arrangement of bit groups 0 to 179 of the LDPC code of 64 k bits is interleaved into the arrangement of the bit groups 139, 106, 125, 81, 88, 104, 3, 66, 60, 65, 2, 95, 155, 24, 151, 5, 51, 53, 29, 75, 52, 85, 8, 22, 98, 93, 168, 15, 86, 126, 173, 100, 130, 176, 20, 10, 87, 92, 175, 36, 143, 110, 67, 146, 149, 127, 133, 42, 84, 64, 78, 1, 48, 159, 79, 138, 46, 112, 164, 31, 152, 57, 144, 69, 27, 136, 122, 170, 132, 171, 129, 115, 107, 134, 89, 157, 113, 119, 135, 45, 148, 83, 114, 71, 128, 161, 140, 26, 13, 59, 38, 35, 96, 28, 0, 80, 174, 137, 49, 16, 101, 74, 179, 91, 44, 55, 169, 131, 163, 123, 145, 162, 108, 178, 12, 77, 167, 21, 154, 82, 54, 90, 177, 17, 41, 39, 7, 102, 156, 62, 109, 14, 37, 23, 153, 6, 147, 50, 47, 63, 18, 70, 68, 124, 72, 33, 158, 32, 118, 99, 105, 94, 25, 121, 166, 120, 160, 141, 165, 111, 19, 150, 97, 76, 73, 142, 117, 4, 172, 58, 11, 30, 9, 103, 40, 61, 43, 34, 56, and 116.

FIG. 101 is an illustration of a fifth example of a GW pattern for an LDPC code with a code length N of 64 k bits.

According to the GW pattern of FIG. 101, the arrangement of bit groups 0 to 179 of the LDPC code of 64 k bits is interleaved into the arrangement of the bit groups 72, 59, 65, 61, 80, 2, 66, 23, 69, 101, 19, 16, 53, 109, 74, 106, 113, 56, 97, 30, 164, 15, 25, 20, 117, 76, 50, 82, 178, 13, 169, 36, 107, 40, 122, 138, 42, 96, 27, 163, 46, 64, 124, 57, 87, 120, 168, 166, 39, 177, 22, 67, 134, 9, 102, 28, 148, 91, 83, 88, 167, 32, 99, 140, 60, 152, 1, 123, 29, 154, 26, 70, 149, 171, 12, 6, 55, 100, 62, 86, 114, 174, 132, 139, 7, 45, 103, 130, 31, 49, 151, 119, 79, 41, 118, 126, 3, 179, 110, 111, 51, 93, 145, 73, 133, 54, 104, 161, 37, 129, 63, 38, 95, 159, 89, 112, 115, 136, 33, 68, 17, 35, 137, 173, 143, 78, 77, 141, 150, 58, 158, 125, 156, 24, 105, 98, 43, 84, 92, 128, 165, 153, 108, 0, 121, 170, 131, 144, 47, 157, 11, 155, 176, 48, 135, 4, 116, 146, 127, 52, 162, 142, 8, 5, 34, 85, 90, 44, 172, 94, 160, 175, 75, 71, 18, 147, 10, 21, 14, and 81.

FIG. 102 is an illustration of a sixth example of a GW pattern for an LDPC code with a code length N of 64 k bits.

According to the GW pattern of FIG. 102, the arrangement of bit groups 0 to 179 of the LDPC code of 64 k bits is interleaved into the arrangement of the bit groups 8, 27, 7, 70, 75, 84, 50, 131, 146, 99, 96, 141, 155, 157, 82, 57, 120, 38, 137, 13, 83, 23, 40, 9, 56, 171, 124, 172, 39, 142, 20, 128, 133, 2, 89, 153, 103, 112, 129, 151, 162, 106, 14, 62, 107, 110, 73, 71, 177, 154, 80, 176, 24, 91, 32, 173, 25, 16, 17, 159, 21, 92, 6, 67, 81, 37, 15, 136, 100, 64, 102, 163, 168, 18, 78, 76, 45, 140, 123, 118, 58, 122, 11, 19, 86, 98, 119, 111, 26, 138, 125, 74, 97, 63, 10, 152, 161, 175, 87, 52, 60, 22, 79, 104, 30, 158, 54, 145, 49, 34, 166, 109, 179, 174, 93, 41, 116, 48, 3, 29, 134, 167, 105, 132, 114, 169, 147, 144, 77, 61, 170, 90, 178, 0, 43, 149, 130, 117, 47, 44, 36, 115, 88, 101, 148, 69, 46, 94, 143, 164, 139, 126, 160, 156, 33, 113, 65, 121, 53, 42, 66, 165, 85, 127, 135, 5, 55, 150, 72, 35, 31, 51, 4, 1, 68, 12, 28, 95, 59, and 108.

FIG. 103 is an illustration of a seventh example of a GW pattern for an LDPC code with a code length N of 64 k bits.

According to the GW pattern of FIG. 103, the arrangement of bit groups 0 to 179 of the LDPC code of 64 k bits is interleaved into the arrangement of the bit groups 0, 2, 4, 6, 8, 10, 12, 14, 16, 18, 20, 22, 24, 26, 28, 30, 32, 34, 36, 38, 40, 42, 44, 46, 48, 50, 52, 54, 56, 58, 60, 62, 64, 66, 68, 70, 72, 74, 76, 78, 80, 82, 84, 86, 88, 90, 92, 94, 96, 98, 100, 102, 104, 106, 108, 110, 112, 114, 116, 118, 120, 122, 124, 126, 128, 130, 132, 134, 136, 138, 140, 142, 144, 146, 148, 150, 152, 154, 156, 158, 160, 162, 164, 166, 168, 170, 172, 174, 176, 178, 1, 3, 5, 7, 9, 11, 13, 15, 17, 19, 21, 23, 25, 27, 29, 31, 33, 35, 37, 39, 41, 43, 45, 47, 49, 51, 53, 55, 57, 59, 61, 63, 65, 67, 69, 71, 73, 75, 77, 79, 81, 83, 85, 87, 89, 91, 93, 95, 97, 99, 101, 103, 105, 107, 109, 111, 113, 115, 117, 119, 121, 123, 125, 127, 129, 131, 133, 135, 137, 139, 141, 143, 145, 147, 149, 151, 153, 155, 157, 159, 161, 163, 165, 167, 169, 171, 173, 175, 177, and 179.

FIG. 104 is an illustration of an eighth example of a GW pattern for an LDPC code with a code length N of 64 k bits.

According to the GW pattern of FIG. 104, the arrangement of bit groups 0 to 179 of the LDPC code of 64 k bits is interleaved into the arrangement of the bit groups 11, 5, 8, 18, 1, 25, 32, 31, 19, 21, 50, 102, 65, 85, 45, 86, 98, 104, 64, 78, 72, 53, 103, 79, 93, 41, 82, 108, 112, 116, 120, 124, 128, 132, 136, 140, 144, 148, 152, 156, 160, 164, 168, 172, 176, 4, 12, 15, 3, 10, 20, 26, 34, 23, 33, 68, 63, 69, 92, 44, 90, 75, 56, 100, 47, 106, 42, 39, 97, 99, 89, 52, 109, 113, 117, 121, 125, 129, 133, 137, 141, 145, 149, 153, 157, 161, 165, 169, 173, 177, 6, 16, 14, 7, 13, 36, 28, 29, 37, 73, 70, 54, 76, 91, 66, 80, 88, 51, 96, 81, 95, 38, 57, 105, 107, 59, 61, 110, 114, 118, 122, 126, 130, 134, 138, 142, 146, 150, 154, 158, 162, 166, 170, 174, 178, 0, 9, 17, 2, 27, 30, 24, 22, 35, 77, 74, 46, 94, 62, 87, 83, 101, 49, 43, 84, 48, 60, 67, 71, 58, 40, 55, 111, 115, 119, 123, 127, 131, 135, 139, 143, 147, 151, 155, 159, 163, 167, 171, 175, and 179.

FIG. 105 is an illustration of a ninth example of a GW pattern for an LDPC code with a code length N of 64 k bits.

According to the GW pattern of FIG. 105, the arrangement of bit groups 0 to 179 of the LDPC code of 64 k bits is interleaved into the arrangement of the bit groups 9, 18, 15, 13, 35, 26, 28, 99, 40, 68, 85, 58, 63, 104, 50, 52, 94, 69, 108, 114, 120, 126, 132, 138, 144, 150, 156, 162, 168, 174, 8, 16, 17, 24, 37, 23, 22, 103, 64, 43, 47, 56, 92, 59, 70, 42, 106, 60, 109, 115, 121, 127, 133, 139, 145, 151, 157, 163, 169, 175, 4, 1, 10, 19, 30, 31, 89, 86, 77, 81, 51, 79, 83, 48, 45, 62, 67, 65, 110, 116, 122, 128, 134, 140, 146, 152, 158, 164, 170, 176, 6, 2, 0, 25, 20, 34, 98, 105, 82, 96, 90, 107, 53, 74, 73, 93, 55, 102, 111, 117, 123, 129, 135, 141, 147, 153, 159, 165, 171, 177, 14, 7, 3, 27, 21, 33, 44, 97, 38, 75, 72, 41, 84, 80, 100, 87, 76, 57, 112, 118, 124, 130, 136, 142, 148, 154, 160, 166, 172, 178, 5, 11, 12, 32, 29, 36, 88, 71, 78, 95, 49, 54, 61, 66, 46, 39, 101, 91, 113, 119, 125, 131, 137, 143, 149, 155, 161, 167, 173, and 179.

FIG. 106 is an illustration of a 10th example of a GW pattern for an LDPC code with a code length N of 64 k bits.

According to the GW pattern of FIG. 106, the arrangement of bit groups 0 to 179 of the LDPC code of 64 k bits is interleaved into the arrangement of the bit groups 0, 14, 19, 21, 2, 11, 22, 9, 8, 7, 16, 3, 26, 24, 27, 80, 100, 121, 107, 31, 36, 42, 46, 49, 75, 93, 127, 95, 119, 73, 61, 63, 117, 89, 99, 129, 52, 111, 124, 48, 122, 82, 106, 91, 92, 71, 103, 102, 81, 113, 101, 97, 33, 115, 59, 112, 90, 51, 126, 85, 123, 40, 83, 53, 69, 70, 132, 134, 136, 138, 140, 142, 144, 146, 148, 150, 152, 154, 156, 158, 160, 162, 164, 166, 168, 170, 172, 174, 176, 178, 4, 5, 10, 12, 20, 6, 18, 13, 17, 15, 1, 29, 28, 23, 25, 67, 116, 66, 104, 44, 50, 47, 84, 76, 65, 130, 56, 128, 77, 39, 94, 87, 120, 62, 88, 74, 35, 110, 131, 98, 60, 37, 45, 78, 125, 41, 34, 118, 38, 72, 108, 58, 43, 109, 57, 105, 68, 86, 79, 96, 32, 114, 64, 55, 30, 54, 133, 135, 137, 139, 141, 143, 145, 147, 149, 151, 153, 155, 157, 159, 161, 163, 165, 167, 169, 171, 173, 175, 177, and 179.

FIG. 107 is an illustration of an 11th example of a GW pattern for an LDPC code with a code length N of 64 k bits.

According to the GW pattern of FIG. 107, the arrangement of bit groups 0 to 179 of the LDPC code of 64 k bits is interleaved into the arrangement of the bit groups 21, 11, 12, 9, 0, 6, 24, 25, 85, 103, 118, 122, 71, 101, 41, 93, 55, 73, 100, 40, 106, 119, 45, 80, 128, 68, 129, 61, 124, 36, 126, 117, 114, 132, 136, 140, 144, 148, 152, 156, 160, 164, 168, 172, 176, 20, 18, 10, 13, 16, 8, 26, 27, 54, 111, 52, 44, 87, 113, 115, 58, 116, 49, 77, 95, 86, 30, 78, 81, 56, 125, 53, 89, 94, 50, 123, 65, 83, 133, 137, 141, 145, 149, 153, 157, 161, 165, 169, 173, 177, 2, 17, 1, 4, 7, 15, 29, 82, 32, 102, 76, 121, 92, 130, 127, 62, 107, 38, 46, 43, 110, 75, 104, 70, 91, 69, 96, 120, 42, 34, 79, 35, 105, 134, 138, 142, 146, 150, 154, 158, 162, 166, 170, 174, 178, 19, 5, 3, 14, 22, 28, 23, 109, 51, 108, 131, 33, 84, 88, 64, 63, 59, 57, 97, 98, 48, 31, 99, 37, 72, 39, 74, 66, 60, 67, 47, 112, 90, 135, 139, 143, 147, 151, 155, 159, 163, 167, 171, 175, and 179.

FIG. 108 is an illustration of a 12th example of a GW pattern for an LDPC code with a code length N of 64 k bits.

According to the GW pattern of FIG. 108, the arrangement of bit groups 0 to 179 of the LDPC code of 64 k bits is interleaved into the arrangement of the bit groups 12, 15, 2, 16, 27, 50, 35, 74, 38, 70, 108, 32, 112, 54, 30, 122, 72, 116, 36, 90, 49, 85, 132, 138, 144, 150, 156, 162, 168, 174, 0, 14, 9, 5, 23, 66, 68, 52, 96, 117, 84, 128, 100, 63, 60, 127, 81, 99, 53, 55, 103, 95, 133, 139, 145, 151, 157, 163, 169, 175, 10, 22, 13, 11, 28, 104, 37, 57, 115, 46, 65, 129, 107, 75, 119, 110, 31, 43, 97, 78, 125, 58, 134, 140, 146, 152, 158, 164, 170, 176, 4, 19, 6, 8, 24, 44, 101, 94, 118, 130, 69, 71, 83, 34, 86, 124, 48, 106, 89, 40, 102, 91, 135, 141, 147, 153, 159, 165, 171, 177, 3, 20, 7, 17, 25, 87, 41, 120, 47, 80, 59, 62, 88, 45, 56, 131, 61, 126, 113, 92, 51, 98, 136, 142, 148, 154, 160, 166, 172, 178, 21, 18, 1, 26, 29, 39, 73, 121, 105, 77, 42, 114, 93, 82, 111, 109, 67, 79, 123, 64, 76, 33, 137, 143, 149, 155, 161, 167, 173, and 179.

FIG. 109 is an illustration of a 13th example of a GW pattern for an LDPC code with a code length N of 64 k bits.

According to the GW pattern of FIG. 109, the arrangement of bit groups 0 to 179 of the LDPC code of 64 k bits is interleaved into the arrangement of the bit groups 0, 2, 4, 6, 8, 10, 12, 14, 16, 18, 20, 22, 24, 26, 28, 30, 32, 34, 36, 38, 40, 42, 44, 46, 48, 50, 52, 54, 56, 58, 60, 62, 64, 66, 68, 70, 72, 74, 76, 78, 80, 82, 84, 86, 88, 90, 92, 94, 96, 98, 100, 102, 104, 106, 108, 110, 112, 114, 116, 118, 120, 122, 124, 126, 128, 130, 132, 134, 136, 138, 140, 142, 144, 146, 148, 150, 152, 154, 156, 158, 160, 162, 164, 166, 168, 170, 172, 174, 176, 178, 1, 3, 5, 7, 9, 11, 13, 15, 17, 19, 21, 23, 25, 27, 29, 31, 33, 35, 37, 39, 41, 43, 45, 47, 49, 51, 53, 55, 57, 59, 61, 63, 65, 67, 69, 71, 73, 75, 77, 79, 81, 83, 85, 87, 89, 91, 93, 95, 97, 99, 101, 103, 105, 107, 109, 111, 113, 115, 117, 119, 121, 123, 125, 127, 129, 131, 133, 135, 137, 139, 141, 143, 145, 147, 149, 151, 153, 155, 157, 159, 161, 163, 165, 167, 169, 171, 173, 175, 177, and 179.

FIG. 110 is an illustration of a 14th example of a GW pattern for an LDPC code with a code length N of 64 k bits.

According to the GW pattern of FIG. 110, the arrangement of bit groups 0 to 179 of the LDPC code of 64 k bits is interleaved into the arrangement of the bit groups 0, 4, 8, 12, 16, 20, 24, 28, 32, 36, 40, 44, 48, 52, 56, 60, 64, 68, 72, 76, 80, 84, 88, 92, 96, 100, 104, 108, 112, 116, 120, 124, 128, 132, 136, 140, 144, 148, 152, 156, 160, 164, 168, 172, 176, 1, 5, 9, 13, 17, 21, 25, 29, 33, 37, 41, 45, 49, 53, 57, 61, 65, 69, 73, 77, 81, 85, 89, 93, 97, 101, 105, 109, 113, 117, 121, 125, 129, 133, 137, 141, 145, 149, 153, 157, 161, 165, 169, 173, 177, 2, 6, 10, 14, 18, 22, 26, 30, 34, 38, 42, 46, 50, 54, 58, 62, 66, 70, 74, 78, 82, 86, 90, 94, 98, 102, 106, 110, 114, 118, 122, 126, 130, 134, 138, 142, 146, 150, 154, 158, 162, 166, 170, 174, 178, 3, 7, 11, 15, 19, 23, 27, 31, 35, 39, 43, 47, 51, 55, 59, 63, 67, 71, 75, 79, 83, 87, 91, 95, 99, 103, 107, 111, 115, 119, 123, 127, 131, 135, 139, 143, 147, 151, 155, 159, 163, 167, 171, 175, and 179.

FIG. 111 is an illustration of a 15th example of a GW pattern for an LDPC code with a code length N of 64 k bits.

According to the GW pattern of FIG. 111, the arrangement of bit groups 0 to 179 of the LDPC code of 64 k bits is interleaved into the arrangement of the bit groups 8, 112, 92, 165, 12, 55, 5, 126, 87, 70, 69, 94, 103, 78, 137, 148, 9, 60, 13, 7, 178, 79, 43, 136, 34, 68, 118, 152, 49, 15, 99, 61, 66, 28, 109, 125, 33, 167, 81, 93, 97, 26, 35, 30, 153, 131, 122, 71, 107, 130, 76, 4, 95, 42, 58, 134, 0, 89, 75, 40, 129, 31, 80, 101, 52, 16, 142, 44, 138, 46, 116, 27, 82, 88, 143, 128, 72, 29, 83, 117, 172, 14, 51, 159, 48, 160, 100, 1, 102, 90, 22, 3, 114, 19, 108, 113, 39, 73, 111, 155, 106, 105, 91, 150, 54, 25, 135, 139, 147, 36, 56, 123, 6, 67, 104, 96, 157, 10, 62, 164, 86, 74, 133, 120, 174, 53, 140, 156, 171, 149, 127, 85, 59, 124, 84, 11, 21, 132, 41, 145, 158, 32, 17, 23, 50, 169, 170, 38, 18, 151, 24, 166, 175, 2, 47, 57, 98, 20, 177, 161, 154, 176, 163, 37, 110, 168, 141, 64, 65, 173, 162, 121, 45, 77, 115, 179, 63, 119, 146, and 144.

The $1^{st}$ to $15^{th}$ examples of the GW pattern for the LDPC code with the code length N of 64 k bits can also be applied to any combination of an LDPC code with the code length N of 64 k bits and an arbitrary encoding rate r and an arbitrary modulation method (constellation).

With respect to the group-wise interleaving, however, by setting a GW pattern to be applied for each combination of a code length N of an LDPC code, an encoding rate r of an LDPC code, and a modulation method (constellation), an error rate of each combination can be further improved.

By applying the GW pattern of FIG. 97 to, for example, a combination of the ETRI code with (64 k, 5/15) and QPSK, a particularly satisfactory error rate can be achieved.

By applying the GW pattern of FIG. 98 to, for example, a combination of the ETRI code with (64 k, 5/15) and 16QAM, a particularly satisfactory error rate can be achieved.

By applying the GW pattern of FIG. 99 to, for example, a combination of the ETRI code with (64 k, 5/15) and 64QAM, a particularly satisfactory error rate can be achieved.

By applying the GW pattern of FIG. 100 to, for example, a combination of the Sony code with (64 k, 7/15) and QPSK, a particularly satisfactory error rate can be achieved.

By applying the GW pattern of FIG. 101 to, for example, a combination of the Sony code with (64 k, 7/15) and 16QAM, a particularly satisfactory error rate can be achieved.

By applying the GW pattern of FIG. 102 to, for example, a combination of the Sony code with (64 k, 7/15) and 64QAM, a particularly satisfactory error rate can be achieved.

By applying the GW pattern of FIG. 103 to, for example, a combination of the Sony code with (64 k, 9/15) and QPSK, a particularly satisfactory error rate can be achieved.

By applying the GW pattern of FIG. 104 to, for example, a combination of the Sony code with (64 k, 9/15) and 16QAM, a particularly satisfactory error rate can be achieved.

By applying the GW pattern of FIG. 105 to, for example, a combination of the Sony code with (64 k, 9/15) and 64QAM, a particularly satisfactory error rate can be achieved.

By applying the GW pattern of FIG. 106 to, for example, a combination of the Sony code with (64 k, 11/15) and QPSK, a particularly satisfactory error rate can be achieved.

By applying the GW pattern of FIG. 107 to, for example, a combination of the Sony code with (64 k, 11/15) and 16QAM, a particularly satisfactory error rate can be achieved.

By applying the GW pattern of FIG. 108 to, for example, a combination of the Sony code with (64 k, 11/15) and 64QAM, a particularly satisfactory error rate can be achieved.

By applying the GW pattern of FIG. 109 to, for example, a combination of the Sony code with (64 k, 13/15) and QPSK, a particularly satisfactory error rate can be achieved.

By applying the GW pattern of FIG. 110 to, for example, a combination of the Sony code with (64 k, 13/15) and 16QAM, a particularly satisfactory error rate can be achieved.

By applying the GW pattern of FIG. 111 to, for example, a combination of the Sony code with (64 k, 13/15) and 64QAM, a particularly satisfactory error rate can be achieved.

Figure 112:
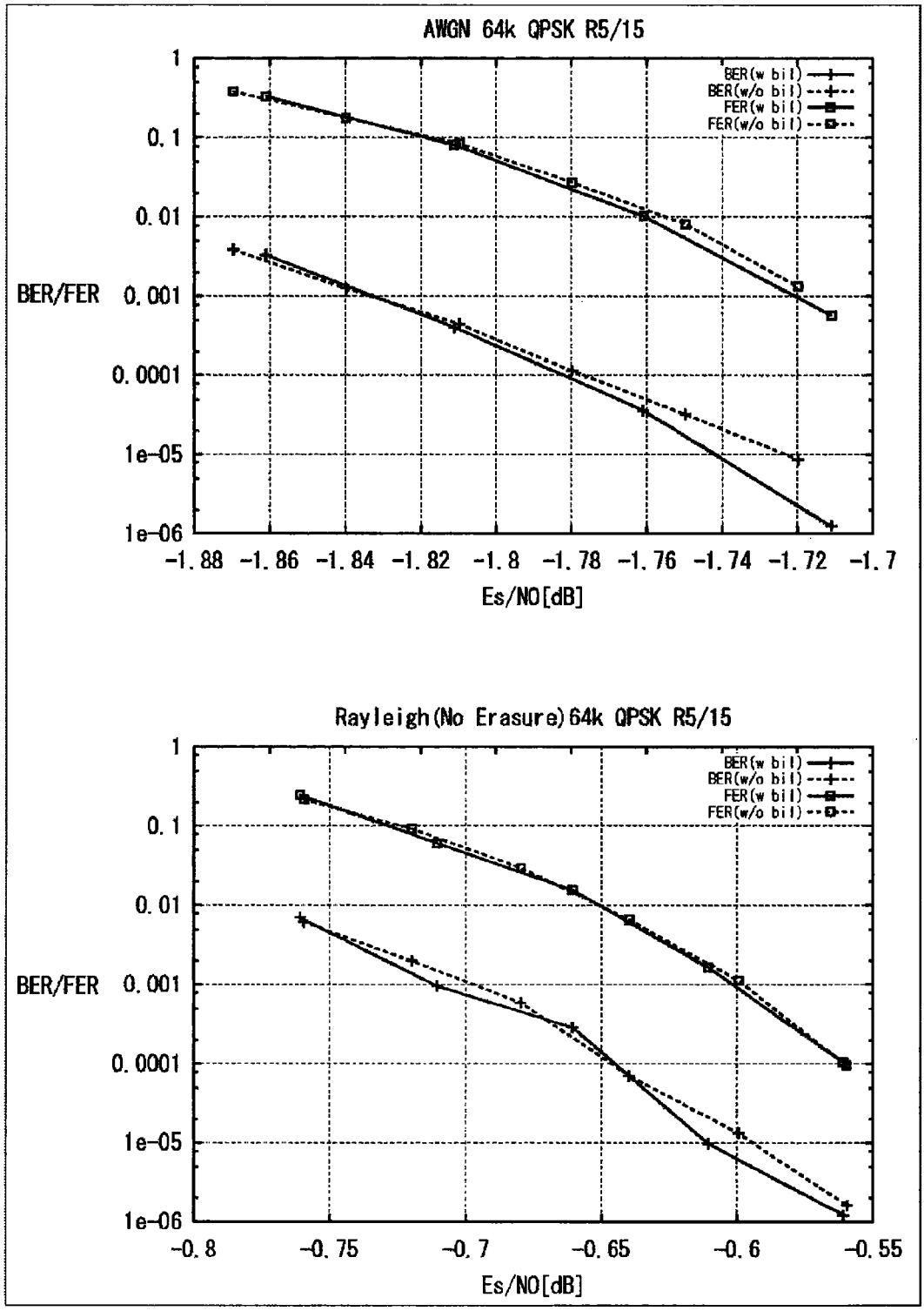
FIG. 112 is an illustration of simulation results of simulations for measuring an error rate.

FIG. 112 is an illustration of BER/FER curves as simulation results of simulations for measuring an error rate when the GW pattern of FIG. 97 is applied to the combination of the ETRI code with (64 k, 5/15) and QPSK.

Figure 113:
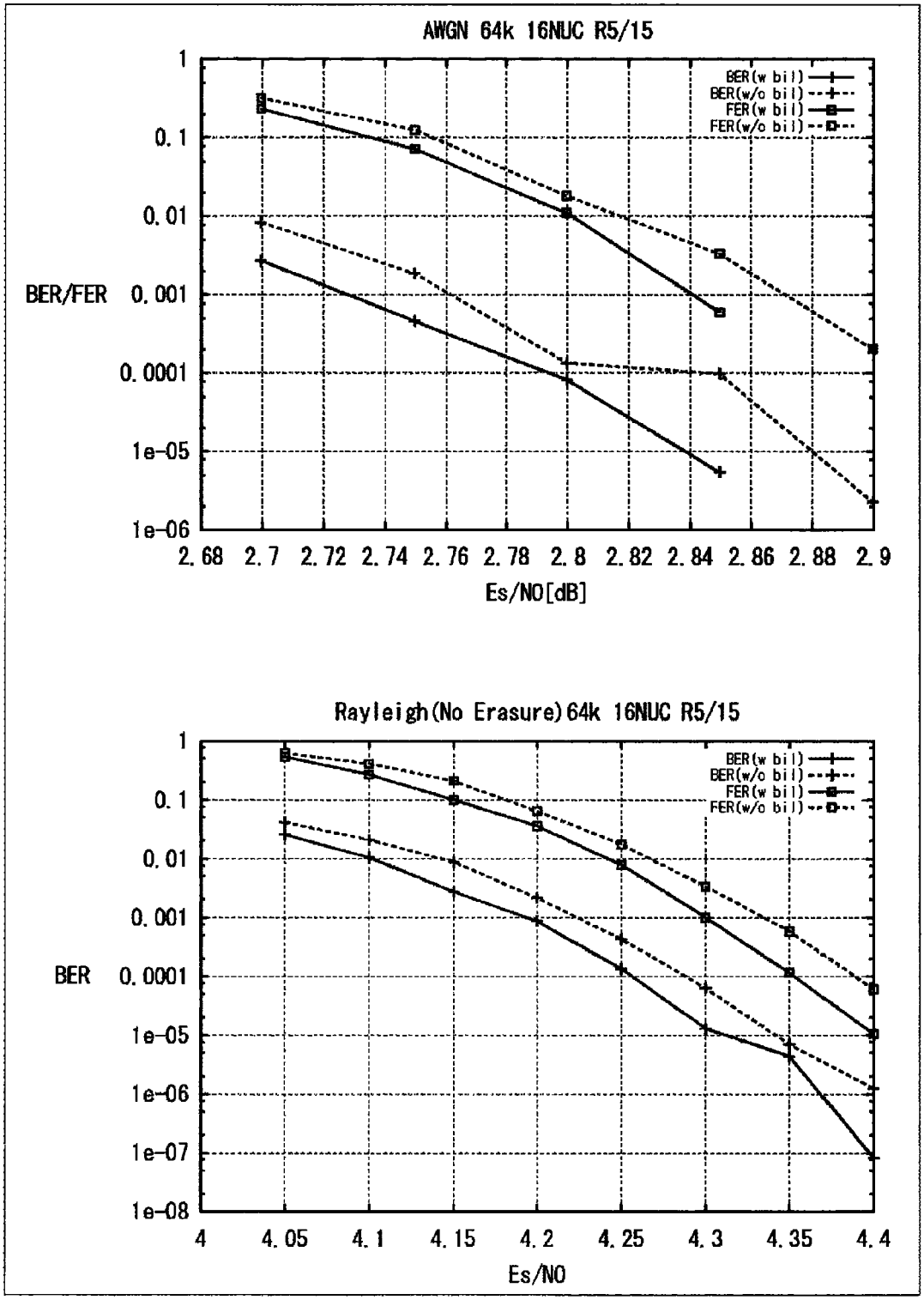
FIG. 113 is an illustration of simulation results of simulations for measuring an error rate.

FIG. 113 is an illustration of BER/FER curves as simulation results of simulations for measuring an error rate when the GW pattern of FIG. 98 is applied to the combination of the ETRI code with (64 k, 5/15) and 16QAM.

Figure 114:
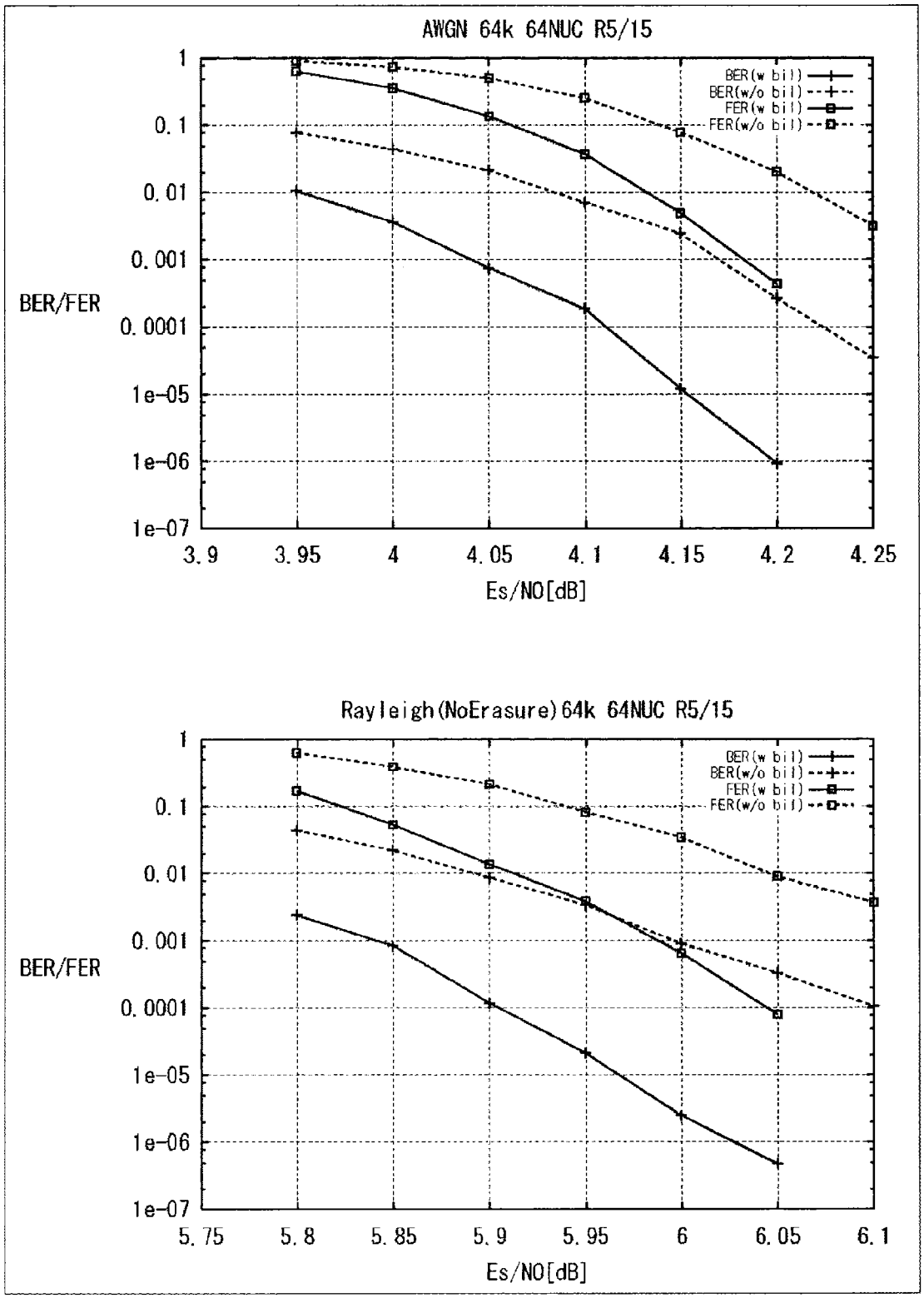
FIG. 114 is an illustration of simulation results of simulations for measuring an error rate.

FIG. 114 is an illustration of BER/FER curves as simulation results of simulations for measuring an error rate when the GW pattern of FIG. 99 is applied to the combination of the ETRI code with (64 k, 5/15) and 64QAM.

Figure 115:
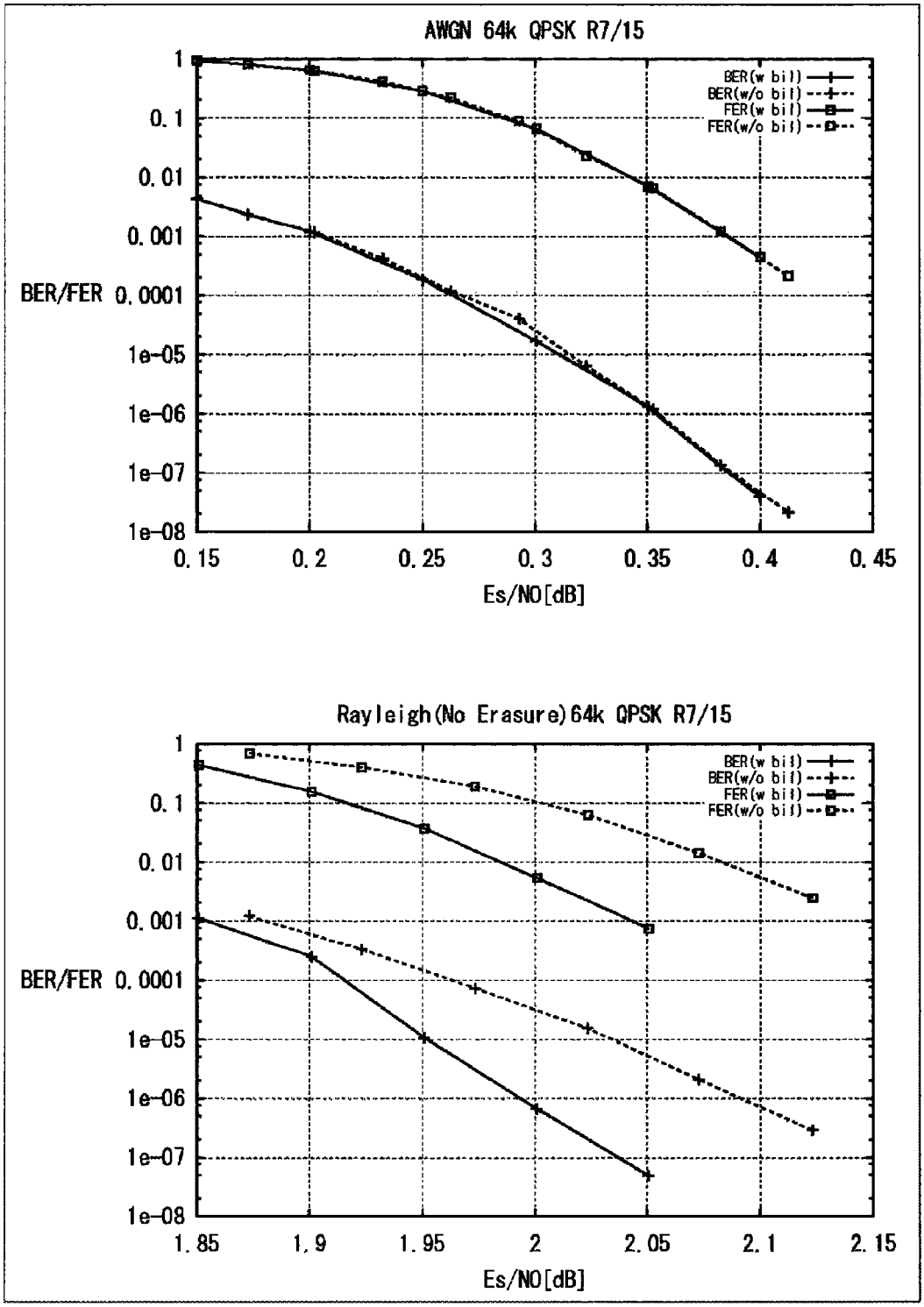
FIG. 115 is an illustration of simulation results of simulations for measuring an error rate.

FIG. 115 is an illustration of BER/FER curves as simulation results of simulations for measuring an error rate when the GW pattern of FIG. 100 is applied to the combination of the Sony code with (64 k, 7/15) and QPSK.

Figure 116:
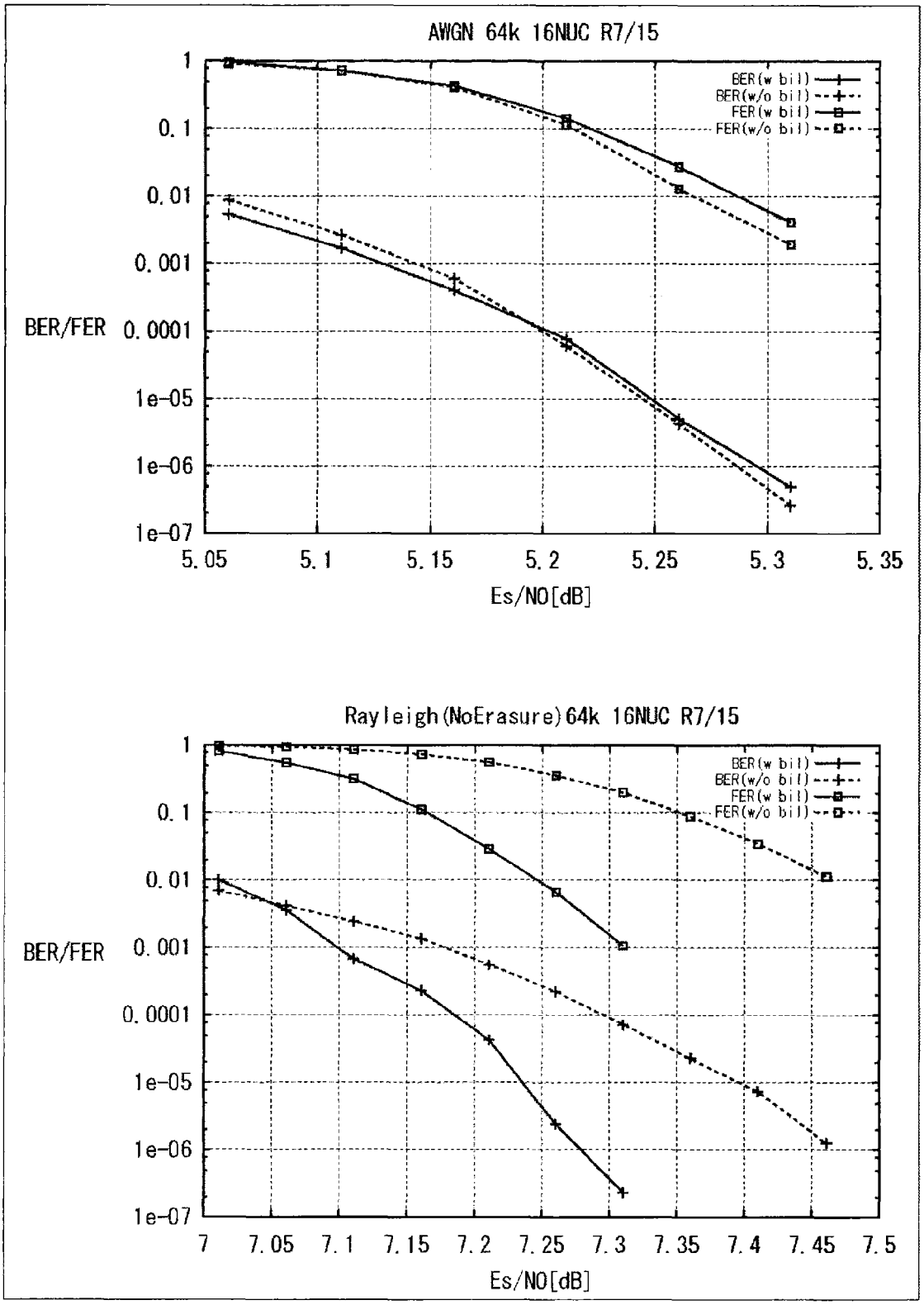
FIG. 116 is an illustration of simulation results of simulations for measuring an error rate.

FIG. 116 is an illustration of BER/FER curves as simulation results of simulations for measuring an error rate when the GW pattern of FIG. 101 is applied to the combination of the Sony code with (64 k, 7/15) and 16QAM.

Figure 117:
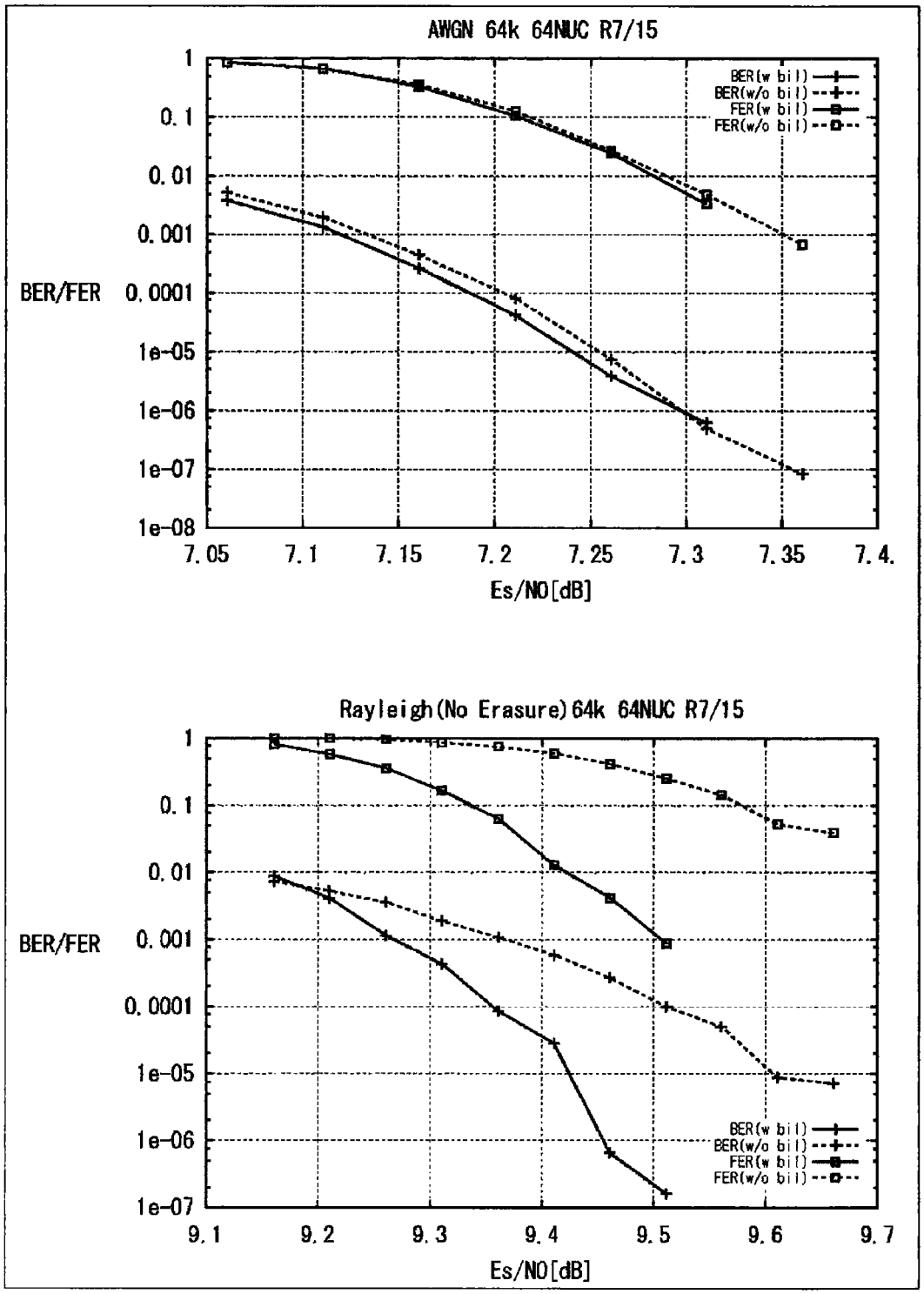
FIG. 117 is an illustration of simulation results of simulations for measuring an error rate.

FIG. 117 is an illustration of BER/FER curves as simulation results of simulations for measuring an error rate when the GW pattern of FIG. 102 is applied to the combination of the Sony code with (64 k, 7/15) and 64QAM.

Figure 118:
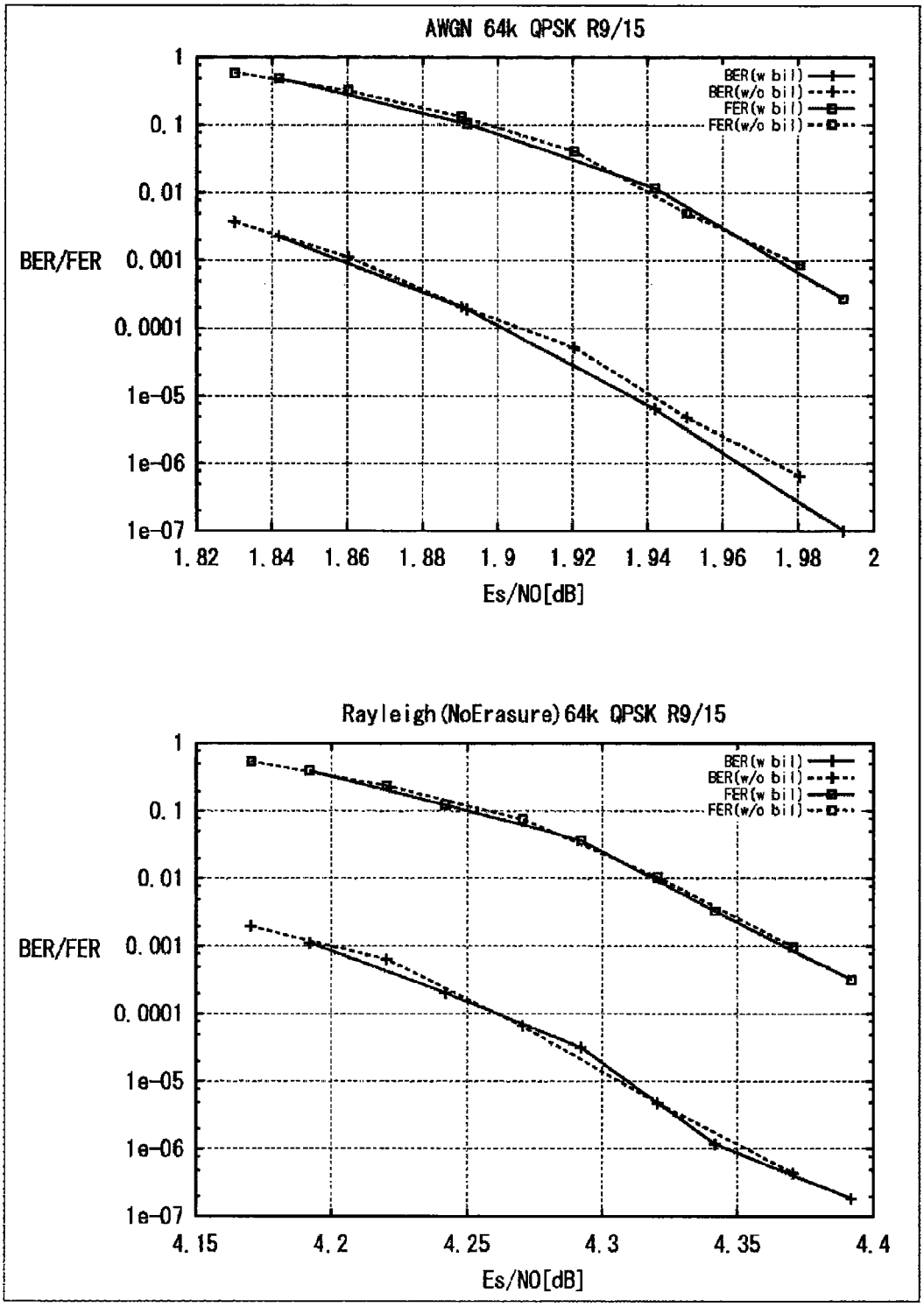
FIG. 118 is an illustration of simulation results of simulations for measuring an error rate.

FIG. 118 is an illustration of BER/FER curves as simulation results of simulations for measuring an error rate when the GW pattern of FIG. 103 is applied to the combination of the Sony code with (64 k, 9/15) and QPSK.

Figure 119:
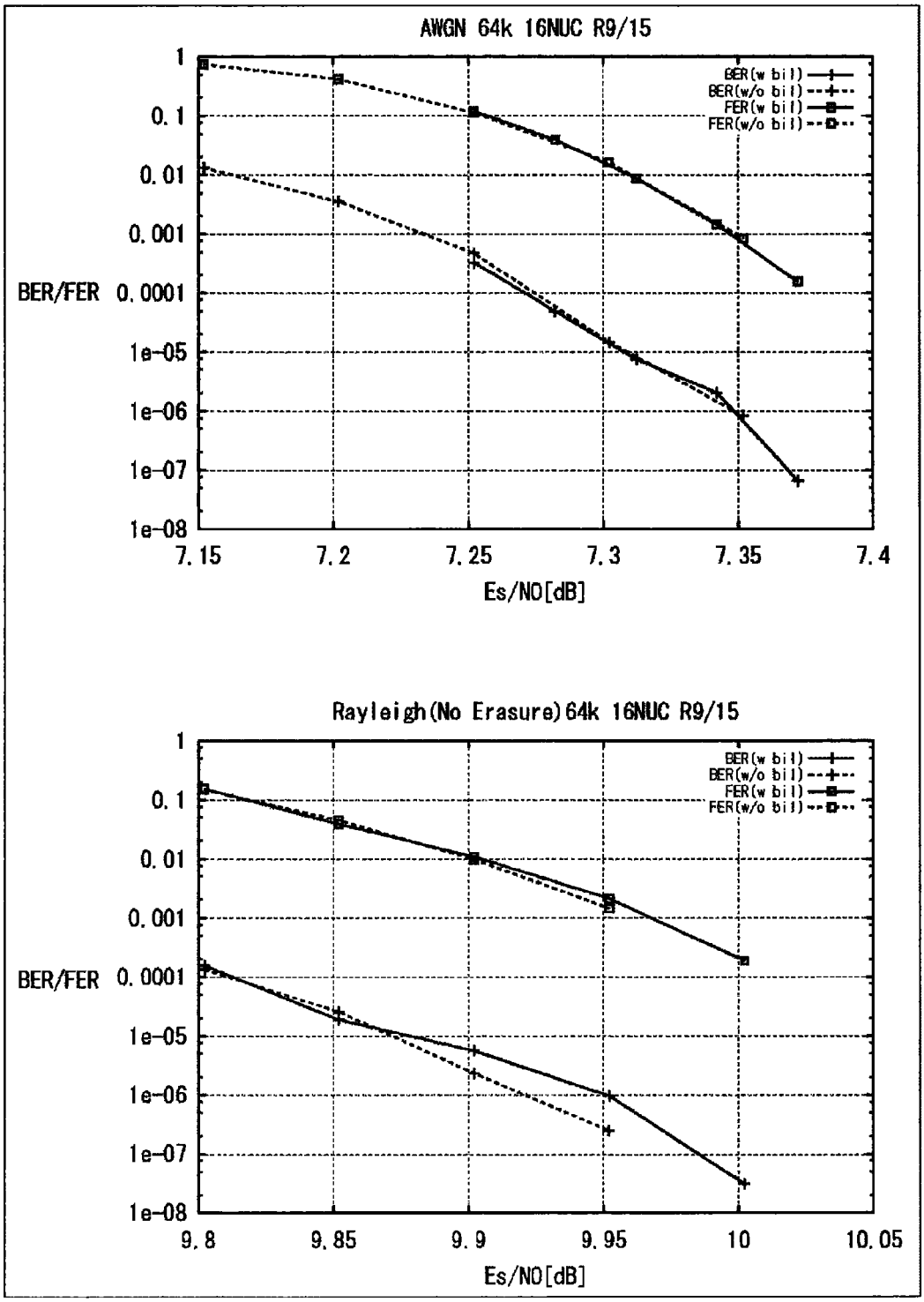
FIG. 119 is an illustration of simulation results of simulations for measuring an error rate.

FIG. 119 is an illustration of BER/FER curves as simulation results of simulations for measuring an error rate when the GW pattern of FIG. 104 is applied to the combination of the Sony code with (64 k, 9/15) and 16QAM.

Figure 120:
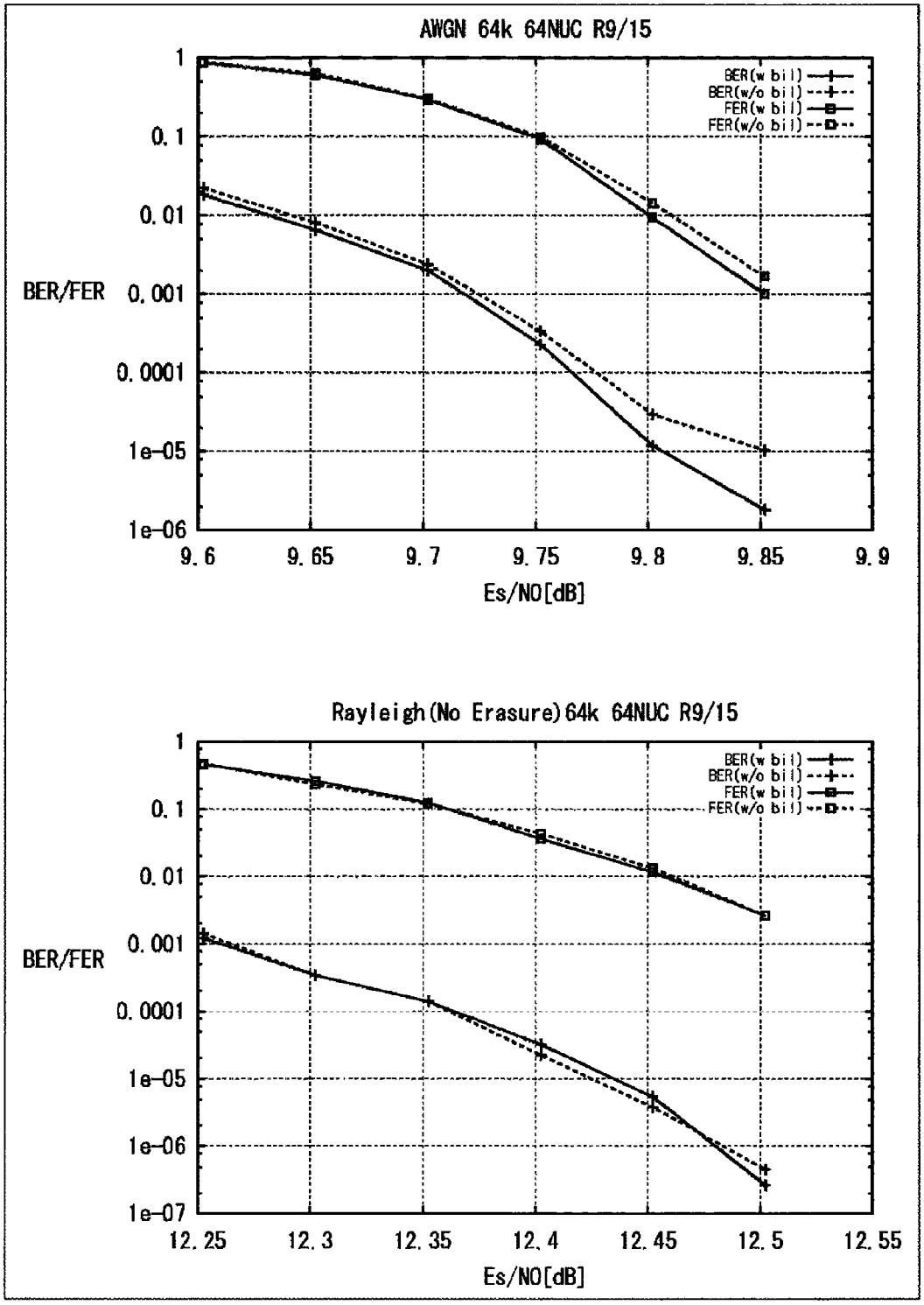

FIG. 120 is an illustration of BER/FER curves as simulation results of simulations for measuring an error rate when the GW pattern of FIG. 105 is applied to the combination of the Sony code with (64 k, 9/15) and 64QAM.

Figure 121:
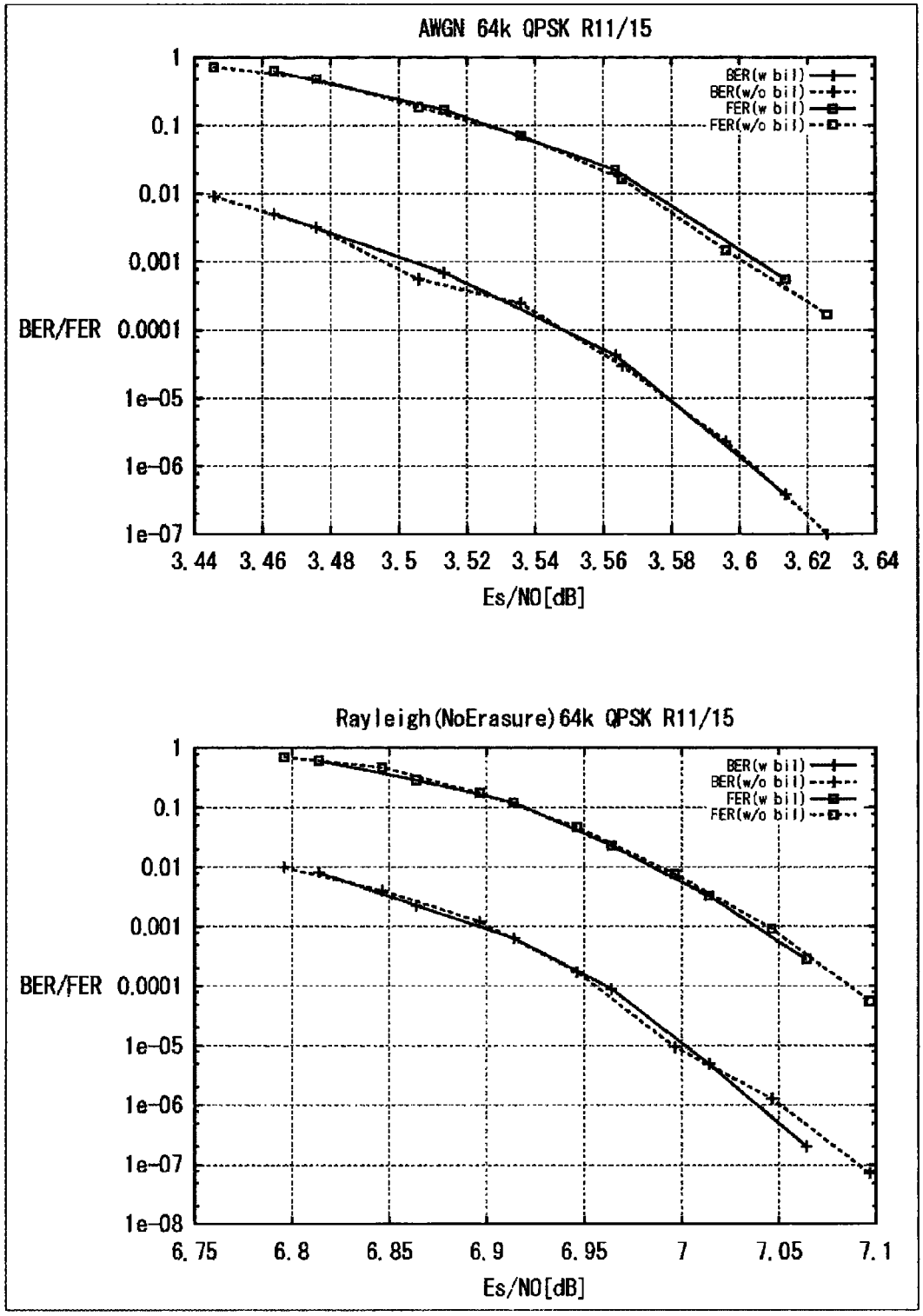

FIG. 121 is an illustration of BER/FER curves as simulation results of simulations for measuring an error rate when the GW pattern of FIG. 106 is applied to the combination of the Sony code with (64 k, 11/15) and QPSK.

Figure 122:
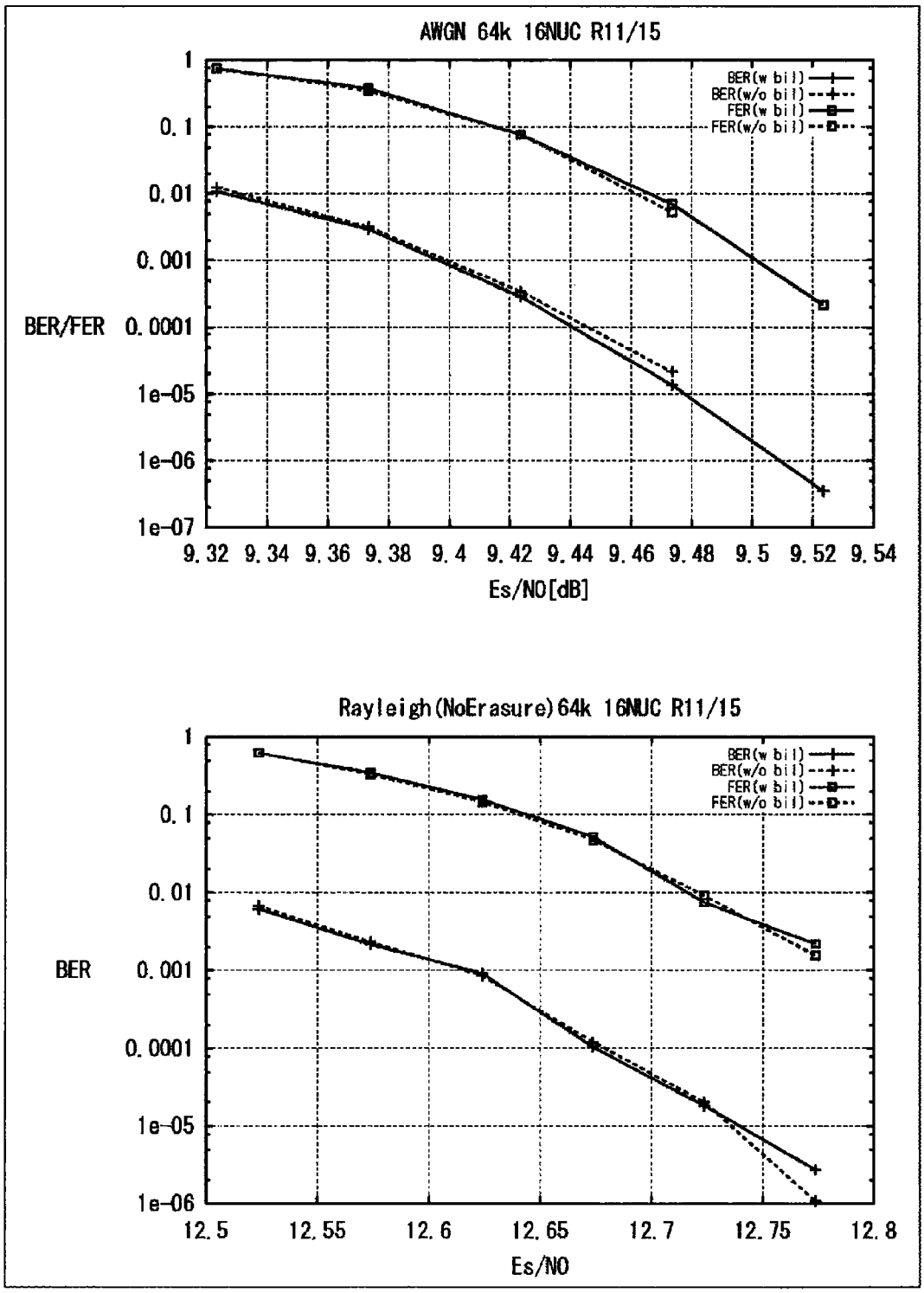

FIG. 122 is an illustration of BER/FER curves as simulation results of simulations for measuring an error rate when the GW pattern of FIG. 107 is applied to the combination of the Sony code with (64 k, 11/15) and 16QAM.

Figure 123:
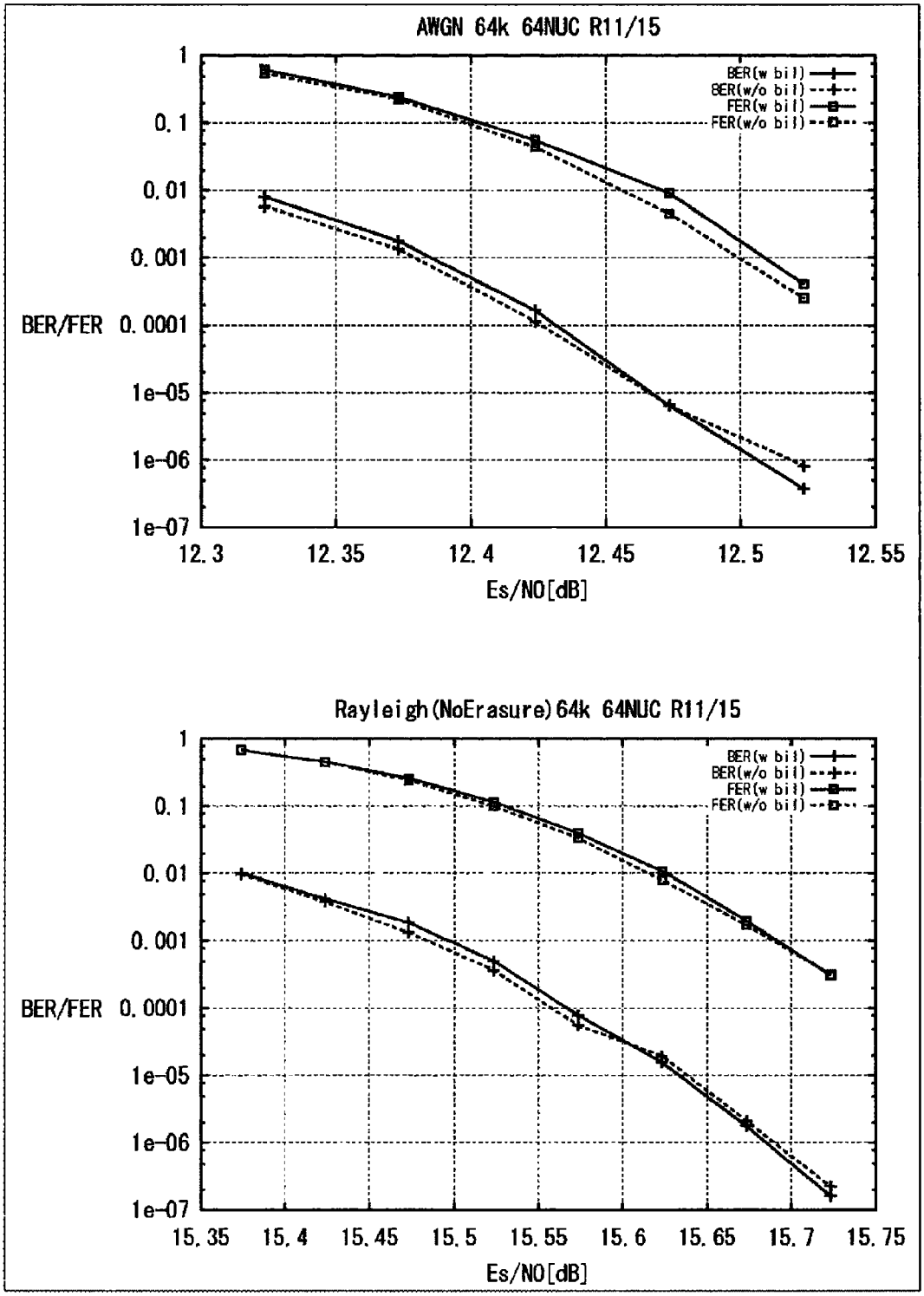

FIG. 123 is an illustration of BER/FER curves as simulation results of simulations for measuring an error rate when the GW pattern of FIG. 108 is applied to the combination of the Sony code with (64 k, 11/15) and 64QAM.

Figure 124:
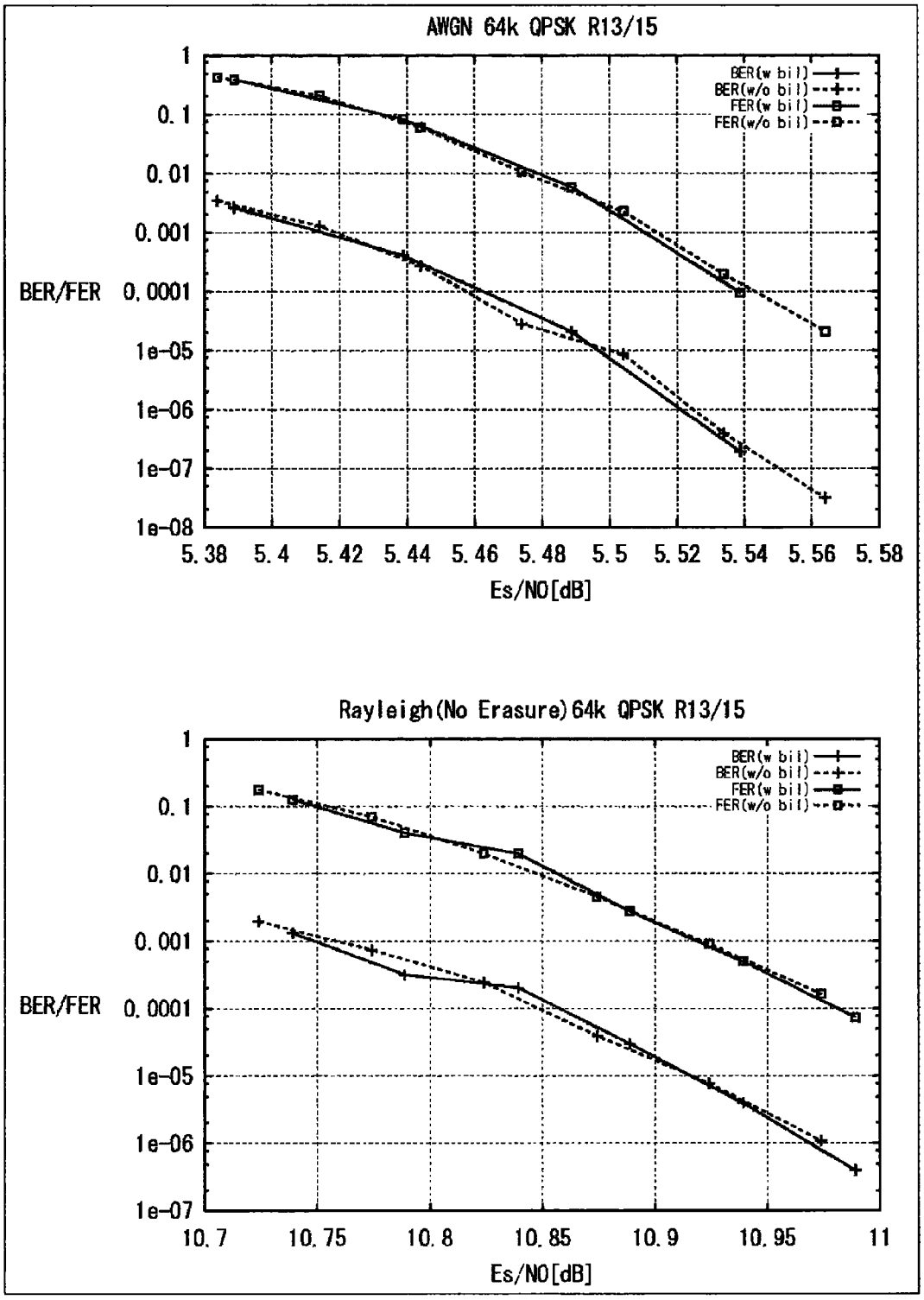

FIG. 124 is an illustration of BER/FER curves as simulation results of simulations for measuring an error rate when the GW pattern of FIG. 109 is applied to the combination of the Sony code with (64 k, 13/15) and QPSK.

Figure 125:
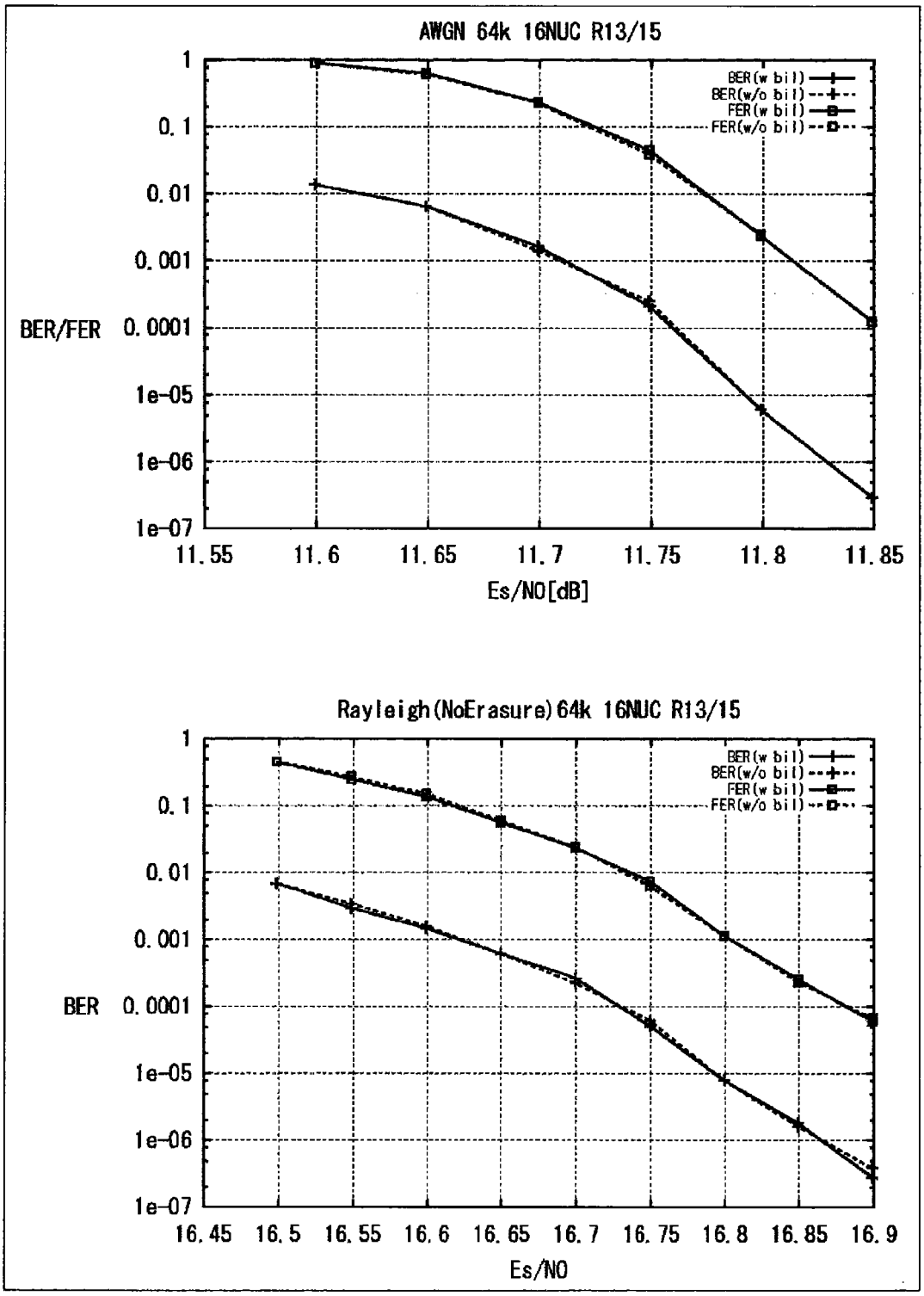

FIG. 125 is an illustration of BER/FER curves as simulation results of simulations for measuring an error rate when the GW pattern of FIG. 110 is applied to the combination of the Sony code with (64 k, 13/15) and 16QAM.

Figure 126:
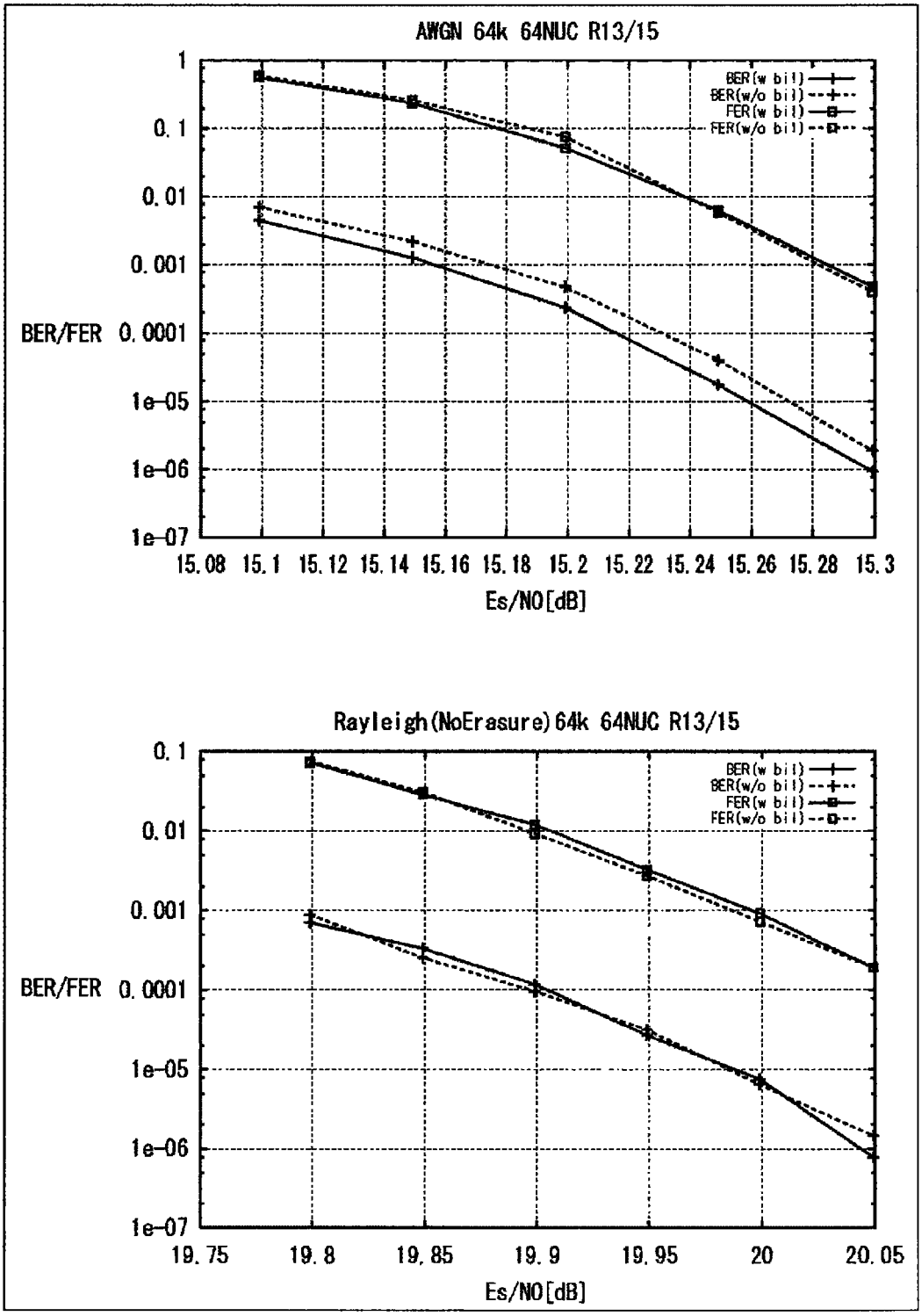

FIG. 126 is an illustration of BER/FER curves as simulation results of simulations for measuring an error rate when the GW pattern of FIG. 111 is applied to the combination of the Sony code with (64 k, 13/15) and 64QAM.

Note that FIGS. 112 to 126 illustrates BER/FER curves when the AWGN channel is adopted (the upper graphs) and a Rayleigh (fading) channel is adopted (the lower graphs) as the communication path 13 (FIG. 7).

In addition, in FIGS. 112 to 126, the solid lines (w bil) represent BER/FER curves obtained when parity interleaving, group-wise interleaving, and block-wise interleaving are performed, and the dotted lines (w/o bil) represent BER/FER curves obtained when parity interleaving, group-wise interleaving, and block-wise interleaving are not performed.

According to FIGS. 112 to 126, it can be seen that BER/FER can be further improved and a better error rate can be achieved when parity interleaving, group-wise interleaving, and block-wise interleaving are performed than when they are not performed.

Note that the GW patterns of FIGS. 97 to 111 can also be applied to a constellation obtained by symmetrically moving the signal point arrangement illustrated in FIGS. 87 to 89 around the I axis or the Q axis, a constellation obtained by symmetrically moving the arrangement around the origin, a constellation obtained by rotating the arrangement around the origin at an arbitrary angle, and the like, in addition to constellations of QPSK, 16QAM, and 64QAM of the signal point arrangement illustrated in FIGS. 87 to 89 described above, and the same effect as that obtained when they are applied to the constellations of QPSK, 16QAM, and 64QAM of the signal point arrangement illustrated in FIGS. 87 to 89 can be exhibited.

Further, the GW patterns of FIGS. 97 to 111 can also be applied to a constellation in which the most significant bit (MSB) and the least significant bit (LSB) of symbols corresponding (allocated) to signal points are switched in the signal point arrangement illustrated in FIGS. 87 to 89, in addition to the constellations of QPSK, 16QAM, and 64QAM of the signal point arrangement illustrated in FIGS. 87 to 89, and of course, the same effect as that obtained when they are applied to the constellations of QPSK, 16QAM, and 64QAM of the signal point arrangement illustrated in FIGS. 87 to 89 can be exhibited.

<Example of Configuration of Receiving Device 12>

Figure 127:
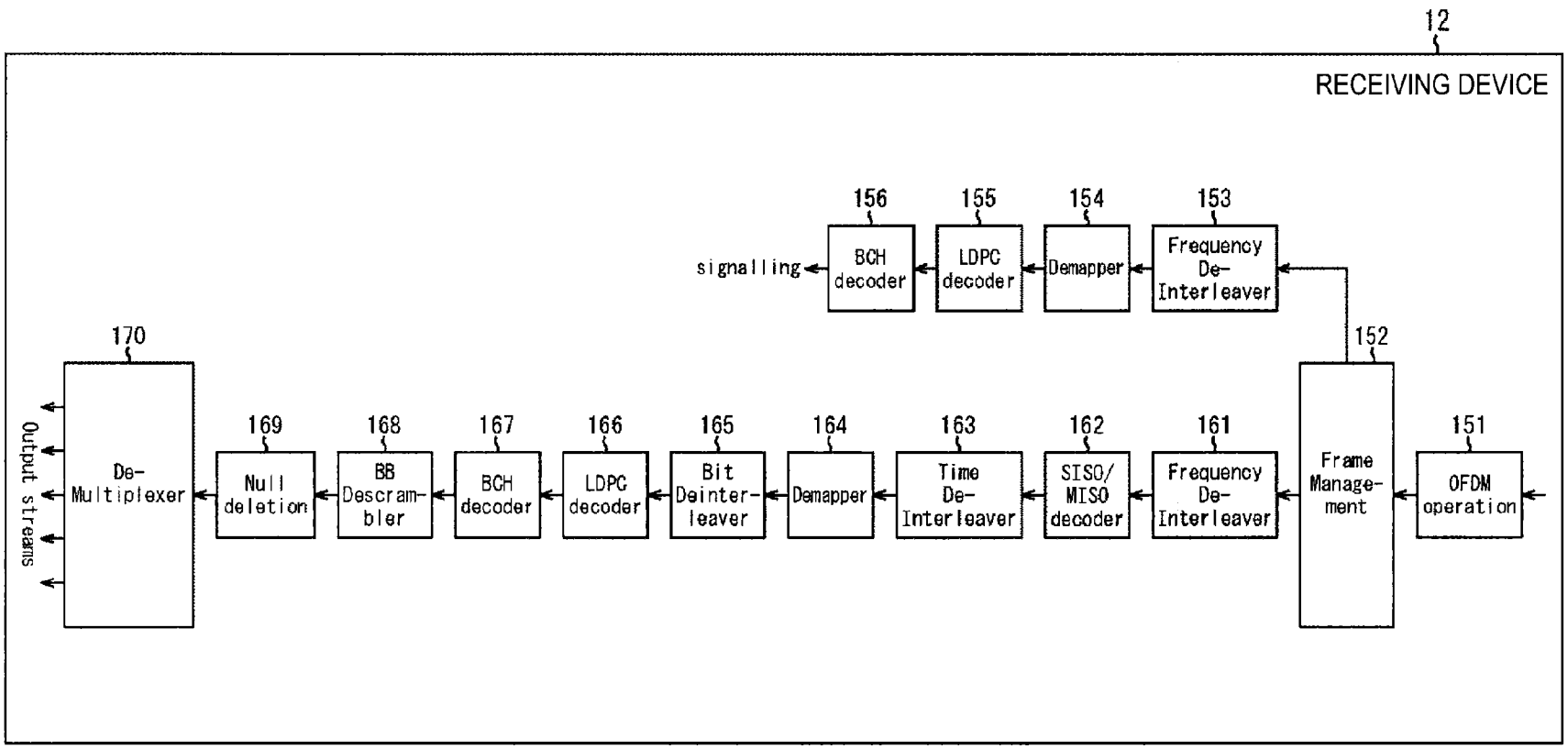

FIG. 127 is a block diagram illustrating an example of a configuration of the receiving device 12 of FIG. 7.

An OFDM processing (OFDM operation) unit 151 receives an OFDM signal from the transmitting device 11 (FIG. 7) and performs signal processing on the OFDM signal. Data obtained when the OFDM processing unit 151 performs signal processing is supplied to a frame management unit 152.

The frame management unit 152 performs processing of a frame including the data supplied from the OFDM processing unit 151 (frame interpretation), and supplies a signal of target data obtained as a result of the processing and a signal of control data to frequency deinterleavers 161 and 153.

The frequency deinterleaver 153 performs frequency deinterleaving on the data from the frame management unit 152 in units of symbols, and supplies the result to a demapper 154.

The demapper 154 performs demapping (signal point arrangement decoding) and quadrature demodulation on the data (data on a constellation) from the frequency deinterleaver 153 based on arrangement (constellation) of signal points decided through quadrature modulation performed on the transmitting device 11 side, and supplies data obtained as a result of the processing ((likelihood of) an LDPC code) to an LDPC decoder 155.

The LDPC decoder 155 performs LDPC decoding of the LDPC code from the demapper 154, and supplies LDPC target data (here, a BCH code) obtained as a result of the processing to a BCH decoder 156.

The BCH decoder 156 performs BCH decoding on the LDPC target data from the LDPC decoder 155, and outputs control data (signaling) obtained as a result of the processing.

On the other hand, the frequency deinterleaver 161 performs frequency deinterleaving on the data from the frame management unit 152 in units of symbols, and supplies the result to a SISO/MISO decoder 162.

The SISO/MISO decoder 162 performs spatiotemporal decoding on the data from the frequency deinterleaver 161, and supplies the result to a time deinterleaver 163.

The time deinterleaver 163 performs time deinterleaving on the data from the SISO/MISO decoder 162 in units of symbols, and supplies the result to a demapper 164.

The demapper 164 performs demapping (signal point arrangement decoding) and quadrature demodulation on the data from the time deinterleaver 163 (data on a constellation) based on arrangement (constellation) of signal points decided through quadrature modulation performed on the transmitting device 11 side, and supplies the data obtained as a result of the processing to a bit deinterleaver 165.

The bit deinterleaver 165 performs bit deinterleaving on the data from the demapper 164, and supplies (likelihood of) an LDPC code that is bit-interleaved data to an LDPC decoder 166.

The LDPC decoder 166 performs LDPC decoding on the LDPC code from the bit deinterleaver 165, and supplies LDPC target data (here, a BCH code) obtained as a result of the processing to a BCH decoder 167.

The BCH decoder 167 performs BCH decoding on the LDPC target data from the LDPC decoder 155, and supplies data obtained as a result of the processing to a BB descrambler 168.

The BB descrambler 168 performs BB descrambling on the data from the BCH decoder 167, and supplies data obtained as a result of the processing to a null deletion unit 169.

The null deletion unit 169 deletes null data input by the padder 112 of FIG. 8 from the data from the BB descrambler 168, and supplies the result to a demultiplexer 170.

The demultiplexer 170 separates one or more respective streams (target data) multiplexed to the data from the null deletion unit 169, performs necessary processing, and outputs the target data as output streams.

Note that the receiving device 12 can be configured without some of the blocks illustrated in FIG. 127. That is to say, when the transmitting device 11 (FIG. 8) is configured without the time interleaver 118, the SISO/MISO encoder 119, the frequency interleaver 120, and the frequency interleaver 124, for example, the receiving device 12 can be configured without the time deinterleaver 163, the SISO/MISO decoder 162, the frequency deinterleaver 161, and the frequency deinterleaver 153 which are blocks corresponding respectively to the time interleaver 118, the SISO/MISO encoder 119, the frequency interleaver 120, and the frequency interleaver 124 of the transmitting device 11.

<Example of Configuration of Bit Deinterleaver 165>

Figure 128:
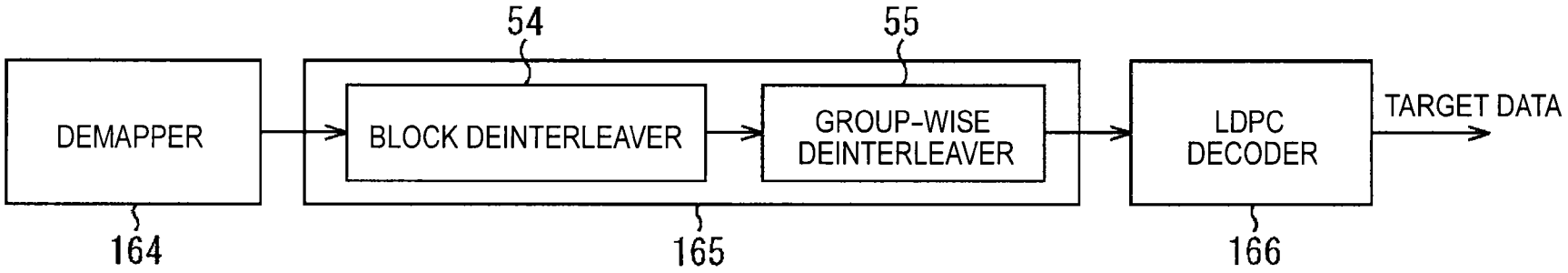

FIG. 128 is a block diagram illustrating an example of a configuration of the bit deinterleaver 165 of FIG. 127.

The bit deinterleaver 165 includes a block deinterleaver 54 and a group-wise deinterleaver 55, and performs (bit) deinterleaving on symbol bits of symbols that are data from the demapper 164 (FIG. 127).

That is to say, the block deinterleaver 54 performs block deinterleaving (inverse processing of block interleaving) corresponding to block interleaving performed by the block interleaver 25 of FIG. 9 targeting the symbol bits of the symbols from the demapper 164, i.e., block deinterleaving of returning the positions of (likelihood of) code bits of the LDPC code reordered through the block interleaving to the original positions, and supplies the LDPC code obtained as a result of the processing to the group-wise deinterleaver 55.

The group-wise deinterleaver 55 performs group-wise deinterleaving (inverse processing of group-wise interleaving) corresponding to group-wise interleaving performed by the group-wise interleaver 24 of FIG. 9 targeting the LDPC code from the block deinterleaver 54, i.e., performs group-wise deinterleaving of returning the arrangement to the original arrangement by, for example, reordering, in units of bit groups, code bits of the LDPC code of which arrangement has been changed through the group-wise interleaving in units of bit groups described in FIG. 96.

Here, when parity interleaving, group-wise interleaving, and block interleaving are performed on the LDPC code supplied from the demapper 164 to the bit deinterleaver 165, the bit deinterleaver 165 can perform all of parity deinterleaving corresponding to the parity interleaving (inverse processing of parity interleaving, i.e., parity deinterleaving to return the code bits of the LDPC code of which the arrangement has been changed through parity interleaving to the original arrangement), block deinterleaving corresponding to the block interleaving, and group-wise deinterleaving corresponding to the group-wise interleaving.

In the bit deinterleaver 165 of FIG. 128, however, the block deinterleaver 54 which performs block deinterleaving corresponding to the block interleaving and the group-wise deinterleaver 55 which performs group-wise deinterleaving corresponding to the group-wise interleaving are provided, but a block which performs parity deinterleaving corresponding to the parity interleaving is not provided, and thus parity deinterleaving is not performed.

Thus, the LDPC code which has undergone block deinterleaving and group-wise deinterleaving but has not undergone parity deinterleaving is supplied to the LDPC decoder 166 from (the group-wise deinterleaver 55 of) the bit deinterleaver 165.

The LDPC decoder 166 performs LDPC decoding of the LDPC code from the bit deinterleaver 165 using a transformed parity check matrix obtained by at least performing column permutation equivalent to parity interleaving on a parity check matrix H of the DVB method used by the LDPC encoder 115 of FIG. 8 in LDPC encoding (or the transformed parity check matrix (FIG. 29) obtained by performing row permutation on the parity check matrix (FIG. 27) of the ETRI method), and outputs data obtained as a result of the processing as a decoding result of the LDPC target data.

FIG. 129 is a flowchart describing an example of a process performed by the demapper 164, the bit deinterleaver 165, and the LDPC decoder 166 of FIG. 128.

In Step S111, the demapper 164 performs demapping on the data from the time deinterleaver 163 (data on the constellation mapped to the signal points) for quadrature demodulation, supplies the data to the bit deinterleaver 165, and then the process proceeds to Step S112.

In Step S112, the bit deinterleaver 165 performs deinterleaving (bit deinterleaving) on the data from the demapper 164, and then the process proceeds to Step S113.

In other words, in Step S112, the block deinterleaver 54 of the bit deinterleaver 165 performs block deinterleaving targeting the data (symbols) from the demapper 164, and supplies code bits of the LDPC code obtained as a result of the processing to the group-wise deinterleaver 55.

The group-wise deinterleaver 55 performs group-wise deinterleaving targeting the LDPC code from the block deinterleaver 54, and supplies (likelihood of) the LDPC code obtained as a result of the processing to the LDPC decoder 166.

In Step S113, the LDPC decoder 166 performs LDPC decoding on the LDPC code from the group-wise deinterleaver 55 using the parity check matrix H used by the LDPC encoder 115 of FIG. 8 in LDPC encoding, i.e., using, for example, the transformed parity check matrix obtained from the parity check matrix H, and outputs data obtained as a result of the processing to the BCH decoder 167 as a decoding result of the LDPC target data.

Note that, for the sake of convenience in description, the block deinterleaver 54 which performs block deinterleaving and the group-wise deinterleaver 55 which performs group-wise deinterleaving are configured as separate components in FIG. 128 the same as in FIG. 9, but the block deinterleaver 54 and the group-wise deinterleaver 55 can be configured as an integrated component.

<LDPC Decoding>

LDPC decoding performed by the LDPC decoder 166 of FIG. 127 will be described more.

In the LDPC decoder 166 of FIG. 127, LDPC decoding of the LDPC code from the group-wise deinterleaver 55 which has undergone block deinterleaving and group-wise deinterleaving and has not undergone parity deinterleaving is performed using a transformed parity check matrix obtained by at least performing column permutation equivalent to parity interleaving on the parity check matrix H of the DVB method used by the LDPC encoder 115 of FIG. 8 in LDPC encoding (or the transformed parity check matrix (FIG. 29) obtained by performing row permutation on the parity check matrix (FIG. 27) of the ETRI method) as described above.

Here, LDPC decoding in which an operation frequency can be kept in a sufficiently feasible range while suppressing a circuit scale by performing the LDPC decoding using the transformed parity check matrix has been proposed before (for example, refer to Japanese Patent Number 4224777).

Thus, the LDPC decoding using the transformed parity check matrix that has been proposed before will first be described with reference to FIGS. 130 to 133.

FIG. 130 is an illustration of an example of the parity check matrix H of an LDPC code with a code length N of 90 and an encoding rate of 2/3.

Note that zeros (0) are expressed as periods (.) in FIG. 130 (also in FIGS. 131 and 132 to be described below).

In the parity check matrix H of FIG. 130, a parity matrix has the staircase structure.

FIG. 131 is an illustration of a parity check matrix H' obtained by performing row permutation of Expression (11) and column permutation of Expression (12) on the parity check matrix H (transformed parity check matrix) of FIG. 130.

Row permutation: 6s+t+1-th row→5t+s+1-th row Expression (11)

Column permutation: 6x+y+61-th column→5y+x+61-th column Expression (12)

In Expressions (11) and (12), s, t, x, and y are integers in the ranges of $0 \leq s < 5$, $0 \leq t < 6$, $0 \leq x < 5$, and $0 \leq t < 6$.

According to the row permutation of Expression (11), the permutation is performed such that $1^{st}$, $7^{th}$, $13^{th}$, $19^{th}$, and $25^{th}$ rows which have remainders of 1 when their numbers are divided by 6 are permuted to $1^{st}$, $2^{nd}$, $3^{rd}$, $4^{th}$, and $5^{th}$ rows, respectively, and $2^{nd}$, $8^{th}$, $14^{th}$, $20^{th}$, and $26^{th}$ rows which have remainders of 2 when their numbers are divided by 6 are permuted to $6^{th}$, $7^{th}$, $8^{th}$, $9^{th}$, and $10^{th}$ rows, respectively.

In addition, according to the column permutation of Expression (12), permutation is performed for $61^{st}$ and the succeeding columns (in the parity matrix) such that $61^{st}$, $67^{th}$, $73^{rd}$, $79^{th}$, and $85^{th}$ columns which have remainders of 1 when their numbers are divided by 6 are permuted to $61^{st}$, $62^{nd}$, $63^{rd}$, $64^{th}$, and $65^{th}$ columns, respectively, and $62^{nd}$, $68^{th}$, $74^{th}$, $80^{th}$, and $86^{th}$ columns which have remainders of 2 when their numbers are divided by 6 are permuted to $66^{th}$, $67^{th}$, $68^{th}$, $69^{th}$, and $70^{th}$ columns, respectively.

In this manner, the matrix obtained by performing row and column permutation on the parity check matrix H of FIG. 130 is the parity check matrix H' of FIG. 131.

Here, even when row permutation of the parity check matrix H is performed, the arrangement of the code bits of the LDPC code is not affected.

In addition, the column permutation of Expression (12) is equivalent to parity interleaving when an information length K is set to 60, the unit size P to 5, and a divisor q (=M/P) of a parity length M (herein, 30) to 6 for parity interleaving to interleave a K+qx+y+1-th code bit to the position of a K+Py+x+1-th code bit.

Thus, the parity check matrix H' of FIG. 131 is a transformed parity check matrix obtained by at least performing column permutation of permuting the K+qx+y+1-th column to the K+Py+x+1-th column of the parity check matrix (hereinafter appropriately referred to as the original parity check matrix) H of FIG. 130.

When the parity check matrix H' of FIG. 131 is multiplied by the matrix that is obtained by performing the same permutation as Expression (12) on the LDPC code of the original parity check matrix H of FIG. 130, the 0 vector is output. That is to say, when a row vector obtained by performing the column permutation of Expression (12) on a row vector c serving as the LDPC code (one code word) of the original parity check matrix H is denoted as c', $Hc^T$ becomes the 0 vector in light of a feature of a parity check matrix, and thus $H'c'^T$ naturally becomes the 0 vector.

Based on the above, the parity check matrix H' of FIG. 131 is a parity check matrix of the LDPC code c' obtained by performing the column permutation of Expression (12) on the LDPC code c of the original parity check matrix H.

Thus, by performing the column permutation of Expression (12) on the LDPC code c of the original parity check matrix H, decoding the LDPC code c' that has undergone the column permutation using the transformed parity check matrix H' of FIG. 131 (LDPC decoding), and performing inverse permutation to the column permutation of Expression (12) on the result of the decoding, the same decoding result as that obtained when the LDPC code of the original parity check matrix H is decoded using the parity check matrix H can be obtained.

FIG. 132 is an illustration of the transformed parity check matrix H' of FIG. 131 with intervals in units of 5×5 matrixes.

In FIG. 132, the transformed parity check matrix H' is represented by a combination of 5×5 (=p×p) unit matrixes, matrixes each obtained by setting one or more 1s of the unit matrix to zero (hereinafter appropriately referred to as a quasi unit matrix), matrixes each obtained by cyclically shifting the unit matrix or the quasi unit matrix (hereinafter appropriately referred to as a shifted matrix), the sums of two or more matrixes of the unit matrix, the quasi unit matrix, and the shifted matrix (hereinafter appropriately referred to as a sum matrix), and 5×5 zero matrixes.

The transformed parity check matrix H' of FIG. 132 can be said to be constituted by 5×5 unit matrixes, quasi unit matrixes, shifted matrixes, sum matrixes, and zero matrixes. Therefore, the 5×5 matrixes (the unit matrix, the quasi unit matrix, the shifted matrix, the sum matrix, and the zero matrix) that constitute the transformed parity check matrix H' are appropriately referred to as constitutive matrixes hereinafter.

In decoding of an LDPC code of a parity check matrix represented by P×P constitutive matrixes, an architecture in which check node operations and variable node operations are simultaneously performed P times can be used.

FIG. 133 is a block diagram illustrating an example of a configuration of a decoding device which performs such decoding.

That is to say, FIG. 133 illustrates an example of a configuration of a decoding device which performs decoding of an LDPC code using the transformed parity check matrix H' of FIG. 132 that is obtained by at least performing the column permutation of Expression (12) on the original parity check matrix H of FIG. 130.

The decoding device of FIG. 133 includes a branch data storing memory 300 that includes 6 FIFOs $\mathbf{300}_1$ to $\mathbf{300}_6$, a selector 301 that selects the FIFOs $\mathbf{300}_1$ to $\mathbf{300}_6$, a check node calculating unit 302, two cyclic shift circuits 303 and 308, a branch data storing memory 304 that includes 18 FIFOs $\mathbf{304}_1$ to $\mathbf{304}_{18}$, a selector 305 that selects the FIFOs $\mathbf{304}_1$ to $\mathbf{304}_{18}$, a reception data memory 306 that stores reception data, a variable node calculating unit 307, a decoding word calculating unit 309, a reception data rearranging unit 310, and a decoded data rearranging unit 311.

First, a method of storing data in the branch data storing memories 300 and 304 will be described.

The branch data storing memory 300 includes the 6 FIFOs $\mathbf{300}_1$ to $\mathbf{300}_6$ that correspond to a number obtained by dividing the number of rows 30 of the transformed parity check matrix H' of FIG. 132 by the number of rows 5 (the unit size P) of a constitutive matrix. The FIFO $\mathbf{300}_y$ (y=1, 2, . . . , and 6) includes storage regions having a plurality of steps, and in the storage region of each step, messages corresponding to five branches which is the number of rows or the number of columns (the unit size P) of the constitutive matrix can be simultaneously read or written. The number of steps of the storage regions of the FIFO $\mathbf{300}_y$ becomes 9 that is the maximum number of 1s (Hamming weight) of the row direction of the transformed parity check matrix of FIG. 132.

In the FIFO $\mathbf{300}_1$, data (messages $v_i$ from variable nodes) corresponding to positions of is in the first to fifth rows of the transformed parity check matrix H' of FIG. 132 is stored in a form filling each row in a transverse direction (a form in which 0 is ignored). That is, if a j-th row and an i-th column are represented as (j, i), data corresponding to positions of is of a 5×5 unit matrix of (1, 1) to (5, 5) of the transformed parity check matrix H' is stored in the storage region of the $1^{st}$ step of the FIFO $\mathbf{300}_1$. In the storage region of the $2^{nd}$ step, data corresponding to positions of Is of a shifted matrix (shifted matrix obtained by cyclically shifting the 5×5 unit matrix to the right by 3) of (1, 21) to (5, 25) of the transformed parity check matrix H' is stored. Similar to the above case, in the storage regions of the $3^{rd}$ to $8^{1h}$ steps, data is stored in association with the transformed parity check matrix H'. In the storage region of the $9^{th}$ step, data corresponding to positions of 1s of a shifted matrix (shifted matrix obtained by replacing Is of the first row of the 5×5 unit matrix with 0s and cyclically shifting the unit matrix to the left by 1) of (1, 86) to (5, 90) of the transformed parity check matrix H' is stored.

In the FIFO $\mathbf{300}_2$, data corresponding to positions of 1s in the sixth to tenth rows of the transformed parity check matrix H' of FIG. 132 is stored. That is, in the storage region of the $1^{st}$ step of the FIFO $\mathbf{300}_2$, data corresponding to positions of 1s of the first shifted matrix constituting a sum matrix (sum matrix to be the sum of the first shifted matrix obtained by cyclically shifting the 5×5 unit matrix to the right by 1 and the second shifted matrix obtained by cyclically shifting the 5×5 unit matrix to the right by 2) of (6, 1) to (10, 5) of the transformed parity check matrix H' is stored. In addition, in the storage region of the $2^{nd}$ step, data corresponding to positions of 1s of the second shifted matrix constituting the sum matrix of (6, 1) to (10, 5) of the transformed parity check matrix H' is stored.

That is, with respect to a constitutive matrix of which the weight is two or higher, when the constitutive matrix is represented in the form of the sum of plural matrixes among a P×P unit matrix of which the weight is 1, a quasi unit matrix in which one or more elements of 1 in the unit matrix become 0, and a shifted matrix obtained by cyclically shifting the unit matrix or the quasi unit matrix, data corresponding to the positions of 1s in the unit matrix having the weight of 1, the quasi unit matrix, or the shifted matrix (messages corresponding to branches belonging to the unit matrix, the quasi unit matrix, or the shifted matrix) is stored at the same address (the same FIFO among the FIFOs $\mathbf{300}_1$ to $\mathbf{300}_6$).

Thereafter, also in the storage regions of the $3^{rd}$ to $9^{th}$ steps, data is stored in association with the transformed parity check matrix H'.

In the FIFOs $\mathbf{300}_3$ to $\mathbf{300}_6$, data is stored in association with the transformed parity check matrix H' in the same manner as above.

The branch data storing memory 304 includes 18 FIFOs $\mathbf{304}_1$ to $\mathbf{304}_{18}$ of which the number is obtained by dividing the number of columns 90 of the transformed parity check matrix H' by the number of columns 5 (the unit size P) of a constitutive matrix. The FIFO $304_x$ (x=1, 2, . . . , and 18) includes storage regions having a plurality of steps, and in the storage region of each step, messages corresponding to five branches whose number is the number of rows or the number of columns (the unit size P) of a constitutive matrix can be simultaneously read or written.

In the FIFO $304_1$, data (messages $u_j$ from check nodes) corresponding to positions of 1s in the $1^{st}$ to $5^{th}$ columns of the transformed parity check matrix H' of FIG. 132 is stored in a form filling each column in a longitudinal direction (a form in which 0 is ignored). That is, data corresponding to positions of is of a 5×5 unit matrix of (1, 1) to (5, 5) of the transformed parity check matrix H' is stored in the storage region of the $1^{st}$ step of the FIFO $304_1$. In the storage region of the $2^{nd}$ step, data corresponding to positions of is of the first shifted matrix constituting a sum matrix (sum matrix of the sum of the first shifted matrix obtained by cyclically shifting the 5×5 unit matrix to the right by 1 and the second shifted matrix obtained by cyclically shifting the unit matrix to the right by 2) of (6, 1) to (10, 5) of the transformed parity check matrix H' is stored. In addition, in the storage region of the $3^{rd}$ step, data corresponding to positions of 1 s of the second shifted matrix constituting the sum matrix of (6, 1) to (10, 5) of the transformed parity check matrix H' is stored.

That is, with respect to a constitutive matrix of which the weight is two or higher, when the constitutive matrix is represented by the sum of plural matrixes of a P×P unit matrix of which the weight is 1, a quasi unit matrix in which one or more elements of 1 in the unit matrix become 0, and a shifted matrix obtained by cyclically shifting the unit matrix or the quasi unit matrix, data corresponding to the positions of is in the unit matrix having the weight of 1, the quasi unit matrix, or the shifted matrix (messages corresponding to branches belonging to the unit matrix, the quasi unit matrix, or the shifted matrix) is stored at the same address (the same FIFO among the FIFOs $304_1$ to $304_{18}$).

Thereafter, also in the storage regions of the $4^{th}$ and $5^{th}$ steps, data is stored in association with the transformed parity check matrix H'. The number of steps of the storage regions of the FIFO $304_1$ becomes 5 that is the maximum number of 1 s (Hamming weight) of the row direction in the $1^{st}$ to $5^{th}$ columns of the transformed parity check matrix H'.

In the FIFOs $304_2$ and $304_3$, data is stored in association with the transformed parity check matrix H' in the same manner as the above, and the length of each memory (the number of steps) is 5. In the FIFOs $304_4$ to $304_{12}$, data is stored in association with the transformed parity check matrix H' in the same manner as above, and the length of each memory is 3. In the FIFOs $304_{13}$ to $304_{18}$, data is stored in association with the transformed parity check matrix H' in the same manner as above, and the length of each memory is 2.

Next, an operation of the decoding device of FIG. 133 will be described.

The branch data storing memory 300 includes the 6 FIFOs $300_1$ to $300_6$, and according to information (matrix data) D312 indicating to which row of the transformed parity check matrix H' of FIG. 132 five messages D311 supplied from a cyclic shift circuit 308 of a previous step belong, a FIFO storing data is selected from the FIFOs $300_1$ to $300_6$ and the five messages D311 are collectively stored in the selected FIFO in order. When reading the data, the branch data storing memory 300 sequentially reads the five messages D$300_1$ from the FIFO $300_1$ and supplies the messages to the selector 301 of a next step. After finishing reading of the messages from the FIFO $300_1$, the branch data storing memory 300 reads the messages sequentially from the FIFOs $300_2$ to $300_6$ and supplies the messages to the selector 301.

The selector 301 selects the five messages from the FIFO from which data is being currently read among the FIFOs $300_1$ to $300_6$, according to a select signal D301, and supplies the selected messages to the check node calculating unit 302 as messages D302.

The check node calculating unit 302 includes five check node calculators $302_1$ to $302_5$, and performs a check node operation according to Expression (7), using the messages D302 (D$302_1$ to D$302_5$) (messages $v_i$ of Expression (7)) supplied through the selector 301, and supplies five messages D303 (D$303_1$ to D$303_5$) (messages $u_j$ of Expression (7)) obtained as a result of the check node operation to a cyclic shift circuit 303.

The cyclic shift circuit 303 cyclically shifts the five messages D$303_1$ to D$303_5$ calculated by the check node calculating unit 302 on the basis of information (matrix data) D305 indicating how many unit matrixes (or quasi unit matrixes) in which the corresponding branches serve as bases in the corresponding transformed parity check matrix H' are cyclically shifted, and supplies the result as messages D304 to the branch data storing memory 304.

The branch data storing memory 304 includes the 18 FIFOs $304_1$ to $304_{18}$, and according to information D305 indicating to which row of the transformed parity check matrix H' five messages D304 supplied from a cyclic shift circuit 303 of a previous step belong, a FIFO storing data is selected from the FIFOs $304_1$ to $304_{18}$ and the five messages D304 are collectively stored in the selected FIFO in order. When reading the data, the branch data storing memory 304 sequentially reads the five messages D$306_1$ from the FIFO $304_1$ and supplies the messages to the selector 305 of a next step. After finishing reading of the data from the FIFO $304_1$, the branch data storing memory 304 reads the messages sequentially from the FIFOs $304_2$ to $304_{18}$ and supplies the messages to the selector 305.

The selector 305 selects the five messages from the FIFO from which data is being currently read among the FIFOs $304_1$ to $304_{18}$, according to a select signal D307, and supplies the selected messages to the variable node calculating unit 307 and the decoding word calculating unit 309 as messages D308.

Meanwhile, the reception data rearranging unit 310 rearranges the LDPC code D313 that corresponds to the parity check matrix H in FIG. 130 received through the communication path 13 by performing the column permutation of Expression (12) and supplies the LDPC code to the reception data memory 306 as reception data D314. The reception data memory 306 calculates a reception Log Likelihood Ratio (LLR) from the reception data D314 supplied from the reception data rearranging unit 310 and stores the reception LLR, sets five reception LLRs collectively as a reception value D309, and supplies the value to the variable node calculating unit 307 and the decoding word calculating unit 309.

The variable node calculating unit 307 includes five variable node calculators $307_1$ to $307_5$, and performs the variable node operation according to Expression (1) using the messages D308 (D$308_1$ to D$308_5$) (messages $u_j$ of Expression (1)) supplied through the selector 305 and the five reception values D309 (reception values $u_{0i}$ of Expression (1)) supplied from the reception data memory 306, and supplies messages D310 (D$310_1$ to D$310_5$) (message $v_i$ of Expression (1)) obtained as a result of the operation to the cyclic shift circuit 308.

The cyclic shift circuit 308 cyclically shifts the messages D310$_1$ to D310$_5$ calculated by the variable node calculating unit 307 on the basis of information indicating how many unit matrixes (or quasi unit matrixes) in which the corresponding branches serve as bases in the corresponding transformed parity check matrix H' are cyclically shifted, and supplies the result as messages D311 to the branch data storing memory 300.

By circulating the above operation in one cycle, decoding (the variable node operation and check node operation) of the LDPC code can be performed once. After decoding the LDPC code a predetermined number of times, the decoding device of FIG. 133 calculates a final decoding result in the decoding word calculating unit 309 and the decoded data rearranging unit 311 and outputs the result.

That is, the decoding word calculating unit 309 includes five decoding word calculators 309$_1$ to 309$_5$, calculates a decoding result (decoding word) on the basis of Expression (5) as a final step of multiple times of decoding using the five messages D308 (D308$_1$ to D308$_5$) (messages $u_j$ of Expression (5)) output by the selector 305 and the five reception values D309 (reception values $u_0$, of Expression (5)) supplied from the reception data memory 306, and supplies decoded data D315 obtained as a result to the decoded data rearranging unit 311.

The decoded data rearranging unit 311 performs the reverse permutation of the column permutation of Expression (12) with respect to the decoded data D315 supplied from the decoding word calculating unit 309, rearranges the order thereof, and outputs the decoded data as a final decoding result D316.

As mentioned above, by performing one or both of row permutation and column permutation on the parity check matrix (original parity check matrix) and transforming it into a parity check matrix (transformed parity check matrix) that can be represented by a combination of a P×P unit matrix, a quasi unit matrix in which one or more elements of 1 thereof become 0, a shifted matrix obtained by cyclically shifting the unit matrix or the quasi unit matrix, a sum matrix that is the sum of plural matrixes of the unit matrix, the quasi unit matrix and the shifted matrix, and a P×P zero matrix, that is, the combination of constitutive matrixes, an architecture in which check node operations and variable node operations are simultaneously performed P times, this number being lower than the number of rows or the number of columns of the parity check matrix, can be adopted to decoding of the LDPC code. When the architecture in which node operations (check node operations and variable node operations) are simultaneously performed P times, this number being lower than the number of rows or the number of columns of the parity check matrix, is adopted, an operation frequency can be kept in a feasible range and decoding can be performed iteratively a number of times, in comparison to a case in which the node operations are simultaneously performed as many times as the number of rows or the number of columns of the parity check matrix.

The LDPC decoder 166 that constitutes the receiving device 12 of FIG. 127 performs the LDPC decoding by simultaneously performing check node operations and variable node operations P times like, for example, the decoding device of FIG. 133.

That is, for the sake of simplified description, if the parity check matrix of the LDPC code output by the LDPC encoder 115 constituting the transmitting device 11 of FIG. 8 is assumed to be, for example, the parity check matrix H illustrated in FIG. 130 in which the parity matrix has the staircase structure, the parity interleaver 23 of the transmitting device 11 performs parity interleaving to interleave the (K+qx+y+1)-th code bit to the position of the (K+Py+x+1)-th code bit with the information length K of 60, the column number P of 5, and the divisor q (=M/P) of the parity length M of 6.

Because the parity interleaving corresponds to the column permutation of Expression (12) as described above, it is not necessary to perform the column permutation of Expression (12) in the LDPC decoder 166.

For this reason, in the receiving device 12 of FIG. 127, the LDPC code which has not undergone parity deinterleaving, that is, the LDPC code in a state in which the column permutation of Expression (12) has been performed, is supplied from the group-wise deinterleaver 55 to the LDPC decoder 166 as described above, and in the LDPC decoder 166, the same processing as in the decoding device of FIG. 133 except for non-performance of the column permutation of Expression (12) is executed.

FIG. 134 is a diagram illustrating an example of a configuration of the LDPC decoder 166 of FIG. 127.

In FIG. 134, the LDPC decoder 166 has the same configuration as the decoding device of FIG. 133 except that the reception data rearranging unit 310 of FIG. 133 is not provided, and performs the same process as the decoding device of FIG. 133 except that the column permutation of Expression (12) is not performed, and thus description thereof will be omitted.

Since the LDPC decoder 166 can be configured without the reception data rearranging unit 310 as described above, a scale thereof can be reduced more than that of the decoding device of FIG. 133.

Note that, although the code length N of the LDPC code is set to 90, the information length K to 60, the unit size (the number of rows and the number of columns of the constitutive matrix) P to 5, and the divisor q (=M/P) of the parity length M to 6 for the sake of simplified description in FIGS. 130 to 134, none of the code length N, the information length K, the unit size P, and the divisor q (=M/P) is limited to the above-described values.

That is, in the transmitting device 11 of FIG. 8, data output by the LDPC encoder 115 is an LDPC code with, for example, the code length N of 64800 or 16200, the information length K of N−Pq (=N−M), the unit size P of 360, and the divisor q of M/P, and the LDPC decoder 166 of FIG. 134 can be applied to a case in which LDPC decoding is performed by simultaneously performing check node operations and variable node operations P times targeting such an LDPC code.

In addition, when the portion of parity of the decoding result is unnecessary and only information bits of the decoding result are output after decoding the LDPC code by the LDPC decoder 166, the LDPC decoder 166 can be configured without the decoded data rearranging unit 311.

<Example of Configuration of Block Deinterleaver 54>

FIG. 135 is a block diagram illustrating an example of a configuration of the block deinterleaver 54 of FIG. 128.

The block deinterleaver 54 is configured the same as the block interleaver 25 described in FIG. 93.

Thus, the block deinterleaver 54 has a storage region called a part 1 and another storage region called a part 2, and the parts 1 and 2 each store 1 bit in the row direction, each of which includes C columns serving as storage regions for storing a predetermined number of bits in the column direction that are arranged in the row direction, and the number C is equal to the number of bits m of a symbol.

The block deinterleaver 54 performs block deinterleaving by writing and reading the LDPC code on and from the parts 1 and 2.

In block deinterleaving, however, writing of the LDPC code (which has become a symbol) is performed in the order in which the block interleaver 25 of FIG. 93 reads the LDPC code.

Further, in block deinterleaving, reading of the LDPC code is performed in the order in which the block interleaver 25 of FIG. 93 writes the LDPC code.

That is, the LDPC code is written in the column direction and read in the row direction with respect to the parts 1 and 2 in block interleaving by the block interleaver 25 of FIG. 93, but in the block deinterleaving by the block deinterleaver 54 of FIG. 135, the LDPC code is written in the row direction and read in the column direction with respect to the parts 1 and 2.

<Another Example of Configuration of Bit Deinterleaver 165>

FIG. 136 is a block diagram illustrating another example of the configuration the bit deinterleaver 165 of FIG. 127.

Note that the same reference numerals are given to portions of the drawing corresponding to those in FIG. 128, and description thereof will be appropriately omitted below.

That is, the bit deinterleaver 165 of FIG. 136 has the same configuration as in FIG. 128 except that a parity deinterleaver 1011 is newly provided therein.

In FIG. 136, the bit deinterleaver 165 includes the block deinterleaver 54, the group-wise deinterleaver 55, and the parity deinterleaver 1011, and performs bit deinterleaving on code bits of the LDPC code from the demapper 164.

That is, targeting the LDPC code from the demapper 164, the block deinterleaver 54 performs block deinterleaving corresponding to block interleaving (inverse processing of block interleaving) performed by the block interleaver 25 of the transmitting device 11, i.e., block deinterleaving of returning the positions of the code bits reordered through the block interleaving to the original positions, and supplies the LDPC code obtained as a result of the processing to the group-wise deinterleaver 55.

The group-wise deinterleaver 55 performs group-wise deinterleaving corresponding to group-wise interleaving performed as rearrangement processing by the group-wise interleaver 24 of the transmitting device 11, targeting the LDPC code from the block deinterleaver 54.

The LDPC code obtained by as a result of the group-wise deinterleaving is supplied to the parity deinterleaver 1011 from the group-wise deinterleaver 55.

The parity deinterleaver 1011 performs parity deinterleaving corresponding to parity interleaving (inverse processing of parity interleaving) performed by the parity interleaver 23 of the transmitting device 11, i.e., parity deinterleaving of returning the code bits of the LDPC code whose arrangement has been changed through the parity interleaving to the original arrangement, targeting the code bits group-wise-deinterleaved by the group-wise deinterleaver 55.

The LDPC code obtained as a result of the parity deinterleaving is supplied to the LDPC decoder 166 from the parity deinterleaver 1011.

Thus, in the bit deinterleaver 165 of FIG. 136, the LDPC code that has undergone block deinterleaving, group-wise deinterleaving, and parity deinterleaving, i.e., the LDPC code obtained through LDPC encoding according to the parity check matrix H, is supplied to the LDPC decoder 166.

The LDPC decoder 166 performs LDPC decoding on the LDPC code from the bit deinterleaver 165 using the parity check matrix H used by the LDPC encoder 115 of the transmitting device 11 in the LDPC encoding. That is, the LDPC decoder 166 performs LDPC decoding on the LDPC code from the bit deinterleaver 165 using the parity check matrix H (of the DVB method) used by the LDPC encoder 115 of the transmitting device 11 in the LDPC encoding or using a transformed parity check matrix obtained by at least performing column permutation equivalent to parity interleaving on the parity check matrix H (with respect to the ETRI method, the parity check matrix (FIG. 28) obtained by performing column permutation on the parity check matrix (FIG. 27) used in the LDPC encoding or the transformed parity check matrix (FIG. 29) obtained by performing row permutation on the parity check matrix (FIG. 27) used in the LDPC encoding).

Here, in FIG. 136, since the LDPC code obtained through the LDPC encoding according to the parity check matrix H is supplied from (the parity deinterleaver 1011 of) the bit deinterleaver 165 to the LDPC decoder 166, when LDPC decoding of the LDPC code is performed using the parity check matrix H (of the DVB method) used by the LDPC encoder 115 of the transmitting device 11 in the LDPC encoding (with respect to the ETRI method, the parity check matrix (FIG. 28) obtained by performing column permutation on the parity check matrix (FIG. 27) used in the LDPC encoding), the LDPC decoder 166 can be configured as a decoding device which performs LDPC decoding using, for example, a full serial decoding method in which operations of messages (check node messages and variable node messages) are sequentially performed for each node or a decoding device which performs LDPC decoding using a full parallel decoding method in which operations of messages are performed simultaneously (in parallel) for all nodes.

In addition, when the LDPC decoder 166 performs LDPC decoding on the LDPC code using the transformed parity check matrix obtained by at least performing column permutation equivalent to parity interleaving on the parity check matrix H (of the DVB method) used by the LDPC encoder 115 of the transmitting device 11 in the LDPC encoding (with respect to the ETRI method, the transformed parity check matrix (FIG. 29) obtained by performing row permutation on the parity check matrix (FIG. 27) used in the LDPC encoding), the LDPC decoder 166 can be configured as a decoding device of the architecture in which check node operations and variable node operations are simultaneously performed P times (or a divisor of P other than 1) and a decoding device (FIG. 133) having the reception data rearranging unit 310 which rearranges the code bits of the LDPC code by performing the same column permutation as the column permutation for obtaining the transformed parity check matrix (parity interleaving) on the LDPC code.

Note that, in FIG. 136, the block deinterleaver 54 which performs block deinterleaving, the group-wise deinterleaver 55 which performs group-wise deinterleaving, and the parity deinterleaver 1011 which performs parity deinterleaving are set to be configured as separate components for the sake of convenience of description, but two or more of the block deinterleaver 54, the group-wise deinterleaver 55, and the parity deinterleaver 1011 can be configured as an integrated component, in the same manner as the parity interleaver 23, the group-wise interleaver 24, and the block interleaver 25 of the transmitting device 11.

<Example of Configuration of Reception System>

FIG. 137 is a block diagram illustrating a first example of a configuration of a reception system to which the receiving device 12 can be applied.

In FIG. 137, the reception system includes an acquisition unit 1101, a transmission path decoding processing unit 1102, and an information source decoding processing unit 1103.

The acquisition unit 1101 acquires a signal including an LDPC code obtained by at least performing LDPC encoding on LDPC target data such as image data, audio data, or the like of a program through a transmission path (communication path) that is not illustrated, for example, digital terrestrial broadcasting, digital satellite broadcasting, a CATV network, the Internet, and other networks, and supplies the signal to the transmission path decoding processing unit 1102.

Here, when the signal acquired by the acquisition unit 1101 is broadcast from a broadcasting station through, for example, terrestrial waves, satellite waves, a cable television (CATV) network, or the like, the acquisition unit 1101 includes a tuner, a set-top box (STB), or the like. In addition, when the signal acquired by the acquisition unit 1101 is transmitted from, for example, a web server through multicast like an Internet Protocol Television (IPTV), the acquisition unit 1101 includes a network interface (I/F), for example, a network interface card (NIC) or the like.

The transmission path decoding processing unit 1102 corresponds to the receiving device 12. The transmission path decoding processing unit 1102 performs transmission path decoding processing which includes at least a process of correcting an error occurring in a transmission path on the signal acquired by the acquisition unit 1101 through the transmission path, and supplies a signal obtained as a result of the processing to the information source decoding processing unit 1103.

That is to say, the signal acquired by the acquisition unit 1101 through the transmission path is a signal obtained by at least performing error correction encoding for correcting an error occurring on the transmission path, and the transmission path decoding processing unit 1102 performs transmission path decoding processing, for example, error correction processing or the like with respect to the signal.

Here, as the error correction encoding, for example, there are LDPC encoding, BCH encoding, and the like. In this case, at least LDPC encoding is performed as the error correction encoding.

In addition, the transmission path decoding processing may include demodulation of a modulated signal or the like.

The information source decoding processing unit 1103 performs information source decoding processing on the signal that has undergone the transmission path decoding processing, which includes at least a process of decompressing compressed information into original information.

That is to say, there may be cases in which compression encoding for compressing information is performed on the signal acquired by the acquisition unit 1101 via the transmission path in order to reduce the data amount of images, sounds, or the like serving as information, and in such a case, the information source decoding processing unit 1103 performs information source decoding processing including a process of decompressing compressed information into original information (decompression processing) on the signal that has undergone the transmission path decoding processing.

Note that, when compression encoding is not performed on the signal acquired by the acquisition unit 1101 through the transmission path, the information source decoding processing unit 1103 does not perform the process of decompressing compressed information into original information.

Here, as the decompressing processing, for example, there is MPEG decoding or the like. In addition, the transmission path decoding processing may include descrambling or the like in addition to the decompressing processing.

In the reception system configured as described above, the acquisition unit 1101 acquires a signal obtained by performing compression encoding such as MPEG encoding and further performing error correction encoding such as LDPC encoding on, for example, image or audio data through a transmission path, and supplies the signal to the transmission path decoding processing unit 1102.

The transmission path decoding processing unit 1102 performs, for example, the same processing as the receiving device 12 on the signal from the acquisition unit 1101 as transmission path decoding processing, and supplies a signal obtained as a result of the processing to the information source decoding processing unit 1103.

The information source decoding processing unit 1103 performs information source decoding processing such as MPEG decoding on the signal from the transmission path decoding processing unit 1102, and outputs images or sounds that are obtained as a result of the processing.

The reception system of FIG. 137 described above can be applied to, for example, a television tuner which receives television broadcasting as digital broadcasting and the like.

Note that the acquisition unit 1101, the transmission path decoding processing unit 1102, and the information source decoding processing unit 1103 can each be configured as one independent device (hardware (such as an integrated circuit (IC)) or a software module).

In addition, with the acquisition unit 1101, the transmission path decoding processing unit 1102, and the information source decoding processing unit 1103, a set of the acquisition unit 1101 and the transmission path decoding processing unit 1102, a set of the transmission path decoding processing unit 1102 and the information source decoding processing unit 1103, and a set of the acquisition unit 1101, the transmission path decoding processing unit 1102, and the information source decoding processing unit 1103 can each be configured as one independent device.

FIG. 138 is a block diagram illustrating a second example of the configuration of the reception system to which the receiving device 12 can be applied.

Note that the same reference numerals are given to portions of the drawing corresponding to those in FIG. 137, and description thereof will be appropriately omitted below.

The reception system of FIG. 138 has a common point to that of FIG. 137 in that the acquisition unit 1101, the transmission path decoding processing unit 1102, and the information source decoding processing unit 1103 are provided, and is different from that of FIG. 137 in that an output unit 1111 is newly provided.

The output unit 1111 is, for example, a display device which displays images or a speaker which outputs sounds, and outputs images, sounds, and the like that are signals output from the information source decoding processing unit 1103. That is to say, the output unit 1111 displays images or outputs sounds.

The reception system of FIG. 138 configured as above can be applied to, for example, a TV (television receiver) which receives television broadcasting as digital broadcasting, a radio receiver which receives radio broadcasting, and the like.

Note that, when compression encoding is not performed on a signal acquired by the acquisition unit 1101, the signal output by the transmission path decoding processing unit 1102 is supplied to the output unit 1111.

FIG. 139 is a block diagram illustrating a third example of the configuration of the reception system to which the receiving device 12 can be applied.

Note that the same reference numerals are given to portions of the drawing corresponding to those in FIG. 137, and description thereof will be appropriately omitted below.

The reception system of FIG. 139 has a common point to that of FIG. 137 in that the acquisition unit 1101 and the transmission path decoding processing unit 1102 are provided.

The reception system of FIG. 139, however, is different from that of FIG. 137 in that the information source decoding processing unit 1103 is not provided and a recording unit 1121 is newly provided.

The recording unit 1121 records (stores) a signal output by the transmission path decoding processing unit 1102 (for example, a TS packet of an MPEG-TS) on a recording (storage) medium such as an optical disc, a hard disk (magnetic disk), or a flash memory.

The reception system of FIG. 139 configured as above can be applied to a recorder which records television broadcasting and the like.

Note that, in FIG. 139, the reception system can include the information source decoding processing unit 1103 and record signals that have undergone the information source decoding processing, i.e., images and sounds obtained through decoding by the information source decoding processing unit 1103 using the recording unit 1121.

<Embodiment of a Computer>

The above-described series of processes can be performed using hardware or software. When the series of processes is performed using software, a program constituting the software is installed in a general-purpose computer or the like.

Thus, FIG. 140 illustrates an example of a configuration of an embodiment of a computer in which a program for executing the above-described series of processes is installed.

The program can be recorded in advance in a hard disk 705 or a ROM 703 serving as a recording medium built in the computer.

Alternatively, the program can be temporarily or permanently stored (recorded) on a removable recording medium 711 such as a flexible disk, a Compact Disc Read Only Memory (CD-ROM), a magneto optical (MO) disc, a digital versatile disc (DVD), a magnetic disk, or a semiconductor memory. Such a removable recording medium 711 can be provided as so-called package software.

Note that, in addition to being installed in the computer from the removable recording medium 711 described above, the program can be transferred to the computer via a satellite for digital satellite broadcasting in a wireless manner, or transferred to the computer via a network such as a local area network (LAN) or the Internet in a wired manner from a download site, and in the computer, the program transferred as above can be received by a communication unit 708 and installed in the built-in hard disk 705.

The computer includes a central processing unit (CPU) 702. The CPU 702 is connected to an input and output interface 710 via a bus 701, and when a user inputs a command by operating an input unit 707 including a keyboard, a mouse, a microphone, or the like via the input and output interface 710, the CPU 702 executes a program stored in the read only memory (ROM) 703 according to the command. Alternatively, the CPU 702 loads a program stored in the hard disk 705, a program transferred from a satellite or a network, received by the communication unit 708, and installed in the hard disk 705, or a program read from the removable recording medium 711 loaded in a drive 709 and installed in the hard disk 705 in a random access memory (RAM) 704 and executes the program. Accordingly, the CPU 702 performs processing according to the above-described flowcharts or processing performed with the configurations of the above-described block diagrams. Then, the CPU 702 causes a result of the processing to be, for example, output from an output unit 706 including a liquid crystal display (LCD), a speaker, or the like, transmitted from the communication unit 708, or further recorded in the hard disk 705 via the input and output interface 710, as necessary.

In the present specification, it is not necessary to perform processing steps for describing a program which causes a computer to perform various kinds of processing in a time series manner in the orders described as flowcharts, and processing executed separately or in parallel (for example, parallel processing or processing by an object).

In addition, the program may be processed by one computer, or be subject to distributed processing performed by a plurality of computers. Further, the program may be transferred to and executed by a remote computer.

Note that an embodiment of the present technology is not limited to the above-described embodiments, and can be variously modified within a scope not deviating from the gist of the present technology.

That is to say, for example, (the parity check matrix initial value table of) the above-described new LDPC code the communication path 13 (FIG. 7) can be any of a satellite channel, terrestrial waves, a cable (wired channel), and others. Further, the new LDPC code can also be used in data transmission other than digital broadcasting.

In addition, the above-described GW pattern can also be applied to codes other than the new LDPC code. Further, a modulation method to which the above-described GW pattern is applied is not limited to 16QAM, 64QAM, 256QAM, and 1024QAM.

Note that the effects described in the present specification are thoroughly illustrative and not limitative, and other effects may be included.

REFERENCE SIGNS LIST

11 transmitting device
12 receiving device
23 parity interleaver
24 group-wise interleaver
25 block interleaver
54 block deinterleaver
55 group-wise deinterleaver
111 mode adaptation/multiplexer
112 padder
113 BB scrambler
114 BCH encoder
115 LDPC encoder
116 bit interleaver
117 mapper
118 time interleaver
119 SISO/MISO encoder
120 frequency interleaver
121 BCH encoder
122 LDPC encoder
123 mapper
124 frequency interleaver
131 frame builder/resource allocation unit
132 OFDM generating unit
151 OFDM processing unit

152 frame management unit
153 frequency deinterleaver
154 demapper
155 LDPC encoder
156 BCH decoder
161 frequency deinterleaver
162 SISO/MISO decoder
163 time deinterleaver
164 demapper
165 bit deinterleaver
166 LDPC decoder
167 BCH decoder
168 BB descrambler
169 null deletion unit
170 demultiplexer
300 branch data storing memory
301 selector
302 check node calculating unit
303 cyclic shift circuit
304 branch data storing memory
305 selector
306 reception data memory
307 variable node calculating unit
308 cyclic shift circuit
309 decoding word calculating unit
310 reception data rearranging unit
311 decoded data rearranging unit
601 encoding processing unit
602 storage unit
611 encoding rate setting unit
612 initial value table reading unit
613 parity check matrix generating unit
614 information bit reading unit
615 encoding parity operation unit
616 control unit
701 bus
702 CPU
703 ROM
704 RAM
705 hard disk
706 output unit
707 input unit
708 communication unit
709 drive
710 input and output interface
711 removable recording medium
1001 inverse reordering unit
1002 memory
1011 parity deinterleaver
1101 acquisition unit
1101 transmission path decoding processing unit
1103 information source decoding processing unit
1111 output unit
1121 recording unit

The invention claimed is:

[1. A data processing method comprising:

an encoding step of performing LDPC encoding based on a parity check matrix of an LDPC code having a code length N of 64800 bits and an encoding rate r of 5/15;

a group-wise interleaving step of performing group-wise interleaving of interleaving the LDPC code in a unit of a bit group of 360 bits; and a mapping step of mapping the LDPC code to any one of four signal points decided using a modulation method in a unit of 2 bits, wherein, in the group-wise interleaving, setting an i+1-th bit group from a head of the LDPC code as a bit group i, arrangement of bit groups 0 to 179 of the LDPC code of 64800 bits is interleaved into arrangement of bit groups 39, 47, 96, 176, 33, 75, 165, 38, 27, 58, 90, 76, 17, 46, 10, 91, 133, 69, 171, 32, 117, 78, 13, 146, 101, 36, 0, 138, 25, 77, 122, 49, 14, 125, 140, 93, 130, 2, 104, 102, 128, 4, 111, 151, 84, 167, 35, 127, 156, 55, 82, 85, 66, 114, 8, 147, 115, 113, 5, 31, 100, 106, 48, 52, 67, 107, 18, 126, 112, 50, 9, 143, 28, 160, 71, 79, 43, 98, 86, 94, 64, 3, 166, 105, 103, 118, 63, 51, 139, 172, 141, 175, 56, 74, 95, 29, 45, 129, 120, 168, 92, 150, 7, 162, 153, 137, 108, 159, 157, 173, 23, 89, 132, 57, 37, 70, 134, 40, 21, 149, 80, 1, 121, 59, 110, 142, 152, 15, 154, 145, 12, 170, 54, 155, 99, 22, 123, 72, 177, 131, 116, 44, 158, 73, 11, 65, 164, 119, 174, 34, 83, 53, 24, 42, 60, 26, 161, 68, 178, 41, 148, 109, 87, 144, 135, 20, 62, 81, 169, 124, 6, 19, 30, 163, 61, 179, 136, 97, 16, and 88, wherein the parity check matrix includes an A matrix which is on an upper left of the parity check matrix having g rows and K columns represented with a predetermined value g and an information length K=N×r of the LDPC code, a B matrix which has a staircase structure close to a right side of the A matrix having g rows and g columns, a Z matrix which is a zero matrix close to a right side of the B matrix having g rows and N−K−g columns, a C matrix which is close to a bottom side of the A matrix and the B matrix having N−K−g rows and K+g columns, and a D matrix which is a unit matrix close to a right side of the C matrix having N−K−g rows and N−K−g columns, wherein the predetermined value g is 1440, wherein the A matrix and the C matrix are expressed using a parity check matrix initial value table, and wherein the parity check matrix initial value table is a table representing positions of elements of 1 of the A matrix and the C matrix for every 360 columns, the table including 221 1011 1218 4299 7143 8728 11072 15533 17356 33909 36833

360 1210 1375 2313 3493 16822 21373 23588 23656 26267 34098

544 1347 1433 2457 9186 10945 13583 14858 19195 34606 37441

37 596 715 4134 8091 12106 24307 24658 34108 40591 42883

235 398 1204 2075 6742 11670 13512 23231 24784 27915 34752

204 873 890 13550 16570 19774 34012 35249 37655 39885 42890

221 371 514 11984 14972 15690 28827 29069 30531 31018 43121

280 549 1435 1889 3310 10234 11575 15243 20748 30469 36005

223 666 1248 13304 14433 14732 18943 21248 23127 38529 39272

370 819 1065 9461 10319 25294 31958 33542 37458 39681 40039

585 870 1028 5087 5216 12228 16216 16381 16937 27132 27893

164 167 1210 7386 11151 20413 22713 23134 24188 36771 38992

298 511 809 4620 7347 8873 19602 24162 29198 34304 41145

105 830 1212 2415 14759 15440 16361 16748 22123 32684 42575
659 665 668 6458 22130 25972 30697 31074 32048 36078 37129
91 808 953 8015 8988 13492 13987 15979 28355 34509 39698
594 983 1265 3028 4029 9366 11069 11512 27066 40939 41639
506 740 1321 1484 10747 16376 17384 20285 31502 38925 42606
338 356 975 2022 3578 18689 18772 19826 22914 24733 27431
709 1264 1366 4617 8893 25226 27800 29080 30277 37781 39644
840 1179 1338 2973 3541 7043 12712 15005 17149 19910 36795
1009 1267 1380 4919 12679 22889 29638 30987 34637 36232 37284
466 913 1247 1646 3049 5924 9014 20539 34546 35029 36540
374 697 984 1654 5870 10883 11684 20294 28888 31612 34031
117 240 635 5093 8673 11323 12456 14145 21397 39619 42559
122 1265 1427 13528 14282 15241 16852 17227 34723 36836 39791
595 1180 1310 6952 17916 24725 24971 27243 29555 32138 35987
140 470 1017 13222 13253 18462 20806 21117 28673 31598 37235
7 710 1072 8014 10804 13303 14292 16690 26676 36443 41966
48 189 759 12438 14523 16388 23178 27315 28656 29111 29694
285 387 410 4294 4467 5949 25386 27898 34880 41169 42614
474 545 1320 10506 13186 18126 27110 31498 35353 36193 37322
1075 1130 1424 11390 13312 14161 16927 25071 25844 34287 38151
161 396 427 5944 17281 22201 25218 30143 35566 38261 42513
233 247 694 1446 3180 3507 9069 20764 21940 33422 39358
271 508 1013 6271 21760 21858 24887 29808 31099 35475 39924
8 674 1329 3135 5110 14460 28108 28388 31043 31137 31863
1035 1222 1409 8287 16083 24450 24888 29356 30329 37834 39684
391 1090 1128 1866 4095 10643 13121 14499 20056 22195 30593
55 161 1402 6289 6837 8791 17937 21425 26602 30461 37241
110 377 1228 6875 13253 17032 19008 23274 32285 33452 41630
360 638 1355 5933 12593 13533 23377 23881 24586 26040 41663
535 1240 1333 3354 10860 16032 32573 34908 34957 39255 40759
526 936 1321 7992 10260 18527 28248 29356 32636 34666 35552
336 785 875 7530 13062 13075 18925 27963 28703 33688 36502
36 591 1062 1518 3821 7048 11197 17781 19408 22731 24783
214 1145 1223 1546 9475 11170 16061 21273 38688 40051 42479
1136 1226 1423 20227 22573 24951 26462 29586 34915 42441 43048
26 276 1425 6048 7224 7917 8747 27559 28515 35002 37649
127 294 437 4029 8585 9647 11904 24115 28514 36893 39722
748 1093 1403 9536 19305 20468 31049 38667 40502 40720 41949
96 638 743 9806 12101 17751 22732 24937 32007 32594 38504
649 904 1079 2770 3337 9158 20125 24619 32921 33698 35173
401 518 984 7372 12438 12582 18704 35874 39420 39503 39790
10 451 1077 8078 16320 17409 25807 28814 30613 41261 42955
405 592 1178 15936 18418 19585 21966 24219 30637 34536 37838
50 584 851 9720 11919 22544 22545 25851 35567 41587 41876
911 1113 1176 1806 10058 10809 14220 19044 20748 29424 36671
441 550 1135 1956 11254 18699 30249 33099 34587 35243 39952
510 1016 1281 8621 13467 13780 15170 16289 20925 26426 34479
4969 5223 17117 21950 22144 24043 27151 39809
11452 13622 18918 19670 23995 32647 37200 37399
6351 6426 13185 13973 16699 22524 31070 31916
4098 10617 14854 18004 28580 36158 37500 38552.]

[2. A data processing method comprising:

a group-wise deinterleaving step of returning an arrangement of the LDPC code that has undergone group-wise interleaving obtained from data transmitted from a transmitting device to an original arrangement, the transmitting device including an encoding unit configured to perform LDPC encoding based on a parity check matrix of an LDPC code having a code length N of 64800 bits and an encoding rate r of 5/15, a group-wise interleaving unit configured to perform group-wise interleaving of interleaving the LDPC code in a unit of a bit group of 360 bits, and a mapping unit configured to map the LDPC code to any one of four signal points decided using a modulation method in a unit of 2 bits, wherein, in the group-wise interleaving, setting an i+1-th bit group from a head of the LDPC code as a bit group i, arrangement of bit groups 0 to 179 of the LDPC code of 64800 bits is interleaved into arrangement of bit groups 39, 47, 96, 176, 33, 75, 165, 38, 27, 58, 90, 76, 17, 46, 10, 91, 133, 69, 171, 32, 117, 78, 13, 146, 101, 36, 0, 138, 25, 77, 122, 49, 14, 125, 140, 93, 130, 2, 104, 102, 128, 4, 111, 151, 84, 167, 35, 127, 156, 55, 82, 85, 66, 114, 8, 147, 115, 113, 5, 31, 100, 106, 48, 52, 67, 107, 18, 126, 112, 50, 9, 143, 28, 160, 71, 79, 43, 98, 86, 94, 64, 3, 166, 105, 103, 118, 63, 51, 139, 172, 141, 175, 56, 74, 95, 29, 45, 129, 120, 168, 92, 150, 7, 162, 153, 137, 108, 159, 157, 173, 23, 89, 132, 57, 37, 70, 134, 40, 21, 149, 80, 1, 121, 59, 110, 142, 152, 15, 154, 145, 12, 170, 54, 155, 99, 22, 123, 72, 177, 131, 116, 44, 158, 73, 11, 65, 164, 119, 174, 34, 83, 53, 24, 42, 60, 26, 161, 68, 178, 41, 148, 109, 87, 144, 135, 20, 62, 81, 169, 124, 6, 19, 30, 163, 61, 179, 136, 97, 16, and 88, wherein the parity check matrix includes an A matrix which is on an upper left of the parity check matrix having g rows and K columns represented with a predetermined value g and an information length K=N×r of the LDPC code, a B matrix which has a staircase structure close to a right side of the A matrix having g rows and g columns, a Z matrix which is a zero matrix close to a right side of the B matrix having g rows and N−K−g columns, a C matrix which is close to a bottom side of the A matrix and the B matrix having N−K−g rows and K+g columns, and a D matrix which is a unit matrix close to a right side of the C matrix having N−K−g rows and N−K−g columns, wherein the predetermined value g is 1440, wherein the A matrix and the C matrix are expressed using a parity check matrix initial value table, and wherein the parity check matrix initial value table is a table representing positions of elements of 1 of the A matrix and the C matrix for every 360 columns, the table including 221 1011 1218 4299 7143 8728 11072 15533 17356 33909 36833

360 1210 1375 2313 3493 16822 21373 23588 23656 26267 34098

544 1347 1433 2457 9186 10945 13583 14858 19195 34606 37441

37 596 715 4134 8091 12106 24307 24658 34108 40591 42883

235 398 1204 2075 6742 11670 13512 23231 24784 27915 34752

204 873 890 13550 16570 19774 34012 35249 37655 39885 42890

221 371 514 11984 14972 15690 28827 29069 30531 31018 43121

280 549 1435 1889 3310 10234 11575 15243 20748 30469 36005

223 666 1248 13304 14433 14732 18943 21248 23127 38529 39272

370 819 1065 9461 10319 25294 31958 33542 37458 39681 40039

585 870 1028 5087 5216 12228 16216 16381 16937 27132 27893

164 167 1210 7386 11151 20413 22713 23134 24188 36771 38992

298 511 809 4620 7347 8873 19602 24162 29198 34304 41145

105 830 1212 2415 14759 15440 16361 16748 22123 32684 42575

659 665 668 6458 22130 25972 30697 31074 32048 36078 37129

91 808 953 8015 8988 13492 13987 15979 28355 34509 39698

594 983 1265 3028 4029 9366 11069 11512 27066 40939 41639

506 740 1321 1484 10747 16376 17384 20285 31502 38925 42606

338 356 975 2022 3578 18689 18772 19826 22914 24733 27431

709 1264 1366 4617 8893 25226 27800 29080 30277 37781 39644

840 1179 1338 2973 3541 7043 12712 15005 17149 19910 36795

1009 1267 1380 4919 12679 22889 29638 30987 34637 36232 37284

466 913 1247 1646 3049 5924 9014 20539 34546 35029 36540

374 697 984 1654 5870 10883 11684 20294 28888 31612 34031

117 240 635 5093 8673 11323 12456 14145 21397 39619 42559

122 1265 1427 13528 14282 15241 16852 17227 34723 36836 39791

595 1180 1310 6952 17916 24725 24971 27243 29555 32138 35987

140 470 1017 13222 13253 18462 20806 21117 28673 31598 37235

7 710 1072 8014 10804 13303 14292 16690 26676 36443 41966

48 189 759 12438 14523 16388 23178 27315 28656 29111 29694

285 387 410 4294 4467 5949 25386 27898 34880 41169 42614

474 545 1320 10506 13186 18126 27110 31498 35353 36193 37322

1075 1130 1424 11390 13312 14161 16927 25071 25844 34287 38151

161 396 427 5944 17281 22201 25218 30143 35566 38261 42513

233 247 694 1446 3180 3507 9069 20764 21940 33422 39358

271 508 1013 6271 21760 21858 24887 29808 31099 35475 39924

8 674 1329 3135 5110 14460 28108 28388 31043 31137 31863

1035 1222 1409 8287 16083 24450 24888 29356 30329 37834 39684

391 1090 1128 1866 4095 10643 13121 14499 20056 22195 30593

55 161 1402 6289 6837 8791 17937 21425 26602 30461 37241

110 377 1228 6875 13253 17032 19008 23274 32285 33452 41630

360 638 1355 5933 12593 13533 23377 23881 24586 26040 41663

535 1240 1333 3354 10860 16032 32573 34908 34957 39255 40759

526 936 1321 7992 10260 18527 28248 29356 32636 34666 35552

336 785 875 7530 13062 13075 18925 27963 28703 33688 36502

36 591 1062 1518 3821 7048 11197 17781 19408 22731 24783

214 1145 1223 1546 9475 11170 16061 21273 38688 40051 42479

1136 1226 1423 20227 22573 24951 26462 29586 34915 42441 43048

26 276 1425 6048 7224 7917 8747 27559 28515 35002 37649

127 294 437 4029 8585 9647 11904 24115 28514 36893 39722

748 1093 1403 9536 19305 20468 31049 38667 40502 40720 41949

96 638 743 9806 12101 17751 22732 24937 32007 32594 38504

649 904 1079 2770 3337 9158 20125 24619 32921 33698 35173

401 518 984 7372 12438 12582 18704 35874 39420 39503 39790

10 451 1077 8078 16320 17409 25807 28814 30613 41261 42955

405 592 1178 15936 18418 19585 21966 24219 30637 34536 37838

50 584 851 9720 11919 22544 22545 25851 35567 41587 41876

911 1113 1176 1806 10058 10809 14220 19044 20748 29424 36671

441 550 1135 1956 11254 18699 30249 33099 34587 35243 39952

510 1016 1281 8621 13467 13780 15170 16289 20925 26426 34479

4969 5223 17117 21950 22144 24043 27151 39809

11452 13622 18918 19670 23995 32647 37200 37399

6351 6426 13185 13973 16699 22524 31070 31916

4098 10617 14854 18004 28580 36158 37500 38552.]

[3. A data processing method comprising:

an encoding step of performing LDPC encoding based on a parity check matrix of an LDPC code having a code length N of 64800 bits and an encoding rate r of 5/15;

a group-wise interleaving step of performing group-wise interleaving of interleaving the LDPC code in a unit of a bit group of 360 bits; and a mapping step of mapping the LDPC code to any one of 16 signal points decided using a modulation method in a unit of 4 bits, wherein, in the group-wise interleaving, setting an i+1-th bit group from a head of the LDPC code as a bit group i, arrangement of bit groups 0 to 179 of the LDPC code of 64800 bits is interleaved into arrangement of bit groups 6, 14, 1, 127, 161, 177, 75, 123, 62, 103, 17, 18, 167, 88, 27, 34, 8, 110, 7, 78, 94, 44, 45, 166, 149, 61, 163, 145, 155, 157, 82, 130, 70, 92, 151, 139, 160, 133, 26, 2, 79, 15, 95, 122, 126, 178, 101, 24, 138, 146, 179, 30, 86, 58, 11, 121, 159, 49, 84, 132, 117, 119, 50, 52, 4, 51, 48, 74, 114, 59, 40, 131, 33, 89, 66, 136, 72, 16, 134, 37, 164, 77, 99, 173, 20, 158, 156, 90, 41, 176, 81, 42, 60, 109, 22, 150, 105, 120, 12, 64, 56, 68, 111, 21, 148, 53, 169, 97, 108, 35, 140, 91, 115, 152, 36, 106, 154, 0, 25, 54, 63, 172, 80, 168, 142, 118, 162, 135, 73, 83, 153, 141, 9, 28, 55, 31, 112, 107, 85, 100, 175, 23, 57, 47, 38, 170, 137, 76, 147, 93, 19, 98, 124, 39, 87, 174, 144, 46, 10, 129, 69, 71, 125, 96, 116, 171, 128, 65, 102, 5, 43, 143, 104, 13, 67, 29, 3, 113, 32, and 165, wherein the parity check matrix includes an A matrix which is on an upper left of the parity check matrix having g rows and K columns represented with a predetermined value g and an information length K=N×r of the LDPC code, a B matrix which has a staircase structure close to a right side of the A matrix having g rows and g columns, a Z matrix which is a zero matrix close to a right side of the B matrix having g rows and N−K−g columns, a C matrix which is close to a bottom side of the A matrix and the B matrix having N−K−g rows and K+g columns, and a D matrix which is a unit matrix close to a right side of the C matrix having N−K−g rows and N−K−g columns, wherein the predetermined value g is 1440, wherein the A matrix and the C matrix are expressed using a parity check matrix initial value table, and wherein the parity check matrix initial value table is a table representing positions of elements of 1 of the A matrix and the C matrix for every 360 columns, the table including 221 1011 1218 4299 7143 8728 11072 15533 17356 33909 36833

360 1210 1375 2313 3493 16822 21373 23588 23656 26267 34098

544 1347 1433 2457 9186 10945 13583 14858 19195 34606 37441

37 596 715 4134 8091 12106 24307 24658 34108 40591 42883

235 398 1204 2075 6742 11670 13512 23231 24784 27915 34752

204 873 890 13550 16570 19774 34012 35249 37655 39885 42890

221 371 514 11984 14972 15690 28827 29069 30531 31018 43121

280 549 1435 1889 3310 10234 11575 15243 20748 30469 36005

223 666 1248 13304 14433 14732 18943 21248 23127 38529 39272

370 819 1065 9461 10319 25294 31958 33542 37458 39681 40039

585 870 1028 5087 5216 12228 16216 16381 16937 27132 27893

164 167 1210 7386 11151 20413 22713 23134 24188 36771 38992

298 511 809 4620 7347 8873 19602 24162 29198 34304 41145

105 830 1212 2415 14759 15440 16361 16748 22123 32684 42575

659 665 668 6458 22130 25972 30697 31074 32048 36078 37129

91 808 953 8015 8988 13492 13987 15979 28355 34509 39698

594 983 1265 3028 4029 9366 11069 11512 27066 40939 41639

506 740 1321 1484 10747 16376 17384 20285 31502 38925 42606

338 356 975 2022 3578 18689 18772 19826 22914 24733 27431

709 1264 1366 4617 8893 25226 27800 29080 30277 37781 39644

840 1179 1338 2973 3541 7043 12712 15005 17149 19910 36795

1009 1267 1380 4919 12679 22889 29638 30987 34637 36232 37284

466 913 1247 1646 3049 5924 9014 20539 34546 35029 36540

374 697 984 1654 5870 10883 11684 20294 28888 31612 34031

117 240 635 5093 8673 11323 12456 14145 21397 39619 42559

122 1265 1427 13528 14282 15241 16852 17227 34723 36836 39791

595 1180 1310 6952 17916 24725 24971 27243 29555 32138 35987

140 470 1017 13222 13253 18462 20806 21117 28673 31598 37235

7 710 1072 8014 10804 13303 14292 16690 26676 36443 41966

48 189 759 12438 14523 16388 23178 27315 28656 29111 29694

285 387 410 4294 4467 5949 25386 27898 34880 41169 42614

474 545 1320 10506 13186 18126 27110 31498 35353 36193 37322
1075 1130 1424 11390 13312 14161 16927 25071 25844 34287 38151
161 396 427 5944 17281 22201 25218 30143 35566 38261 42513
233 247 694 1446 3180 3507 9069 20764 21940 33422 39358
271 508 1013 6271 21760 21858 24887 29808 31099 35475 39924
8 674 1329 3135 5110 14460 28108 28388 31043 31137 31863
1035 1222 1409 8287 16083 24450 24888 29356 30329 37834 39684
391 1090 1128 1866 4095 10643 13121 14499 20056 22195 30593
55 161 1402 6289 6837 8791 17937 21425 26602 30461 37241
110 377 1228 6875 13253 17032 19008 23274 32285 33452 41630
360 638 1355 5933 12593 13533 23377 23881 24586 26040 41663
535 1240 1333 3354 10860 16032 32573 34908 34957 39255 40759
526 936 1321 7992 10260 18527 28248 29356 32636 34666 35552
336 785 875 7530 13062 13075 18925 27963 28703 33688 36502
36 591 1062 1518 3821 7048 11197 17781 19408 22731 24783
214 1145 1223 1546 9475 11170 16061 21273 38688 40051 42479
1136 1226 1423 20227 22573 24951 26462 29586 34915 42441 43048
26 276 1425 6048 7224 7917 8747 27559 28515 35002 37649
127 294 437 4029 8585 9647 11904 24115 28514 36893 39722
748 1093 1403 9536 19305 20468 31049 38667 40502 40720 41949
96 638 743 9806 12101 17751 22732 24937 32007 32594 38504
649 904 1079 2770 3337 9158 20125 24619 32921 33698 35173
401 518 984 7372 12438 12582 18704 35874 39420 39503 39790
10 451 1077 8078 16320 17409 25807 28814 30613 41261 42955
405 592 1178 15936 18418 19585 21966 24219 30637 34536 37838
50 584 851 9720 11919 22544 22545 25851 35567 41587 41876
911 1113 1176 1806 10058 10809 14220 19044 20748 29424 36671
441 550 1135 1956 11254 18699 30249 33099 34587 35243 39952
510 1016 1281 8621 13467 13780 15170 16289 20925 26426 34479
4969 5223 17117 21950 22144 24043 27151 39809
11452 13622 18918 19670 23995 32647 37200 37399
6351 6426 13185 13973 16699 22524 31070 31916
4098 10617 14854 18004 28580 36158 37500 38552.]

[4. A data processing method comprising:

a group-wise deinterleaving step of returning an arrangement of the LDPC code that has undergone group-wise interleaving obtained from data transmitted from a transmitting device to an original arrangement, the transmitting device including an encoding unit configured to perform LDPC encoding based on a parity check matrix of an LDPC code having a code length N of 64800 bits and an encoding rate r of 5/15, a group-wise interleaving unit configured to perform group-wise interleaving of interleaving the LDPC code in a unit of a bit group of 360 bits, and a mapping unit configured to map the LDPC code to any one of 16 signal points decided using a modulation method in a unit of 4 bits, wherein, in the group-wise interleaving, setting an i+1-th bit group from a head of the LDPC code as a bit group i, arrangement of bit groups 0 to 179 of the LDPC code of 64800 bits is interleaved into arrangement of bit groups 6, 14, 1, 127, 161, 177, 75, 123, 62, 103, 17, 18, 167, 88, 27, 34, 8, 110, 7, 78, 94, 44, 45, 166, 149, 61, 163, 145, 155, 157, 82, 130, 70, 92, 151, 139, 160, 133, 26, 2, 79, 15, 95, 122, 126, 178, 101, 24, 138, 146, 179, 30, 86, 58, 11, 121, 159, 49, 84, 132, 117, 119, 50, 52, 4, 51, 48, 74, 114, 59, 40, 131, 33, 89, 66, 136, 72, 16, 134, 37, 164, 77, 99, 173, 20, 158, 156, 90, 41, 176, 81, 42, 60, 109, 22, 150, 105, 120, 12, 64, 56, 68, 111, 21, 148, 53, 169, 97, 108, 35, 140, 91, 115, 152, 36, 106, 154, 0, 25, 54, 63, 172, 80, 168, 142, 118, 162, 135, 73, 83, 153, 141, 9, 28, 55, 31, 112, 107, 85, 100, 175, 23, 57, 47, 38, 170, 137, 76, 147, 93, 19, 98, 124, 39, 87, 174, 144, 46, 10, 129, 69, 71, 125, 96, 116, 171, 128, 65, 102, 5, 43, 143, 104, 13, 67, 29, 3, 113, 32, and 165, wherein the parity check matrix includes an A matrix which is on an upper left of the parity check matrix having g rows and K columns represented with a predetermined value g and an information length K=N×r of the LDPC code, a B matrix which has a staircase structure close to a right side of the A matrix having g rows and g columns, a Z matrix which is a zero matrix close to a right side of the B matrix having g rows and N−K−g columns, a C matrix which is close to a bottom side of the A matrix and the B matrix having N−K−g rows and K+g columns, and a D matrix which is a unit matrix close to a right side of the C matrix having N−K−g rows and N−K−g columns, wherein the predetermined value g is 1440, wherein the A matrix and the C matrix are expressed using a parity check matrix initial value table, and wherein the parity check matrix initial value table is a table representing positions of elements of 1 of the A matrix and the C matrix for every 360 columns, the table including 221 1011 1218 4299 7143 8728 11072 15533 17356 33909 36833
360 1210 1375 2313 3493 16822 21373 23588 23656 26267 34098
544 1347 1433 2457 9186 10945 13583 14858 19195 34606 37441
37 596 715 4134 8091 12106 24307 24658 34108 40591 42883
235 398 1204 2075 6742 11670 13512 23231 24784 27915 34752
204 873 890 13550 16570 19774 34012 35249 37655 39885 42890

221 371 514 11984 14972 15690 28827 29069 30531 31018 43121
280 549 1435 1889 3310 10234 11575 15243 20748 30469 36005
223 666 1248 13304 14433 14732 18943 21248 23127 38529 39272
370 819 1065 9461 10319 25294 31958 33542 37458 39681 40039
585 870 1028 5087 5216 12228 16216 16381 16937 27132 27893
164 167 1210 7386 11151 20413 22713 23134 24188 36771 38992
298 511 809 4620 7347 8873 19602 24162 29198 34304 41145
105 830 1212 2415 14759 15440 16361 16748 22123 32684 42575
659 665 668 6458 22130 25972 30697 31074 32048 36078 37129
91 808 953 8015 8988 13492 13987 15979 28355 34509 39698
594 983 1265 3028 4029 9366 11069 11512 27066 40939 41639
506 740 1321 1484 10747 16376 17384 20285 31502 38925 42606
338 356 975 2022 3578 18689 18772 19826 22914 24733 27431
709 1264 1366 4617 8893 25226 27800 29080 30277 37781 39644
840 1179 1338 2973 3541 7043 12712 15005 17149 19910 36795
1009 1267 1380 4919 12679 22889 29638 30987 34637 36232 37284
466 913 1247 1646 3049 5924 9014 20539 34546 35029 36540
374 697 984 1654 5870 10883 11684 20294 28888 31612 34031
117 240 635 5093 8673 11323 12456 14145 21397 39619 42559
122 1265 1427 13528 14282 15241 16852 17227 34723 36836 39791
595 1180 1310 6952 17916 24725 24971 27243 29555 32138 35987
140 470 1017 13222 13253 18462 20806 21117 28673 31598 37235
7 710 1072 8014 10804 13303 14292 16690 26676 36443 41966
48 189 759 12438 14523 16388 23178 27315 28656 29111 29694
285 387 410 4294 4467 5949 25386 27898 34880 41169 42614
474 545 1320 10506 13186 18126 27110 31498 35353 36193 37322
1075 1130 1424 11390 13312 14161 16927 25071 25844 34287 38151
161 396 427 5944 17281 22201 25218 30143 35566 38261 42513
233 247 694 1446 3180 3507 9069 20764 21940 33422 39358
271 508 1013 6271 21760 21858 24887 29808 31099 35475 39924
8 674 1329 3135 5110 14460 28108 28388 31043 31137 31863
1035 1222 1409 8287 16083 24450 24888 29356 30329 37834 39684
391 1090 1128 1866 4095 10643 13121 14499 20056 22195 30593
55 161 1402 6289 6837 8791 17937 21425 26602 30461 37241
110 377 1228 6875 13253 17032 19008 23274 32285 33452 41630
360 638 1355 5933 12593 13533 23377 23881 24586 26040 41663
535 1240 1333 3354 10860 16032 32573 34908 34957 39255 40759
526 936 1321 7992 10260 18527 28248 29356 32636 34666 35552
336 785 875 7530 13062 13075 18925 27963 28703 33688 36502
36 591 1062 1518 3821 7048 11197 17781 19408 22731 24783
214 1145 1223 1546 9475 11170 16061 21273 38688 40051 42479
1136 1226 1423 20227 22573 24951 26462 29586 34915 42441 43048
26 276 1425 6048 7224 7917 8747 27559 28515 35002 37649
127 294 437 4029 8585 9647 11904 24115 28514 36893 39722
748 1093 1403 9536 19305 20468 31049 38667 40502 40720 41949
96 638 743 9806 12101 17751 22732 24937 32007 32594 38504
649 904 1079 2770 3337 9158 20125 24619 32921 33698 35173
401 518 984 7372 12438 12582 18704 35874 39420 39503 39790
10 451 1077 8078 16320 17409 25807 28814 30613 41261 42955
405 592 1178 15936 18418 19585 21966 24219 30637 34536 37838
50 584 851 9720 11919 22544 22545 25851 35567 41587 41876
911 1113 1176 1806 10058 10809 14220 19044 20748 29424 36671
441 550 1135 1956 11254 18699 30249 33099 34587 35243 39952
510 1016 1281 8621 13467 13780 15170 16289 20925 26426 34479
4969 5223 17117 21950 22144 24043 27151 39809
11452 13622 18918 19670 23995 32647 37200 37399
6351 6426 13185 13973 16699 22524 31070 31916
4098 10617 14854 18004 28580 36158 37500 38552.]

[5. A data processing method comprising:

an encoding step of performing LDPC encoding based on a parity check matrix of an LDPC code having a code length N of 64800 bits and an encoding rate r of 5/15;

a group-wise interleaving step of performing group-wise interleaving of interleaving the LDPC code in a unit of a bit group of 360 bits; and a mapping step of mapping the LDPC code to any one of 64 signal points decided using a modulation method in a unit of 6 bits, wherein, in the group-wise interleaving, setting an i+1-th bit group from a head of the LDPC code as a bit group i, arrangement of bit groups 0 to 179 of the LDPC code of 64800 bits is interleaved into arrangement of bit groups 103, 116, 158, 0, 27, 73, 140, 30, 148, 36, 153, 154, 10, 174, 122, 178, 6, 106, 162, 59, 142, 112, 7, 74, 11, 51, 49, 72, 31, 65, 156, 95, 171, 105, 173, 168, 1, 155, 125, 82, 86, 161, 57, 165, 54, 26, 121, 25, 157, 93, 22, 34, 33, 39, 19, 46, 150, 141, 12, 9, 79, 118, 24, 17, 85, 117, 67, 58, 129, 160, 89, 61, 146, 77, 130, 102, 101, 137, 94, 69, 14, 133, 60, 149, 136, 16, 108, 41, 90, 28, 144, 13, 175, 114, 2, 18, 63, 68, 21, 109, 53, 123, 75, 81, 143, 169, 42, 119, 138, 104, 4, 131, 145, 8, 5, 76, 15, 88, 177, 124, 45, 97, 64, 100, 37, 132, 38, 44, 107, 35, 43, 80, 50, 91, 152, 78, 166, 55, 115, 170, 159, 147, 167, 87, 83, 29, 96, 172, 48, 98, 62, 139, 70, 164, 84, 47, 151, 134, 126, 113, 179, 110, 111, 128, 32, 52, 66, 40, 135, 176, 99, 127, 163, 3, 120, 71, 56, 92, 23, and 20, wherein the parity check matrix includes an A matrix which is on an upper left of the parity check matrix having g rows and K columns represented with a predetermined value g and an information length K=N×r of the LDPC code, a B matrix which has a staircase structure close to a right side of the A matrix having g rows and g columns, a Z matrix which is a zero matrix close to a right side of the B matrix having g rows and N−K−g columns, a C matrix which is close to a bottom side of the A matrix and the B matrix having N−K−g rows and K+g columns, and a D matrix which is a unit matrix close to a right side of the C matrix having N−K−g rows and N−K−g columns, wherein the predetermined value g is 1440, wherein the A matrix and the C matrix are expressed using a parity check matrix initial value table, and wherein the parity check matrix initial value table is a table representing positions of elements of 1 of the A matrix and the C matrix for every 360 columns, the table including 221 1011 1218 4299 7143 8728 11072 15533 17356 33909 36833

360 1210 1375 2313 3493 16822 21373 23588 23656 26267 34098

544 1347 1433 2457 9186 10945 13583 14858 19195 34606 37441

37 596 715 4134 8091 12106 24307 24658 34108 40591 42883

235 398 1204 2075 6742 11670 13512 23231 24784 27915 34752

204 873 890 13550 16570 19774 34012 35249 37655 39885 42890

221 371 514 11984 14972 15690 28827 29069 30531 31018 43121

280 549 1435 1889 3310 10234 11575 15243 20748 30469 36005

223 666 1248 13304 14433 14732 18943 21248 23127 38529 39272

370 819 1065 9461 10319 25294 31958 33542 37458 39681 40039

585 870 1028 5087 5216 12228 16216 16381 16937 27132 27893

164 167 1210 7386 11151 20413 22713 23134 24188 36771 38992

298 511 809 4620 7347 8873 19602 24162 29198 34304 41145

105 830 1212 2415 14759 15440 16361 16748 22123 32684 42575

659 665 668 6458 22130 25972 30697 31074 32048 36078 37129

91 808 953 8015 8988 13492 13987 15979 28355 34509 39698

594 983 1265 3028 4029 9366 11069 11512 27066 40939 41639

506 740 1321 1484 10747 16376 17384 20285 31502 38925 42606

338 356 975 2022 3578 18689 18772 19826 22914 24733 27431

709 1264 1366 4617 8893 25226 27800 29080 30277 37781 39644

840 1179 1338 2973 3541 7043 12712 15005 17149 19910 36795

1009 1267 1380 4919 12679 22889 29638 30987 34637 36232 37284

466 913 1247 1646 3049 5924 9014 20539 34546 35029 36540

374 697 984 1654 5870 10883 11684 20294 28888 31612 34031

117 240 635 5093 8673 11323 12456 14145 21397 39619 42559

122 1265 1427 13528 14282 15241 16852 17227 34723 36836 39791

595 1180 1310 6952 17916 24725 24971 27243 29555 32138 35987

140 470 1017 13222 13253 18462 20806 21117 28673 31598 37235

7 710 1072 8014 10804 13303 14292 16690 26676 36443 41966

48 189 759 12438 14523 16388 23178 27315 28656 29111 29694

285 387 410 4294 4467 5949 25386 27898 34880 41169 42614

474 545 1320 10506 13186 18126 27110 31498 35353 36193 37322

1075 1130 1424 11390 13312 14161 16927 25071 25844 34287 38151

161 396 427 5944 17281 22201 25218 30143 35566 38261 42513

233 247 694 1446 3180 3507 9069 20764 21940 33422 39358

271 508 1013 6271 21760 21858 24887 29808 31099 35475 39924

8 674 1329 3135 5110 14460 28108 28388 31043 31137 31863

1035 1222 1409 8287 16083 24450 24888 29356 30329 37834 39684

391 1090 1128 1866 4095 10643 13121 14499 20056 22195 30593

55 161 1402 6289 6837 8791 17937 21425 26602 30461 37241

110 377 1228 6875 13253 17032 19008 23274 32285 33452 41630

360 638 1355 5933 12593 13533 23377 23881 24586 26040 41663

535 1240 1333 3354 10860 16032 32573 34908 34957 39255 40759

526 936 1321 7992 10260 18527 28248 29356 32636 34666 35552

336 785 875 7530 13062 13075 18925 27963 28703 33688 36502

36 591 1062 1518 3821 7048 11197 17781 19408 22731 24783

214 1145 1223 1546 9475 11170 16061 21273 38688 40051 42479

1136 1226 1423 20227 22573 24951 26462 29586 34915 42441 43048

26 276 1425 6048 7224 7917 8747 27559 28515 35002 37649

127 294 437 4029 8585 9647 11904 24115 28514 36893 39722

748 1093 1403 9536 19305 20468 31049 38667 40502 40720 41949
96 638 743 9806 12101 17751 22732 24937 32007 32594 38504
649 904 1079 2770 3337 9158 20125 24619 32921 33698 35173
401 518 984 7372 12438 12582 18704 35874 39420 39503 39790
10 451 1077 8078 16320 17409 25807 28814 30613 41261 42955
405 592 1178 15936 18418 19585 21966 24219 30637 34536 37838
50 584 851 9720 11919 22544 22545 25851 35567 41587 41876
911 1113 1176 1806 10058 10809 14220 19044 20748 29424 36671
441 550 1135 1956 11254 18699 30249 33099 34587 35243 39952
510 1016 1281 8621 13467 13780 15170 16289 20925 26426 34479
4969 5223 17117 21950 22144 24043 27151 39809
11452 13622 18918 19670 23995 32647 37200 37399
6351 6426 13185 13973 16699 22524 31070 31916
4098 10617 14854 18004 28580 36158 37500 38552.]

[6. A data processing method comprising:

a group-wise deinterleaving step of returning an arrangement of the LDPC code that has undergone group-wise interleaving obtained from data transmitted from a transmitting device to an original arrangement, the transmitting device including an encoding unit configured to perform LDPC encoding based on a parity check matrix of an LDPC code having a code length N of 64800 bits and an encoding rate r of 5/15, a group-wise interleaving unit configured to perform group-wise interleaving of interleaving the LDPC code in a unit of a bit group of 360 bits, and a mapping unit configured to map the LDPC code to any one of 64 signal points decided using a modulation method in a unit of 6 bits, wherein, in the group-wise interleaving, setting an i+1-th bit group from a head of the LDPC code as a bit group i, arrangement of bit groups 0 to 179 of the LDPC code of 64800 bits is interleaved into arrangement of bit groups 103, 116, 158, 0, 27, 73, 140, 30, 148, 36, 153, 154, 10, 174, 122, 178, 6, 106, 162, 59, 142, 112, 7, 74, 11, 51, 49, 72, 31, 65, 156, 95, 171, 105, 173, 168, 1, 155, 125, 82, 86, 161, 57, 165, 54, 26, 121, 25, 157, 93, 22, 34, 33, 39, 19, 46, 150, 141, 12, 9, 79, 118, 24, 17, 85, 117, 67, 58, 129, 160, 89, 61, 146, 77, 130, 102, 101, 137, 94, 69, 14, 133, 60, 149, 136, 16, 108, 41, 90, 28, 144, 13, 175, 114, 2, 18, 63, 68, 21, 109, 53, 123, 75, 81, 143, 169, 42, 119, 138, 104, 4, 131, 145, 8, 5, 76, 15, 88, 177, 124, 45, 97, 64, 100, 37, 132, 38, 44, 107, 35, 43, 80, 50, 91, 152, 78, 166, 55, 115, 170, 159, 147, 167, 87, 83, 29, 96, 172, 48, 98, 62, 139, 70, 164, 84, 47, 151, 134, 126, 113, 179, 110, 111, 128, 32, 52, 66, 40, 135, 176, 99, 127, 163, 3, 120, 71, 56, 92, 23, and 20, wherein the parity check matrix includes an A matrix which is on an upper left of the parity check matrix having g rows and K columns represented with a predetermined value g and an information length K=N×r of the LDPC code, a B matrix which has a staircase structure close to a right side of the A matrix having g rows and g columns, a Z matrix which is a zero matrix close to a right side of the B matrix having g rows and N−K−g columns, a C matrix which is close to a bottom side of the A matrix and the B matrix having N−K−g rows and K+g columns, and a D matrix which is a unit matrix close to a right side of the C matrix having N−K−g rows and N−K−−g columns, wherein the predetermined value g is 1440, wherein the A matrix and the C matrix are expressed using a parity check matrix initial value table, and wherein the parity check matrix initial value table is a table representing positions of elements of 1 of the A matrix and the C matrix for every 360 columns, the table including 221 1011 1218 4299 7143 8728 11072 15533 17356 33909 36833
360 1210 1375 2313 3493 16822 21373 23588 23656 26267 34098
544 1347 1433 2457 9186 10945 13583 14858 19195 34606 37441
37 596 715 4134 8091 12106 24307 24658 34108 40591 42883
235 398 1204 2075 6742 11670 13512 23231 24784 27915 34752
204 873 890 13550 16570 19774 34012 35249 37655 39885 42890
221 371 514 11984 14972 15690 28827 29069 30531 31018 43121
280 549 1435 1889 3310 10234 11575 15243 20748 30469 36005
223 666 1248 13304 14433 14732 18943 21248 23127 38529 39272
370 819 1065 9461 10319 25294 31958 33542 37458 39681 40039
585 870 1028 5087 5216 12228 16216 16381 16937 27132 27893
164 167 1210 7386 11151 20413 22713 23134 24188 36771 38992
298 511 809 4620 7347 8873 19602 24162 29198 34304 41145
105 830 1212 2415 14759 15440 16361 16748 22123 32684 42575
659 665 668 6458 22130 25972 30697 31074 32048 36078 37129
91 808 953 8015 8988 13492 13987 15979 28355 34509 39698
594 983 1265 3028 4029 9366 11069 11512 27066 40939 41639
506 740 1321 1484 10747 16376 17384 20285 31502 38925 42606
338 356 975 2022 3578 18689 18772 19826 22914 24733 27431
709 1264 1366 4617 8893 25226 27800 29080 30277 37781 39644
840 1179 1338 2973 3541 7043 12712 15005 17149 19910 36795
1009 1267 1380 4919 12679 22889 29638 30987 34637 36232 37284
466 913 1247 1646 3049 5924 9014 20539 34546 35029 36540
374 697 984 1654 5870 10883 11684 20294 28888 31612 34031

117 240 635 5093 8673 11323 12456 14145 21397 39619 42559
122 1265 1427 13528 14282 15241 16852 17227 34723 36836 39791
595 1180 1310 6952 17916 24725 24971 27243 29555 32138 35987
140 470 1017 13222 13253 18462 20806 21117 28673 31598 37235
7 710 1072 8014 10804 13303 14292 16690 26676 36443 41966
48 189 759 12438 14523 16388 23178 27315 28656 29111 29694
285 387 410 4294 4467 5949 25386 27898 34880 41169 42614
474 545 1320 10506 13186 18126 27110 31498 35353 36193 37322
1075 1130 1424 11390 13312 14161 16927 25071 25844 34287 38151
161 396 427 5944 17281 22201 25218 30143 35566 38261 42513
233 247 694 1446 3180 3507 9069 20764 21940 33422 39358
271 508 1013 6271 21760 21858 24887 29808 31099 35475 39924
8 674 1329 3135 5110 14460 28108 28388 31043 31137 31863
1035 1222 1409 8287 16083 24450 24888 29356 30329 37834 39684
391 1090 1128 1866 4095 10643 13121 14499 20056 22195 30593
55 161 1402 6289 6837 8791 17937 21425 26602 30461 37241
110 377 1228 6875 13253 17032 19008 23274 32285 33452 41630
360 638 1355 5933 12593 13533 23377 23881 24586 26040 41663
535 1240 1333 3354 10860 16032 32573 34908 34957 39255 40759
526 936 1321 7992 10260 18527 28248 29356 32636 34666 35552
336 785 875 7530 13062 13075 18925 27963 28703 33688 36502
36 591 1062 1518 3821 7048 11197 17781 19408 22731 24783
214 1145 1223 1546 9475 11170 16061 21273 38688 40051 42479
1136 1226 1423 20227 22573 24951 26462 29586 34915 42441 43048
26 276 1425 6048 7224 7917 8747 27559 28515 35002 37649
127 294 437 4029 8585 9647 11904 24115 28514 36893 39722
748 1093 1403 9536 19305 20468 31049 38667 40502 40720 41949
96 638 743 9806 12101 17751 22732 24937 32007 32594 38504
649 904 1079 2770 3337 9158 20125 24619 32921 33698 35173
401 518 984 7372 12438 12582 18704 35874 39420 39503 39790
10 451 1077 8078 16320 17409 25807 28814 30613 41261 42955
405 592 1178 15936 18418 19585 21966 24219 30637 34536 37838
50 584 851 9720 11919 22544 22545 25851 35567 41587 41876
911 1113 1176 1806 10058 10809 14220 19044 20748 29424 36671
441 550 1135 1956 11254 18699 30249 33099 34587 35243 39952
510 1016 1281 8621 13467 13780 15170 16289 20925 26426 34479
4969 5223 17117 21950 22144 24043 27151 39809
11452 13622 18918 19670 23995 32647 37200 37399
6351 6426 13185 13973 16699 22524 31070 31916
4098 10617 14854 18004 28580 36158 37500 38552.]

*7. A receiving device, comprising:*

*a receiver configured to receive a digital signal including an interleaved low density parity check (LDPC) code word;*

*a deinterleaver configured to deinterleave the interleaved LDPC code word to obtain an LDPC code word, in accordance with a group-wise deinterleaving; and*

*an LDPC decoder configured to decode the LDPC code word,*

*wherein the LDPC code word includes information bits and parity bits, and*

*wherein the LDPC code word includes a sequence of bit groups 0 to 179, the interleaved LDPC code word being group-wise interleaved into a following interleaved sequence of bit groups*

*39, 47, 96, 176, 33, 75, 165, 38, 27, 58, 90, 76, 17, 46, 10, 91, 133, 69, 171, 32, 117, 78, 13, 146, 101, 36, 0, 138, 25, 77, 122, 49, 14, 125, 140, 93, 130, 2, 104, 102, 128, 4, 111, 151, 84, 167, 35, 127, 156, 55, 82, 85, 66, 114, 8, 147, 115, 113, 5, 31, 100, 106, 48, 52, 67, 107, 18, 126, 112, 50, 9, 143, 28, 160, 71, 79, 43, 98, 86, 94, 64, 3, 166, 105, 103, 118, 63, 51, 139, 172, 141, 175, 56, 74, 95, 29, 45, 129, 120, 168, 92, 150, 7, 162, 153, 137, 108, 159, 157, 173, 23, 89, 132, 57, 37, 70, 134, 40, 21, 149, 80, 1, 121, 59, 110, 142, 152, 15, 154, 145, 12, 170, 54, 155, 99, 22, 123, 72, 177, 131, 116, 44, 158, 73, 11, 65, 164, 119, 174, 34, 83, 53, 24, 42, 60, 26, 161, 68, 178, 41, 148, 109, 87, 144, 135, 20, 62, 81, 169, 124, 6, 19, 30, 163, 61, 179, 136, 97, 16, and 88.*

*8. The receiving device according to claim 7, further comprising a demapper configured to demap a plurality of symbols into the interleaved LDPC code word.*

*9. The receiving device according to claim 8, wherein each symbol of the plurality of symbols is mapped in units of 2 bits of a QPSK symbol.*

*10. The receiving device according to claim 7, wherein the interleaved LDPC code word is group-wise interleaved in units of 360 bits.*

*11. The receiving device according to claim 7, wherein the LDPC code word is encoded in accordance with an LDPC having a code length N of 64800 bits and a code rate of 5/15.*

*12. The receiving device according to claim 7, wherein the deinterleaver is further configured to deinterleave the interleaved LDPC code word, in accordance with a parity deinterleaving.*

*13. The receiving device according to claim 7, wherein the deinterleaver is further configured to deinterleave the interleaved LDPC code word, in accordance with a block deinterleaving.*

*14. The receiving device according to claim 7, wherein the digital signal is a digital television broadcast signal.*

*15. The receiving device according to claim 7, wherein the receiving device includes a display and a speaker.*

*16. The receiving device according to claim 7, wherein the receiving device is a television receiver.*

*17. The receiving device according to claim 7, wherein the LDPC decoder is further configured to decode the LDPC code word to obtain the information bits, and*

*the receiving device further includes processing circuitry configured to obtain images and sound by information source decoding of the information bits, cause a display to display the obtained images, and cause a speaker to output the obtained sound.*

*18. A receiving method, comprising:*

*receiving a digital signal including an interleaved low density parity check (LDPC) code word;*

*deinterleaving the interleaved LDPC code word to obtain an LDPC code word, in accordance with a group-wise deinterleaving; and*

*decoding the LDPC code word,*

*wherein the LDPC code word includes information bits and parity bits, and*

*wherein the LDPC code word includes a sequence of bit groups 0 to 179, the interleaved LDPC code word being group-wise interleaved into a following interleaved sequence of bit groups*

*39, 47, 96, 176, 33, 75, 165, 38, 27, 58, 90, 76, 17, 46, 10, 91, 133, 69, 171, 32, 117, 78, 13, 146, 101, 36, 0, 138, 25, 77, 122, 49, 14, 125, 140, 93, 130, 2, 104, 102, 128, 4, 111, 151, 84, 167, 35, 127, 156, 55, 82, 85, 66, 114, 8, 147, 115, 113, 5, 31, 100, 106, 48, 52, 67, 107, 18, 126, 112, 50, 9, 143, 28, 160, 71, 79, 43, 98, 86, 94, 64, 3, 166, 105, 103, 118, 63, 51, 139, 172, 141, 175, 56, 74, 95, 29, 45, 129, 120, 168, 92, 150, 7, 162, 153, 137, 108, 159, 157, 173, 23, 89, 132, 57, 37, 70, 134, 40, 21, 149, 80, 1, 121, 59, 110, 142, 152, 15, 154, 145, 12, 170, 54, 155, 99, 22, 123, 72, 177, 131, 116, 44, 158, 73, 11, 65, 164, 119, 174, 34, 83, 53, 24, 42, 60, 26, 161, 68, 178, 41, 148, 109, 87, 144, 135, 20, 62, 81, 169, 124, 6, 19, 30, 163, 61, 179, 136, 97, 16, and 88.*

*19. The receiving method according to claim 18, wherein the receiving method further comprises demapping a plurality of symbols into the interleaved LDPC code word.*

*20. The receiving method according to claim 19, wherein each symbol of the plurality of symbols is mapped in units of 2 bits of a QPSK symbol.*

*21. The receiving method according to claim 18, wherein the interleaved LDPC code word is group-wise interleaved in units of 360 bits.*

*22. The receiving method according to claim 18, wherein the LDPC code word is encoded in accordance with an LDPC having a code length N of 64800 bits and a code rate of 5/15.*

*23. The receiving method according to claim 18, wherein the deinterleaving comprises deinterleaving the interleaved LDPC code word, in accordance with a parity deinterleaving.*

*24. The receiving method according to claim 18, wherein the deinterleaving comprises deinterleaving the interleaved LDPC code word, in accordance with a block deinterleaving.*

*25. The receiving method according to claim 18, wherein the digital signal is a digital television broadcast signal.*

*26. The receiving method according to claim 18, wherein the receiving method further comprises:*

*decoding the LDPC code word to obtain the information bits,*

*obtaining images and sound from information source decoding of the information bits,*

*displaying the images, and*

*outputting the sound.*

*27. A TV receiver, comprising:*

*a display;*

*a speaker;*

*a receiver configured to receive a digital signal including an interleaved low density parity check (LDPC) code word;*

*a deinterleaver configured to deinterleave the interleaved LDPC code word to obtain an LDPC code word, in accordance with a group-wise deinterleaving; and*

*an LDPC decoder configured to decode the LDPC code word,*

*wherein the LDPC code word includes information bits and parity bits, and*

*wherein the LDPC code word includes a sequence of bit groups 0 to 179, the interleaved LDPC code word being group-wise interleaved into a following interleaved sequence of bit groups*

*39, 47, 96, 176, 33, 75, 165, 38, 27, 58, 90, 76, 17, 46, 10, 91, 133, 69, 171, 32, 117, 78, 13, 146, 101, 36, 0, 138, 25, 77, 122, 49, 14, 125, 140, 93, 130, 2, 104, 102, 128, 4, 111, 151, 84, 167, 35, 127, 156, 55, 82, 85, 66, 114, 8, 147, 115, 113, 5, 31, 100, 106, 48, 52, 67, 107, 18, 126, 112, 50, 9, 143, 28, 160, 71, 79, 43, 98, 86, 94, 64, 3, 166, 105, 103, 118, 63, 51, 139, 172, 141, 175, 56, 74, 95, 29, 45, 129, 120, 168, 92, 150, 7, 162, 153, 137, 108, 159, 157, 173, 23, 89, 132, 57, 37, 70, 134, 40, 21, 149, 80, 1, 121, 59, 110, 142, 152, 15, 154, 145, 12, 170, 54, 155, 99, 22, 123, 72, 177, 131, 116, 44, 158, 73, 11, 65, 164, 119, 174, 34, 83, 53, 24, 42, 60, 26, 161, 68, 178, 41, 148, 109, 87, 144, 135, 20, 62, 81, 169, 124, 6, 19, 30, 163, 61, 179, 136, 97, 16, and 88.*

* * * * *